(12) United States Patent
Yoshida

(10) Patent No.: US 8,514,165 B2
(45) Date of Patent: Aug. 20, 2013

(54) SEMICONDUCTOR DEVICE

(75) Inventor: Yasunori Yoshida, Atsugi (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 1063 days.

(21) Appl. No.: 12/003,154

(22) Filed: Dec. 20, 2007

(65) Prior Publication Data

US 2008/0158137 A1 Jul. 3, 2008

(30) Foreign Application Priority Data

Dec. 28, 2006 (JP) ................................. 2006-354387

(51) Int. Cl.
*G09G 3/36* (2006.01)

(52) U.S. Cl.
USPC ...................................... 345/102; 250/214 A

(58) Field of Classification Search
USPC .......................................... 340/619; 345/102
See application file for complete search history.

(56) References Cited

U.S. PATENT DOCUMENTS

| | | | |
|---|---|---|---|
| 4,065,668 A | 12/1977 | Monticelli | |
| 4,118,621 A | 10/1978 | Monticelli | |
| 4,251,742 A | 2/1981 | Beelitz | |
| 4,454,416 A | 6/1984 | Gontowski, Jr. et al. | |
| 4,713,819 A | 12/1987 | Yoshikawa | |
| 5,059,809 A | 10/1991 | Fukuyama | |
| 5,298,455 A | 3/1994 | Arai et al. | |
| 5,343,033 A * | 8/1994 | Cain | 250/208.2 |
| 5,442,198 A | 8/1995 | Arai et al. | |
| 5,479,208 A | 12/1995 | Okumura | |
| 5,574,293 A | 11/1996 | Arai et al. | |
| 5,576,222 A | 11/1996 | Arai et al. | |
| 5,591,988 A | 1/1997 | Arai et al. | |
| 5,708,471 A | 1/1998 | Okumura | |
| 5,760,760 A | 6/1998 | Helms | |
| 5,786,801 A | 7/1998 | Ichise | |
| 5,936,231 A | 8/1999 | Michiyama et al. | |
| 5,952,992 A | 9/1999 | Helms | |
| 5,981,936 A | 11/1999 | Fujiie | |
| 6,057,738 A | 5/2000 | Ku et al. | |
| 6,188,380 B1 | 2/2001 | Kawashima et al. | |
| 6,200,825 B1 | 3/2001 | Yoshimi et al. | |

(Continued)

FOREIGN PATENT DOCUMENTS

| | | |
|---|---|---|
| DE | 9213278 | 1/1993 |
| EP | 0 445 757 | 9/1991 |

(Continued)

*Primary Examiner* — Kevin M Nguyen
*Assistant Examiner* — Kenneth B Lee, Jr.
(74) *Attorney, Agent, or Firm* — Eric J. Robinson; Robinson Intellectual Property Law Office, P.C.

(57) ABSTRACT

A photoelectric conversion device includes a light detection circuit which includes an optical sensor to output a current signal corresponding to illuminance and a current-voltage conversion circuit to convert the current signal output from the optical sensor into a voltage signal; an amplifier to amplify the voltage signal output from the light detection circuit; a comparison circuit to compare voltage output from the amplifier and reference voltage and output the result to a control circuit; and the control circuit to determine an illuminance range to be detected depending on the output from the comparison circuit and output a control signal to the light detection circuit. The current-voltage conversion circuit has a function of changing a resistance value in accordance with the control signal.

25 Claims, 64 Drawing Sheets

(56) References Cited

U.S. PATENT DOCUMENTS

| | | |
|---|---|---|
| 6,287,888 B1 | 9/2001 | Sakakura et al. |
| 6,363,044 B1 | 3/2002 | Lehr et al. |
| 6,403,943 B2 | 6/2002 | Wada et al. |
| 6,531,711 B2 | 3/2003 | Sakakura et al. |
| 6,538,246 B2 | 3/2003 | Wada et al. |
| 6,696,680 B2 | 2/2004 | Wada et al. |
| 6,757,018 B1 | 6/2004 | Fowler |
| 6,897,429 B1 | 5/2005 | Turner et al. |
| 6,914,230 B2 | 7/2005 | Baer |
| 7,002,881 B2 | 2/2006 | Okuda et al. |
| 7,022,967 B2 | 4/2006 | Horiguchi et al. |
| 7,030,551 B2 | 4/2006 | Yamazaki et al. |
| 7,042,980 B2 | 5/2006 | Endo |
| 7,067,788 B2 | 6/2006 | Bardsley |
| 7,091,462 B2 | 8/2006 | Wilson et al. |
| 7,214,922 B2 | 5/2007 | Takiba et al. |
| 7,253,391 B2 | 8/2007 | Koyama et al. |
| 7,335,951 B2 | 2/2008 | Nishi et al. |
| 7,449,718 B2 | 11/2008 | Nishi et al. |
| 7,495,272 B2 | 2/2009 | Maruyama et al. |
| 7,501,306 B2 | 3/2009 | Nishi et al. |
| 7,531,784 B2 | 5/2009 | Arao et al. |
| 7,919,779 B2 | 4/2011 | Nishi et al. |
| 2004/0042707 A1 | 3/2004 | Imai et al. |
| 2005/0116310 A1 | 6/2005 | Nishi et al. |
| 2005/0167573 A1 | 8/2005 | Maruyama et al. |
| 2006/0163577 A1 | 7/2006 | Yamazaki et al. |
| 2006/0261253 A1 * | 11/2006 | Arao et al. .............. 250/214.1 |
| 2007/0045672 A1 | 3/2007 | Nishi et al. |
| 2007/0171285 A1 | 7/2007 | Takiba et al. |
| 2010/0187405 A1 | 7/2010 | Arao et al. |

FOREIGN PATENT DOCUMENTS

| | | |
|---|---|---|
| EP | 1 523 043 | 4/2005 |
| EP | 1 727 120 | 11/2006 |
| JP | 60-020655 | 2/1985 |
| JP | 03-257794 | 11/1991 |
| JP | 10-256841 | 9/1998 |
| JP | 2001-175799 A | 6/2001 |
| JP | 2001-266391 | 9/2001 |
| JP | 2001-274645 A | 10/2001 |
| JP | 2002-026369 A | 1/2002 |
| JP | 2002-534005 | 10/2002 |
| JP | 3444093 | 6/2003 |
| JP | 3444093 | 9/2003 |
| JP | 2003-315149 | 11/2003 |
| JP | 2004-022051 | 1/2004 |
| JP | 2004-085306 A | 3/2004 |
| JP | 2004-179382 A | 6/2004 |
| JP | 2005-136394 | 5/2005 |
| JP | 2005-167157 | 6/2005 |
| JP | 2006-086425 | 3/2006 |
| JP | 2006-261524 A | 9/2006 |
| JP | 2007-005774 | 1/2007 |
| JP | 2007-059889 | 3/2007 |
| WO | WO-00/38409 | 6/2000 |
| WO | WO 2005/114749 | 12/2005 |
| WO | WO 2007/013534 | 2/2007 |
| WO | WO 2007/125977 | 11/2007 |

* cited by examiner

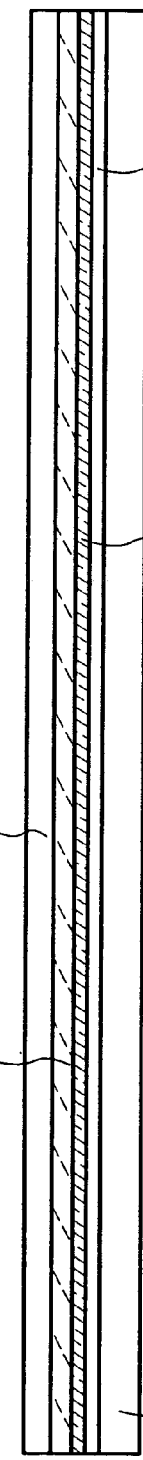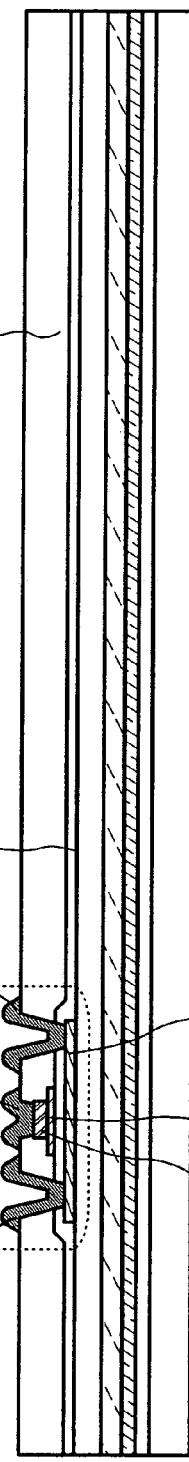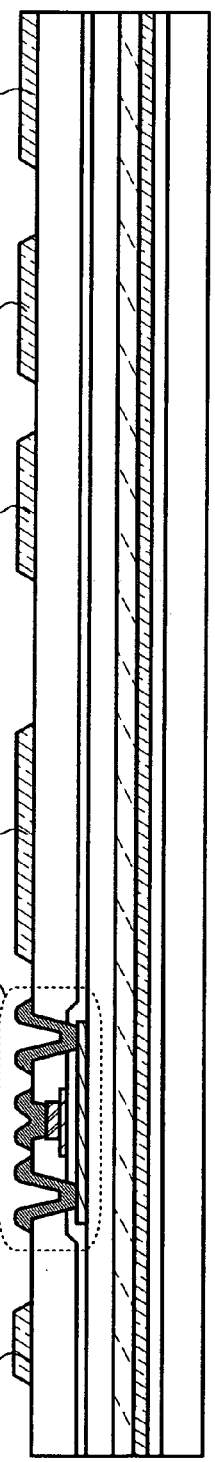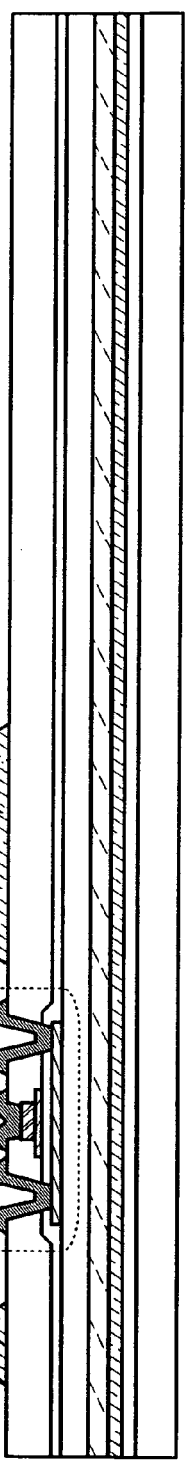
FIG. 14A
FIG. 14B
FIG. 14C
FIG. 14D

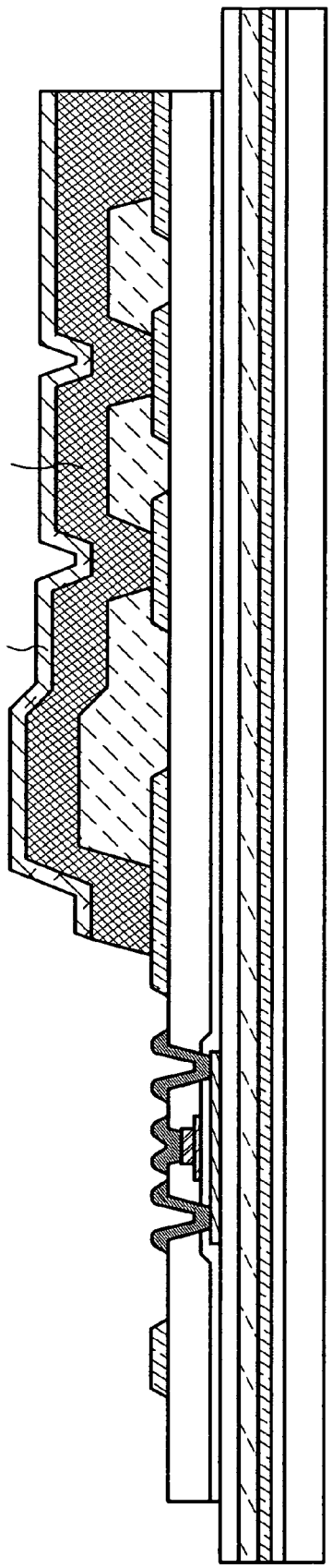
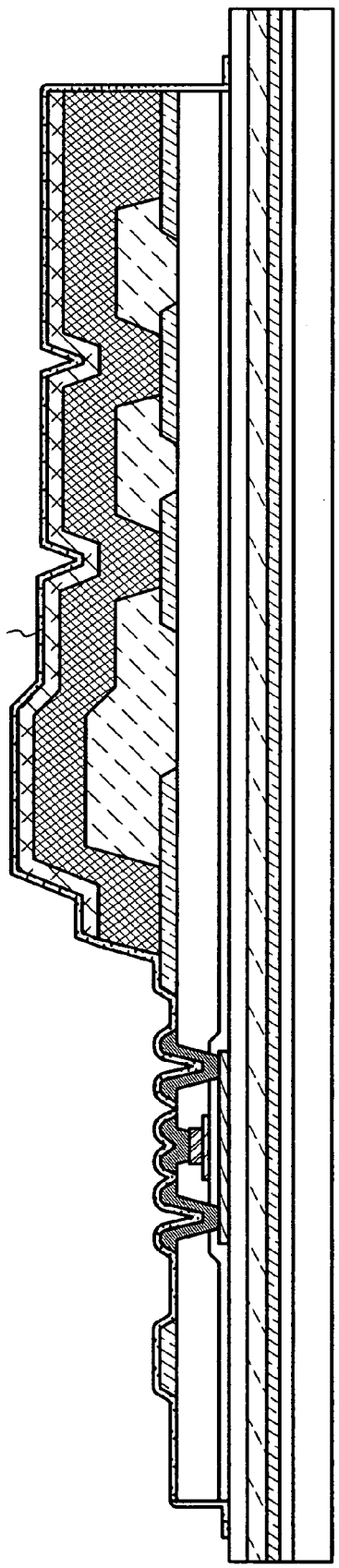
FIG. 22A
FIG. 22B

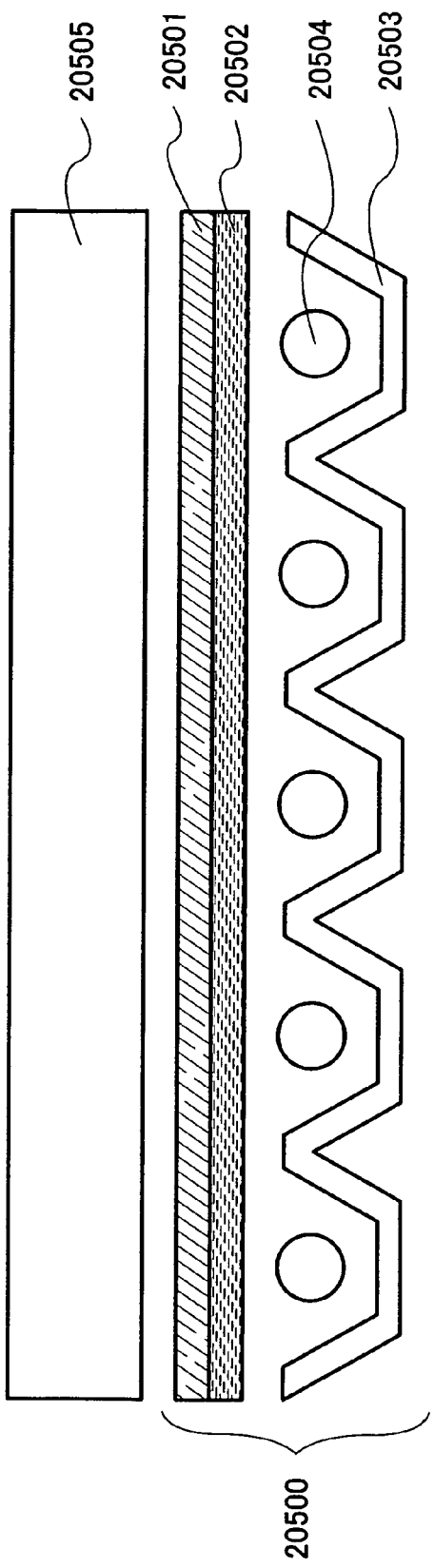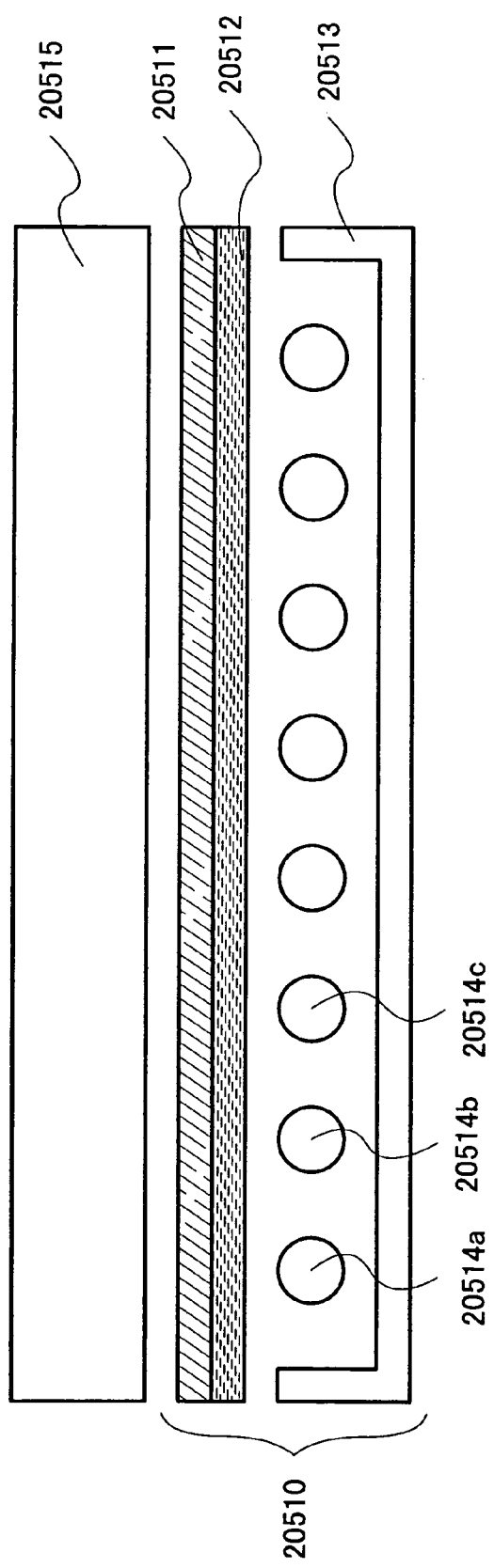

SEMICONDUCTOR DEVICE

BACKGROUND OF THE INVENTION

1. Field of the Invention

The present invention relates to a semiconductor device. In particular, the present invention relates to a semiconductor device including a photoelectric conversion element. In addition, the present invention relates to an electronic device using the semiconductor device.

2. Description of the Related Art

A number of photoelectric conversion devices generally used for sensing an electromagnetic wave are known, and for example, a photoelectric conversion device having sensitivity in ultraviolet rays to infrared rays is collectively referred to as an optical sensor. An optical sensor having sensitivity in a visible light region with a wavelength of 400 to 700 nm is particularly referred to as a visible light sensor, and a large number of visible light sensors are used for devices which need illuminance adjustment, on/off control, or the like depending on human living environment.

In particular, in a display device, brightness in the periphery of the display device is detected to adjust display luminance thereof. This is because unnecessary electric power can be reduced by detecting peripheral brightness and obtaining appropriate display luminance. For example, such an optical sensor for adjusting luminance is used for a mobile phone and a personal computer.

In addition, as well as peripheral brightness, luminance of a backlight of a display device, in particular, a liquid crystal display device is also detected by an optical sensor to adjust luminance of a display screen.

In such an optical sensor, a photodiode is used for a sensing part and output current of the photodiode is amplified by an amplifier circuit. As such an amplifier circuit, a current mirror circuit is used, for example (e.g., see Patent Document 1: Japanese Patent No. 3444093).

In addition, a semiconductor optical sensor device in which an illuminance measurement range is extended is disclosed in Patent Document 2 (Patent Document 2: Japanese Published Patent Application No. 2006-86425). The semiconductor optical sensor device disclosed in Patent Document 2 is provided with two photodiodes for low illuminance and high illuminance. A switch is controlled by comparing output and reference voltage so as to select which of the photodiodes is to be used.

SUMMARY OF THE INVENTION

In the case of a conventional optical sensor, when detection of higher illuminance is attempted, output current or output voltage ranges widely, so that the following problems are given: the conventional optical sensor is not easily used as a photoelectric conversion device, and power consumption is increased.

Further, in the conventional optical sensor device in Patent Document 2, two optical sensors (the photodiodes in Patent Document 2) are required, so that yield is low and manufacturing cost is high. Moreover, two photodiodes are required to be formed so as to properly have characteristics for low illuminance and high illuminance. When the characteristics of two photodiodes vary, an output variation corresponds to the sum of both output variations. Thus, the output variation is increased compared with the case of using one photodiode.

In view of the foregoing problems, objects of the invention are to obtain a photoelectric conversion device capable of detecting a wider range of illuminance without expansion of a range of output voltage or output current; to obtain a photoelectric conversion device with a small output variation due to variation in characteristics of an optical sensor; to obtain a photoelectric conversion device with low power consumption; and to obtain a photoelectric conversion device with high yield and low manufacturing cost.

In a semiconductor device according to this specification, a circuit (a current-voltage conversion circuit) which converts output current of an optical sensor into voltage is provided with a plurality of current-voltage conversion elements having different characteristics, and a current-voltage conversion element to be used is changed depending on output voltage. As the current-voltage conversion element, an element such as a resistor, a diode, or a transistor can be used. Further, the current-voltage conversion circuit may be provided with a current-voltage conversion element characteristics of which can be controlled by the output voltage. In this case, as the current-voltage conversion element, an element such as a variable resistor or a transistor can be used. In addition, as the optical sensor, a photodiode, a phototransistor, or the like can be used.

Note that various types of switches, for example, an electrical switch and a mechanical switch can be used. That is, any element can be used without being limited to a particular type as long as it can control a current flow. For example, a transistor (e.g., a bipolar transistor or a MOS transistor), a diode (e.g., a PN diode, a PIN diode, a Schottky diode, an MIM (metal-insulator-metal) diode, an MIS (metal-insulator-semiconductor) diode, or a diode-connected transistor), a thyristor, or the like can be used as a switch. Alternatively, a logic circuit in which such elements are combined can be used as a switch.

Examples of a mechanical switch include a switch formed using a micro electro mechanical system (MEMS) technology, such as a digital micro mirror device (DMD). Such a switch includes an electrode which can be moved mechanically, and operates by controlling connection or non-connection based on movement of the electrode.

In the case where a transistor is used as a switch, polarity (a conductivity type) of the transistor is not particularly limited since it operates just as a switch. Note that when off-current is preferably to be suppressed, a transistor of polarity with smaller off-current is preferably used. Examples of a transistor with smaller off-current include a transistor having an LDD region and a transistor having a multi-gate structure. Further, an n-channel transistor is preferably used when the transistor operates with a potential of a source terminal closer to a potential of a low potential side power supply (e.g., Vss, GND, or 0 V). On the other hand, a p-channel transistor is preferably used when the transistor operates with a potential of a source terminal close to a potential of a high potential side power supply (e.g., Vdd). This is because when the n-channel transistor operates with the potential of the source terminal close to the low potential side power supply and when the p-channel transistor operates with the potential of the source terminal close to the high potential side power supply, an absolute value of gate-source voltage can be increased; thus, the transistor can more precisely operate as a switch. Moreover, this is because reduction in output voltage does not occur often since the transistor does not often perform a source follower operation.

Note that a CMOS switch may also be employed by using both n-channel and p-channel transistors. A CMOS switch can easily function as a switch since current can flow when one of the n-channel transistor and the p-channel transistor is turned on. For example, voltage can be output as appropriate whether voltage of an input signal to the switch is high or low.

Further, since a voltage amplitude value of a signal for turning on/off a switch can be decreased, power consumption can be reduced.

Note that when a transistor is used as a switch, the switch includes an input terminal (one of a source terminal and a drain terminal), an output terminal (the other of the source terminal and the drain terminal), and a terminal (a gate terminal) for controlling electrical conduction. On the other hand, when a diode is used as a switch, the switch does not have a terminal for controlling electrical conduction in some cases. Therefore, when a diode is used as a switch, the number of wirings for controlling terminals can be reduced compared with the case where a transistor is used as a switch.

Note that when it is explicitly described that A and B are connected, the case where A and B are electrically connected, the case where A and B are functionally connected, and the case where A and B are directly connected are included. Here, each of A and B is an object (e.g., a device, an element, a circuit, a wiring, an electrode, a terminal, a conductive film, or a layer). Accordingly, another element may be provided in a connection relationship shown in drawings and texts, without being limited to a predetermined connection relationship, for example, connection relationships shown in the drawings and the texts.

For example, when A and B are electrically connected, one or more elements which enable electrical connection of A and B (e.g., a switch, a transistor, a capacitor, an inductor, a resistor, or a diode) may be provided between A and B. Alternatively, when A and B are functionally connected, one or more circuits which enable functional connection of A and B (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a voltage step-up circuit or a voltage step-down circuit) or a level shifter circuit for changing a potential level of a signal; a voltage source; a current source; a switching circuit; or an amplifier circuit which can increase signal amplitude, the amount of current, or the like, such as an operational amplifier, a differential amplifier circuit, a source follower circuit, or a buffer circuit; a signal generation circuit; a memory circuit; or a control circuit) may be provided between A and B. Alternatively, when A and B are directly connected, A and B may be directly connected without interposing another element or another circuit therebetween.

When it is explicitly described that A and B are directly connected, the case where A and B are directly connected (i.e., the case where A and B are connected without interposing another element or another circuit therebetween) and the case where A and B are electrically connected (i.e., the case where A and B are connected by interposing another element or another circuit therebetween) are included.

In addition, when it is explicitly described that A and B are electrically connected, the case where A and B are electrically connected (i.e., the case where A and B are connected by interposing another element or another circuit therebetween), the case where A and B are functionally connected (i.e., the case where A and B are functionally connected by interposing another circuit therebetween), and the case where A and B are directly connected (i.e., the case where A and B are connected without interposing another element or another circuit therebetween) are included. That is, when it is explicitly described that A and B are electrically connected, the description is the same as the case where it is explicitly only described that A and B are connected.

Note that a display element, a display device which is a device including a display element, a light-emitting element, and a light-emitting device which is a device including a light-emitting element can employ various modes and can include various elements. For example, as a display element, a display device, a light-emitting element, and a light-emitting device, a display medium, contrast, luminance, reflectivity, transmittance, or the like of which is changed by electromagnetic action, such as an EL (electroluminescence) element (e.g., an EL element including both organic and inorganic materials, an organic EL element, or an inorganic EL element), an electron emitter, a liquid crystal element, electronic ink, an electrophoretic element, a grating light valve (GLV), a plasma display panel (PDP), a digital micromirror device (DMD), a piezoelectric ceramic display, or a carbon nanotube can be used. Note that display devices using an EL element include an EL display; display devices using an electron emitter include a field emission display (FED), an SED-type flat panel display (SED: surface-conduction electron-emitter display), and the like; display devices using a liquid crystal element include a liquid crystal display (e.g., a transmissive liquid crystal display, a transflective liquid crystal display, a reflective liquid crystal display, a direct-view liquid crystal display, or a projection type liquid crystal display); and display devices using electronic ink include electronic paper.

Note that an EL element is an element including an anode, a cathode, and an EL layer interposed between the anode and the cathode. Examples of the EL layer include various types of EL layers, for example, a layer utilizing light emission (fluorescence) from a singlet exciton, a layer utilizing light emission (phosphorescence) from a triplet exciton, a layer utilizing light emission (fluorescence) from a singlet exciton and light emission (phosphorescence) from a triplet exciton, a layer formed of an organic material, a layer formed of an inorganic material, a layer formed of an organic material and an inorganic material, a layer including a high molecular material, a layer including a low molecular material, and a layer including a low molecular material and a high molecular material. Note that the invention is not limited thereto, and various types of EL elements can be used.

Note that an electron emitter is an element in which electrons are extracted by high electric field concentration on a pointed cathode. For example, the electron emitter may be any one of a Spindt type, a carbon nanotube (CNT) type, a metal-insulator-metal (MIM) type in which a metal, an insulator, and a metal are stacked, a metal-insulator-semiconductor (MIS) type in which a metal, an insulator, and a semiconductor are stacked, a MOS type, a silicon type, a thin film diode type, a diamond type, a surface conduction emitter SCD type, a thin film type in which a metal, an insulator, a semiconductor, and a metal are stacked, a HEED type, an EL type, a porous silicon type, a surface-conduction electron-emitter (SED) type, and the like. However, the invention is not limited thereto, and various elements can be used as an electron emitter.

Note that a liquid crystal element is an element which controls transmission or non-transmission of light by optical modulation action of a liquid crystal and includes a pair of electrodes and a liquid crystal. Optical modulation action of a liquid crystal is controlled by an electric filed applied to the liquid crystal (including a horizontal electric field, a vertical electric field, and an oblique electric field). The following can be used for a liquid crystal element: a nematic liquid crystal, a cholesteric liquid crystal, a smectic liquid crystal, a discotic liquid crystal, a thermotropic liquid crystal, a lyotropic liquid Crystal, a low molecular liquid crystal, a high molecular liquid crystal, a ferroelectric liquid crystal, an anti-ferroelectric liquid crystal, a main chain type liquid crystal, a side chain type polymer liquid crystal, a plasma addressed liquid crystal (PALC), a banana-shaped liquid crystal, a TN (twisted nematic) mode, an STN (super twisted nematic) mode, an IPS (in-plane-switching) mode, an FFS (fringe field switching) mode, an MVA (multi-domain vertical alignment) mode, a PVA (patterned vertical alignment) mode, an ASV (advanced super view) mode, an ASM (axially symmetric aligned microcell) mode, an OCB (optical compensated birefringence) mode, an ECB (electrically controlled birefringence) mode, an FLC (ferroelectric liquid crystal) mode, an AFLC (anti-ferroelectric liquid crystal) mode, a PDLC (polymer dispersed liquid crystal) mode, and a guest-host mode. Note that the invention is not limited thereto, and various kinds of liquid crystal elements can be used.

Note that examples of electronic paper include a device displayed by molecules which utilizes optical anisotropy, dye molecular orientation, or the like; a device displayed by particles which utilizes electrophoresis, particle movement, particle rotation, phase change, or the like; a device displayed by moving one end of a film; a device using light emission or phase change of molecules; a device using optical absorption by molecules; and a device using self-light emission by combining electrons and holes. For example, the following can be used as electronic paper: a microcapsule type electrophoresis device, a horizontal type electrophoresis device, a vertical type electrophoresis device, a device using a spherical twisting ball, a device using a magnetic twisting ball, a device using a column twisting ball, a device using a charged toner, a quick-response liquid powder display, a magnetic electrophoresis type device, a magnetic heat-sensitive type device, an electrowetting type device, a light-scattering (transparent-opaque change) type device, a device using a cholesteric liquid crystal and a photoconductive layer, a cholesteric liquid crystal device, a bistable nematic liquid crystal device, a ferroelectric liquid crystal device, a liquid crystal dispersed type device with a dichroic dye, a device using a movable film, a device using coloring and decoloring properties of a leuco dye, a photochromic device, an electrochromic device, an electrodeposition device, a device using flexible organic EL, and the like. Note that the invention is not limited thereto, and various types of electronic paper can be used. By using a microcapsule electrophoretic device, defects of electrophoresis, which are aggregation and precipitation of phoresis particles, can be solved. Quick-response liquid powder has advantages such as high-speed response, high reflectivity, wide viewing angle, low power consumption, and memory properties.

A plasma display includes a substrate having a surface provided with an electrode, and a substrate having a surface provided with an electrode and a minute groove in which a phosphor layer is formed. In the plasma display, the substrates are opposite to each other with a narrow interval and a rare gas is sealed therein. Display can be performed by applying voltage between the electrodes to generate an ultraviolet ray so that the phosphor emits light. Note that the plasma display panel may be a DC type PDP or an AC type PDP. As a driving method of the plasma display panel, ASW (address while sustain) driving, ADS (address display separated) driving in which a subframe is divided into a reset period, an address period, and a sustain period, CLEAR (high-contrast, low energy address and reduction of false contour sequence) driving, ALIS (alternate lighting of surfaces) method, TERES (technology of reciprocal sustainer) driving, and the like can be used. Note that the invention is not limited thereto, and various types of plasma displays can be used.

Note that electroluminescence, a cold cathode fluorescent lamp, a hot cathode fluorescent lamp, an LED, a laser light source, a mercury lamp, or the like can be used as a light source needed for a display device, such as a liquid crystal display device (a transmissive liquid crystal display, a transflective liquid crystal display, a reflective liquid crystal display, a direct-view liquid crystal display, and a projection type liquid crystal display), a display device using a grating light valve (GLV), and a display device using a digital micromirror device (DMD). Note that the invention is not limited thereto, and various light sources can be used.

Note that as a transistor, various types of transistors can be employed without being limited to a certain type. For example, a thin film transistor (TFT) including a non-single crystalline semiconductor film typified by amorphous silicon, polycrystalline silicon, microcrystalline (also referred to as semi-amorphous) silicon, or the like can be used. The use of the TFT has various advantages. For example, since a transistor can be formed at temperature lower than that of the case of using single crystalline silicon, reduction in manufacturing cost or increase in size of a manufacturing device can be realized. A transistor can be formed using a large substrate with increase in size of the manufacturing device. Accordingly, a large number of display devices can be formed at the same time, and thus can be formed at low cost. Further, since manufacturing temperature is low, a substrate having low heat resistance can be used. Accordingly, a transistor can be formed over a light-transmitting substrate; thus, transmission of light in a display element can be controlled by using the transistor formed over the light-transmitting substrate. Alternatively, since the thickness of the transistor is thin, part of a film forming the transistor can transmit light; thus, an aperture ratio can be increased.

When polycrystalline silicon is formed, the use of a catalyst (e.g., nickel) enables further improvement in crystallinity and formation of a transistor having excellent electrical characteristics. Thus, a gate driver circuit (a scan line driver circuit), a source driver circuit (a signal line driver circuit), and a signal processing circuit (e.g., a signal generation circuit, a gamma correction circuit, or a DA converter circuit) can be formed over the same substrate.

When microcrystalline silicon is formed, the use of a catalyst (e.g., nickel) enables further improvement in crystallinity and formation of a transistor having excellent electrical characteristics. At this time, the crystallinity can be improved by performing only heat treatment without laser irradiation. Thus, a gate driver circuit (a scan line driver circuit) and part of a source driver circuit (e.g., an analog switch) can be formed over the same substrate. Further, when laser irradiation is not performed for crystallization, unevenness of silicon crystallinity can be suppressed. Accordingly, an image with improved image quality can be displayed.

Note that polycrystalline silicon and microcrystalline silicon can be formed without using a catalyst (e.g., nickel).

Note that the crystallinity of silicon is preferably improved to polycrystal or microcrystal in the whole panel, but not limited thereto. The crystallinity of silicon may be improved only in part of the panel. The selective increase in crystallinity can be achieved by selective laser irradiation or the like. For example, only a peripheral driver circuit region excluding pixels may be irradiated with laser light. Alternatively, only a region of a gate driver circuit, a source driver circuit, or the like may be irradiated with laser light. Further alternatively, only part of a source driver circuit (e.g., an analog switch) may be irradiated with laser light. As a result, the crystallinity of silicon only in a region in which a circuit needs to operate at high speed can be improved. A pixel region does not especially need to operate at high speed. Thus, even if the crystallinity is not improved, the pixel circuit can operate without problems. Since a region crystallinity of which is improved is small, manufacturing steps can be shortened, throughput can be increased, and manufacturing cost can be reduced. Since the number of manufacturing devices needed is small, manufacturing cost can be reduced.

Alternatively, a transistor can be formed using a semiconductor substrate, an SOI substrate, or the like. Accordingly, a small transistor with few variations in characteristics, sizes, shapes, or the like, with high current supply capacity can be formed. By using such a transistor, reduction in power consumption or high integration of circuits can be realized.

Alternatively, a transistor including a compound semiconductor or an oxide semiconductor such as zinc oxide (ZnO), a-InGaZnO, silicon germanium (SiGe), gallium arsenide (GaAs), indium zinc oxide (IZO), indium tin oxide (ITO), or tin oxide (SnO), a thin film transistor obtained by thinning such a compound semiconductor or an oxide semiconductor, or the like can be used. Thus, manufacturing temperature can be lowered, and a transistor can be formed at room temperature, for example. Accordingly, the transistor can be formed directly on a substrate having low heat resistance, such as a plastic substrate or a film substrate. Note that such a compound semiconductor or an oxide semiconductor can be used for not only a channel portion of the transistor but also other applications. For example, such a compound semiconductor or an oxide semiconductor can be used as a resistor, a pixel electrode, or an electrode having a light-transmitting property. Further, since such an element can be formed at the same time as the transistor, cost can be reduced.

Alternatively, a transistor or the like formed by using an inkjet method or a printing method can be used. Accordingly, the transistor can be formed at room temperature or at a low vacuum, or can be formed using a large substrate. Since the transistor can be formed without using a mask (a reticle), layout of the transistor can be easily changed. Further, since it is not necessary to use a resist, material cost is reduced and the number of steps can be reduced. Moreover, since a film is formed only in a required portion, a material is not wasted and cost can be reduced compared with a manufacturing method in which etching is performed after the film is formed over the entire surface.

A transistor or the like including an organic semiconductor or a carbon nanotube can also be used. Accordingly, a transistor can be formed using a substrate which can be bent. A semiconductor device using such a substrate can resist a shock.

In addition, transistors with various structures can be used. For example, a MOS transistor, a junction transistor, a bipolar transistor, or the like can be used as a transistor. The use of a MOS transistor can reduce the size of a transistor. Accordingly, a plurality of transistors can be mounted. The use of a bipolar transistor can allow large current to flow; thus, a circuit can operate at high speed.

Note that a MOS transistor, a bipolar transistor, and the like may be mixed over one substrate. Thus, low power consumption, reduction in size, high-speed operation, and the like can be achieved.

In addition, various other transistors can be used.

Note that transistor can be formed using various substrates. The type of a substrate is not limited to a certain type. For example, a single crystalline substrate, an SOI substrate, a glass substrate, a quartz substrate, a plastic substrate, a paper substrate, a cellophane substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, a stainless steel substrate, a substrate including a stainless steel foil, or the like can be used as a substrate. Alternatively, a skin (e.g., epidermis or corium) or hypodermal tissue of an animal such as a human may be used as the substrate. In addition, the transistor may be formed using one substrate, and then, the transistor may be transferred to another substrate so as to be provided over another substrate. As a substrate to which the transistor is transferred, a single crystalline substrate, an SOI substrate, a glass substrate, a quartz substrate, a plastic substrate, a paper substrate, a cellophane substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, a stainless steel substrate, a substrate including a stainless steel foil, or the like can be used. Alternatively, a skin (e.g., epidermis or corium) or hypodermal tissue of an animal such as a human may be used as the substrate. Further alternatively, a transistor may be formed using a substrate, and the substrate may be thinned by polishing. As a substrate to be polished, a single crystalline substrate, an SOI substrate, a glass substrate, a quartz substrate, a plastic substrate, a paper substrate, a cellophane substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, a stainless steel substrate, a substrate including a stainless steel foil, or the like can be used. Alternatively, a skin (e.g., epidermis or corium) or hypodermal tissue of an animal such as a human may be used as the substrate. By using such a substrate, a transistor with excellent properties or a transistor with low power consumption can be formed, a device with high durability can be formed, high heat resistance can be provided, and reduction in weight or size can be realized.

Note that a structure of a transistor can employ various modes without being limited to a certain structure. For example, a multi-gate structure having two or more gate electrodes can be employed. When the multi-gate structure is employed, a structure where a plurality of transistors are connected in series is provided since channel regions are connected in series. The multi-gate structure realizes reduction in off-current and improvement in reliability due to improvement in withstand voltage of the transistor. Further, by employing the multi-gate structure, drain-source current does not change much even if drain-source voltage changes when the transistor operates in a saturation region; thus, the slope of voltage-current characteristics can be flat. By utilizing the characteristics in which the slope of the voltage-current characteristics is flat, an ideal current source circuit and an active load having an extremely high resistance value can be realized. Thus, a differential circuit or a current mirror circuit having excellent properties can be realized.

As another example, a structure where gate electrodes are formed above and below a channel can be employed. By employing the structure where gate electrodes are formed above and below the channel, a channel region is enlarged, the amount of current can be increased since the number of channel regions is increased, or a subthreshold swing can be reduced since a depletion layer is easily formed. By employing the structure where the gate electrodes are formed above and below the channel, it seems that a plurality of transistors are connected in parallel.

A structure where a gate electrode is formed above a channel region, a structure where a gate electrode is formed below a channel region, a staggered structure, an inversely staggered structure, a structure where a channel region is divided into a plurality of regions, or a structure where channel regions are connected in parallel or in series can be employed. Further, a structure where a source electrode or a drain electrode overlaps with a channel region (or part thereof) can be employed. By employing the structure where the source electrode or the drain electrode overlaps with the channel region (or part thereof), an unstable operation due to accumulation of charge in part of the channel region can be prevented. Alternatively, a structure where an LDD region is provided can be employed. By providing the LDD region, off-current can be reduced or the withstand voltage of the transistor can be increased to improve reliability. Alternatively, by providing the LDD region, drain-source current does not change much even if drain-source voltage changes when the transistor operates in the saturation region, so that characteristics where a slope of voltage-current characteristics is flat can be obtained.

Note that various types of transistors can be used, and the transistor can be formed using various types of substrates. Accordingly, all of circuits which are necessary to realize a predetermined function can be formed using the same substrate. For example, all of the circuits which are necessary to realize the predetermined function can be formed using various substrates such as a glass substrate, a plastic substrate, a single crystalline substrate, or an SOI substrate. When all of the circuits which are necessary to realize the predetermined function are formed using the same substrate, cost can be reduced by reduction in the number of component parts or reliability can be improved by reduction in the number of connections between circuit components. Alternatively, part of the circuits which are necessary to realize the predetermined function may be formed using one substrate and another part of the circuits which are necessary to realize the predetermined function may be formed using another substrate. That is, not all of the circuits which are necessary to realize the predetermined function are required to be formed using the same substrate. For example, part of the circuits which are necessary to realize the predetermined function may be formed over a glass substrate by using transistors and another part of the circuits which are necessary to realize the predetermined function may be formed using a single crystalline substrate, and an IC chip formed by a transistor using the single crystalline substrate can be connected to the glass substrate by COG (Chip On Glass) so that the IC chip is provided over the glass substrate. Alternatively, the IC chip can be connected to the glass substrate by TAB (Tape Automated Bonding) or a printed wiring board. When part of the circuits are formed using the same substrate in such a manner, cost can be reduced by reduction in the number of component parts or reliability can be improved by reduction in the number of connections between circuit components. Alternatively, since circuits in a portion with high driving voltage or a portion with high driving frequency consume large power, the circuits in such portions are formed using a single crystalline substrate, for example, and using an IC chip formed by the circuit instead of using the same substrate; thus, increase in power consumption can be prevented.

Note that one pixel corresponds to one element brightness of which can be controlled. For example, one pixel corresponds to one color element and brightness is expressed with the one color element. Accordingly, in the case of a color display device having color elements of R (red), G (green), and B (blue), the smallest unit of an image is formed of three pixels of an R pixel, a G pixel, and a B pixel. Note that the color elements are not limited to three colors, and color elements of more than three colors may be used and/or a color other than RGB may be used. For example, RGBW can be employed by adding W (white). Alternatively, RGB added with one or more colors of yellow, cyan, magenta emerald green, vermilion, and the like may be used. Further alternatively, a color similar to at least one of R, G, and B may be added to RGB. For example, R, G, B1, and B2 may be used. Although both B1 and B2 are blue, they have slightly different frequency. Similarly, R1, R2, G, and B may be used. By using such color elements, display which is closer to an real object can be performed and power consumption can be reduced. As another example, in the case where brightness of one color element is controlled by using a plurality of regions, one region may correspond to one pixel. For example, in the case of performing area ratio gray scale display or the case of including a subpixel, a plurality of regions which control brightness are provided in each color element and gray scales are expressed with all of the regions, and one region which controls brightness can correspond to one pixel. In that case, one color element includes a plurality of pixels. Alternatively, even when a plurality of the regions which control brightness are provided in one color element, these regions may be collected and one color element may be referred to as one pixel. In that case, one color element includes one pixel. Further alternatively, when brightness is controlled by a plurality of regions in one color element, regions which contribute to display may have different area dimensions depending on pixels in some cases. Alternatively, in a plurality of the regions which control brightness in one color element, signals supplied to the regions may be slightly varied to widen a viewing angle. That is, potentials of pixel electrodes included in the plurality of the regions in one color element can be different from each other. Accordingly, voltages applied to liquid crystal molecules are varied depending on the pixel electrodes. Thus, the viewing angle can be widened.

Note that when it is explicitly described as one pixel (for three colors), it corresponds to the case where three pixels of R, G, and B are considered as one pixel. When it is explicitly described as one pixel (for one color), it corresponds to the case where a plurality of the regions are provided in each color element and collectively considered as one pixel.

Note that pixels are provided (arranged) in matrix in some cases. Here, description that pixels are provided (arranged) in matrix includes the case where the pixels are arranged in a straight line or in a jagged line in a longitudinal direction or a lateral direction. For example, in the case where full-color display is performed with three color elements (e.g., RGB), the following cases are included therein: the case where the pixels are arranged in stripes, the case where dots of the three color elements are arranged in a delta pattern, and the case where dots of the three color elements are provided in Bayer arrangement. Note that the color elements are not limited to three colors, and color elements of more than three colors may be employed, for example, RGBW (W corresponds to white), RGB added with one or more of yellow, cyan, magenta, and the like, or the like. Note that the size of display regions may be different between respective dots of color elements. Thus, power consumption can be reduced or the life of a display element can be prolonged.

Note that an active matrix method in which an active element is included in a pixel or a passive matrix method in which an active element is not included in a pixel can be used.

In the active matrix method, as an active element (a non-linear element), not only a transistor but also various active elements (non-linear elements), such as an MIM (metal-insulator-metal) and a TFD (thin film diode) can be used. Since such an element has few number of manufacturing steps, manufacturing cost can be reduced or the yield can be improved. Further, since the size of the element is small, an aperture ratio can be increased, and reduction in power consumption and high luminance can be achieved.

As a method other than the active matrix method, the passive matrix method in which an active element (a non-linear element) is not used can also be used. Since an active element (a non-linear element) is not used, the number of manufacturing steps is small, so that manufacturing cost can be reduced or the yield can be improved. Further, since an active element (a non-linear element) is not used, the aperture ratio can be increased, and reduction in power consumption and high luminance can be achieved.

Note that a transistor is an element having at least three terminals of a gate, a drain, and a source. The transistor includes a channel region between a drain region and a source region, and current can flow through the drain region, the channel region, and the source region. Here, since the source and the drain of the transistor may change depending on a structure, operating conditions, and the like of the transistor, it is difficult to define which is a source or a drain. Therefore, in this document (the specification, the claims, the drawings, and the like), a region functioning as a source and a drain is not called the source or the drain in some cases. In such a case, one of the source and the drain may be referred to as a first terminal and the other thereof may be referred to as a second terminal, for example. Alternatively, one of the source and the drain may be referred to as a first electrode and the other thereof may be referred to as a second electrode. Further alternatively, one of the source and the drain may be referred to as a source region and the other thereof may be referred to as a drain region.

In addition, a transistor may be an element having at least three terminals of a base, an emitter, and a collector. In this case also, one of the emitter and the collector may be referred to as a first terminal and the other terminal may be referred to as a second terminal.

Note that a gate corresponds to all or part of a gate electrode and a gate wiring (also referred to as a gate line, a gate signal line, a scan line, a scan signal line, or the like). A gate electrode corresponds to a conductive film which overlaps with a semiconductor forming a channel region with a gate insulating film interposed therebetween. Note that part of the gate electrode overlaps with an LDD (Lightly Doped Drain) region or a source region (or a drain region) with the gate insulating film interposed therebetween in some cases. A gate wiring corresponds to a wiring for connecting gate electrodes of transistors, a wiring for connecting gate electrodes included in each pixel, or a wiring for connecting a gate electrode to another wiring.

However, there is a portion (a region, a conductive film, a wiring, or the like) which functions as both a gate electrode and a gate wiring. Such a portion (a region, a conductive film, a wiring, or the like) may be called either a gate electrode or a gate wiring. That is, there is a region where a gate electrode and a gate wiring cannot be clearly distinguished from each other. For example, in the case where a channel region overlaps with part of an extended gate wiring, the overlapped portion (region, conductive film, wiring, or the like) functions as both a gate wiring and a gate electrode. Accordingly, such a portion (a region, a conductive film, a wiring, or the like) may be called either a gate electrode or a gate wiring.

Note that a portion (a region, a conductive film, a wiring, or the like) which is formed of the same material as a gate electrode and forms the same island as the gate electrode to be connected to the gate electrode may also be called a gate electrode. Similarly, a portion (a region, a conductive film, a wiring, or the like) which is formed of the same material as a gate wiring and forms the same island as the gate wiring to be connected to the gate wiring may also be called a gate wiring. In a strict sense, such a portion (a region, a conductive film, a wiring, or the like) does not overlap with a channel region or does not have a function of connecting the gate electrode to another gate electrode in some cases. However, there is a portion (a region, a conductive film, a wiring, or the like) which is formed of the same material as a gate electrode or a gate wiring and forms the same island as the gate electrode or the gate wiring to be connected to the gate electrode or the gate wiring in relation to a specification in manufacturing and the like. Thus, such a portion (a region, a conductive film, a wiring, or the like) may also be called either a gate electrode or a gate wiring.

In a multi-gate transistor, for example, a gate electrode is often connected to another gate electrode by using a conductive film which is formed of the same material as the gate electrode. Since such a portion (a region, a conductive film, a wiring, or the like) is for connecting the gate electrode and another gate electrode, it may be called a gate wiring, and it may also be called a gate electrode since a multi-gate transistor can be considered as one transistor. That is, a portion (a region, a conductive film, a wiring, or the like) which is formed of the same material as a gate electrode or a gate wiring and forms the same island as the gate electrode or the gate wiring to be connected to the gate electrode or the gate wiring may be called either a gate electrode or a gate wiring. In addition, part of a conductive film which connects the gate electrode and the gate wiring and is formed of a material different from that of the gate electrode and the gate wiring may also be called either a gate electrode or a gate wiring.

Note that a gate terminal corresponds to part of a portion (a region, a conductive film, a wiring, or the like) of a gate electrode or a portion (a region, a conductive film, a wiring, or the like) which is electrically connected to the gate electrode.

When a wiring is called a gate wiring, a gate line, a gate signal line, a scan line, a scan signal line, or the like, there is the case where a gate of a transistor is not connected to the wiring. In this case, the gate wiring, the gate line, the gate signal line, the scan line, or the scan signal line corresponds to a wiring formed in the same layer as the gate of the transistor, a wiring formed of the same material of the gate of the transistor, or a wiring formed at the same time as the gate of the transistor in some cases. As examples, a wiring for storage capacitance, a power supply line, a reference potential supply line, and the like can be given.

A source corresponds to all or part of a source region, a source electrode, and a source wiring (also referred to as a source line, a source signal line, a data line, a data signal line, or the like). A source region corresponds to a semiconductor region containing a large amount of p-type impurities (e.g., boron or gallium) or n-type impurities (e.g., phosphorus or arsenic). Accordingly, a region containing a small amount of p-type impurities or n-type impurities, a so-called LDD (Lightly Doped Drain) region is not included in the source region. A source electrode is part of a conductive layer formed of a material different from that of a source region and electrically connected to the source region. However, there is the case where a source electrode and a source region are collectively called a source electrode. A source wiring is a wiring for connecting source electrodes of each transistor, a wiring for connecting source electrodes included in each pixel, or a wiring for connecting a source electrode to another wiring.

However, there is a portion (a region, a conductive film, a wiring, or the like) functioning as both a source electrode and a source wiring. Such a portion (a region, a conductive film, a wiring, or the like) may be called either a source electrode or a source wiring. That is, there is a region where a source electrode and a source wiring cannot be clearly distinguished from each other. For example, in the case where a source region overlaps with part of an extended source wiring, the overlapped portion (region, conductive film, wiring, or the like) functions as both a source wiring and a source electrode. Accordingly, such a portion (a region, a conductive film, a wiring, or the like) may be called either a source electrode or a source wiring.

Note that a portion (a region, a conductive film, a wiring, or the like) which is formed of the same material as a source electrode and forms the same island as the source electrode to be connected to the source electrode, or a portion (a region, a conductive film, a wiring, or the like) which connects a source electrode and another source electrode may also be called a source electrode. Further, a portion which overlaps with a source region may be called a source electrode. Similarly, a region which is formed of the same material as a source wiring and forms the same island as the source wiring to be connected to the source wiring may also be called a source wiring. In a strict sense, such a portion (a region, a conductive film, a wiring, or the like) does not overlap with a channel region or does not have a function of connecting the source electrode to another source electrode in some cases. However, there is a portion (a region, a conductive film, a wiring, or the like) which is formed of the same material as a source electrode or a source wiring and forms the same island as the source electrode or the source wiring to be connected to the source electrode or the source wiring in relation to a specification in manufacturing and the like. Thus, such a portion (a region, a conductive film, a wiring, or the like) may also be called either a source electrode or a source wiring.

For example, part of a conductive film which connects a source electrode and a source wiring and is formed of a material which is different from that of the source electrode or the source wiring may be called either a source electrode or a source wiring.

Note that a source terminal corresponds to part of a source region, a source electrode, or a portion (a region, a conductive film, a wiring, or the like) which is electrically connected to the source electrode.

When a wiring is called a source wiring, a source line, a source signal line, a data line, a data signal line, or the like, there is the case in which a source (a drain) of a transistor is not connected to the wiring. In this case, the source wiring, the source line, the source signal line, the data line, or the data signal line corresponds to a wiring formed in the same layer as the source (drain) of the transistor, a wiring formed of the same material of the source (drain) of the transistor, or a wiring formed at the same time as the source (drain) of the transistor in some cases. As examples, a wiring for storage capacitance, a power supply line, a reference potential supply line, and the like can be given.

Note that a drain is similar to the source.

Note that a semiconductor device corresponds to a device having a circuit including a semiconductor element (e.g., a transistor, a diode, or a thyristor). The semiconductor device may also refer to all devices which can function by utilizing semiconductor characteristics. Alternatively, the semiconductor device refers to a device including a semiconductor material.

A display element corresponds to an optical modulation element, a liquid crystal element, a light-emitting element, an EL element (an organic EL element, an inorganic EL element, or an EL element including both organic and inorganic materials), an electron emitter, an electrophoresis element, a discharging element, a light-reflecting element, a light diffraction element, a digital micro device (DMD), or the like. Note that the present invention is not limited thereto.

A display device corresponds to a device including a display element. The display device may include a plurality of pixels having a display element. The display device may include a peripheral driver circuit for driving a plurality of pixels. The peripheral driver circuit for driving a plurality of pixels may be formed over the same substrate as the plurality of pixels. The display device may also include a peripheral driver circuit provided over a substrate by wire bonding or bump bonding, that is, an IC chip connected by so-called chip on glass (COG), TAB, or the like. Further, the display device may also include a flexible printed circuit (FPC) to which an IC chip, a resistor, a capacitor, an inductor, a transistor, or the like is attached. The display device may also include a printed wiring board (PWB) which is connected through a flexible printed circuit (FPC) and the like, and to which an IC chip, a resistor, a capacitor, an inductor, a transistor, or the like is attached. The display device may also include an optical sheet such as a polarizing plate or a retardation plate. The display device may also include a lighting device, a housing, an audio input and output device, an optical sensor, or the like. Here, a lighting device such as a backlight unit may include a light guide plate, a prism sheet, a diffusion sheet, a reflective sheet, a light source (e.g., an LED or a cold cathode fluorescent lamp), a cooling device (e.g., a water cooling type or an air cooling type), or the like.

A lighting device corresponds to a device including a backlight unit, a light guide plate, a prism sheet, a diffusion sheet, a reflective sheet, a light source (e.g., an LED, a cold cathode fluorescent lamp, or a hot cathode fluorescent lamp), a cooling device, or the like.

A light-emitting device corresponds to a device including a light-emitting element or the like. A light-emitting device including a light-emitting element as a display element is a specific example of a display device.

A reflective device corresponds to a device including a light-reflecting element, a light diffraction element, a light reflecting electrode, or the like.

A liquid crystal display device corresponds to a display device including a liquid crystal element. Liquid crystal display devices include a direct-view liquid crystal display, a projection liquid crystal display, a transmissive liquid crystal display, a reflective liquid crystal display, a transflective liquid crystal display, and the like in its category.

A driving device corresponds to a device including a semiconductor element, an electric circuit, or an electronic circuit. Examples of the driving device include a transistor (also referred to as a selection transistor, a switching transistor, or the like) which controls input of a signal from a source signal line to a pixel, a transistor which supplies voltage or current to a pixel electrode, a transistor which supplies voltage or current to a light-emitting element, and the like. Moreover, examples of the driving device include a circuit (also referred to as a gate driver, a gate line driver circuit, or the like) which supplies a signal to a gate signal line, a circuit (also referred to as a source driver, a source line driver circuit, or the like) which supplies a signal to a source signal line, and the like.

Note that a display device, a semiconductor device, a lighting device, a cooling device, a light-emitting device, a reflective device, a driving device, and the like overlap with each other in some cases. For example, a display device includes a semiconductor device and a light-emitting device in some cases. Alternatively, a semiconductor device includes a display device and a driving device in some cases.

When it is explicitly described that B is formed on A or that B is formed over A, it does not necessarily mean that B is formed in direct contact with A. The description includes the case where A and B are not in direct contact with each other, that is, the case where another object is interposed between A and B. Here, each of A and B corresponds to an object (e.g., a device, an element, a circuit, a wiring, an electrode, a terminal, a conductive film, or a layer).

Accordingly, when it is explicitly described that a layer B is formed on (or over) a layer A, for example, it includes both the case where the layer B is formed in direct contact with the layer A, and the case where another layer (e.g., a layer C or a layer D) is formed in direct contact with the layer A and the layer B is formed in direct contact with the layer C or D. Note that another layer (e.g., the layer C or the layer D) may be a single layer or a plurality of layers.

Similarly, when it is explicitly described that B is formed above A, it does not necessarily mean that B is in direct contact with A, and another object may be interposed between A and B. For example, when it is explicitly described that a layer B is formed above a layer A, it includes both the case where the layer B is formed in direct contact with the layer A, and the case where another layer (e.g., a layer C or a layer D) is formed in direct contact with the layer A and the layer B is formed in direct contact with the layer C or D. Note that another layer (e.g., the layer C or the layer D) may be a single layer or a plurality of layers.

When it is explicitly described that B is formed in direct contact with A, it does not include the case where another object is interposed between A and B and includes the case where B is formed in direct contact with A.

Note that the same can be said when it is explicitly described that B is formed below or under A.

Note that explicit singular forms are preferably singular forms. However, without being limited thereto, such singular forms can include plural forms. Similarly, explicit plural forms are preferably plural forms. However, without being limited thereto, such plural forms can include singular forms.

A wide range of illuminance of several to several tens of thousands of lux can be measured by one optical sensor; thus, a photoelectric conversion device which is highly convenient and has low power consumption can be obtained. Further, since the number of optical sensors for measuring illuminance is small, a photoelectric conversion device with a small output variation due to variation in characteristics can be obtained. Moreover, a photoelectric conversion device with high yield and low manufacturing cost can be obtained.

BRIEF DESCRIPTION OF THE DRAWINGS

FIGS. 14A to 14D show manufacturing steps of a semiconductor device of the invention.

FIGS. 22A and 22B show manufacturing steps of a semiconductor device of the invention.

FIGS. 52A and 52B illustrate examples of peripheral components of a semiconductor device of the invention.

DETAILED DESCRIPTION OF THE INVENTION

Figure 1A:
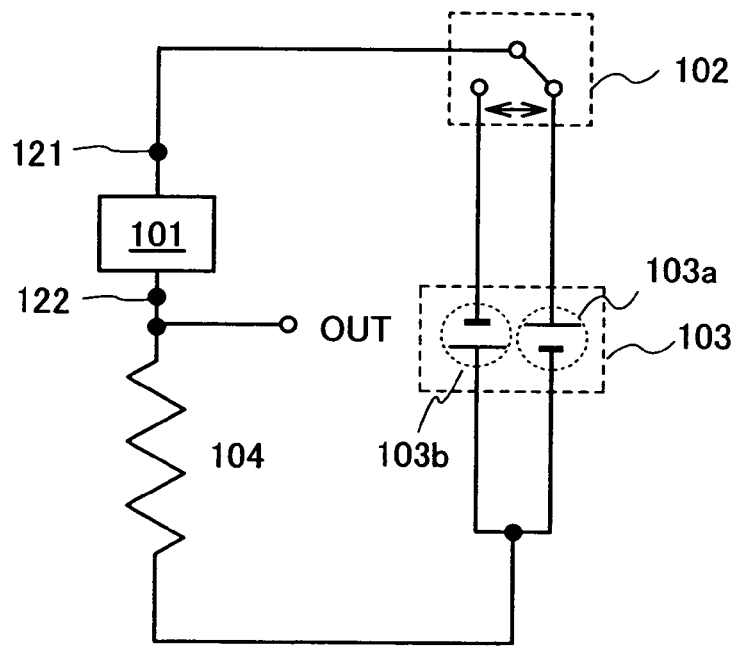
FIGS. 1A and 1B show a semiconductor device of the invention.

Hereinafter, embodiment modes of the present invention will be described with reference to drawings. However, the present invention can be implemented in various modes, and it is easily understood by those skilled in the art that modes and details can be variously changed without departing from the scope and the spirit of the present invention. Therefore, the present invention is not construed as being limited to description of the embodiment modes. Note that in structures of the present invention described below, reference numerals denoting the same components are used in common in different drawings, and detailed description of the same portions or portions having similar functions is omitted.

[Embodiment Mode 1]

A photoelectric conversion device in this embodiment mode is described with reference to FIGS. 29 to 35. The photoelectric conversion device in this embodiment mode includes a light detection circuit 2900, an amplifier 2903, a comparison circuit 2904, a reference voltage generation circuit 2905, and a control circuit 2906. The light detection circuit 2900 includes an optical sensor 2901 and a current-voltage conversion circuit 2902.

The light detection circuit 2900 has a function of outputting a voltage signal corresponding to detected illuminance. The optical sensor 2901 has a function of outputting a current signal corresponding to detected illuminance. The current-voltage conversion circuit 2902 includes a current-voltage conversion element and has a function of converting the current signal output from the optical sensor 2901 into a voltage signal. Note that as the optical sensor 2901, a photodiode or a phototransistor can be used. As the current-voltage conversion element, a resistor, a diode, a transistor, a variable resistor, or the like can be used.

Note that since the light detection circuit 2900 has a function of outputting illuminance as a voltage signal in this embodiment mode, the light detection circuit 2900 alone is referred to as a photoelectric conversion device in some cases.

The amplifier 2903 has a function of amplifying the voltage signal output from the light detection circuit 2900 and outputting it as output of the photoelectric conversion device. As the amplifier 2903, an operational amplifier, a transistor, or the like can be used. Note that when the voltage signal output from the light detection circuit 2900 is sufficiently large, the photoelectric conversion device in this embodiment mode does not necessarily include the amplifier 2903.

The comparison circuit 2904 has a function of comparing output from the amplifier 2903 and output from the reference voltage generation circuit 2905 and outputting the result to the control circuit 2906.

The reference voltage generation circuit 2905 has a function of generating reference voltage which is compared with the output from the amplifier 2903.

The control circuit 2906 has a function of determining an illuminance range to be detected based on the output from the comparison circuit 2904 and outputting a control signal to the light detection circuit 2900. Note that although not shown, the photoelectric conversion device in this embodiment mode may include a circuit which inputs information other than the output from the comparison circuit 2904 to the control circuit 2906. For example, setting information by a physical switch such as a DIP switch, setting information stored in a memory, information on illuminance by another optical sensor, or the like is input to the control circuit 2906, so that a control signal which controls an illuminance range which the light detection circuit 2900 can detect can be determined. In this case, the photoelectric conversion device in this embodiment mode does not necessarily include the comparison circuit 2904 and the reference voltage generation circuit 2905. This is because when various kinds of information for determining a control signal are supplied to the control circuit 2906, the control circuit 2906 can determine the control signal which controls an illuminance range which the light detection circuit 2900 can detect, without comparing output of the light detection circuit 2900 and the reference voltage. When the photoelectric conversion device in this embodiment mode does not include the comparison circuit 2904 and the reference voltage generation circuit 2905, the device can be made smaller by reduction in circuit area, and power consumption can be reduced.

With such a structure, in the photoelectric conversion device in this embodiment mode, a wide range of illuminance of several to several tens of thousands of lux can be measured by one optical sensor. Thus, a photoelectric conversion device which is highly convenient and has low power consumption can be obtained. Further, since the number of optical sensors for measuring illuminance is small, a photoelectric conversion device with a small output variation due to variation in characteristics can be obtained. Moreover, a photoelectric conversion device with high yield and low manufacturing cost can be obtained.

Here, when a photodiode is used as the optical sensor, a relation between a range and accuracy of illuminance to be detected, and a resistance value of a resistor in a light detection circuit in which the photodiode and the resistor are connected in series is briefly described. The photodiode generates photoelectromotive force and photoelectric current corresponding to intensity (illuminance) of light by a photoelectric effect when receiving light from the outside. Further, when the photodiode being reverse biased receives light, photoelectric current depends only on the illuminance, not on intensity of reverse bias. That is, the photodiode being reverse biased can be utilized as a photoelectric conversion element which converts illuminance into current.

Note that photoelectric current does not depend only on illuminance when intensity of reverse bias does not reach a certain level. That is, the intensity of reverse bias has a certain threshold value, and it is difficult for the photodiode to be utilized as a photoelectric conversion element when the intensity of reverse bias is equal to or lower than a certain threshold value. Accordingly, in order to use the photodiode as a photoelectric conversion element, the intensity of reverse bias which is sufficiently larger than the threshold value is necessary.

In addition, the threshold value is larger as illuminance is higher. That is, in order to detect high illuminance precisely, larger reverse bias is needed to be applied to the photodiode.

However, when power supply voltage is limited, ingenuity is needed to apply enough reverse bias to the photodiode. That is, it is important how voltage is allocated between the photodiode and the resistor. For example, since voltage applied to the resistor is reduced as a resistance value of the resistor becomes smaller, enough reverse bias can be applied to the photodiode accordingly. In other words, when the power supply voltage is limited, higher illuminance can be detected precisely (a detection range is increased) as the resistance value of the resistor is smaller.

On the other hand, the resistor has a function of changing current into voltage. This is because the resistor can detect change in current as change in voltage by the level of a voltage drop in the resistor as a result of generation of a voltage drop with the level in proportion to the product of the level of the current and the resistance value. At this time, change in voltage with respect to change in current is increased as the resistance value of the resistor is increased. The description that change in voltage with respect to change in current is large means that change in voltage becomes more sensitive to slight change in current, which means that in the case where a voltage value to be output is extracted by a circuit (an AD converter) which converts analog to digital, the voltage value can be normally extracted even when voltage resolution of the AD converter is low. That is, accuracy of illuminance to be detected by the light detection circuit is improved as the resistance value of the resistor is increased.

As described above, the relation between the range and the accuracy of illuminance to be detected, and the resistance value of the resistor in the light detection circuit in which the photodiode and the resistor are connected in series is as follows: (1) a detection range is increased as the resistance value of the resistor is reduced, and (2) accuracy of illuminance to be detected by the light detection circuit is improved as the resistance value of the resistor is increased.

When the light detection circuit is designed, which of the aforementioned properties (1) and (2) precedes is considered, and a resistor having an optimal resistance value is designed. In general, it is difficult to satisfy the aforementioned properties (1) and (2) at the same time. By the photoelectric conversion device in this embodiment mode, the aforementioned properties (1) and (2) can be satisfied by one light detection circuit.

Figure 29:
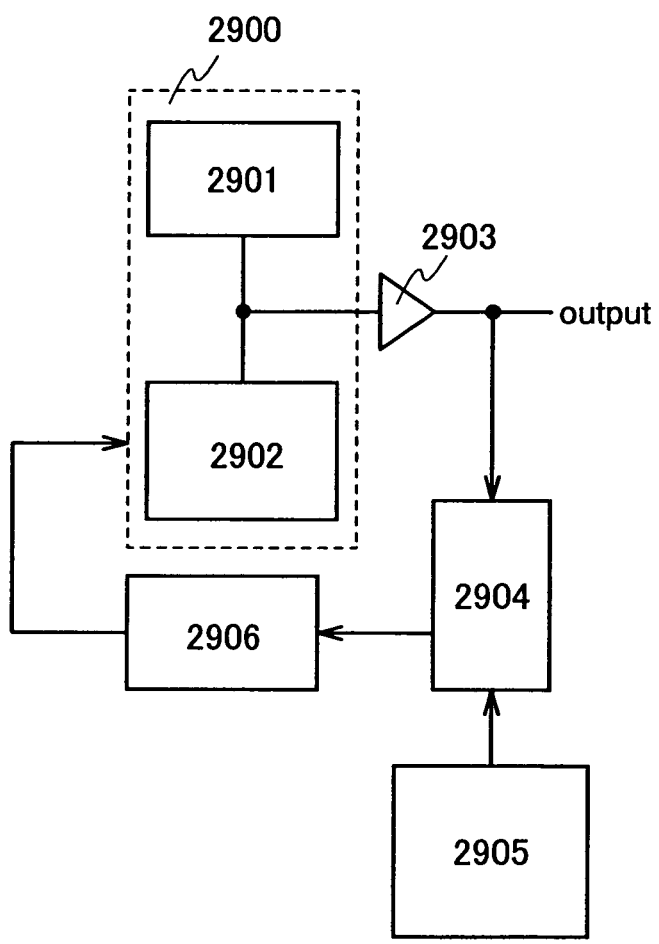
FIG. 29 illustrates an example of a photoelectric conversion device according to the invention.

The light detection circuit 2900 in this embodiment mode has a function of changing an illuminance range to be detected by a control signal output from the control circuit 2906 shown in FIG. 29. Such a function can realize expansion of a detection range and improvement in detection accuracy.

An example of the light detection circuit 2900 in this embodiment mode is described with reference to FIG. 30. In the example of the light detection circuit 2900 shown in FIG. 30, the optical sensor 2901 includes a photoelectric conversion element 3001, and the current-voltage conversion circuit 2902 includes a resistor $R_{301}$, a resistor $R_{302}$, and a switch 3002. A terminal OUT outputs output voltage of the light detection circuit 2900, and is electrically connected to an electrode between the optical sensor and the current-voltage conversion circuit. Here, the resistors $R_{301}$ and $R_{302}$ have different resistance values. As an example, the resistance value of the resistor $R_{302}$ is larger than that of the resistor $R_{301}$. Wirings 3003, 3004, and 3005 are power supply lines. Here, as an example, a high potential is supplied to the wiring 3003, and low potentials are supplied to the wirings 3004 and 3005. Further, as an example, the photoelectric conversion element 3001 is a photodiode.

Figure 30:
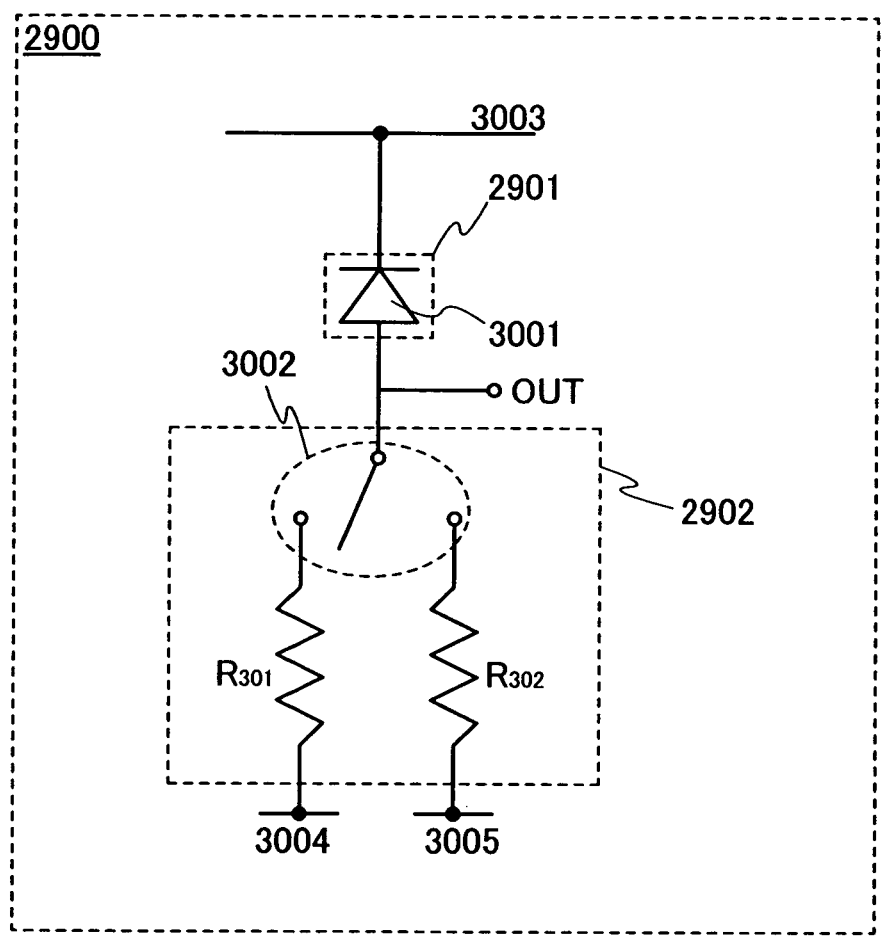
FIG. 30 illustrates an example of a light detection circuit according to the invention.

In the example of the light detection circuit 2900 shown in FIG. 30, the switch 3002 is formed so as to switch between the resistors $R_{301}$ and $R_{302}$ to be electrically connected to the photoelectric conversion element 3001. That is, the photoelectric conversion element 3001 can be in a state of being connected in series to the resistor $R_{301}$ having a low resistance value or in a state of being connected in series to the resistor $R_{302}$ having a high resistance value.

As the switch in this embodiment mode, a single transistor, an analog switch using a transistor, a physical switch such as a DIP switch, or the like can be used.

The wiring 3003 is electrically connected to one electrode of the photoelectric conversion element 3001. The wiring 3004 is electrically connected to one electrode of the resistor $R_{301}$. The wiring 3005 is electrically connected to one electrode of the resistor $R_{302}$.

When the photoelectric conversion element 3001 is in a state of being connected in series to the resistor $R_{301}$ having the low resistance value, an illuminance detection range of the light detection circuit 2900 can be increased by the property that (1) the detection range is increased as the resistance value of the resistor is reduced. Accordingly, the light detection circuit 2900 can detect illuminance precisely even when illuminance is as high as approximately several tens of thousands of lux.

When the photoelectric conversion element 3001 is in a state of being connected in series to the resistor $R_{302}$ having the high resistance value, illuminance detection accuracy of the light detection circuit 2900 can be increased by the property that (2) accuracy of illuminance to be detected by the light detection circuit is improved as the resistance value of the resistor is increased. Accordingly, the light detection circuit 2900 can detect slight change in illuminance even when illuminance is as low as approximately several lux.

Note that the switch 3002 may have a structure where the photoelectric conversion element 3001 can be in a state of not being electrically connected to the resistor $R_{301}$ and the resistor $R_{302}$. Accordingly, the light detection circuit 2900 can be in a sleep state in which current is not supplied thereto even when any illuminance is input to the light detection circuit 2900. With a structure in which such a state can be obtained, power consumption can be reduced.

Further, the switch 3002 can be switched by the control signal output from the control circuit 2906 shown in FIG. 29.

Accordingly, the light detection circuit 2900 for which an illuminance range to be detected and accuracy can be set as appropriate can be obtained.

Here, examples of specific advantages of the light detection circuit 2900 for which an illuminance range to be detected and accuracy can be set as appropriate are as follows. When illuminance is detected in an environment where illuminance reaches several tens of thousands of lux, for example, outdoors in the daytime, it is more important to be able to increase an illuminance range to be detected as much as possible than to be able to precisely detect change in illuminance of approximately several lux. This is because change in illuminance of several lux in the environment at several tens of thousands of lux is less important since it is difficult in the first place for a human to perceive the change, and a capability to perform detection itself is important. In such a case, an illuminance range to be detected can be increased by reducing a resistance value of the current-voltage conversion circuit.

On the other hand, when illuminance is detected in an environment at several to several hundreds of lux, for example, indoors or outdoors at night, it is more important to be able to precisely detect change in illuminance of approximately several lux than to increase an illuminance range to be detected. This is because a human can clearly perceive change in illuminance of several lux in the environment at several to several hundreds of lux. Further, there are not many advantages of being able to detect illuminance of several tens of thousands of lux in the environment at several to several hundreds of lux. In such a case, accuracy of illuminance to be detected can be improved by increasing a resistance value of the current-voltage conversion circuit.

Next, another example of the light detection circuit 2900 in this embodiment mode is described with reference to FIG. 31. In the example of the light detection circuit 2900 shown in FIG. 31, the optical sensor 2901 includes a photoelectric conversion element 3101, and the current-voltage conversion circuit 2902 includes a resistor $R_{311}$, a resistor $R_{312}$, a resistor $R_{313}$, and a switch 3102. The terminal OUT outputs output voltage of the light detection circuit 2900, and is electrically connected to an electrode between the optical sensor and the current-voltage conversion circuit. Here, the resistors $R_{311}$, $R_{312}$, and $R_{313}$ have different resistance values. As an example, the resistance value of the resistor $R_{312}$ is larger than that of the resistor $R_{311}$, and the resistance value of the resistor $R_{313}$ is larger than that of the resistor $R_{312}$. Wirings 3103, 3104, 3105, and 3106 are power supply lines. Here, as an example, a high potential is supplied to the wiring 3103, and low potentials are supplied to the wirings 3104, 3105, and 3106. Further, as an example, the photoelectric conversion element 3101 is a photodiode.

Figure 31:
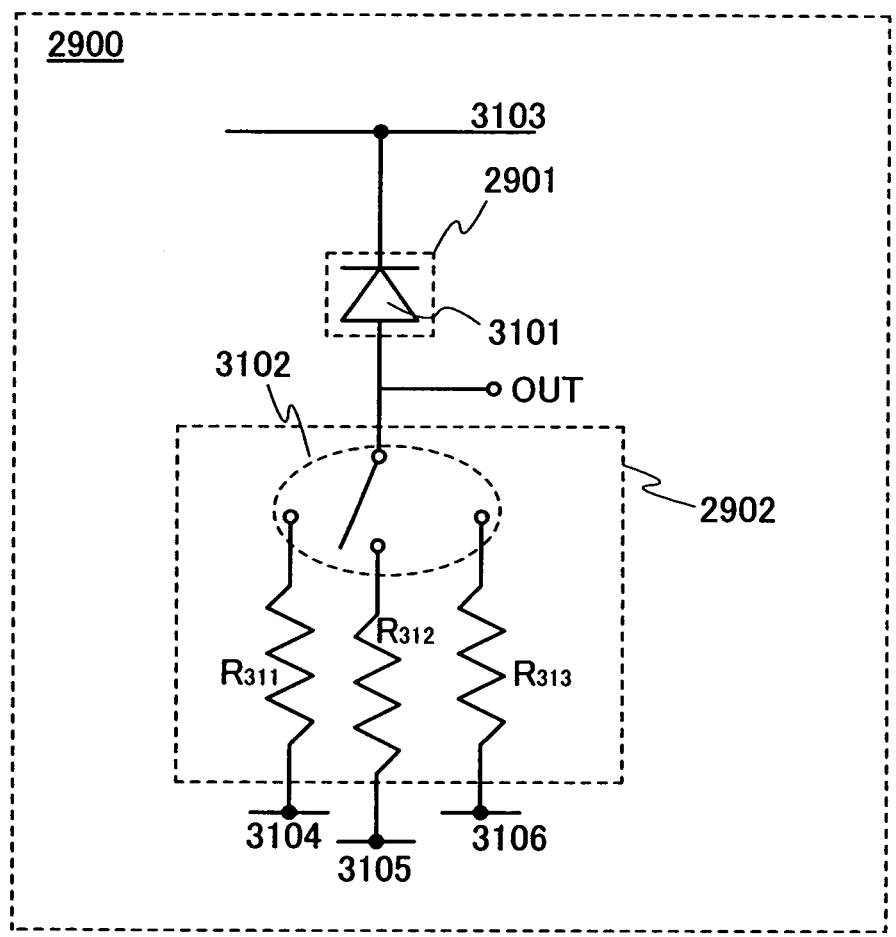
FIG. 31 illustrates an example of a light detection circuit according to the invention.

In the example of the light detection circuit 2900 shown in FIG. 31, the switch 3102 is formed so as to switch between the resistors $R_{311}$, $R_{312}$, and $R_{313}$ to be electrically connected to the photoelectric conversion element 3101. That is, the photoelectric conversion element 3101 can be in a state of being connected in series to the resistor $R_{31}$ having a low resistance value, a state of being connected in series to the resistor $R_{312}$ having a medium resistance value, and a state of being connected in series to the resistor $R_{313}$ having a high resistance value.

The wiring 3103 is electrically connected to one electrode of the photoelectric conversion element 3101. The wiring 3104 is electrically connected to one electrode of the resistor $R_{311}$. The wiring 3105 is electrically connected to one electrode of the resistor $R_{312}$. The wiring 3106 is electrically connected to one electrode of the resistor $R_{313}$.

When the photoelectric conversion element 3101 is in a state of being connected in series to the resistor $R_{31}$, having the low resistance value, an illuminance detection range of the light detection circuit 2900 can be increased by the property that (1) the detection range is increased as the resistance value of the resistor is reduced. Accordingly, the light detection circuit 2900 can detect illuminance precisely even when illuminance is as high as approximately several tens of thousands of lux.

When the photoelectric conversion element 3101 is in a state of being connected in series to the resistor $R_{312}$ having the medium resistance value, an illuminance detection range and detection accuracy of the light detection circuit 2900 can be set at medium level by the properties that (1) the detection range is increased as the resistance value of the resistor is reduced and (2) accuracy of illuminance to be detected by the light detection circuit is improved as the resistance value of the resistor is increased. Accordingly, when illuminance is at the medium level in the range of approximately several tens to several thousands of lux, the light detection circuit 2900 can ensure some degree of a detection range and can detect illuminance with enough detection accuracy.

When the photoelectric conversion element 3101 is in a state of being connected in series to the resistor $R_{313}$ having the high resistance value, illuminance detection accuracy of the light detection circuit 2900 can be increased by the property that (2) accuracy of illuminance to be detected by the light detection circuit is improved as the resistance value of the resistor is increased. Accordingly, the light detection circuit 2900 can detect slight change in illuminance even when illuminance is as low as approximately several lux.

Note that the switch 3102 may have a structure where the photoelectric conversion element 3101 can be in a state of not being electrically connected to the resistors $R_{311}$, $R_{312}$, and $R_{313}$. Accordingly, the light detection circuit 2900 can be in a sleep state in which current is not supplied thereto even when any illuminance is input to the light detection circuit 2900. With a structure in which such a state can be obtained, power consumption can be reduced.

Further, the switch 3102 can be switched by the control signal output from the control circuit 2906 shown in FIG. 29. Accordingly, the light detection circuit 2900 for which an illuminance range to be detected and accuracy can be set as appropriate can be obtained.

Here, the light detection circuit 2900 can appropriately set the illuminance detection range and accuracy in three levels, which leads to the following specific advantages. Not only can the illuminance range to be detected and the accuracy be set as appropriate when illuminance is detected in the environment where illuminance reaches several tens of thousands of lux, for example, outdoors in the daytime, and in the environment at several to several hundreds of lux, for example, indoors or outdoors at night, but also the illuminance range to be detected and the accuracy can be set as appropriate when illuminance is detected in an environment intermediate between both of the environments, such as the environment at several tens to several thousands of lux, for example, indoors and outdoors in cloudy weather. Accordingly, for example, when illuminance is gradually changed within the detection range, a boundary where an illuminance range to be detected and accuracy are drastically changed at some illuminance is prevented from being formed, and illuminance can be smoothly detected in various illuminance ranges.

As described above, it is also important that an illuminance range to be detected and accuracy can be set as finely as possible not only in a low illuminance range and a high illuminance range, but also in an illuminance range intermediate between both of the ranges. Therefore, the current-voltage conversion circuit 2902 included in the light detection circuit 2900 in this embodiment mode may include four or more resistors as well as two or three resistors as described above. As the number of resistors having different resistance values is increased, an illuminance range to be detected and accuracy are prevented from being drastically changed at a boundary where the illuminance range to be detected and the accuracy are changed, and illuminance can be more smoothly detected in various illuminance ranges.

Further, according to this point of view, illuminance can be more smoothly detected in various illuminance ranges as the number of resistance values which the current-voltage conversion circuit 2902 can have is increased. Another structure example of such a light detection circuit 2900 is described with reference to FIG. 32.

Figure 32:
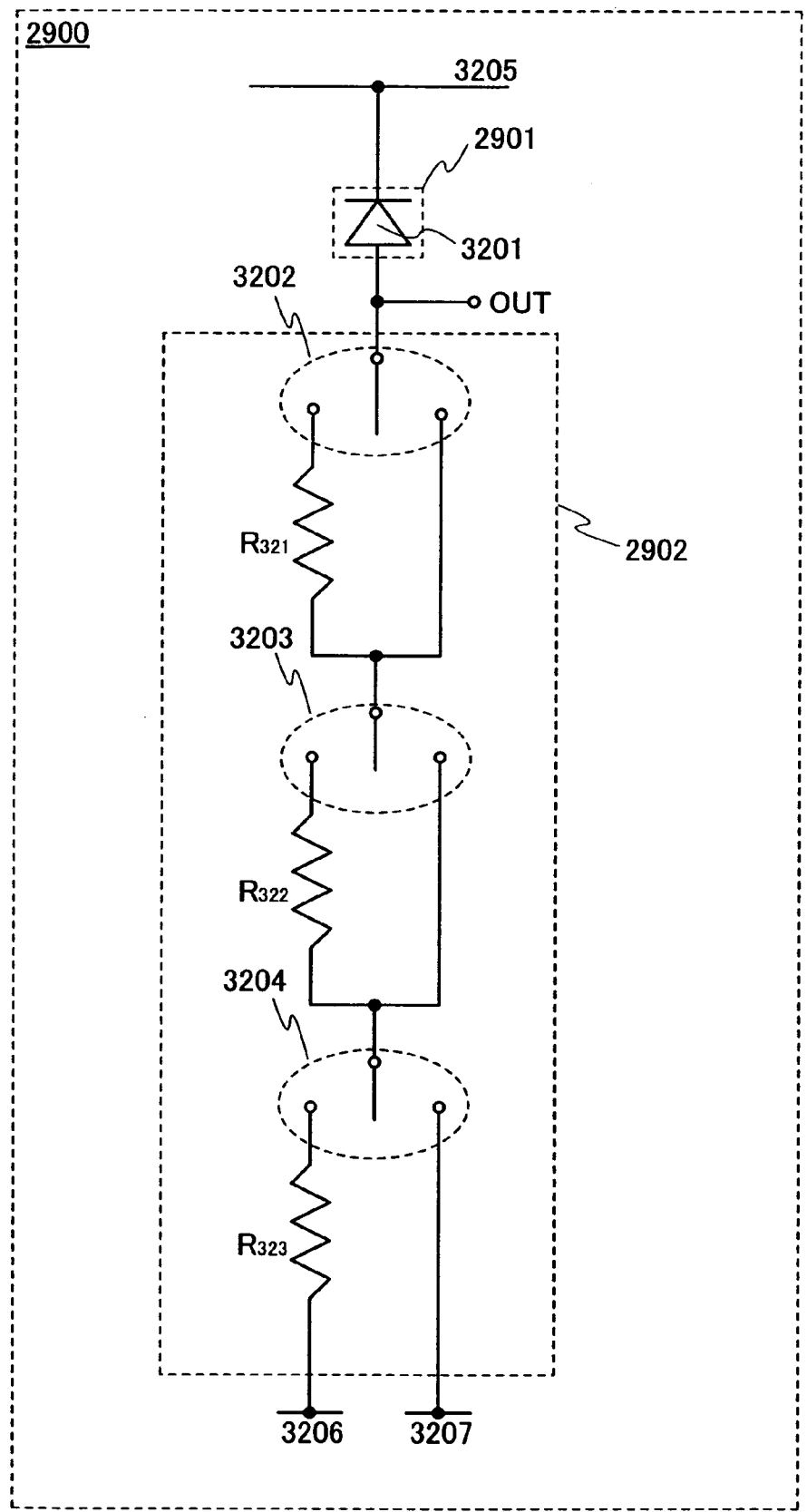
FIG. 32 illustrates an example of a light detection circuit according to the invention.

In the example of the light detection circuit 2900 shown in FIG. 32, the optical sensor 2901 includes a photoelectric conversion element 3201, and the current-voltage conversion circuit 2902 includes a resistor $R_{321}$, a resistor $R_{322}$, a resistor $R_{323}$, and switches 3202, 3203, and 3204. The terminal OUT outputs output voltage of the light detection circuit 2900, and is electrically connected to an electrode between the optical sensor and the current-voltage conversion circuit. Here, the resistors $R_{321}$, $R_{322}$, and $R_{323}$ may have approximately the same resistance value or different resistance values. As an example, the resistance value of the resistor $R_{322}$ is twice that of the resistor $R_{321}$, and the resistance value of the resistor $R_{323}$ is twice that of the resistor $R_{322}$. Wirings 3205, 3206, and 3207 are power supply lines. Here, as an example, a high potential is supplied to the wiring 3205, and low potentials are supplied to the wirings 3206 and 3207. Further, as an example, the photoelectric conversion element 3201 is a photodiode.

The wiring 3205 is electrically connected to one electrode of the photoelectric conversion element 3201. The wiring 3206 is electrically connected to one electrode of the resistor $R_{323}$. The wiring 3207 is electrically connected to an electrode arranged in parallel to the resistor $R_{323}$.

In the example of the light detection circuit 2900 shown in FIG. 32, the switches 3202, 3203, and 3204 are formed so that the resistors $R_{321}$, $R_{322}$, and $R_{323}$, which are electrically connected to the photoelectric conversion element 3201, are switched to be connected in series to the photoelectric conversion element 3201, respectively. That is, the switch 3202 switches whether or not the resistor $R_{321}$ is electrically connected to the photoelectric conversion element 3201. When the resistor $R_{321}$ is not electrically connected to the photoelectric conversion element 3201, the switch 3202 is made to be electrically connected to an electrode arranged in parallel to the resistor $R_{321}$. The switch 3203 switches whether or not the resistor $R_{322}$ is electrically connected to the photoelectric conversion element 3201. When the resistor $R_{322}$ is not electrically connected to the photoelectric conversion element 3201, the switch 3203 is made to be electrically connected to an electrode arranged in parallel to the resistor $R_{322}$. The switch 3204 switches whether or not the resistor $R_{323}$ is electrically connected to the photoelectric conversion element 3201. When the resistor $R_{323}$ is not electrically connected to the photoelectric conversion element 3201, the switch 3204 is made to be electrically connected to the electrode arranged in parallel to the resistor $R_{323}$.

Further, each of the switches 3202, 3203, and 3204 can be switched by the control signal output from the control circuit 2906 shown in FIG. 29. Accordingly, the light detection circuit 2900 for which an illuminance range to be detected and accuracy can be set as appropriate can be obtained.

With such a structure, the photoelectric conversion element 3101 can be in a state where all of the resistors $R_{321}$, $R_{322}$, and $R_{323}$ are connected in series, a state of being connected in series to two of the resistors, and a state of being connected in series to one of the resistors. Accordingly, the number of resistance values which the current-voltage conversion circuit 2902 can have can be increased even when the number of resistors is small; thus, illuminance detection can be more smoothly performed in various illuminance ranges while increase in circuit area is suppressed.

In addition, as in the example of the light detection circuit 2900 shown in FIG. 32, it is preferable that the resistance value of the resistor $R_{322}$ be twice that of the resistor $R_{321}$ and the resistance value of the resistor $R_{323}$ be twice that of the resistor $R_{322}$ in terms of increase in the number of resistance values which the current-voltage conversion circuit 2902 can have. This is because with such a structure, the resistance value can be proportional to a power of two depending on a connection state of the switches, so that a wider range of the resistance values can be set evenly with the smaller number of resistors. For example, when the lowest resistance value of the transistors is denoted by r, the current-voltage conversion circuit 2902 shown in FIG. 32 can have a value close to 0, r, 2r, 3r, 4r, 5r, 6r, and 7r as the resistance values. Accordingly, the number of the resistance values, which is obtained by multiplying 2 and the number of the resistors, can be obtained.

Note that although three resistors are shown in the light detection circuit shown in FIG. 32, the light detection circuit in this embodiment mode is not limited thereto. It is needless to say that two resistors, or four or more resistors may be used. As the number of resistors is increased, the number of resistance values which the current-voltage conversion circuit can have is increased exponentially; thus, illuminance detection can be more smoothly performed in various illuminance ranges while increase in circuit area is suppressed.

Next, according to the point of view that illuminance detection can be more smoothly performed in various illuminance ranges as resistance values which the current-voltage conversion circuit 2902 can have is increased, another structure example of the light detection circuit 2900 is described with reference to FIG. 33.

Figure 33:
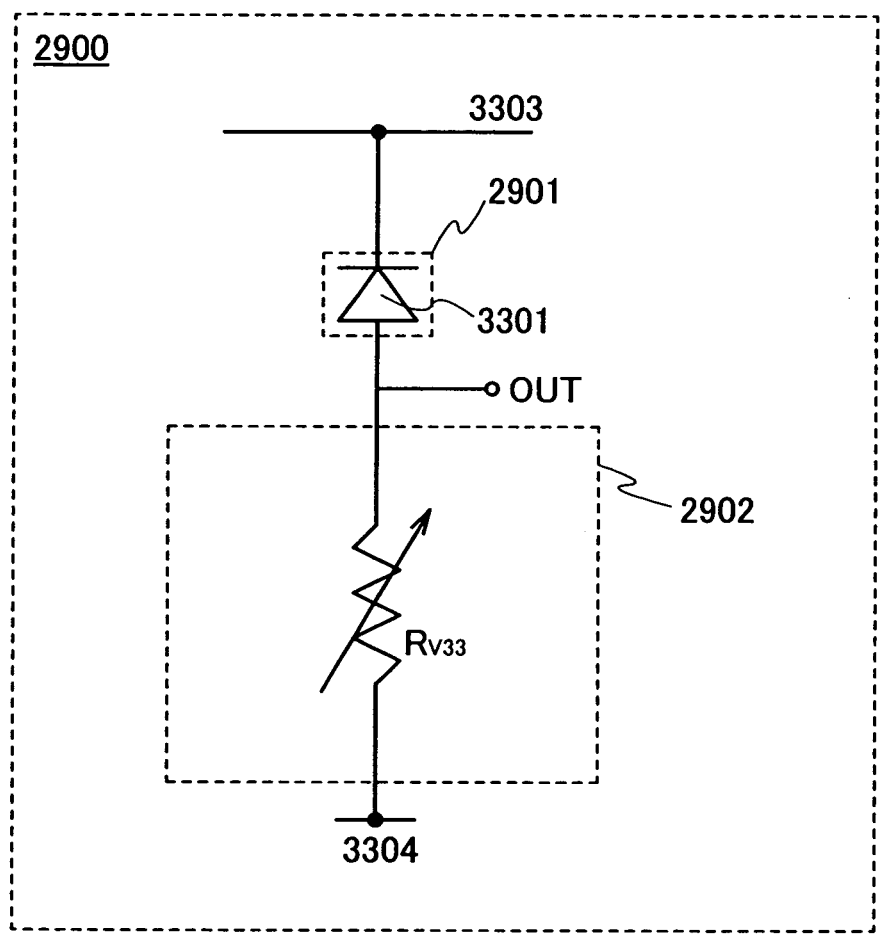
FIG. 33 illustrates an example of a light detection circuit according to the invention.

In the example of the light detection circuit 2900 shown in FIG. 33, the optical sensor 2901 includes a photoelectric conversion element 3301, and the current-voltage conversion circuit 2902 includes a variable resistor $R_{V33}$. The terminal OUT outputs output voltage of the light detection circuit 2900, and is electrically connected to an electrode between the optical sensor and the current-voltage conversion circuit. Here, a resistance value of the variable resistor $R_{V33}$ can be controlled by the control signal output from the control circuit 2906 shown in FIG. 29. Thus, the light detection circuit 2900 for which an illuminance range to be detected and accuracy can be set as appropriate can be obtained. Wirings 3303 and 3304 are power supply lines. Here, as an example, a high potential is supplied to the wiring 3303, and a low potential is supplied to the wiring 3304. Further, as an example, the photoelectric conversion element 3301 is a photodiode.

The wiring 3303 is electrically connected to one electrode of the photoelectric conversion element 3301. The wiring 3304 is electrically connected to one electrode of the variable resistor $R_{V33}$.

As described above, with a structure where the variable resistor $R_{V33}$ is used for the current-voltage conversion circuit 2902 and the resistance value of the variable resistor $R_{V33}$ is controlled by the control signal output from the control circuit

2906 shown in FIG. 29, the resistance value which the current-voltage conversion circuit 2902 can have may be controlled. Accordingly, illuminance detection can be more smoothly performed in various illuminance ranges while increase in circuit area is suppressed.

Next, according to the point of view that illuminance detection can be more smoothly performed in various illuminance ranges as resistance values which the current-voltage conversion circuit 2902 can have is increased, another structure example of the light detection circuit 2900 is described with reference to FIG. 34.

Figure 34:
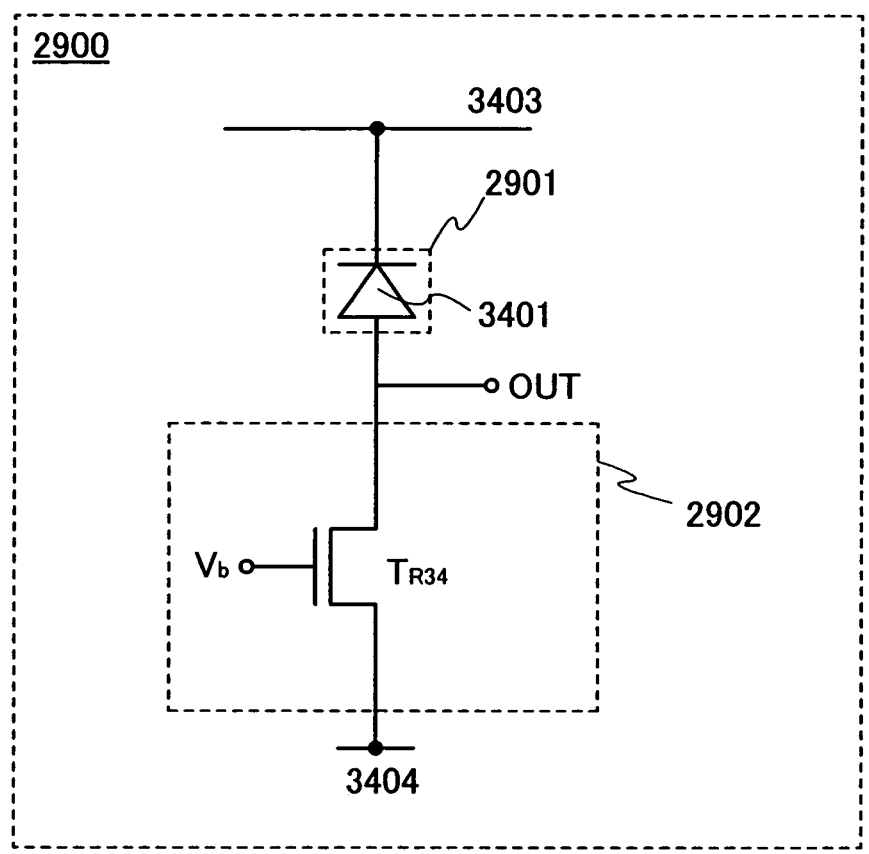
FIG. 34 illustrates an example of a light detection circuit according to the invention.

In the example of the light detection circuit 2900 shown in FIG. 34, the optical sensor 2901 includes a photoelectric conversion element 3401, and the current-voltage conversion circuit 2902 includes a transistor $T_{R34}$. The terminal OUT outputs output voltage of the light detection circuit 2900, and is electrically connected to an electrode between the optical sensor and the current-voltage conversion circuit. Here, a resistance value of the transistor $T_{R34}$ can be controlled by the control signal output from the control circuit 2906 shown in FIG. 29. Thus, the light detection circuit 2900 for which an illuminance range to be detected and accuracy can be set as appropriate can be obtained. Wirings 3403 and 3404 are power supply lines. Here, as an example, a high potential is supplied to the wiring 3403, and a low potentials is supplied to the wiring 3404. Further, as an example, the photoelectric conversion element 3401 is a photodiode.

The wiring 3403 is electrically connected to one electrode of the photoelectric conversion element 3401. The wiring 3404 is electrically connected to one electrode of the transistor $T_{R34}$.

As described above, with a structure where the transistor $T_{R34}$ is used for the current-voltage conversion circuit 2902 and the resistance value of the transistor $T_{R34}$ is controlled by the control signal output from the control circuit 2906 shown in FIG. 29, the resistance value which the current-voltage conversion circuit 2902 can have may be controlled. Accordingly, illuminance detection can be more smoothly performed in various illuminance ranges while increase in circuit area is suppressed.

Further, a more valuable effect can be obtained by using the transistor $T_{R34}$ for the current-voltage conversion circuit 2902. The effect is that by operating the transistor $T_{R34}$ in a saturation region, an upper limit of current flowing to the light detection circuit 2900 can be controlled by the control circuit 2906 shown in FIG. 29.

The above point is hereinafter described in detailed. When the transistor $T_{R34}$ is used for the current-voltage conversion circuit 2902, the transistor $T_{R34}$ operates in an operation region where current flowing to the transistor $T_{R34}$ depends on source-drain voltage of the transistor $T_{R34}$, that is, operates in a linear region. Thus, the current-voltage conversion circuit 2902 in which current output from the optical sensor 2901 is converted into voltage by using the transistor $T_{R34}$ can be realized.

When the optical sensor 2901 receives light with very high illuminance or static electricity is generated so that very large current flows to the light detection circuit 2900, the optical sensor 2901, the current-voltage conversion circuit 2902, an amplifier electrically connected to the terminal OUT, or the like might be destroyed. However, when the transistor $T_{R34}$ is used for the current-voltage conversion circuit 2902, the upper limit of current flowing to the light detection circuit 2900 can be controlled by the control circuit 2906 shown in FIG. 29 by operating the transistor $T_{R34}$ in the saturation region; thus, breakdown of the circuit by large current can be prevented. This is because when the transistor $T_{R34}$ operates in the saturation region, current flowing to the transistor $T_{R34}$ is constant regardless of the source-drain voltage of the transistor $T_{R34}$, so that the transistor $T_{R34}$ can operate as a limiter for current flowing to the light detection circuit 2900.

Note that the upper limit of current flowing to the light detection circuit 2900 can be controlled by gate voltage of the transistor $T_{R34}$. The gate voltage of the transistor $T_{R34}$ may be controlled by the control circuit 2906 shown in FIG. 29.

Note that in the examples of the light detection circuit 2900 described in this embodiment mode, a relation of potentials of the power supply lines may be reversed. That is, if a low potential is supplied to the power supply line connected to the optical sensor 2901, a high potential is supplied to the current-voltage conversion circuit 2902, and the photoelectric conversion element 3401 is reversed, the light detection circuit 2900 operates normally.

Note that in the examples of the light detection circuit 2900 described in this embodiment mode, an additional current-voltage conversion circuit may be provided between the optical sensor 2901 and the power supply line connected to the optical sensor 2901. Thus, the light detection circuit 2900 can have two outputs. In the two outputs, a direction of change in voltage with respect to illuminance is reversed. That is, the output on a high potential side of the optical sensor 2901 has a high potential when the optical sensor 2901 is not irradiated with light (when current is not supplied to the light detection circuit 2900), and the potential is decreased as the optical sensor 2901 is irradiated with stronger light. On the other hand, the output on a low potential side of the optical sensor 2901 has a low potential when the optical sensor 2901 is not irradiated with light, and the potential is increased as the optical sensor 2901 is irradiated with stronger light. Accordingly, by using the two outputs in which the direction of change in voltage with respect to illuminance is reversed, a logic circuit (an optical switch) using the light detection circuit 2900 can be formed simply. For example, since a circuit for inverting a signal is not necessary, the size of the circuit can be reduced, and power consumption can be reduced. Moreover, breakdown of the circuit by large current can be further reduced.

Next, a specific operation example of the photoelectric conversion element in this embodiment mode, which is shown in FIG. 29, is described with reference to a flow chart shown in FIG. 35.

Figure 35:
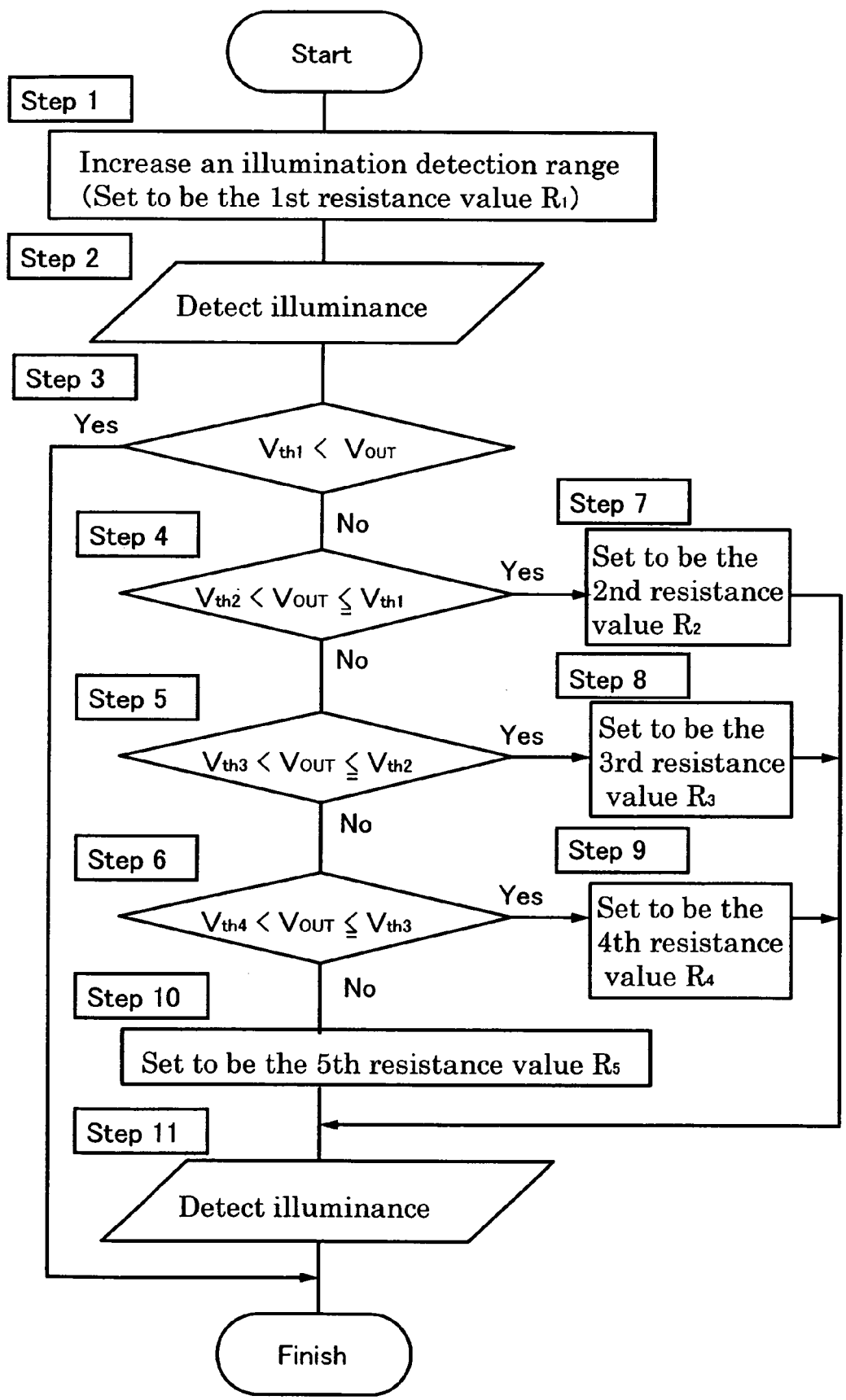
FIG. 35 illustrates an example of an operation flow chart of a photoelectric conversion device according to the invention.

Brief description of the operation based on the flow chart shown in FIG. 35 is as follows. First, illuminance is changed into a voltage signal by the light detection circuit 2900 which sets a detection range up as widely as possible, and the voltage signal is amplified by the amplifier 2903 to be output. This output voltage is denoted by $V_{OUT}$. This detection operation is referred to as a first illuminance detection operation. At this time, a plurality of different reference voltages are generated by the reference voltage generation circuit 2905 and input to the comparison circuit 2904. Then, the output voltage $V_{OUT}$ of the amplifier 2903 is compared with each of the plurality of different reference voltages, and it is determined which range of reference voltages the level of the output voltage $V_{OUT}$ is included. Then, depending on the range of the reference voltage in which the output voltage $V_{OUT}$ is included, a detection range and detection accuracy of the light detection circuit 2900 are set by the control circuit 2906, and illuminance is detected again. This detection operation is referred to as a second illuminance detection operation. That is, this is a method in which illuminance is roughly detected once, and when detected illuminance is in a range where detection can be performed more precisely, illuminance is detected again with higher detection accuracy.

Here, resistance values of the current-voltage conversion circuit 2902 are described on the assumption that a first resistance value $R_1$ is the lowest, a second resistance value $R_2$ is higher than $R_1$, a third resistance value $R_3$ is higher than $R_2$, a fourth resistance value $R_4$ is higher than $R_3$, and a fifth resistance value $R_5$ is higher than $R_4$. Note that although five resistance values are described here, it is apparent that the number of resistance values of the current-voltage conversion circuit 2902 in this embodiment mode is not limited thereto. The number of resistance values of the current-voltage conversion circuit 2902 according to this embodiment mode may be one, two, three, four, or six or more. Further, a resistance which changes a resistance value continuously, such as a variable resistor or a transistor, can be employed. Here, the number of resistance values may be one because a current value can be controlled in the optical sensor 2901 as described below.

In addition, the number of a plurality of different reference voltages may be determined depending on the number of the resistance values which the current-voltage conversion circuit 2902 can have. For example, when the number of the resistance values is five, the number of the plurality of different reference voltages may be four, which is one smaller than the number of the resistance values. The plurality of different reference voltages at this time are denoted by $V_{th1}$, $V_{th2}$, $V_{th3}$, and $V_{th4}$ in descending order. Further, when the resistance value can be controlled as continuous quantity, the number of a plurality of different reference voltages may be determined as appropriate, but is preferably approximately five. This is because when an illuminance range of several to several tens of thousands of lux is detected, an illuminance range corresponding to the case where illuminance is changed by an order of magnitude can correspond to one range of the reference voltage.

Next, the operation based on the flow chart shown in FIG. 35 is described in detail. After the start, a resistance value of the current-voltage conversion circuit 2902 is set to be the first resistance value $R_1$ in order to increase an illuminance detection range as much as possible. This operation is referred to as Step 1.

After Step 1, the process proceeds to Step 2. Step 2 is an operation of detecting illuminance by the light detection circuit 2900. By the operation of Step 2, the output voltage $V_{OUT}$ in accordance with the illuminance in the wide detection range is output.

After Step 2, the process proceeds to Step 3. Step 3 is one of operations that decides a resistance value from the result of comparing the output voltage $V_{OUT}$ output in Step 2 with the reference voltages generated by the reference voltage generation circuit 2905. In Step 3, it is determined whether the output voltage $V_{OUT}$ output in Step 2 is higher than the first reference voltage $V_{th1}$. In Step 3, when it is determined that $V_{OUT}>V_{th1}$ is satisfied, the detection operation ends. Otherwise, the process proceeds to Step 4.

The reason of an operation by the result determined in Step 3 is as follows. Here, since description is made on the assumption that the output voltage $V_{OUT}$ is higher as illuminance is higher, the situation that the output voltage $V_{OUT}$ output in Step 2 is higher than the reference voltage $V_{th1}$ which is the highest among the plurality of different reference voltages means that high illuminance is detected in Step 2. The output voltage $V_{OUT}$ output in Step 2 is a result of detection with the first resistance value $R_1$ having a low resistance value. That is, the illuminance measured in the widest detection range is larger than illuminance corresponding to the highest reference voltage $V_{th1}$; thus, no additional measurement with a different resistance value and higher accuracy is needed.

Step 4 is one of the operations that decides a resistance value from the result of comparing the output voltage $V_{OUT}$ output in Step 2 with the reference voltages generated by the reference voltage generation circuit 2905. In Step 4, it is determined whether the output voltage $V_{OUT}$ output in Step 2 satisfies $V_{th2}<V_{OUT}\leq V_{th1}$. In Step 4, when it is determined that the output voltage $V_{OUT}$ is in the range of $V_{th2}<V_{OUT}\leq V_{th1}$, the process proceeds to Step 7. Otherwise, the process proceeds to Step 5.

Step 5 is one of the operations that decides a resistance value from the result of comparing the output voltage $V_{OUT}$ output in Step 2 with the reference voltages generated by the reference voltage generation circuit 2905. In Step 5, it is determined whether the output voltage $V_{OUT}$ output in Step 2 satisfies $V_{th3}<V_{OUT}\leq V_{th2}$. In Step 5, when it is determined that the output voltage $V_{OUT}$ is in the range of $V_{th3}<V_{OUT}\leq V_{th2}$, the process proceeds to Step 8. Otherwise, the process proceeds to Step 6.

Step 6 is one of the operations that decides a resistance value from the result of comparing the output voltage $V_{OUT}$ output in Step 2 with the reference voltages generated by the reference voltage generation circuit 2905. In Step 6, it is determined whether the output voltage $V_{OUT}$ output in Step 2 satisfies $V_{th4}<V_{OUT}\leq V_{th3}$. In Step 6, when it is determined that the output voltage $V_{OUT}$ is in the range of $V_{th4}<V_{OUT}\leq V_{th3}$, the process proceeds to Step 9. Otherwise, the process proceeds to Step 10.

Step 7 is an operation in which the resistance value of the current-voltage conversion circuit 2902 is set to be the second resistance value $R_2$ when it is determined in Step 4 that the output voltage $V_{OUT}$ is in the range of $V_{th2}<V_{OUT}\leq V_{th1}$. After the resistance value of the current-voltage conversion circuit 2902 is set to be the second resistance value $R_2$, the process proceeds to Step 11.

Step 8 is an operation in which the resistance value of the current-voltage conversion circuit 2902 is set to be the third resistance value $R_3$ when it is determined in Step 5 that the output voltage $V_{OUT}$ is in the range of $V_{th3}<V_{OUT}\leq V_{th2}$. After the resistance value of the current-voltage conversion circuit 2902 is set to be the third resistance value $R_3$, the process proceeds to Step 11.

Step 9 is an operation in which the resistance value of the current-voltage conversion circuit 2902 is set to be the fourth resistance value $R_4$ when it is determined in Step 6 that the output voltage $V_{OUT}$ is in the range of $V_{th4}<V_{OUT}\leq V_{th3}$. After the resistance value of the current-voltage conversion circuit 2902 is set to be the fourth resistance value $R_4$, the process proceeds to Step 11.

Step 10 is an operation in which the resistance value of the current-voltage conversion circuit 2902 is set to be the fifth resistance value $R_5$ when it is determined in Step 6 that the output voltage $V_{OUT}$ is not in the range of $V_{th4}<V_{OUT}\leq V_{th3}$. After the resistance value of the current-voltage conversion circuit 2902 is set to be the fifth resistance value $R_5$, the process proceeds to Step 11. voltage $V_{OUT}$ output in Step 2 is a result of detection with the first resistance value $R_1$ having the low resistance value. It is determined that the detected illuminance exists in which range of the illuminance in Step 4 to Step 6. When approximate luminance is obtained in Step 4 to Step 6, a detection range is narrowed down in accordance with the illuminance. For this purpose, in Step 7 to Step 10, the resistance value of the current-voltage conversion circuit 2902 is made larger as illuminance is smaller. Accordingly, detection accuracy can be further improved as illuminance is smaller. Thus, a photoelectric conversion device for which an illuminance range to be detected and accuracy can be set as appropriate can be obtained.

Step 11 is an operation in which illuminance is detected again by using the resistance value set in Step 7 to Step 10. In Step 11, illuminance can be detected with an optimal detection range and detection accuracy since an optimal resistance value is set with respect to the detected illuminance in Step 1 to Step 10. In such a manner, by operating the photoelectric conversion device in this embodiment mode in accordance with the flow chart shown in FIG. 35, the photoelectric conversion device for which an illuminance detection range and accuracy can be set as appropriate can be obtained.

Note that description has been made on the assumption that the output voltage $V_{OUT}$ is higher as illuminance is higher; however, the operation of photoelectric conversion device in this embodiment mode is not limited thereto, and the output voltage $V_{OUT}$ may be lower as illuminance is higher. In that case, the lowest reference voltage is used in Step 3, and the reference voltages used in Step 4 to Step 6 are sequentially compared with the output voltage in ascending order. Accordingly, detection accuracy can be further improved as illuminance is smaller. Thus, a photoelectric conversion device for which an illuminance detection range and accuracy can be set as appropriate can be obtained.

Note that although this embodiment mode is described with reference to various drawings, the contents (or part of the contents) described in each drawing can be freely applied to, combined with, or replaced with the contents (or part of the contents) described in another drawing. Further, much more drawings can be formed by combining each part with another part in the above-described drawings.

Similarly, the contents (or part of the contents) described in each drawing in this embodiment mode can be freely applied to, combined with, or replaced with the contents (or part of the contents) described in a drawing in another embodiment mode. Further, much more drawings can be formed by combining each part in each drawing in this embodiment mode with part of another embodiment mode.

Note that this embodiment mode shows examples of embodying, slightly transforming, partially modifying, improving, describing in detail, or applying the contents (or part of the contents) described in other embodiment modes, an example of related part thereof, or the like. Therefore, the contents described in other embodiment modes can be freely applied to, combined with, or replaced with this embodiment mode.

[Embodiment Mode 2]

This embodiment mode is described with reference to FIGS. 1A, 1B, 2, 3A, 3B, 4 to 7, 8A, 8B, 9A to 9D, 10A to 10C, 11A to 11C, 12, and 13. A semiconductor device shown in FIG. 1A includes a photoelectric conversion device 101, a bias switching unit 102, a power supply 103, the terminal OUT, and a resistor 104. The photoelectric conversion device 101 has a thin film integrated circuit including a photoelectric conversion element 115 and thin film transistors (TFTs). The thin film integrated circuit includes at least a current mirror circuit 114 formed of a thin film transistor 113 and a diode-connected thin film transistor 112. Note that in this embodiment mode, each thin film transistor included in the current mirror circuit 114 is an n-channel thin film transistor. In addition, the photoelectric conversion device is also referred to as a photo IC.

One terminal 121 of the photoelectric conversion device 101 is connected to one electrode of the power supply 103 through the bias switching unit 102, and the other terminal 122 of the photoelectric conversion device 101 is connected to the other electrode of the power supply 103 through the resistor 104. Note that current obtained from the photoelectric conversion device 101 is output as voltage from the terminal OUT connected to the terminal 121 by using the resistor 104.

Next, the photoelectric conversion device 101 is described with reference to FIG. 1B. The terminal 121 is connected to a gate electrode and a first electrode (one of a source electrode and a drain electrode) of the thin film transistor 112 through the photoelectric conversion element 115. A second electrode (the other of the source electrode and the drain electrode) of the thin film transistor 112 is connected to the terminal 122. Further, the terminal 121 is also connected to a first electrode (one of a source electrode and a drain electrode) of the thin film transistor 113. A second electrode (the other of the source electrode and the drain electrode) of the thin film transistor 113 is connected to the terminal 122. Note that a gate electrode of the thin film transistor 113 is connected to the gate electrode of the thin film transistor 112.

When Embodiment Mode 1 is combined with this embodiment mode, the photoelectric conversion device 101 or the photoelectric conversion element 115 in this embodiment mode may be used for the optical sensor 2901 in Embodiment Mode 1. That is, the optical sensor 2901 in Embodiment Mode 1 may include, but does not necessarily include, the current mirror circuit 114.

In the semiconductor device shown in FIG. 1A, the photoelectric conversion element 115 is irradiated with light, so that an electron and a hole are generated, and current is generated. Note that the current mirror circuit 114 has a function of amplifying the current obtained from the photoelectric conversion element 115. FIG. 1B shows the case of one thin film transistor 113, that is, the case where the current obtained from the photoelectric conversion element 115 is amplified to be doubled. When higher current is necessary, a plurality of units 116 may be provided in parallel between the terminals 121 and 122. One unit 116 refers to the thin film transistor 113 the gate electrode of which is connected to the gate electrode of the thin film transistor 112. For example, when the number of units is set to n as shown in FIG. 2 and current obtained from the photoelectric conversion element 115 is set to i, (n+1) times the current, (n+1)×i, can be output from the photoelectric conversion device 101. Note that the current obtained from the photoelectric conversion element 115 has illuminance dependency, so that illuminance, that is, irradiation light can be detected. Here, the current obtained from the photoelectric conversion device 101 is output as voltage from the terminal OUT by using the resistor 104, and thus illuminance is detected.

Here, the numbers of units shown in FIG. 2 may be increased or decreased by the control circuit 2906 shown in FIG. 29. Specifically, a switch may be provided between the unit 116 and the terminal 121 or between the unit 116 and the terminal 122 and on/off of the switch may be controlled by the control circuit 2906 shown in FIG. 29. Accordingly, output current according to illuminance of the optical sensor 2901 can be set as appropriate in accordance with an illuminance range; thus, a detection range can be increased in a range where illuminance is high, and detection accuracy can be increased in a range where illuminance is low.

The bias switching unit 102 reverses potentials to be supplied to the terminals 121 and 122 of the photoelectric conversion device 101, that is, bias at a boundary of predetermined illuminance, with the use of the power supply 103. In FIGS. 1A and 1B, two kinds of power supplies 103a and 103b are used. As long as the bias to be applied to the photoelectric conversion device 101 is reversed, power supplies are not particularly limited thereto. It is needless to say that the voltage applied to the photoelectric conversion device 101 is not always needed to be the same before and after the reversal.

Further, by reversing bias to be applied to the photoelectric conversion device 101, output voltage output from the terminal OUT is also reversed; thus, output may be obtained from the terminal OUT through a switching unit (not shown) for reversing output.

Figure 3A:
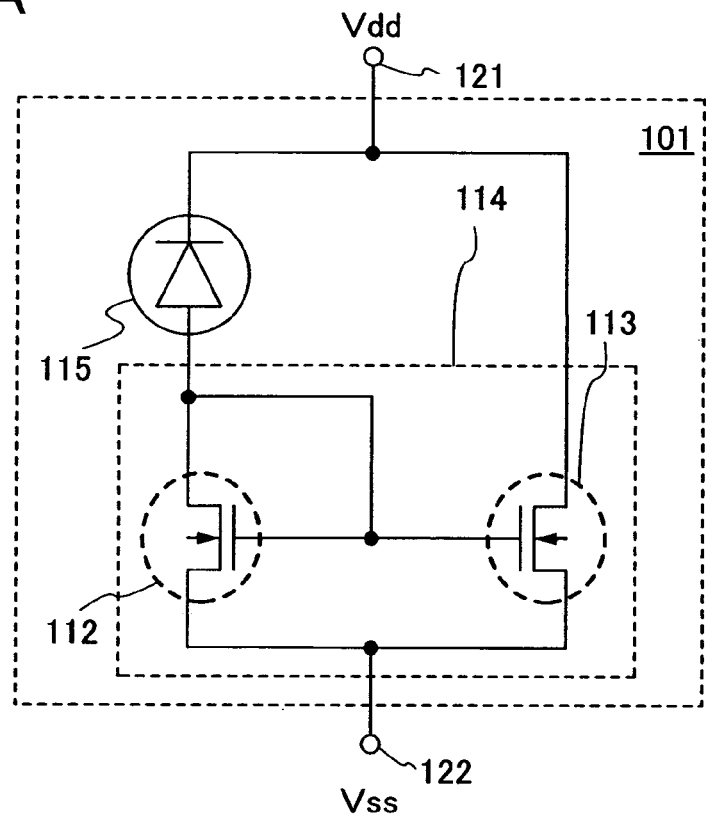
FIGS. 3A and 3B show a photoelectric conversion device of the invention.

Light detection in the case where voltage is applied to the photoelectric conversion device 101 by using the power supply 103a is described with reference to FIG. 3A in which the photoelectric conversion device 101 is extracted from the semiconductor device. Note that a potential Vdd is supplied to the terminal 121 connected to a positive electrode side of the power supply 103a, whereas a potential Vss is supplied to the terminal 122 connected to a negative electrode side. In this case, the first electrode of the thin film transistor 113 functions as a drain electrode, and the second electrode thereof functions as a source electrode. In an initial state where light is not irradiated, the thin film transistor 112 and the thin film transistor 113 are electrically disconnected.

Figure 4:
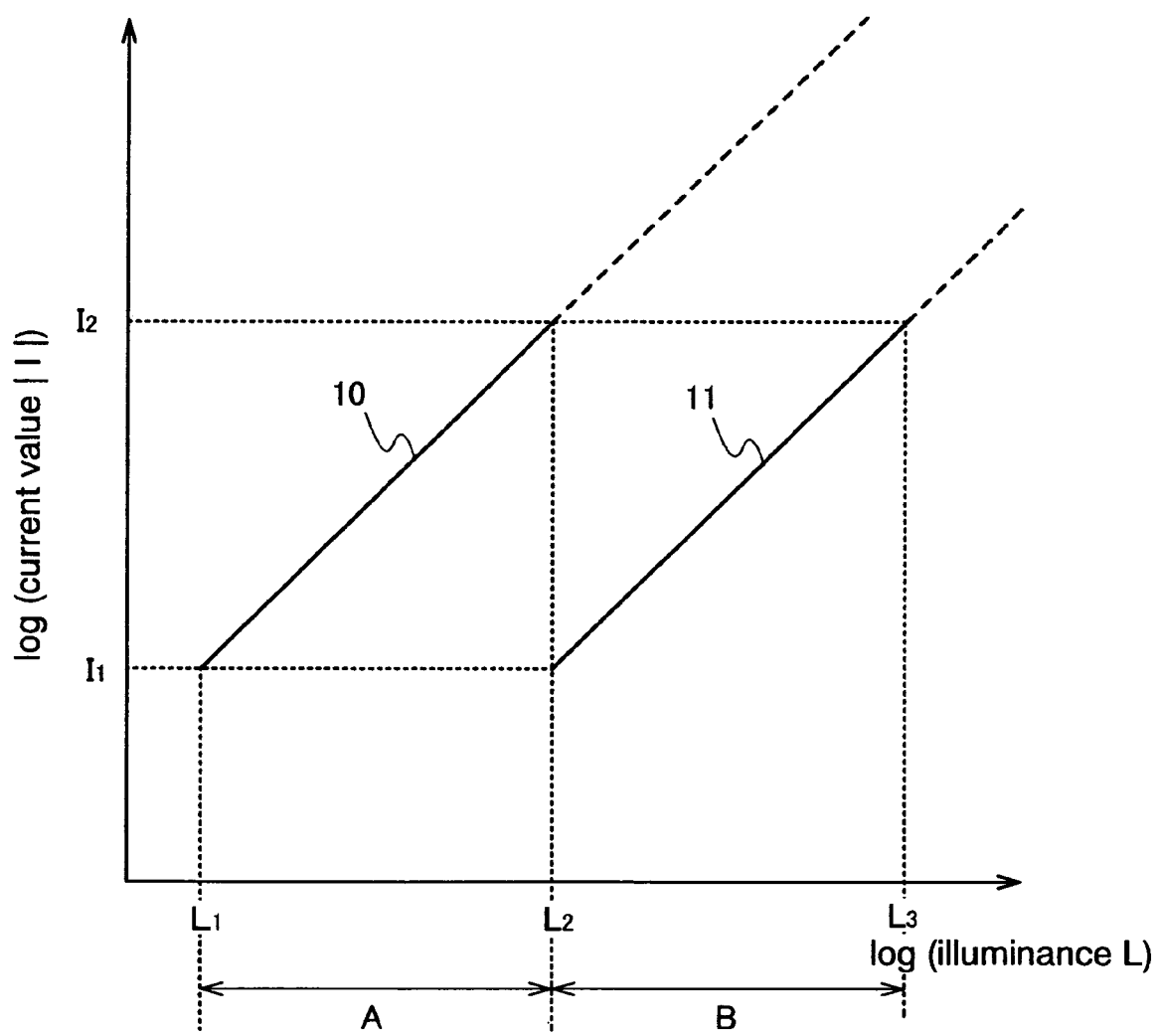
FIG. 4 illustrates dependence of output current of a photoelectric conversion device of the invention on illuminance.

When the photoelectric conversion element 115 is irradiated with light, current can be obtained as described above, the thin film transistor 112 becomes conductive, and current i flows to the thin film transistor 112. Note that in this case, the first electrode of the thin film transistor 112 is a drain electrode, the second electrode thereof is a source electrode, and the thin film transistor 112 is diode-connected. Further, a potential similar to those of the gate electrode and the source electrode of the thin film transistor 112 is supplied to each of the gate electrode and the source electrode of the thin film transistor 113; thus, the current i flows. Accordingly, a current value I of (2×i) can be obtained from the photoelectric conversion device 101. FIG. 4 (reference numeral 10 in FIG. 4) shows a relation of a current value |I| obtained from the photoelectric conversion device 101 (that is, output current |I|) with respect to illuminance at this time. In FIG. 4, the horizontal axis and the vertical axis represent illuminance L and a current value |I| which are expressed logarithmically, respectively. Note that the current value |I| denotes the absolute value of the current value I. When light is detected, if output voltage from the semiconductor device, that is, output voltage from the terminal OUT in FIG. 1A is set to V1 or higher and V2 or lower and a range of detectable current from the photoelectric conversion device 101 is set to $I_1$ or larger and $I_2$ or smaller, an illuminance range to be detected by the semiconductor device in the case of using the power supply 103a is $L_1$ or higher and $L_2$ or lower, that is, within a range A, as seen from FIG. 4.

Figure 3B:
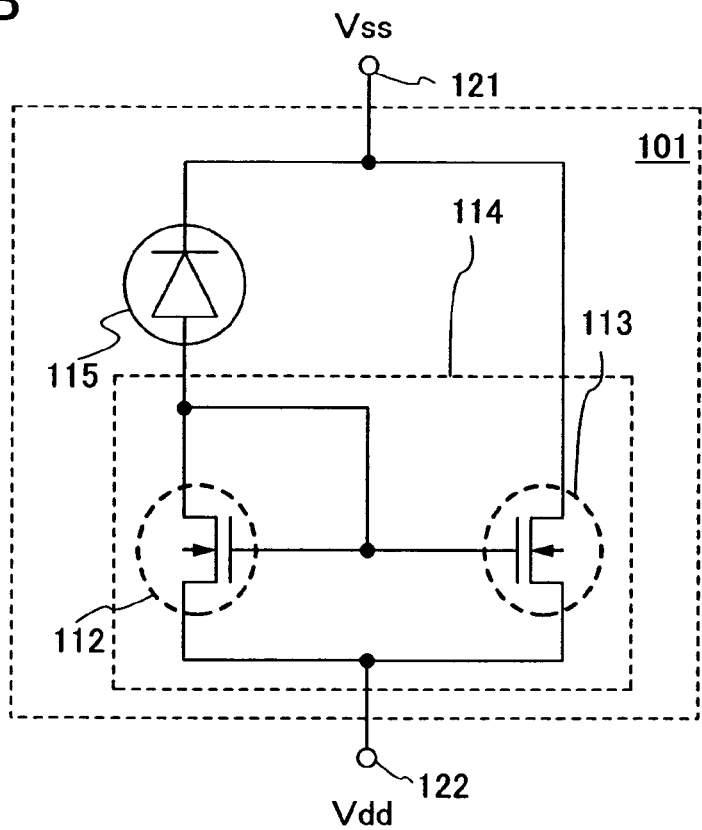

Next, the case where a predetermined level of illuminance at which the power supply 103 is switched by the bias switching unit 102 shown in FIG. 1A is $L_2$ is described. The power supply 103b is used by switching, and the photoelectric conversion device 101 in this case is shown in FIG. 3B. Note that a potential Vss is supplied to the terminal 121 connected to a negative electrode side of the power supply 103b and a potential Vdd is supplied to the terminal 122 connected to a positive electrode side thereof. That is, bias to be applied to the photoelectric conversion device 101 is reversed with respect to that in the case of the power supply 103a shown in FIG. 3A. In this case, the first electrode of the thin film transistor 113 functions as a source electrode, and the second electrode thereof functions as a drain electrode. In an initial state where the photoelectric conversion device 101 is not irradiated with light, the thin film transistor 112 and the thin film transistor 113 are electrically disconnected.

When the thin film transistor 112 is nonconductive and the photoelectric conversion element 115 is irradiated with light, open-circuit voltage Voc proportional to a logarithmic value of illuminance is generated. Accordingly, each potential of the first electrode and the gate electrode of the thin film transistor 112 and the gate electrode of the thin film transistor 113 connected thereto is Vss+Voc. Thus, gate-source voltage of the thin film transistor 113 becomes Voc, and the thin film transistor 113 becomes conductive. Accordingly, current i' flows to the thin film transistor 113. When Vdd>Vss+Voc is satisfied, the first electrode of the thin film transistor 112 is a source electrode, and the second electrode thereof is a drain electrode. Accordingly, since gate-source voltage Vgs of the thin film transistor 112 is 0, the thin film transistor 112 is nonconductive. Note that description is made under the condition that an off current of the thin film transistor 112 is not considered here.

Thus, the current value i' is obtained from the photoelectric conversion device 101. A relation of output current from the photoelectric conversion device 101 with respect to illuminance at this time is denoted by reference numeral 11 in FIG. 4.

As described above, in this embodiment mode, output voltage from the semiconductor device, that is, output voltage from the terminal OUT in FIG. 1A is set to $V_1$ or higher and $V_2$ or lower, and a range of current to be detected is set to $I_1$ or larger and $I_2$ or smaller. Accordingly, a range of illuminance to be detected in the photoelectric conversion device when the power supply 103b is used is $L_2$ or higher and $L_3$ is lower, that is, within a range B, as shown in FIG. 4.

By the reversal of bias to be applied to the photoelectric conversion device in such a manner, a wider range of illuminance can be detected without expansion of a range of output voltage or output current.

Figure 5:
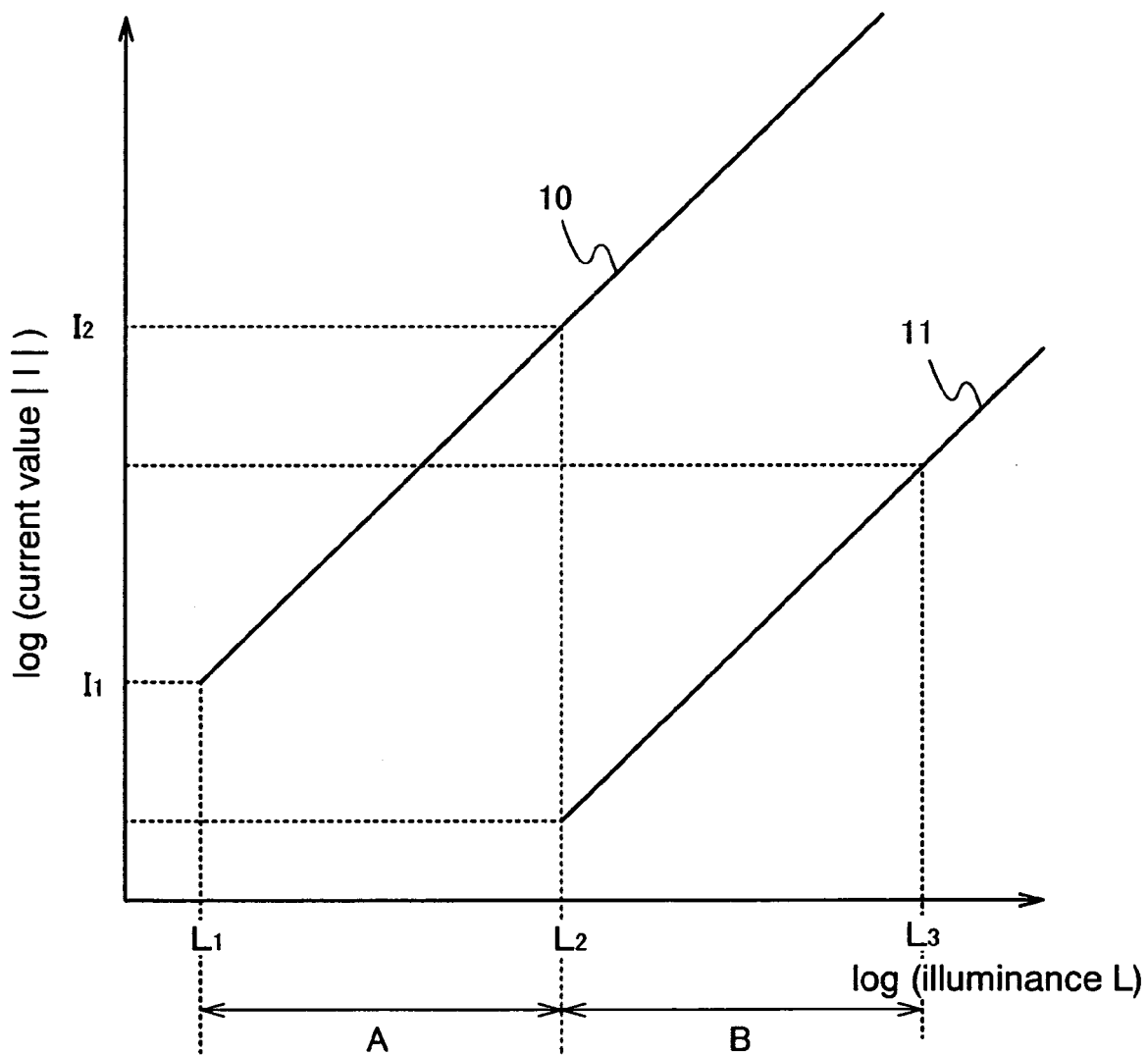
FIG. 5 illustrates dependence of output current of a photoelectric conversion device of the invention on illuminance.

Note that the case where the absolute value |I| of the current value obtained from the photoelectric conversion device 101 is $I_1$ or larger and $I_2$ or smaller in the illuminance range B is described in FIG. 4; however, there is the case where current values obtained in the ranges A and B differ significantly as shown in FIG. 5. In such a case, a range of output voltage is expanded, so that the photoelectric conversion device 101 is not easily used as a semiconductor device, and power consumption is increased.

As described above, for detection of illuminance, characteristics of the photoelectric conversion element 115 are used in the range A, and the open-circuit voltage Voc obtained from the photoelectric conversion element 115 and characteristics of the thin film transistor 112 are used in the range B. Thus, output current in the range B can be changed by changing characteristics of the thin film transistor. By control of the characteristics of the thin film transistor, output current can be obtained within a desired range in the range B; thus, ranges of output current in the ranges A and B can be more approximated. For example, when threshold voltage of the thin film transistor 113 is controlled, a relation of output current with respect to illuminance (the reference numeral 11 in FIG. 5) can be shifted to a vertical axis direction. In other words, a current value to be obtained with respect to illuminance can be significantly increased or decreased. For example, when the threshold voltage of the thin film transistor is changed to a positive direction, output current (the reference numeral 11 in FIG. 5) is shifted to a lower side, whereas when the threshold voltage is changed to a negative direction, the output current (the reference numeral 11 in FIG. 5) is shifted to a higher side. Note that a threshold of the thin film transistor is controlled under the condition that the thin film transistor is not a depletion transistor, that is, in a range where the thin film transistor is not normally on. As described above, output current can be set freely; thus, a wider range of illuminance can be detected without expansion of a range of output current and output voltage.

In addition, by controlling an S value (subthreshold swing) of the thin film transistor, a slope of a relation of output current with respect to illuminance (the reference numeral 11 in FIG. 5) can be set freely. For example, the slope of the reference numeral 11 in FIG. 5 can be small when the S value is large, whereas the slope of the reference numeral 11 in FIG. 5 can be large when the S value is small. Thus, a relation of output current with respect to illuminance in the range A and that in the range B can be the same or different. For example, in the latter case, when high illuminance is detected, illuminance dependency can be lowered compared with the case of low illuminance, and in such a case, a light detection range of a semiconductor device can be further expanded. Accordingly, a semiconductor device having desired illuminance dependency depending on a purpose can be obtained.

Figure 6:
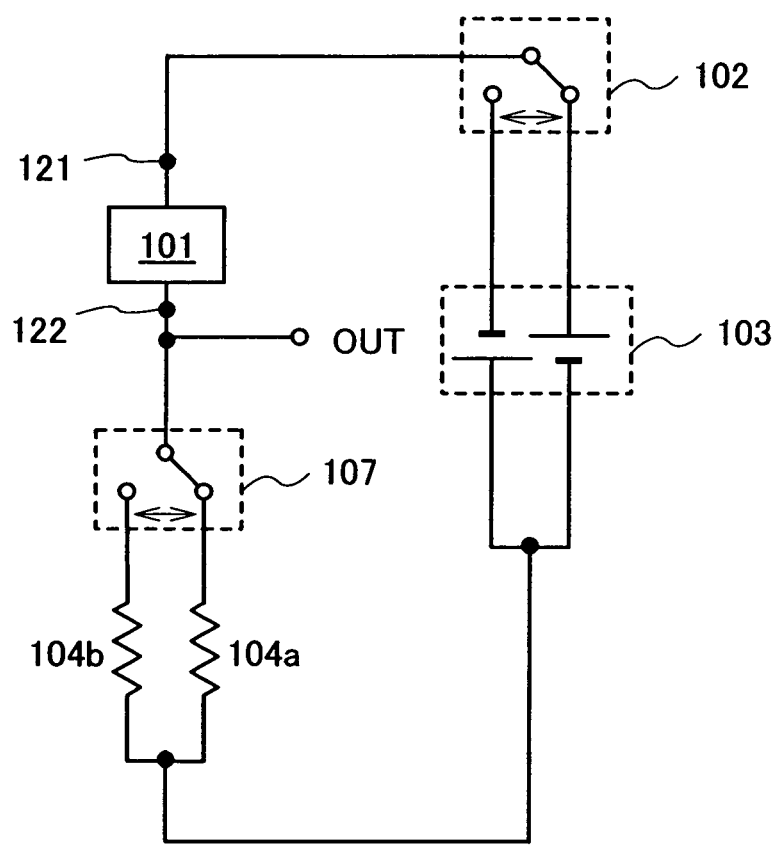
FIG. 6 shows a semiconductor device of the invention.

Further, as for a difference between output currents in the range A and the range B, ranges of output voltages may be the same by selecting a resistance value of a resistor connected to the photoelectric conversion device 101, that is, the resistor 104 in FIG. 1A, in accordance with the power supply 103. Specifically, as shown in FIG. 6, it is only necessary that a resistor 104a and a resistor 104b be switched by using a switching unit 107 which can perform switching at the same time as the bias switching unit 102, and current flowing through the photoelectric conversion device 101 is output as voltage from the terminal OUT.

Note that in the above description, for detection of illuminance, at a boundary of predetermined illuminance, characteristics of the photoelectric conversion element 115 are used in the range A, and the open-circuit voltage Voc obtained from photoelectric conversion element 115 and characteristics of the thin film transistor 112 are used in the range B. Instead, characteristics to be used may be interchanged at a predetermined level of illuminance. For example, in FIG. 4, in the range A, a current amplification factor of the current mirror circuit 114 is reduced so that the output current |I| obtained from the photoelectric conversion device 101 is reduced to 11, whereas in the range B, a threshold of the thin film transistor 113 is controlled so that the output current |I| is increased to the reference numeral 10 in FIG. 4. When a relation of output currents in the range A and the range B is interchanged in such a manner, in detecting illuminance, the open-circuit voltage Voc obtained from the photoelectric conversion element 115 and characteristics of the thin film transistor 112 can be used in the range A, and characteristics of the photoelectric conversion element 115 can be used in the range B.

Figure 7:
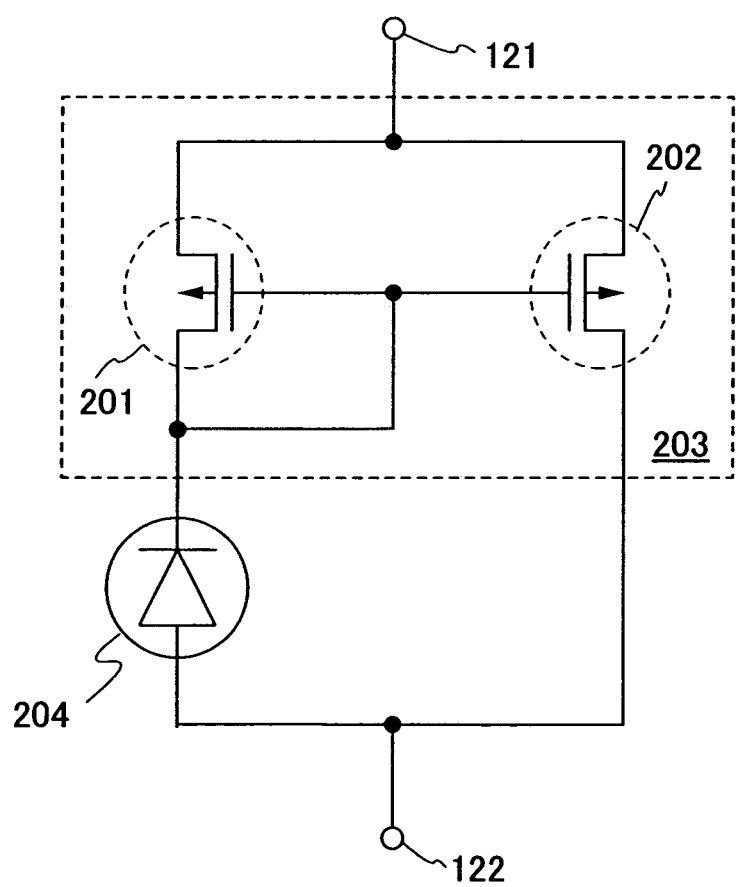
FIG. 7 shows a photoelectric conversion device of the invention.

Note that in this embodiment mode, an n-channel thin film transistor is used for each thin film transistor included in the current mirror circuit 114. Alternatively, a p-channel transistor may be used. FIG. 7 shows an example of an equivalent circuit diagram of a photoelectric conversion device when a p-channel thin film transistor is used for a current mirror circuit. In FIG. 7, a current mirror circuit 203 includes a thin film transistor 201 and a thin film transistor 202. The terminal 121 is connected to the terminal 122 through the thin film transistor 201 and a photoelectric conversion element 204. Further, the terminal 121 is connected to the terminal 122 through the thin film transistor 202. A gate electrode of the thin film transistor 202 is connected to a gate electrode of the thin film transistor 201 and a wiring connecting the thin film transistor 201 and the photoelectric conversion element 204. Note that a plurality of units, each of which refers to the thin film transistor 202, may be provided in parallel, similarly to FIG. 1B.

As described above, by the invention, a wider range of illuminance can be detected without expansion of a range of output voltage or output current by the reversal of bias to be applied to the photoelectric conversion device. Further, characteristics of the thin film transistor included in the photoelectric conversion device, such as a threshold value and an S value, are changed, so that a light detection range, output current, output voltage, and the like can be changed depending on a purpose.

Figure 1B:
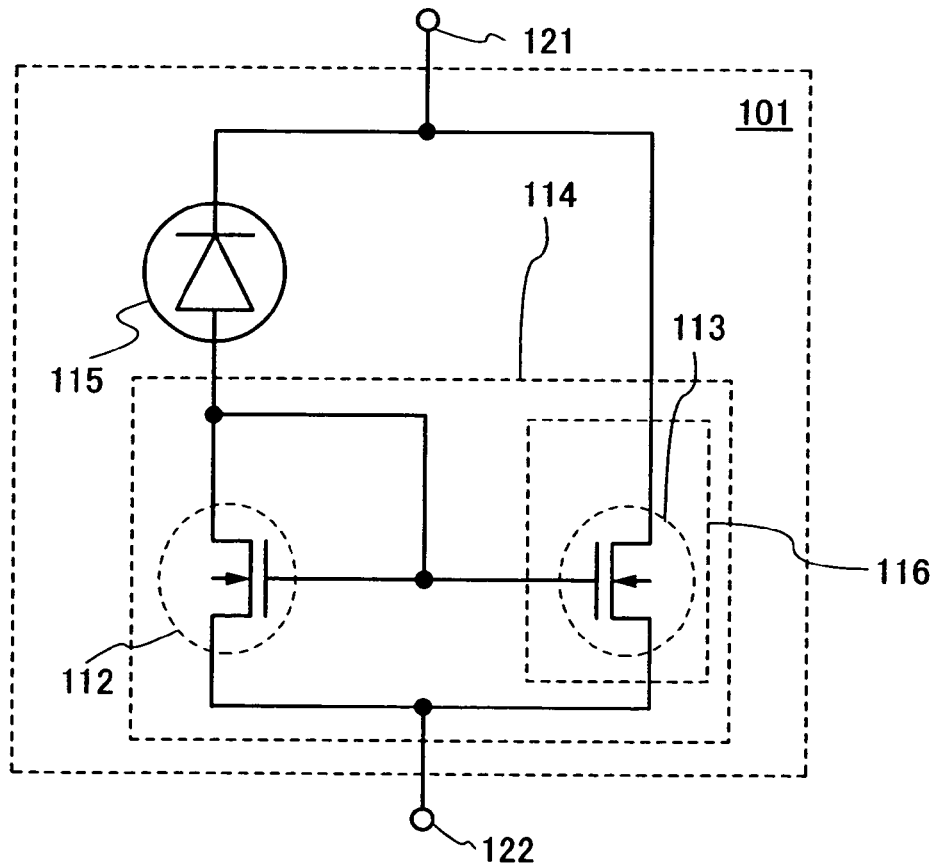
Figure 2:
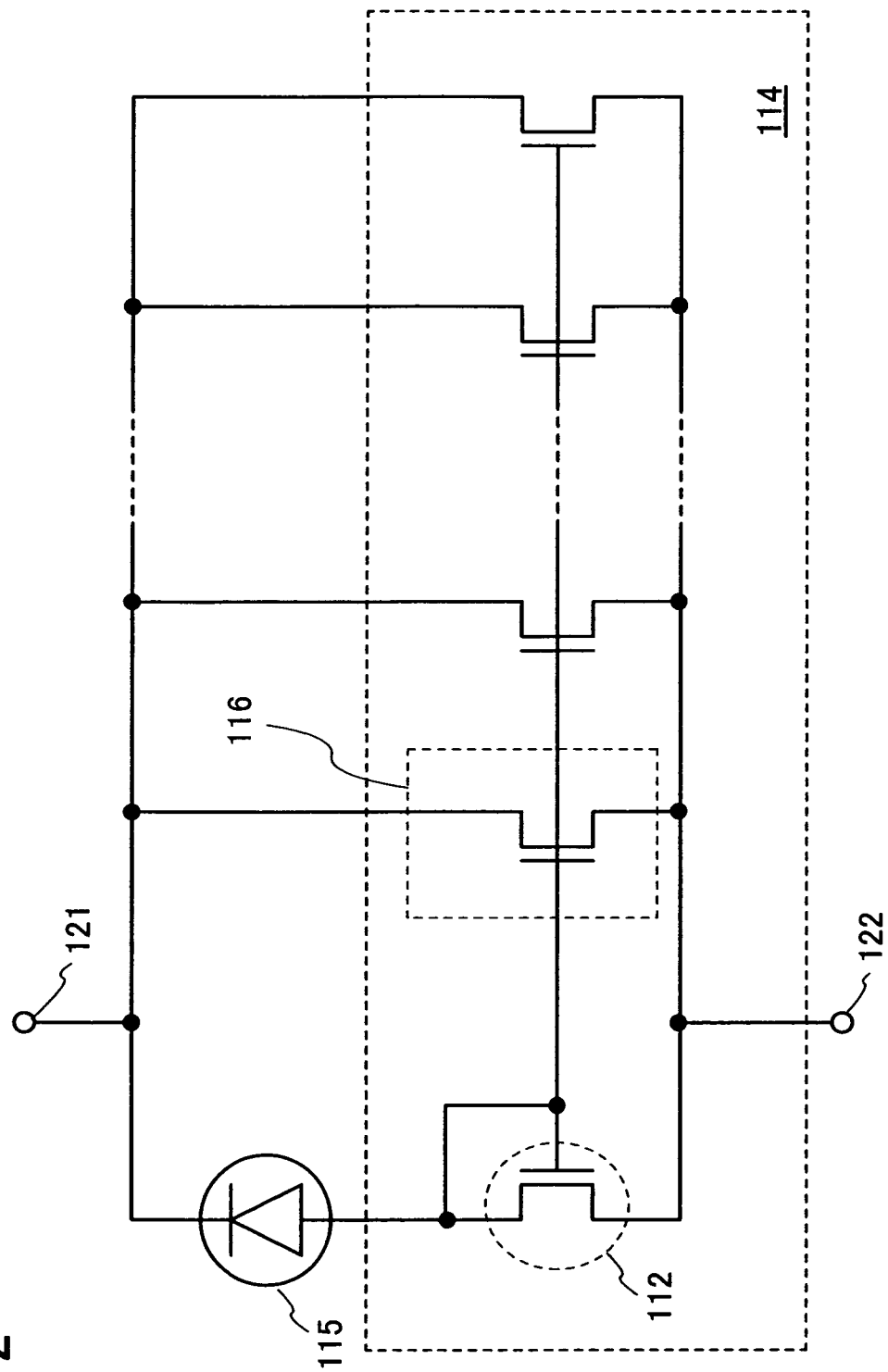
FIG. 2 shows a photoelectric conversion device of the invention.
Figure 8A:
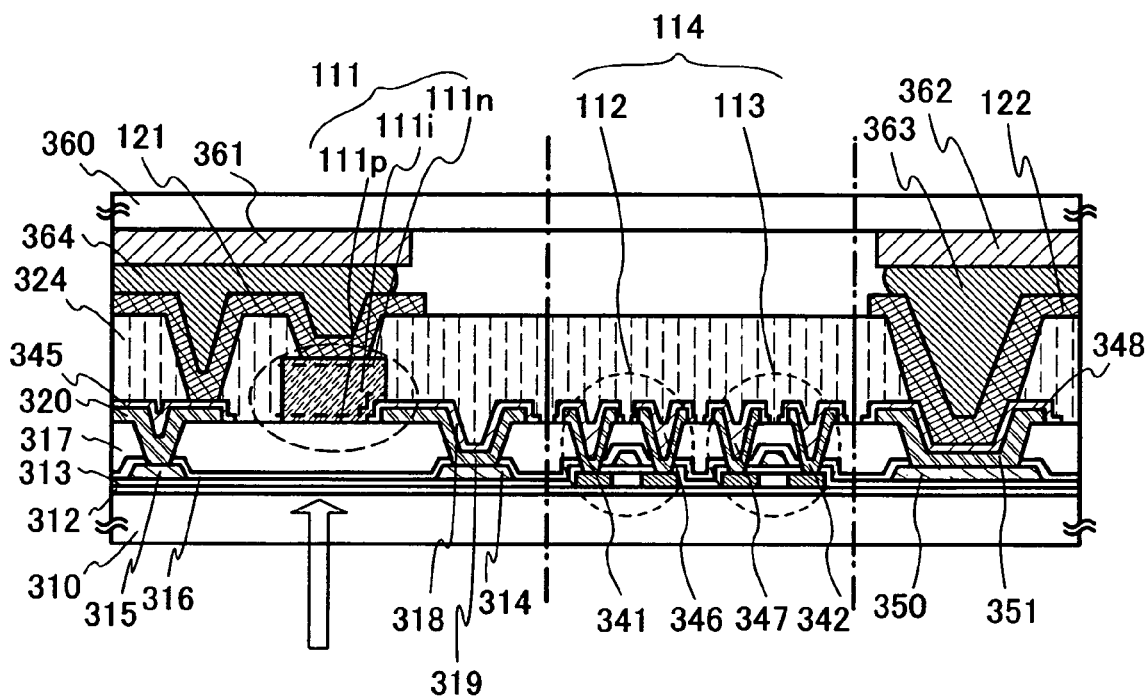
FIGS. 8A and 8B are cross-sectional views of semiconductor devices of the invention.
Figure 8B:
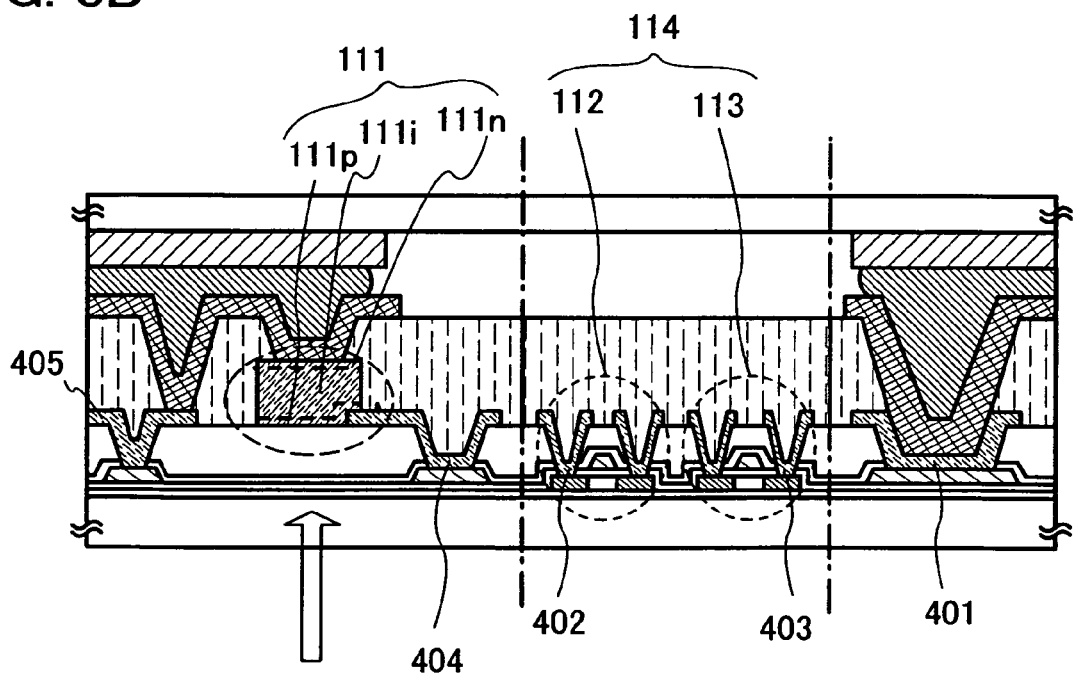

FIGS. 8A and 8B are cross-sectional views of structure examples of the photoelectric conversion device 101 shown in FIG. 1B.

In FIG. 8A, reference numeral 310 denotes a substrate, 312 denotes a base insulating film, and 313 denotes a gate insulating film. Since light to be detected passes through the substrate 310, the base insulating film 312, and the gate insulating film 313, a material having a high light-transmitting property is preferably used.

The photoelectric conversion element 115 in FIG. 1B includes a wiring 319, a protective electrode 318, a photoelectric conversion layer 111, and the terminal 121. Note that the photoelectric conversion layer 111 includes a p-type semiconductor layer 111p, an n-type semiconductor layer 111n, and an intrinsic (i-type) semiconductor layer 111i interposed between the p-type semiconductor layer 111p and the n-type semiconductor layer 111n. The photoelectric conversion element is not limited thereto, and it is only necessary to include a first conductive layer, a second conductive layer, and a photoelectric conversion layer interposed between these two conductive layers. Note also that the photoelectric conversion layer is not limited to the above structure, and it is only necessary to have a stacked-layer structure of a p-type semiconductor layer and an n-type semiconductor layer.

First, as the p-type semiconductor layer 111p, a semi-amorphous silicon film containing an impurity element belonging to Group 13, for example, boron (B) may be formed by a plasma CVD method. Alternatively, an impurity element belonging to Group 13 may be introduced after a semi-amorphous silicon film is formed.

Note that a semi-amorphous semiconductor film includes a semiconductor having an intermediate structure between an amorphous semiconductor film and a semiconductor film having a crystalline structure (including single crystal and polycrystal). The semi-amorphous semiconductor film is a semiconductor film having a third state which is stable in free energy, is a crystalline substance with a short-range order and lattice distortion, and can be dispersed in a non-single crystalline semiconductor film with a grain size of 0.5 to 20 nm. Raman spectrum of the semi-amorphous semiconductor film shifts to a wave number side lower than 520 cm$^{-1}$, and the diffraction peaks of (111) and (220) which are said to be derived from a silicon crystalline lattice are observed by X-ray diffraction. Further, the semi-amorphous semiconductor film contains hydrogen or halogen of at least 1 atomic % or more to terminate dangling bonds. In this specification, such a semiconductor film is referred to as a semi-amorphous semiconductor (SAS) film for convenience. When a rare gas element such as helium, argon, krypton, or neon is contained to further increase the lattice distortion, stability can be enhanced, and a favorable semi-amorphous semiconductor film can be obtained. Note that a microcrystalline semiconductor film (a microcrystal semiconductor film) is also included in the semi-amorphous semiconductor film.

In addition, the SAS film can be obtained by glow discharge decomposition of a gas containing silicon. As a typical gas containing silicon, $SiH_4$, or $Si_2H_6$, $SiH_2Cl_2$, $SiHCl_3$, $SiCl_4$, $SiF_4$, or the like can be used. Further, when the gas containing silicon is diluted with hydrogen or with a gas in which one or more of rare gas elements of helium, argon, krypton, and neon are added to hydrogen, the SAS film can be easily formed. The gas containing silicon is preferably diluted at a dilution ratio in the range of 2 to 1000 times. Further, a carbide gas such as $CH_4$ or $C_2H_6$; a germanium gas such as $GeH_4$ or $GeF_4$; $F_2$; or the like may be mixed into the gas containing silicon to adjust the energy bandwidth to be 1.5 to 2.4 eV or 0.9 to 1.1 eV.

After the p-type semiconductor layer 111p is formed, the semiconductor layer (referred to as an intrinsic semiconductor layer or an i-type semiconductor layer) 111i which does not contain an impurity imparting a conductivity type and the n-type semiconductor layer 111n are sequentially formed. Accordingly, the photoelectric conversion layer 111 including the p-type semiconductor layer 111p, the i-type semiconductor layer 111i, and the n-type semiconductor layer 111n is formed.

Note that in this specification, the i-type semiconductor layer refers to a semiconductor layer in which the concentration of an impurity imparting p-type or n-type conductivity is $1 \times 10^{20}$ cm$^{-3}$ or less and the concentration of oxygen and nitrogen is $5 \times 10^{19}$ cm$^{-3}$ or less. Note that photoconductivity is preferably 1000 times or more higher than dark conductivity. In addition, 10 to 1000 ppm of boron (B) may be added to the i-type semiconductor layer.

As the i-type semiconductor layer 111i, a semi-amorphous silicon film may be formed by a plasma CVD method, for example. Further, as the n-type semiconductor layer 111n, a semi-amorphous silicon film containing an impurity element belonging to Group 15, for example, phosphorus (P) may be formed, or alternatively, an impurity element belonging to Group 15 may be introduced after the semi-amorphous silicon film is formed.

As the p-type semiconductor layer 111p, the i-type semiconductor layer 111i, and the n-type semiconductor layer 111n, an amorphous semiconductor film may be used as well as a semi-amorphous semiconductor film.

Each of the wiring 319, a connection electrode 320, a terminal electrode 351, a source or drain electrode 341 of the thin film transistor 112 and a source or drain electrode 342 of the thin film transistor 113 has a stacked-layer structure of a high melting point metal film and a low resistance metal film (such as an aluminum alloy or pure aluminum). Here, the wiring and these electrodes each have a three-layer structure in which a titanium film (a Ti film), an aluminum film (an Al film), and a Ti film are sequentially stacked.

Moreover, protective electrodes 318, 345, 348, 346 and 347 are formed to cover the wiring 319, the connection electrode 320, the terminal electrode 351, the source or drain electrode 341 of the thin film transistor 112, and the source or drain electrode 342 of the thin film transistor 113, respectively.

The protective electrodes protect the wiring 319 and the like in an etching step for forming the photoelectric conversion layer 111. As a material for the protective electrode 318, a conductive material having slower etching speed than that of the photoelectric conversion layer to an etching gas (or an etchant) for the photoelectric conversion layer 111 is preferable. Further, a conductive material which does not become an alloy by reaction with the photoelectric conversion layer 111 is preferable as the material for the protective electrode 318. Note that the other protective electrodes 345, 348, 346, and 347 are also formed of a material and by a manufacturing step similar to the protective electrode 318.

Alternatively, a structure in which the protective electrodes 318, 345, 348, 346, and 347 are not formed may be employed. FIG. 8B shows an example in which these protective electrodes are not formed. In FIG. 8B, each of a wiring 404, a connection electrode 405, a terminal electrode 401, a source or drain electrode 402 of the thin film transistor 112, and a source or drain electrode 403 of the thin film transistor 113 is formed of a single-layer conductive film. As such a conductive film, a titanium film (a Ti film) is preferably used. Instead of the titanium film, a single-layer film formed from an element selected from tungsten (W), tantalum (Ta), molybdenum (Mo), neodymium (Nd), cobalt (Co), zirconium (Zr), zinc (Zn), ruthenium (Ru), rhodium (Rh), palladium (Pd), osmium (Os), iridium (Ir) and platinum (Pt), or an alloy material or a compound material containing the above element as its main component; a single-layer film formed from nitride of the above element, for example, titanium nitride, tungsten nitride, tantalum nitride, or molybdenum nitride; or a stacked-layer film of the above elements can be used. Each of the wiring 404, the connection electrode 405, the terminal electrode 401, the source or drain electrode 402 of the thin film transistor 112, and the source or drain electrode 403 of the thin film transistor 113 is formed of a single-layer film, so that the number of times of film formation can be reduced in a manufacturing process.

FIGS. 8A and 8B show examples of a top-gate thin film transistor having a structure in which the n-channel thin film transistors 112 and 113 each include one channel formation region (in this specification, referred to as a single gate structure). Alternatively, a structure where a plurality of channel formation regions are formed may be used to reduce variation in on current values. Further, in order to reduce an off current value, lightly doped drain (LDD) regions may be provided in the n-channel thin film transistors 112 and 113. The LDD region refers to a region to which an impurity element is added at low concentration between a channel formation region and a source region or a drain region which is formed by being added with an impurity element at high concentration. By provision of the LDD regions, effects that an electric field in the vicinity of the drain region is reduced and deterioration due to hot carrier injection is prevented can be obtained.

In addition, in order to prevent deterioration of the on current value due to hot carriers, the n-channel thin film transistors 112 and 113 may have a structure in which an LDD region and a gate electrode overlap with each other with a gate insulating film interposed therebetween (in this specification, referred to as a GOLD (gate-drain overlapped LDD) structure). When a GOLD structure is used, effects that an electric field in the vicinity of a drain region is reduced and deterioration due to hot carrier injection is prevented are more enhanced than the case where an LDD region and a gate electrode do not overlap with each other. With such a GOLD structure, electric field intensity in the vicinity of the drain region is reduced and hot carrier injection is prevented; thus, it is effective for prevention of deterioration.

The thin film transistors 112 and 113 included in the current mirror circuit may be a bottom-gate thin film transistor, for example, an inversely staggered thin film transistor, without being limited to the top-gate thin film transistor described above.

A wiring 314 is connected to the wiring 319, and also serves as a gate electrode by being extended above the channel formation region of the thin film transistor 113 in the amplifier circuit.

A wiring 315 is connected to the terminal 121 connected to the n-type semiconductor layer 111n through the connection electrode 320 and the protective electrode 345, and is connected to one of a drain wiring (also referred to as a drain electrode) and a source wiring (also referred to as a source electrode) of the thin film transistor 113.

Since light to be detected passes through interlayer insulating films 316 and 317, a material having a high light-transmitting property is preferably used for the insulating films 316 and 317. Note that for the insulating film 317, an inorganic material such as a silicon oxide (SiOx) film is preferably used so that fixing intensity is improved. For a sealing layer 324, an inorganic material is preferably used, and the insulating film can be formed by a CVD method or the like.

A terminal electrode 350 is formed in the same step as the wirings 314 and 315, and the terminal electrode 351 is formed in the same step as the wiring 319 and the connection electrode 320. Note that the terminal 122 is connected to the terminal electrode 350 through the protective electrode 348 and the terminal electrode 351.

Note that the terminal 121 is mounted on an electrode 361 of a substrate 360 by a solder 364. The terminal 122 is formed in the same step as the terminal 121, and is mounted on an electrode 362 of the substrate 360 by a solder 363.

In FIGS. 8A and 8B, light enters the photoelectric conversion layer 111 from the substrate 310 side as shown by arrows in each drawing. Accordingly, current is generated, and the light can be detected.

In such a photoelectric conversion device, bias to be applied is reversed, so that a wide range of illuminance can be detected without expansion of a range of output voltage or output current. Further, characteristics of a thin film transistor included in the photoelectric conversion device, such as a threshold value and an S value, are changed, so that a light detection range, output voltage, or the like can be changed depending on a purpose.

Here, a method of manufacturing the photoelectric conversion device shown in FIG. 8A is hereinafter described with reference to FIGS. 9A to 9D, 10A to 10C, 11A to 11C, 12, and 13.

First, an element is formed over a substrate (the first substrate 310). Here, AN100, which is one of glass substrates, is used as the substrate 310.

Next, a silicon oxide film containing nitrogen (with a thickness of 100 nm) to be the base insulating film 312 is formed by a plasma CVD method, and further, a semiconductor film such as an amorphous silicon film containing hydrogen (with a thickness of 54 nm) is stacked without being exposed to the atmosphere. Alternatively, the base insulating film 312 may have a stacked-layer structure using a silicon oxide film, a silicon nitride film, and a silicon oxide film containing nitrogen. For example, a film in which a silicon nitride film containing oxygen with a thickness of 50 nm and a silicon oxide film containing nitrogen with a thickness of 100 nm are stacked may be formed as the base insulating film 312. Note that the silicon oxide film containing nitrogen and the silicon nitride film function as a blocking layer which prevents diffusion of an impurity such as an alkali metal from the glass substrate.

Next, the amorphous silicon film is crystallized by a solid phase growth method, a laser crystallization method, a crystallization method using a catalytic metal, or the like to form a semiconductor film having a crystalline structure (a crystalline semiconductor film), for example, a polycrystalline silicon film. Here, a polycrystalline silicon film is obtained by a crystallization method using a catalytic element. First, a nickel acetate solution containing nickel of 10 ppm by weight is added by a spinner. Note that a nickel element may be dispersed over the entire surface by a sputtering method instead of addition of the nickel acetate solution. Then, heat treatment is performed for crystallization to form a semiconductor film having a crystalline structure. Here, a polycrystalline silicon film is obtained by heat treatment for crystallization (at 550° C. for four hours) after the heat treatment (at 500° C. for one hour).

Next, an oxide film on a surface of the polycrystalline silicon film is removed by a dilute hydrofluoric acid or the like. Thereafter, irradiation with laser light (XeCl: a wavelength of 308 nm) in order to increase a crystallization rate in the polycrystalline silicon film and repair defects left in crystal grains is performed in the atmosphere or in an oxygen atmosphere.

As the laser light, excimer laser light with a wavelength of 400 nm or less, or a second harmonic or a third harmonic of a YAG laser is used. Here, pulse laser light with a repetition frequency of approximately 10 to 1000 Hz is used. The pulse laser light is condensed to 100 to 500 mJ/cm$^2$ by an optical system, irradiation is performed with an overlap rate of 90 to 95%, and a surface of the silicon film is scanned. In this embodiment mode, irradiation with laser light having a repetition frequency of 30 Hz and an energy density of 470 mJ/cm$^2$ is performed in the atmosphere.

Since laser light irradiation is performed in the atmosphere or in an oxygen atmosphere, an oxide film is formed on the surface by the laser light irradiation. Note that although an example where the pulse laser is used is shown in this embodiment mode, a continuous wave laser may be used. In order to obtain crystal with large grain size when a semiconductor film is crystallized, it is preferable to use a solid laser which is capable of continuous oscillation and to apply second to fourth harmonics of a fundamental wave. Typically, a second harmonic (532 nm) or a third harmonic (355 nm) of an Nd:YVO$_4$ laser (a fundamental wave of 1064 nm) may be employed.

When a continuous wave laser is used, laser light emitted from a continuous wave YVO$_4$ laser of 10 W output is converted into a harmonic by a non-linear optical element. Alternatively, there is a method by which YVO$_4$ crystal and a non-linear optical element are put in an oscillator and a high harmonic is emitted. Then, the laser light is preferably formed having a rectangular shape or an elliptical shape on an irradiation surface by an optical system, and emitted to an object to be processed. At this time, an energy density of approximately 0.01 to 100 MW/cm$^2$ (preferably, 0.1 to 10 MW/cm$^2$) is necessary. The semiconductor film may be moved at a rate of approximately 10 to 2000 cm/s relatively with respect to the laser light so as to be irradiated.

Next, in addition to the oxide film formed by the above laser light irradiation, a barrier layer formed of an oxide film having a thickness of 1 to 5 nm in total is formed by treatment of the surface with ozone water for 120 seconds. The barrier layer is formed in order to remove the catalytic element added for crystallization, for example, nickel (Ni) from the film. Although the barrier layer is formed using ozone water here, the barrier layer may be formed by deposition of an oxide film having a thickness of approximately 1 to 10 nm by a method of oxidizing a surface of the semiconductor film having a crystalline structure by ultraviolet irradiation in an oxygen atmosphere; a method of oxidizing a surface of the semiconductor film having a crystalline structure by oxygen plasma treatment; a plasma CVD method; a sputtering method; an evaporation method; or the like. Alternatively, the oxide film formed by the laser light irradiation may be removed before the barrier layer is formed.

Then, an amorphous silicon film containing an argon element which serves as a gettering site is formed having a thickness of 10 to 400 nm, here a thickness of 100 nm, over the barrier layer by a sputtering method. Here, the amorphous silicon film containing the argon element is formed under an atmosphere containing argon with the use of a silicon target. When the amorphous silicon film containing the argon element is formed by a plasma CVD method, deposition conditions are as follows: a flow ratio of monosilane to argon ($SiH_4$:Ar) is 1:99, deposition pressure is set to be 6.665 Pa, RF power density is set to be 0.087 W/cm$^2$, and deposition temperature is set to be 350° C.

Thereafter, heat treatment in a furnace heated at 650° C. is performed for three minutes to remove (getter) the catalytic element. Thus, the catalytic element concentration in the semiconductor film having a crystalline structure is reduced. A lamp annealing device may be used instead of the furnace.

Next, the amorphous silicon film containing the argon element, which is the gettering site, is selectively removed using the barrier layer as an etching stopper, and thereafter, the barrier layer is selectively removed with a diluted hydrofluoric acid. Note that nickel tends to move to a region having high oxygen concentration at the time of gettering; thus, it is preferable that the barrier layer formed of the oxide film be removed after gettering.

Note that when crystallization of the semiconductor film with the use of a catalytic element is not performed, the above steps such as formation of the barrier layer, formation of the gettering site, heat treatment for gettering, removal of the gettering site, and removal of the barrier layer are not necessary.

Then, a thin oxide film is formed on the surface of the obtained semiconductor film having a crystalline structure (e.g., a crystalline silicon film) with ozone water. Thereafter, a mask made of a resist is formed using a first photomask, and etching treatment is performed to obtain a desired shape, and semiconductor films 331 and 332 separated into island shapes (in this specification, referred to as island-shaped semiconductor films) (see FIG. 9A). After the island-shaped semiconductor films 331 and 332 are formed, the mask made of the resist is removed.

Next, a very small amount of an impurity element (boron or phosphorus) is doped in order to control a threshold value of a thin film transistor, as needed. Here, diborane ($B_2H_6$) is used as a source gas, and an ion doping method is used in which the impurity element excited by plasma is doped without mass separation.

Then, the oxide film is removed with an etchant containing a hydrofluoric acid, and at the same time, the surfaces of the island-shaped semiconductor films 331 and 332 are washed. Thereafter, an insulating film containing silicon as its main component, which serves as the gate insulating film 313, is formed. Here, a silicon oxide film containing nitrogen (a composition ratio: Si=32%, O=59%, N=7%, and H=2%) is formed having a thickness of 115 nm by a plasma CVD method.

Figure 9A:
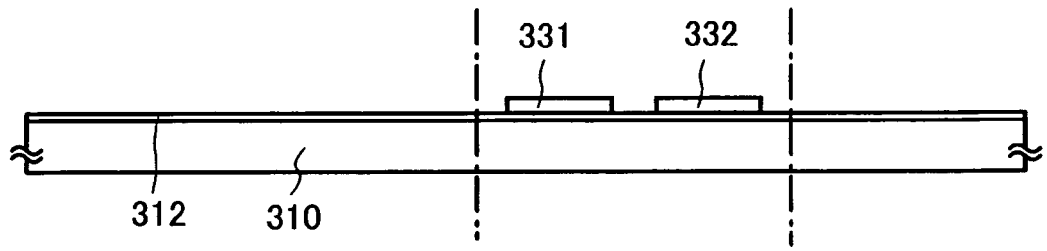
FIGS. 9A to 9D show manufacturing steps of a semiconductor device of the invention.
Figure 9B:
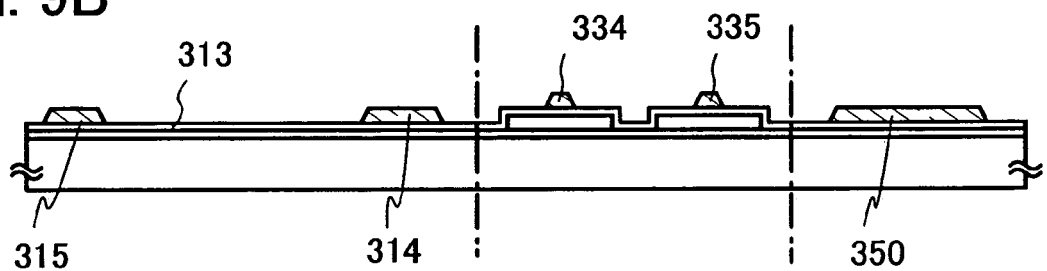

Next, after a metal film is formed over the gate insulating film 313, gate electrodes 334 and 335, the wirings 314 and 315, and the terminal electrode 350 are formed using a second photomask (see FIG. 9B). As the metal film, a film in which a tantalum nitride film of 30 nm and a tungsten (W) film of 370 nm are stacked is used, for example.

As the gate electrodes 334 and 335, the wirings 314 and 315, and the terminal electrode 350, as well as the aforementioned films, a single-layer film formed from an element selected from titanium (Ti), tungsten (W), tantalum (Ta), molybdenum (Mo), neodymium (Nd), cobalt (Co), zirconium (Zr), zinc (Zn), ruthenium (Ru), rhodium (Rh), palladium (Pd), osmium (Os), iridium (Ir), platinum (Pt), aluminum (Al), gold (Au), silver (Ag), and copper (Cu), or an alloy material or a compound material containing the above element as its main component; a single-layer film formed from nitride of the above element, for example, titanium nitride, tungsten nitride, tantalum nitride, or molybdenum nitride; or a stacked-layer film of the above elements can be used.

Figure 9C:
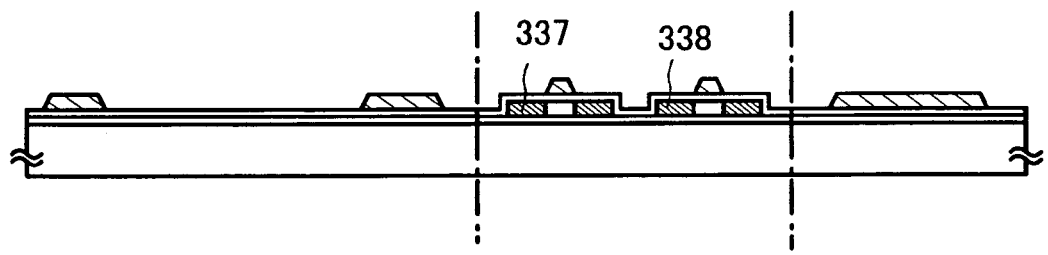

Then, an impurity imparting one conductivity type is introduced into the island-shaped semiconductor films 331 and 332 to form a source or drain region 337 of the thin film transistor 112 and a source or drain region 338 of the thin film transistor 113 (see FIG. 9C). In this embodiment mode, an n-channel thin film transistor is formed, and an n-type impurity such as phosphorus (P) or arsenic (As) is introduced into the island-shaped semiconductor films 331 and 332.

Next, after a first interlayer insulating film (not shown) including a silicon oxide film is formed having a thickness of 50 nm by a CVD method, a step of activating the impurity element added to the island-shaped semiconductor films is performed. The activation step is performed by a rapid thermal annealing method (an RTA method) using a lamp light source; an irradiation method with a YAG laser or an excimer laser from the back side; heat treatment using a furnace; or a method which is a combination of any of these methods.

Then, the second interlayer insulating film 316 including a silicon nitride film containing hydrogen and oxygen is formed having a thickness of 10 nm, for example.

Figure 9D:
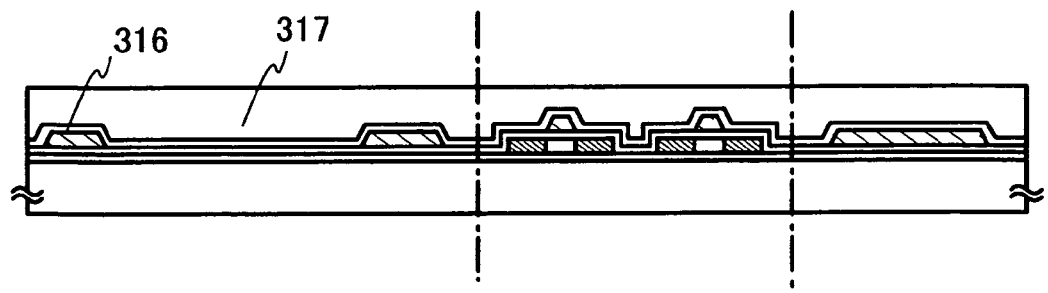

Next, the third interlayer insulating film 317 made of an insulating material is formed over the second interlayer insulating film 316 (see FIG. 9D). An insulating film obtained by a CVD method can be used for the third interlayer insulating film 317. In this embodiment mode, in order to improve fixing intensity, a silicon oxide film containing nitrogen is formed having a thickness of 900 nm as the third interlayer insulating film 317.

Then, heat treatment (heat treatment at 300 to 550° C. for 1 to 12 hours, for example, at 410° C. for 1 hour in a nitrogen atmosphere) is performed to hydrogenate the island-shaped semiconductor films. This step is performed to terminate a dangling bond of the island-shaped semiconductor films by hydrogen contained in the second interlayer insulating film 316. Note that the island-shaped semiconductor films can be hydrogenated regardless of whether or not the gate insulating film 313 is formed.

In addition, as the third interlayer insulating film 317, an insulating film using siloxane or a stacked-layer structure thereof may be used. Siloxane has a skeleton structure of a bond of silicon (Si) and oxygen (O). An organic group containing at least hydrogen (e.g., an alkyl group or aromatic hydrocarbon) is used as a substituent. Alternatively, a fluoro group may be included in a substituent.

When an insulating film using siloxane or a stacked-layer structure thereof is used as the third interlayer insulating film 317, it is also possible that heat treatment to hydrogenate the island-shaped semiconductor films is performed after formation of the second interlayer insulating film 316, and then, the third interlayer insulating film 317 is formed.

Next, a mask made of a resist is formed using a third photomask, and the first interlayer insulating film, the second interlayer insulating film 316, the third interlayer insulating film 317, and the gate insulating film 313 are selectively etched to form a contact hole. Then, the mask made of the resist is removed.

Note that the third interlayer insulating film 317 may be formed as needed. When the third interlayer insulating film 317 is not formed, the first interlayer insulating film, the second interlayer insulating film 316, and the gate insulating film 313 are selectively etched to form a contact hole after the second interlayer insulating film 316 is formed.

Next, after a metal stacked-layer film is formed by a sputtering method, a mask made of a resist is formed using a fourth photomask, and then, the metal film is selectively etched to form the wiring 319, the connection electrode 320, the terminal electrode 351, the source or drain electrode 341 of the thin film transistor 112, and the source or drain electrode 342 of the thin film transistor 113. Then, the mask made of the resist is removed. Note that the metal film in this embodiment mode is a stacked-layer film of a Ti film with a thickness of 100 nm, an Al film containing a very small amount of Si with a thickness of 350 nm, and a Ti film with a thickness of 100 nm.

In addition, as shown in FIG. 8B, when each of the wiring 404, the connection electrode 405, the terminal electrode 401, the source or drain electrode 402 of the thin film transistor 112, and the source or drain electrode 403 of the thin film transistor 113 is formed of a single-layer conductive film, a titanium film (Ti film) is preferable in terms of heat resistance, conductivity, and the like. Further, instead of the titanium film, a single-layer film formed from an element selected from tungsten (W), tantalum (Ta), molybdenum (Mo), neodymium (Nd), cobalt (Co), zirconium (Zr), zinc (Zn), ruthenium (Ru), rhodium (Rh), palladium (Pd), osmium (Os), iridium (Ir), and platinum (Pt), or an alloy material or a compound material containing the above element as its main component; a single-layer film formed from nitride of the above element, for example, titanium nitride, tungsten nitride, tantalum nitride, or molybdenum nitride; or a stacked-layer film of the above elements may be used. Each of the wiring 404, the connection electrode 405, the terminal electrode 401, the source or drain electrode 402 of the thin film transistor 112, and the source or drain electrode 403 of the thin film transistor 113 is formed of a single-layer film, so that the number of times of film formation can be reduced in the manufacturing process.

The top-gate thin film transistors 112 and 113 using the polycrystalline silicon film can be formed through the process described above. Note that S values of the thin film transistors 112 and 113 can be changed depending on crystallinity of the semiconductor film and an interface state between the semiconductor film and the gate insulating film.

Figure 10A:
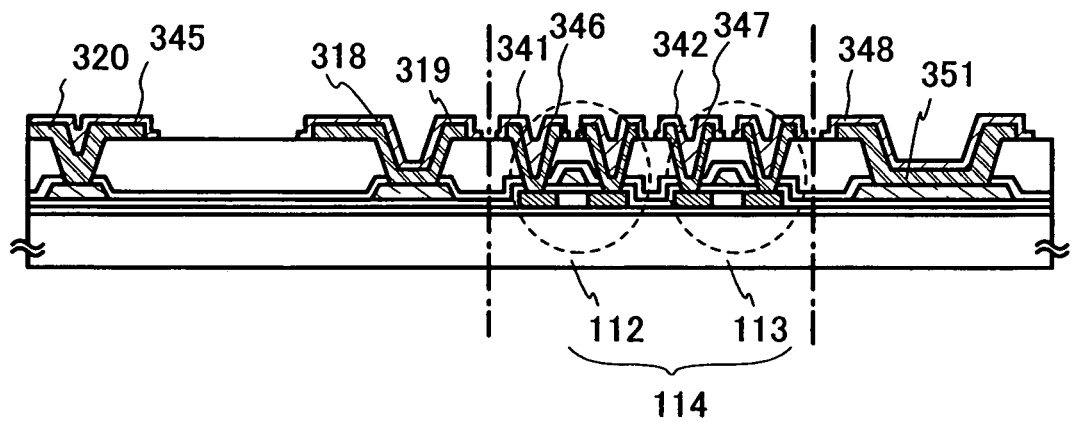
FIGS. 10A to 10C show manufacturing steps of a semiconductor device of the invention.

Next, after formation of a conductive metal film (such as titanium (Ti) or molybdenum (Mo)) which is not likely to be an alloy by reacting with a photoelectric conversion layer (typically, amorphous silicon) which is formed later, a mask made of a resist is formed using a fifth photomask, and then, the conductive metal film is selectively etched to form the protective electrode 318 which covers the wiring 319 (see FIG. 10A). Here, a Ti film having a thickness of 200 nm obtained by a sputtering method is used. Note that the connection electrode 320, the terminal electrode 351, and the source electrode and the drain electrode of the thin film transistor are covered with a conductive metal film similar to the protective electrode 318. Accordingly, the conductive metal film also covers a side surface where the second Al films in these electrodes are exposed, so that the conductive metal film also can prevent diffusion of an aluminum atom to the photoelectric conversion layer.

Note that when each of the wiring 319, the connection electrode 320, the terminal electrode 351, the source or drain electrode 341 of the thin film transistor 112, and the source or drain electrode 342 of the thin film transistor 113 is formed of a single-layer conductive film, that is, as shown in FIG. 8B, when the wiring 404, the connection electrode 405, the terminal electrode 401, the source or drain electrode 402 of the thin film transistor 112, and the source or drain electrode 403 of the thin film transistor 113 are formed instead of these electrodes or the wiring, the protective electrode 318 is not necessarily formed.

Then, the photoelectric conversion layer 111 including the p-type semiconductor layer 111p, the i-type semiconductor layer 111i, and the n-type semiconductor layer 111n is formed over the third interlayer insulating film 317.

The p-type semiconductor layer 111p may be formed by deposition of a semi-amorphous silicon film containing an impurity element belonging to Group 13, for example, boron (B) by a plasma CVD method. Alternatively, an impurity element belonging to Group 13 may be introduced after a semi-amorphous silicon film is formed.

Note that the wiring 319 and the protective electrode 318 are in contact with the bottom layer of the photoelectric conversion layer 111, in this embodiment mode, the p-type semiconductor layer 111p.

After the p-type semiconductor layer 111p is formed, the i-type semiconductor layer 111i and the n-type semiconductor layer 111n are sequentially formed. Accordingly, the photoelectric conversion layer 111 including the p-type semiconductor layer 111p, the i-type semiconductor layer 111i, and the n-type semiconductor layer 111n is formed.

As the i-type semiconductor layer 111i, a semi-amorphous silicon film may be formed by a plasma CVD method, for example. Further, as the n-type semiconductor layer 111n, a semi-amorphous silicon film containing an impurity element belonging to Group 15, for example, phosphorus (P) may be formed, or after a semi-amorphous silicon film is formed, an impurity element belonging to Group 15 may be introduced.

As the p-type semiconductor layer 111p, the i-type semiconductor layer 111i, and the n-type semiconductor layer 111n, an amorphous semiconductor film may be used as well as a semi-amorphous semiconductor film.

Figure 10B:
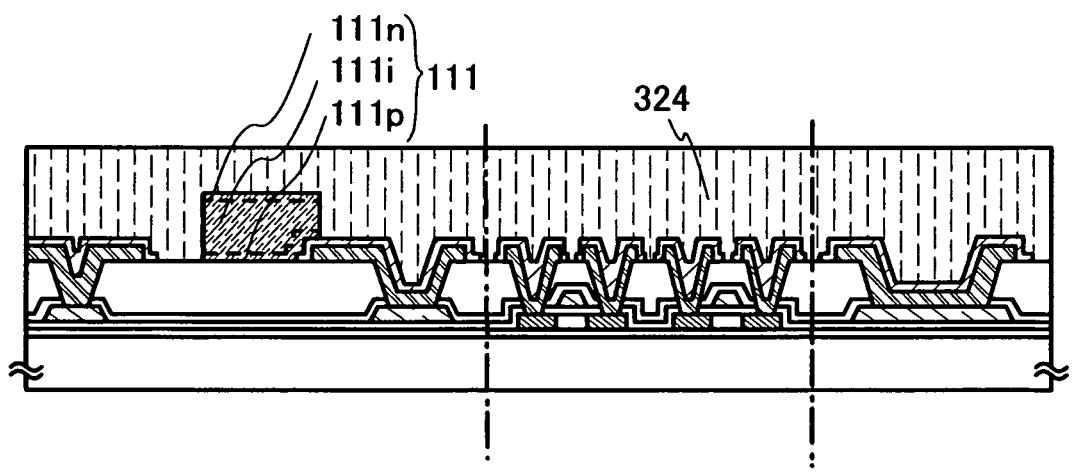

Next, the sealing layer 324 formed from an insulating material (e.g., an inorganic insulating film containing silicon) is formed having a thickness of 1 to 30 μm over the entire surface to obtain a state shown in FIG. 10B. Here, as an insulating film, a silicon oxide film containing nitrogen with a thickness of 1 μm is formed by a CVD method. The use of the inorganic insulating film improves adhesion.

Then, after the sealing layer 324 is etched to provide an opening portion, the terminals 121 and 122 are formed by a sputtering method. Each of the terminals 121 and 122 is a stacked-layer film of a titanium film (a Ti film) (100 nm), a nickel film (a Ni film) (300 nm), and a gold film (an Au film) (50 nm). The terminals 121 and 122 obtained in such a manner have a fixing intensity of higher than 5 N, which is sufficient fixing intensity for a terminal electrode.

Figure 10C:
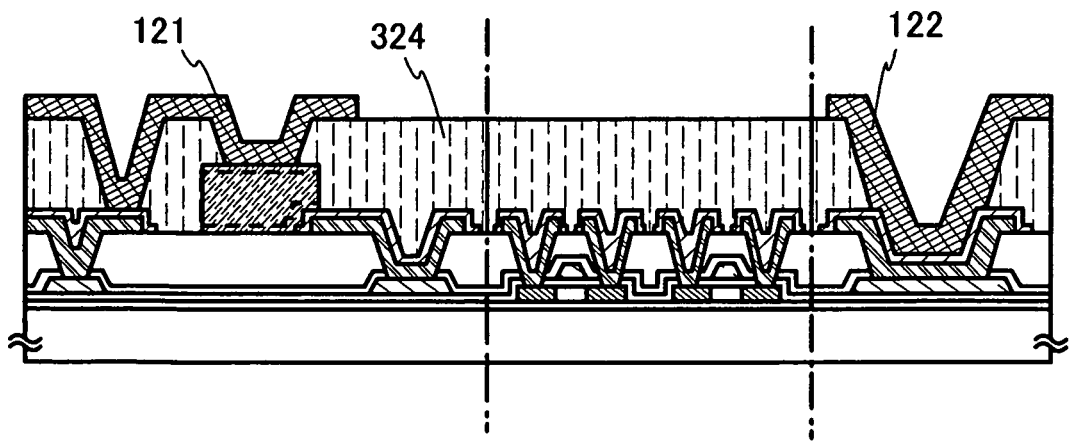

Through the steps described above, the terminals 121 and 122 capable of solder bonding are formed, and a structure shown in FIG. 10C can be obtained.

Accordingly, a large quantity of photo sensor chips (2 mm×1.5 mm each), that is, chips of a photoelectric conversion device can be formed using one large substrate (e.g., 600 cm×720 cm). Next, the substrate is cut into separate sections to take out a plurality of photo sensor chips.

Figure 11A:
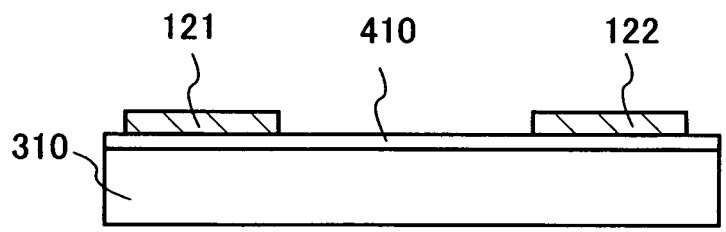
FIGS. 11A to 11C show manufacturing steps of a semiconductor device of the invention.
Figure 11B:
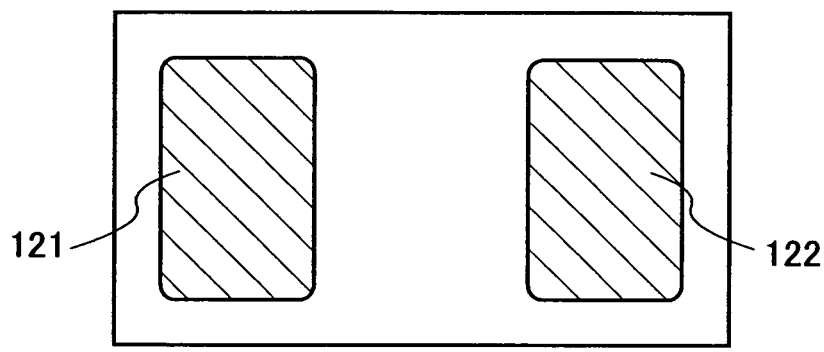
Figure 11C:
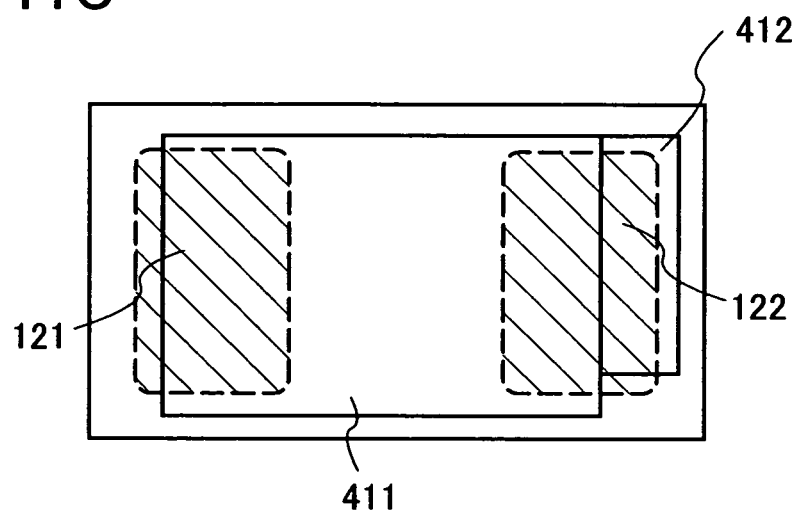

FIG. 11A is a cross-sectional view of one photo sensor chip (2 mm×1.5 mm) taken out. FIG. 11B is a top plan view thereof. FIG. 11C is a bottom view thereof. Note that in FIG. 11A, the total thickness including thicknesses of the substrate 310, an element formation region 410, and the terminals 121 and 122 is 0.8±0.05 mm.

In addition, in order to reduce the total thickness of the optical sensor chip, the substrate 310 may be ground to be thinned by CMP treatment or the like, and then, cut separately by a dicer to take out a plurality of optical sensor chips.

In FIG. 11B, each electrode size of the terminals 121 and 122 is 0.6 mm×1.1 mm, and a space between the electrodes is 0.4 mm. In FIG. 11C, the area of a light receiving portion 411 is 1.57 mm². Moreover, an amplifier circuit portion 412 is provided with approximately 100 thin film transistors.

Lastly, the obtained optical sensor chip is mounted on a mounting surface of the substrate 360 (see FIG. 8A). Note that solders 364 and 363 are used to connect the terminal 121 to the electrode 361 and the terminal 122 to the electrode 362, respectively. The solders are formed in advance over the electrodes 361 and 362 of the substrate 360 by a screen printing method or the like. Then, after the solder and the terminal electrode are made in contact with each other, a reflow soldering process is performed to mount the optical sensor chip on the substrate. The reflow soldering process is performed at approximately 255 to 265° C. for approximately 10 seconds in an inert gas atmosphere, for example. Alternatively, a bump formed from a metal (such as gold or silver), a bump formed from a conductive resin, or the like can be used other than the solder. Further alternatively, a lead-free solder may be used for mounting in consideration of environmental problems.

As described above, a semiconductor device can be manufactured. Note that in order to detect light, light may be blocked using a housing or the like in a portion where light does not enter the photoelectric conversion layer 111 from the substrate 310 side. Any material may be used for the housing as long as it has a function of blocking light, and the housing may be formed using a metal material, a resin material having a black pigment, or the like, for example. With such a structure, a highly reliable semiconductor device having a function of detecting light can be formed.

In this embodiment mode, an example in which an amplifier circuit included in a semiconductor device is formed using an n-channel thin film transistor is described. Alternatively, a p-channel thin film transistor may be used. Note that a p-channel thin film transistor can be formed similarly to an n-channel thin film transistor by using a p-type impurity such as boron (B) as an impurity imparting one conductivity type to an island-shaped semiconductor region. Next, an example in which an amplifier circuit is formed using a p-channel thin film transistor is described.

Figure 12:
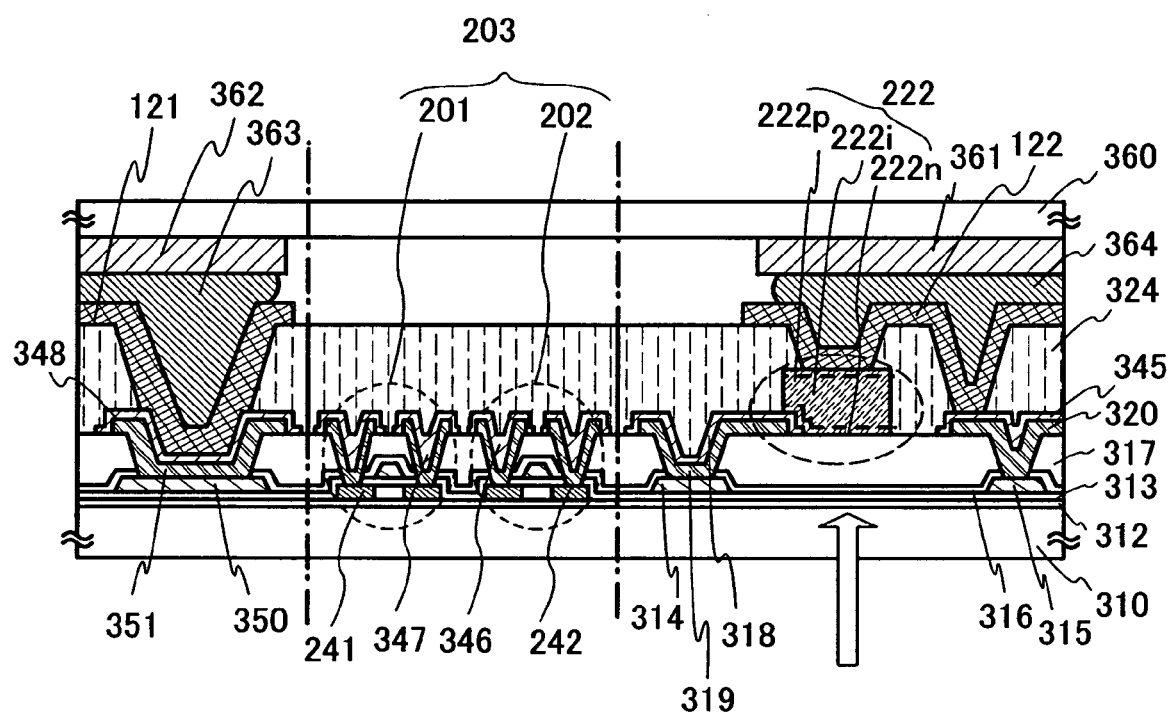
FIG. 12 is a cross-sectional view of a semiconductor device of the invention.

FIG. 7 shows the example of the equivalent circuit diagram of the photoelectric conversion device in which an amplifier circuit, for example, the current mirror circuit is formed using the p-channel thin film transistor as described above, and FIG. 12 shows a cross-sectional view thereof. In FIG. 12, the p-channel thin film transistors 201 and 202, and the photoelectric conversion element 204 in FIG. 7 are shown. Note that the same portions and portions having similar functions to those in FIGS. 8A and 8B are denoted by common reference numerals, and specific description thereof is omitted. As described above, a p-type impurity such as boron (B) is introduced into an island-shaped semiconductor region of the thin film transistor 201 and an island-shaped semiconductor region of the thin film transistor 202, and a source or drain region 241 and a source or drain region 242 are formed for the thin film transistors 201 and 202, respectively. Further, a photoelectric conversion layer 222 included in the photoelectric conversion element has a structure where an n-type semiconductor layer 222*n*, an i-type semiconductor layer 222*i*, and a p-type semiconductor layer 222*p* are sequentially stacked. Note that the n-type semiconductor layer 222*n*, the i-type semiconductor layer 222*i*, and the p-type semiconductor layer 222*p* can be formed using similar materials and manufacturing methods to those of the n-type semiconductor layer 111*n*, the i-type semiconductor layer 111*i*, and the p-type semiconductor layer 111*p*, respectively.

Note that in this embodiment mode, top-gate thin film transistors are formed as the thin film transistors 112, 113, 201, and 202; however, a bottom-gate thin film transistor may be employed.

Figure 13:
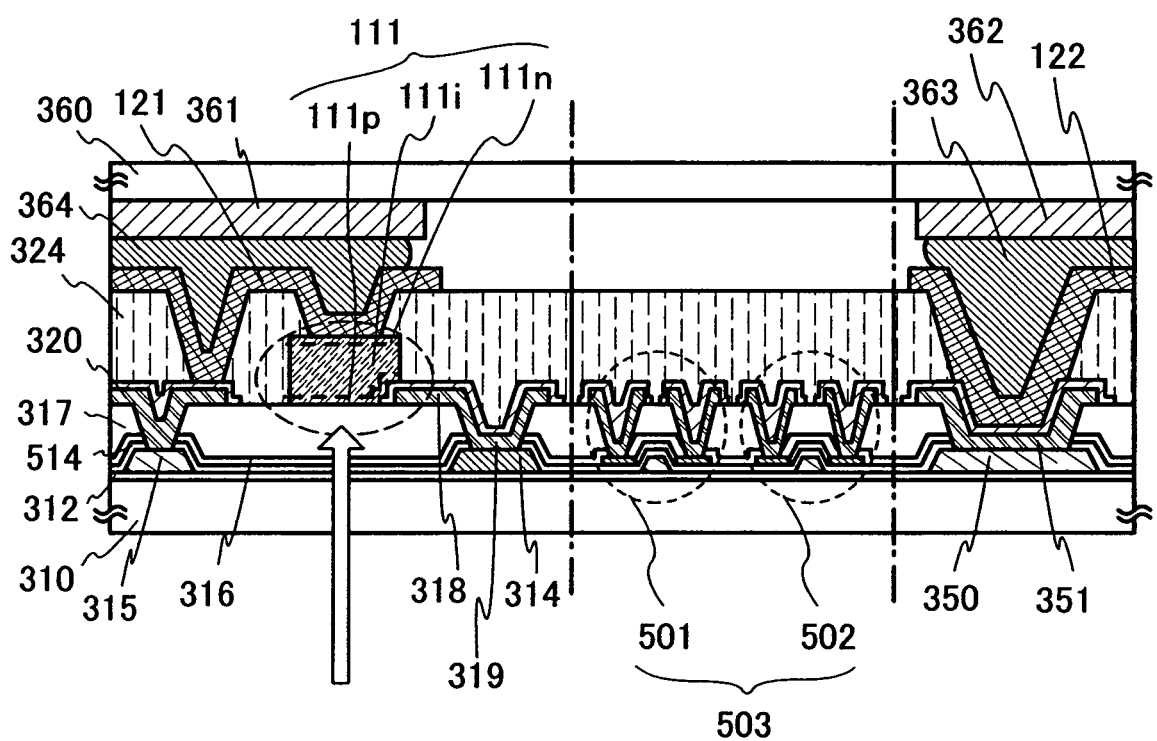
FIG. 13 is a cross-sectional view of a semiconductor device of the invention.

FIG. 13 shows an example where bottom-gate thin film transistors are formed instead of the thin film transistors 112, 113, 201, and 202. In FIG. 13, a current mirror circuit 503 includes bottom-gate thin film transistors 501 and 502.

Each of the bottom-gate thin film transistors 501 and 502 includes a gate electrode, a gate insulating film 514, an active layer including a source region, a drain region, and a channel formation region, the interlayer insulating film 316, a source electrode, and a drain electrode.

Note that in FIG. 13, the same portions as those in FIGS. 8A and 12 are denoted by the same reference numerals.

Each of the thin film transistors 112, 113, 201, 202, 501, and 502 may have a single gate structure in which one gate electrode is formed or a multi-gate structure in which a plurality of gate electrodes are formed. Further, a low concentration impurity region, that is, an LDD (lightly doped drain) region may be, but does not have to be, provided. Part or all of the LDD region may overlap with the gate electrode. The gate electrode may be formed from a single-layer conductive film or may have a stacked-layer structure of a plurality of conductive films. Further, a sidewall may be formed on a side surface of the gate electrode. A structure of the thin film transistor may be changed as appropriate when necessary.

Note that although this embodiment mode is described with reference to various drawings, the contents (or part of the contents) described in each drawing can be freely applied to, combined with, or replaced with the contents (or part of the contents) described in another drawing. Further, much more drawings can be formed by combining each part with another part in the above-described drawings.

Similarly, the contents (or part of the contents) described in each drawing in this embodiment mode can be freely applied to, combined with, or replaced with the contents (or part of the contents) described in a drawing in another embodiment mode. Further, much more drawings can be formed by combining each part in each drawing in this embodiment mode with part of another embodiment mode.

Note that this embodiment mode shows examples of embodying, slightly transforming, partially modifying, improving, describing in detail, or applying the contents (or part of the contents) described in other embodiment modes, an example of related part thereof, or the like. Therefore, the contents described in other embodiment modes can be freely applied to, combined with, or replaced with this embodiment mode.

[Embodiment Mode 3]

In this embodiment mode, a photoelectric conversion device having a structure different from those in Embodiment Modes 1 and 2 and a manufacturing method thereof are described with reference to FIGS. 14A to 14D, 15, 16A, 16B, 17, 18, 19, 20A, 20B, 21A, 21B, 22A, 22B, 23 to 27, 28A, 28B, 36, and 37.

First, an insulating film 1102 is formed over a substrate 1101. As the substrate 1101, a glass substrate, a quartz substrate, a ceramic substrate, a silicon substrate, a metal substrate, a stainless-steel substrate, or the like can be used. Alternatively, a plastic substrate provided with a silicon film containing oxygen or nitrogen on either side may be used. In this embodiment mode, a glass substrate is used as the substrate 1101.

As the insulating film 1102, a film may be formed of silicon oxide, silicon oxide containing nitrogen, silicon nitride, silicon nitride containing oxygen, or a metal oxide material by a sputtering method or a plasma CVD method.

A metal film 1103 is formed over the insulating film 1102. As the metal film 1103, a single layer or a stacked layer of an element selected from W, Ti, Ta, Mo, Cr, Nd, Fe, Ni, Co, Zr, Zn, Ru, Rh, Pd, Os, or Ir, or an alloy material or a compound material containing the above element as its main component; or a single layer or a stacked layer of a nitride of the above element may be used. The thickness of the metal film 1103 is 10 to 200 nm, preferably 25 nm to 75 nm.

Next, an insulating film 1104 is formed over the metal film 1103. At this time, an amorphous metal oxide film 1100 is formed with a thickness of approximately 2 to 5 nm between the metal film 1103 and the insulating film 1104 (see FIG. 14A). When separation is performed in a subsequent step, separation occurs within the metal oxide film 1100, at an interface between the metal oxide film 1100 and the insulating film 1104, or at an interface between the metal oxide film 1100 and the metal film 1103. As the insulating film 1104, a film is formed of silicon oxide, silicon oxide containing nitrogen, silicon nitride, silicon nitride containing oxygen, or a metal oxide material by a sputtering method or a plasma CVD method. The thickness of the insulating film 1104 is preferably twice the thickness of the metal film 1103 or more, and more preferably 150 to 200 nm.

Next, a film of a material containing at least hydrogen is formed over the insulating film 1104. As the film of the material containing at least hydrogen, a semiconductor film, a nitride film, or the like can be used. A semiconductor film is formed in this embodiment mode. Thereafter, heat treatment for diffusing the hydrogen contained in the film of the material containing at least hydrogen is performed. This heat treatment is performed at a temperature of 410° C. or higher, and may be performed separately from a process of forming a crystalline semiconductor film or may be performed in the process of forming a crystalline semiconductor film to reduce the number of steps.

In this embodiment mode, in order to perform heat treatment for diffusing hydrogen and formation of a semiconductor film to be an active layer at the same time, an amorphous semiconductor film containing hydrogen, for example, an amorphous silicon film is formed for the film of the material containing hydrogen and heated to form a crystalline semiconductor film, for example, a polycrystalline silicon film. At this time, when heat treatment at 500° C. or more is performed to crystallize an amorphous semiconductor film, hydrogen can be diffused at the same time as a crystalline semiconductor film is formed.

It is needless to say that heat treatment for diffusing hydrogen may be performed in a step different from formation of the semiconductor film to be an active layer. In this case, the film of the material containing hydrogen is formed and heated, and a semiconductor film to be an active layer may be formed thereover. The semiconductor film to be the active layer may be obtained by forming an amorphous semiconductor film and then crystallizing it or may be formed by forming a crystalline semiconductor film from the start.

Next, an island-shaped semiconductor film 1105 is formed by etching the crystalline semiconductor film into an island shape by a known method.

In the island-shaped semiconductor film 1105, a source region, a drain region, and a channel formation region are formed. Further, a gate insulating film 1106 which covers the island-shaped semiconductor film 1105, and a lower gate electrode 1107 and an upper gate electrode 1108 which are formed over channel formation regions of the island-shaped semiconductor film 1105 are provided. In FIG. 14B, although the gate electrode has a two-layer structure of the lower gate electrode 1107 and the upper gate electrode 1108, a gate electrode having a single-layer structure may be formed. The lower gate electrode 1107 and the upper gate electrode 1108 are collectively referred to as a gate electrode 1145. As described above, a thin film transistor (TFT) 1110 is formed.

Note that in this embodiment mode, the TFT 1110 is a top-gate TFT; however a bottom-gate TFT may be employed. Further, a single-gate TFT having one channel formation region or a multi-gate TFT having a plurality of channel formation regions may be employed.

An interlayer insulating film 1109 is formed to cover the gate electrode 1145 including the lower gate electrode 1107 and the upper gate electrode 1108, and the gate insulating film 1106.

Note that the interlayer insulating film 1109 may be a single-layer insulating film or a stacked layer of insulating layers formed of different materials.

A source electrode 1112 and a drain electrode 1113 which are electrically connected to the source region and the drain region in the island-shaped semiconductor film 1105 are formed over the interlayer insulating film 1109. Further, a gate wiring 1111 electrically connected to the gate electrode 1145 is formed (see FIG. 14B).

Figure 15:
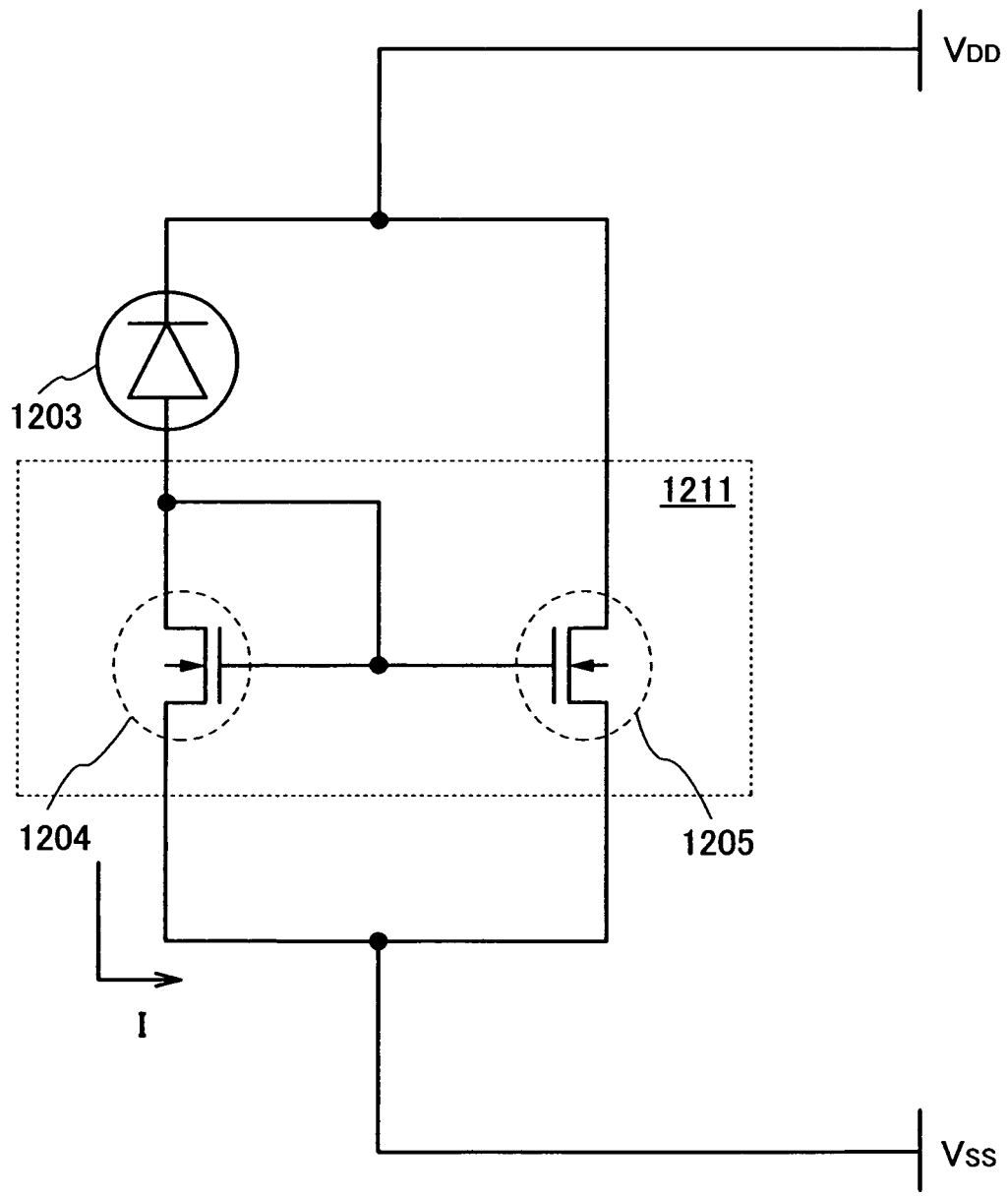
FIG. 15 is a circuit diagram of a semiconductor device of the invention.

Note that through steps up to FIG. 14B, only one TFT is shown. Actually, however, the TFT 1110 is a TFT forming an amplifier circuit which amplifies photoelectric current obtained in a photoelectric conversion layer 1121 formed in a subsequent step, for example, a current mirror circuit, so that at least two TFTs are formed. FIG. 15 is a circuit diagram of a photodiode 1203 including the photoelectric conversion layer 1121 and a current mirror circuit 1211 including a TFT 1204 and a TFT 1205. The TFT 1110 in FIG. 14B is one of the TFT 1204 and the TFT 1205.

In FIG. 15, a gate electrode of the TFT 1204 forming the current mirror circuit 1211 is electrically connected to a gate electrode of the TFT 1205 which is another TFT forming the current mirror circuit 211, and is also electrically connected to a drain electrode (also referred to as a drain terminal) which is one of a source electrode and a drain electrode of the TFT 1204.

The drain terminal of the TFT 1204 is electrically connected to the photodiode 1203, a drain terminal of the TFT 1205, and a high potential power supply $V_{DD}$.

The source electrode (also referred to as a source terminal) of the TFT 1204 which is the other of the source electrode and the drain electrode is electrically connected to a low potential power supply Vss and a source terminal of the TFT 1205.

The gate electrode of the TFT 1205 forming the current mirror circuit 211 is electrically connected to the gate electrode and the drain terminal of the TFT 1204.

Further, the gate electrodes of the TFT 1204 and TFT 1205 are connected to each other, so that a common potential is applied thereto.

FIG. 15 illustrates an example of the current mirror circuit having two TFTs. At this time, when the TFTs 1204 and 1205 have the same characteristics, the ratio of reference current to output current is 1:1.

Figure 16A:
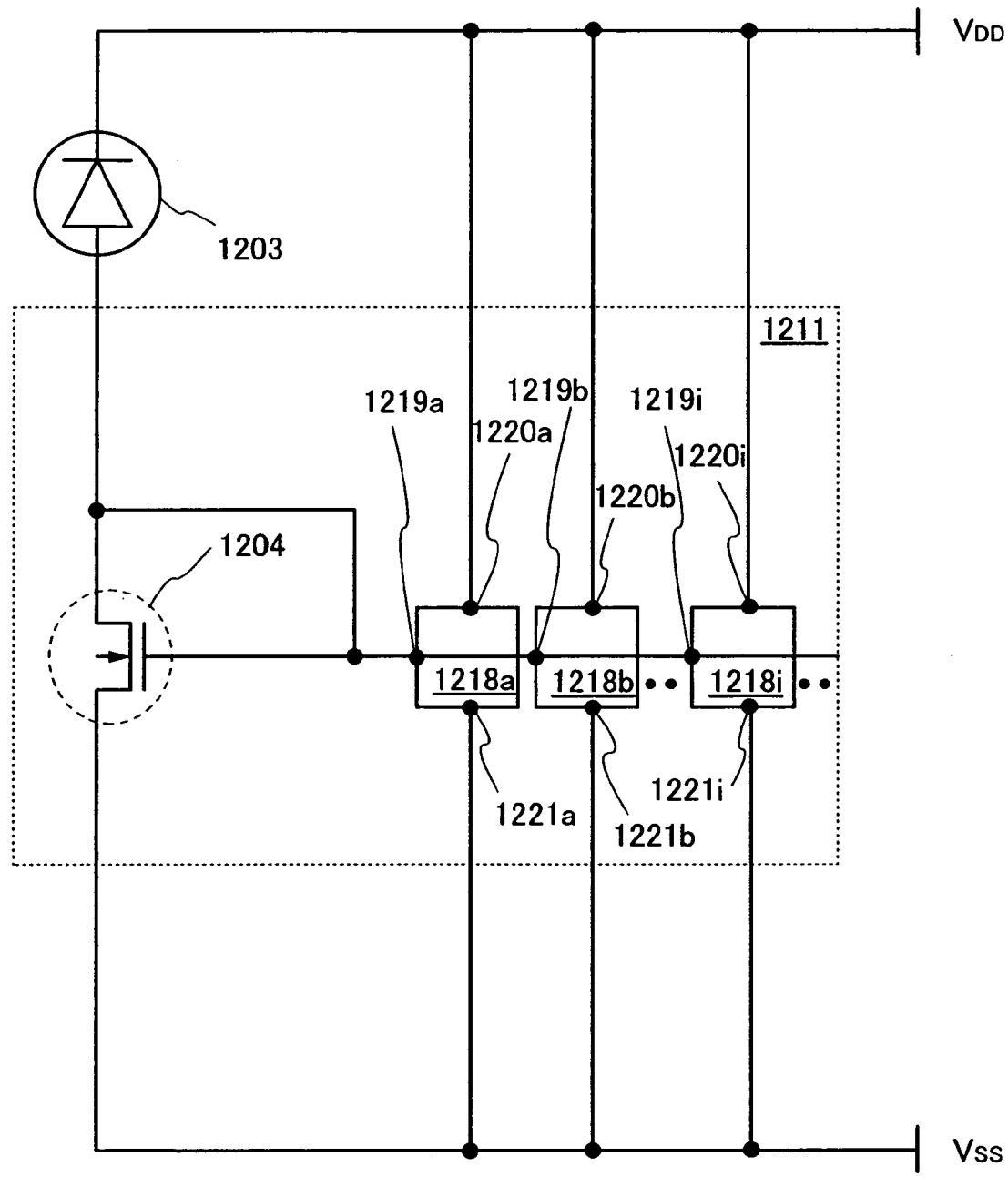
FIGS. 16A and 16B are circuit diagrams of a semiconductor device of the invention.
Figure 16B:
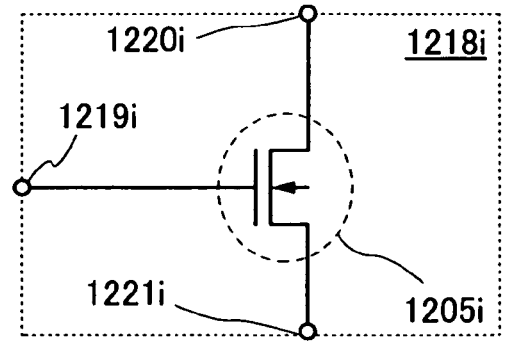

As already described in FIG. 2, FIGS. 16A and 16B are circuit diagrams with which an output value can be increased n times. The circuit diagrams of FIG. 16A correspond to a structure where n TFTs 1205 in FIG. 15 are provided. When the ratio of the TFT 1204 to the TFTs 1205 is set at 1:n as shown in FIG. 16A, the output value can be increased n times. This is a principle similar to a structure in which the channel width W of a TFT is increased to increase a limit of a current flowing through the TFT n times.

For example, when an output value is increased by 100 times, desired current can be obtained by connecting one TFT 1204 and 100 TFTs 1205 in parallel.

FIG. 16B is a specific circuit diagram of a circuit 1218*i* (e.g., circuits 1218*a*, 1218*b*, and the like) in FIG. 16A.

The circuit diagram of FIG. 16B is based on the circuit diagrams of FIGS. 15 and 16A, and the same elements are denoted by the same reference numerals. A gate electrode of a TFT 1205*i* is electrically connected to a terminal 1219*i*, and is also electrically connected to a terminal 1220*i*. A source terminal of the TFT 1205*i* is electrically connected to a terminal 1221*i*.

In order to explain the circuits 1218*a*, 1218*b*, and the like in FIG. 16A, FIG. 16B shows the circuit 1218*i*, which is one of the circuits. Since the circuit 1218*i* is based on the circuit structure in FIG. 15, reference numerals with "i" in FIGS. 16A and 16B denote the same components as those without "i" in FIG. 15. That is, the TFT 1205 in FIG. 15 and the TFT 1205*i* in FIG. 16B, for example, are the same TFTs.

Accordingly, in FIG. 16A, the TFT 1205 includes n TFTs 1205*a*, 1205*b*, 1205*i*, and the like. Thus, current flowing through the TFT 1204 can be amplified n times to be output.

Note that in FIGS. 16A and 16B, components which are the same as those in FIG. 15 are denoted by the same reference numerals.

Although FIG. 15 illustrates the equivalent circuit of the current mirror circuit 1211 using n-channel TFTs, p-channel TFTs may be used instead of the n-channel TFTs.

Figure 17:
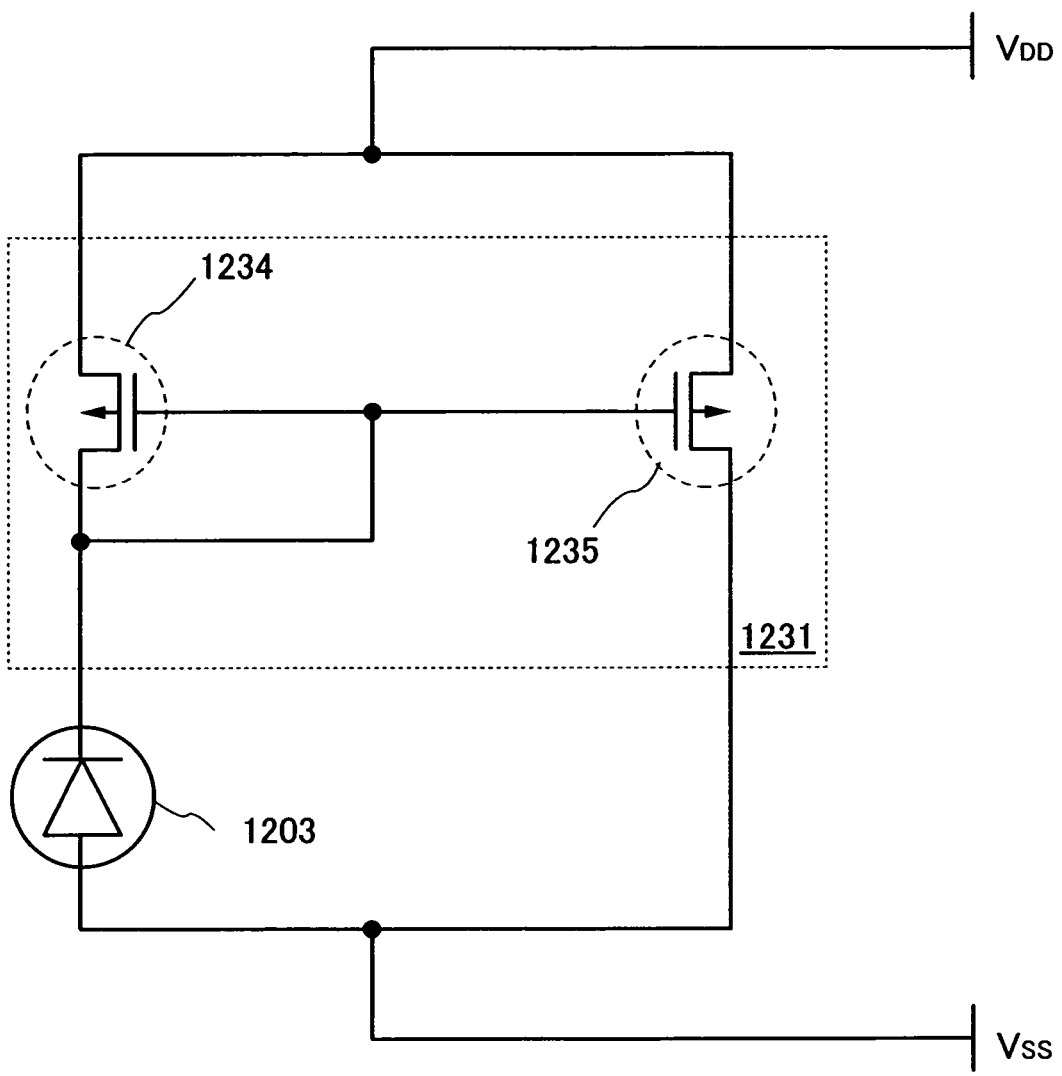
FIG. 17 is a circuit diagram of a semiconductor device of the invention.

When the amplifier circuit is formed using p-channel TFTs, an equivalent circuit shown in FIG. 17 is obtained. As shown in FIG. 17, a current mirror circuit 1231 includes p-channel TFTs 1234 and 1235. Note that in FIG. 17, components which are the same as those in FIGS. 15, 16A, and 16B are denoted by the same reference numerals.

After the TFT 1110 is formed as described above, electrodes 1115 and 1116 are formed over the interlayer insulating film 1109. A plurality of electrodes 1116 are shown in FIG. 14C, whereas only one electrode 1116 is formed in FIG. 14D.

Note that in this embodiment mode, the electrodes 1115 and 1116 are formed using a titanium film by depositing titanium (Ti) to a thickness of 400 nm.

Note that the electrodes 1115 and 1116 may be formed in the same steps as the source electrode 1112 and the drain electrode 1113.

Figure 18:
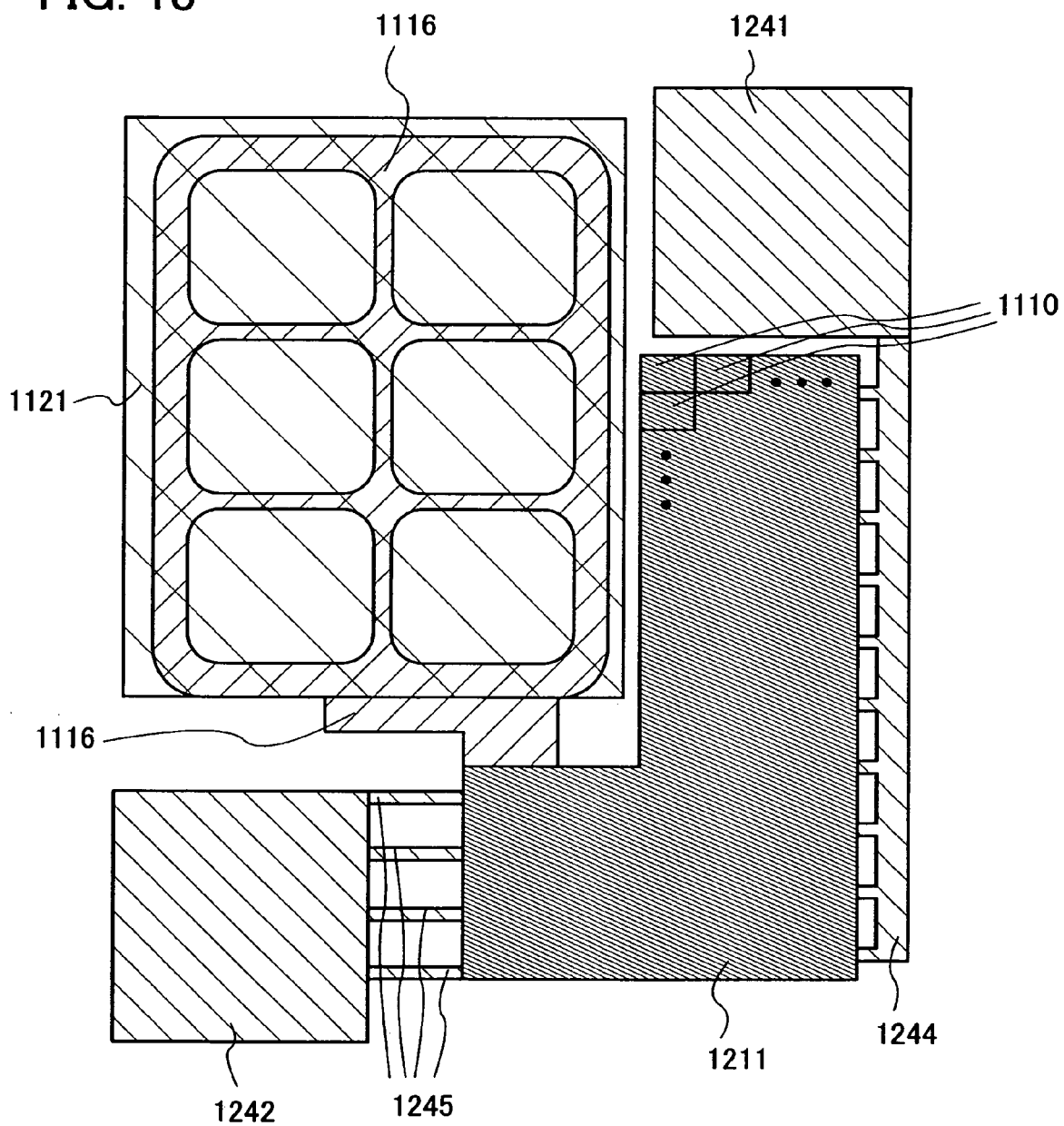
FIG. 18 is a top plan view of a semiconductor device of the invention.
Figure 19:
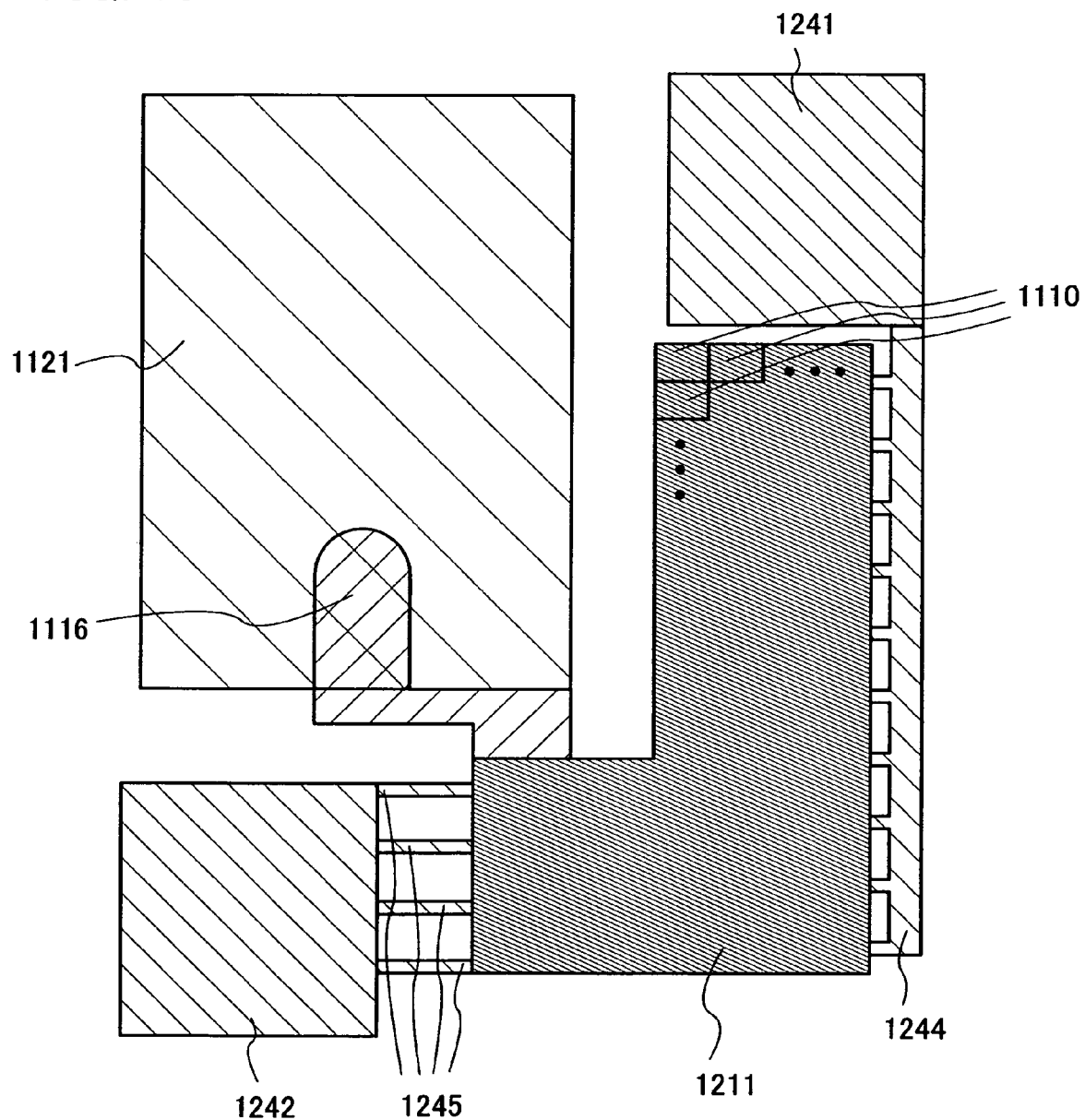
FIG. 19 is a top plan view of a semiconductor device of the invention.

FIG. 18 is a top plan view of the electrode 1116 and the periphery thereof in FIG. 14C. FIG. 19 is a top view of the electrode 1116 and the periphery thereof in FIG. 14D.

In FIG. 18, the electrode 1116 is a grid electrode and is connected at a plurality of portions to the photoelectric conversion layer 1121 formed in a subsequent step. Accordingly, when a cross section of the electrode 1116 is seen, a plurality of electrodes seem to be formed as shown in FIG. 14C; however, actually the electrodes 1116 are formed of the same material in the same step. When the electrodes 1116 are formed in a grid pattern as shown in FIG. 18, it is advantageous in that a resistance value of the photoelectric conversion layer 1121 is lowered.

Further, in FIG. 19, since the electrode 1116 is an electrode having a rectangular shape with a round end, only one electrode 1116 seems to be formed as shown in FIG. 14D when the cross section thereof is seen. In this case, since the area of the electrode 1116 is small, the area of the photoelectric conversion layer 1121 for receiving light is increased, so that sensitivity is improved.

The current mirror circuit 1211 is electrically connected through a wiring 1244 to a connection electrode 1241 connected to a high potential power supply Vdd, and is also electrically connected through a wiring 1245 to a connection electrode 1242 connected to a low potential power supply Vss.

Hereinafter, a photoelectric conversion device with a structure of FIG. 14C is described. A photoelectric conversion device with a structure of FIG. 14D can also be formed in similar steps.

Figure 20A:
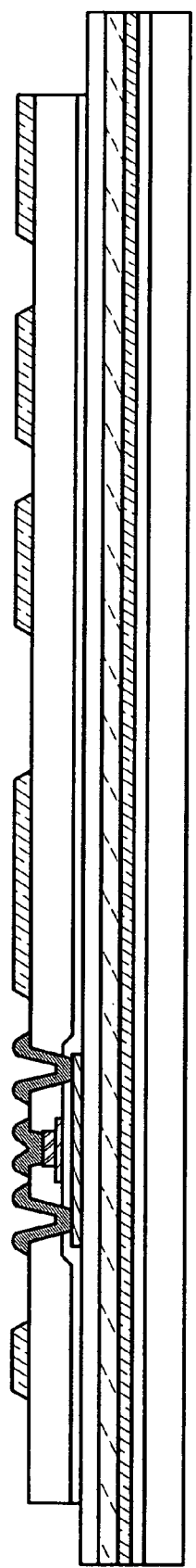
FIGS. 20A and 20B show manufacturing steps of a semiconductor device of the invention.

After a manufacturing step shown in FIG. 14C, end portions of the gate insulating film 1106, the interlayer insulating film 1109, and the electrode 1116 are removed by etching (see FIG. 20A).

Figure 20B:
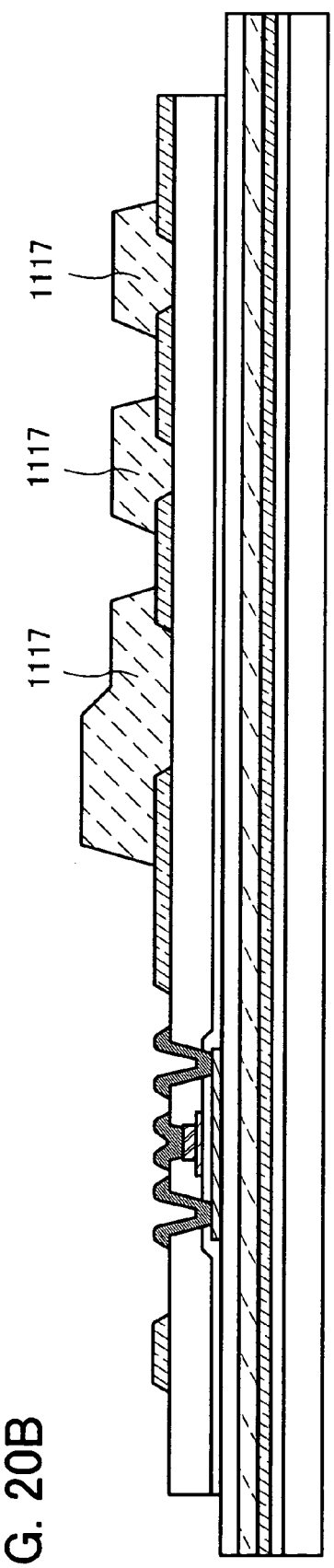

Next, as shown in FIG. 20B, an overcoat layer 1117 is provided over the electrode 1116 and the interlayer insulating film 1109.

The overcoat layer 1117 has a function of improving the shape of the photoelectric conversion layer 1121 to have gentle end portions so that a p-type semiconductor layer 1121*p* and an n-type semiconductor layer 1121*n* are not short-circuited, a function of suppressing mixing of contaminants into the photoelectric conversion layer 1121, and a function of adjusting light which enters the photoelectric conversion layer 1121. Further, the overcoat layer 1117 is formed of a light-transmitting insulating material. For example, an organic resin material such as acrylic or polyimide, or an inorganic material such as silicon nitride, silicon oxide, silicon oxide containing nitrogen, or silicon nitride containing oxygen can be used. Moreover, a stacked-layer film in which those materials are stacked can be used to form the overcoat layer 1117. In this embodiment mode, polyimide is used for the overcoat layer 1117.

Figure 21A:
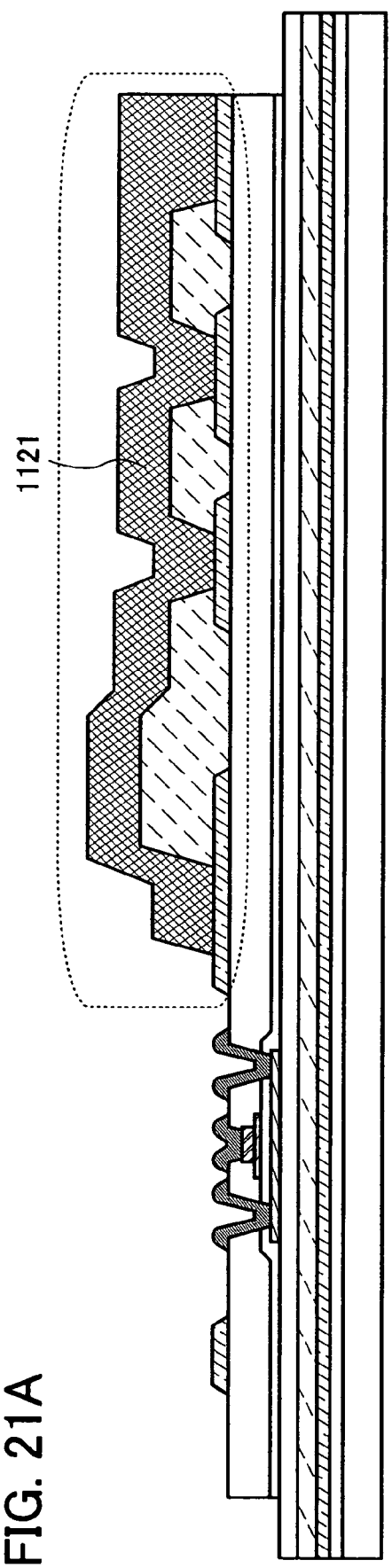
FIGS. 21A and 21B show manufacturing steps of a semiconductor device of the invention.
Figure 21B:
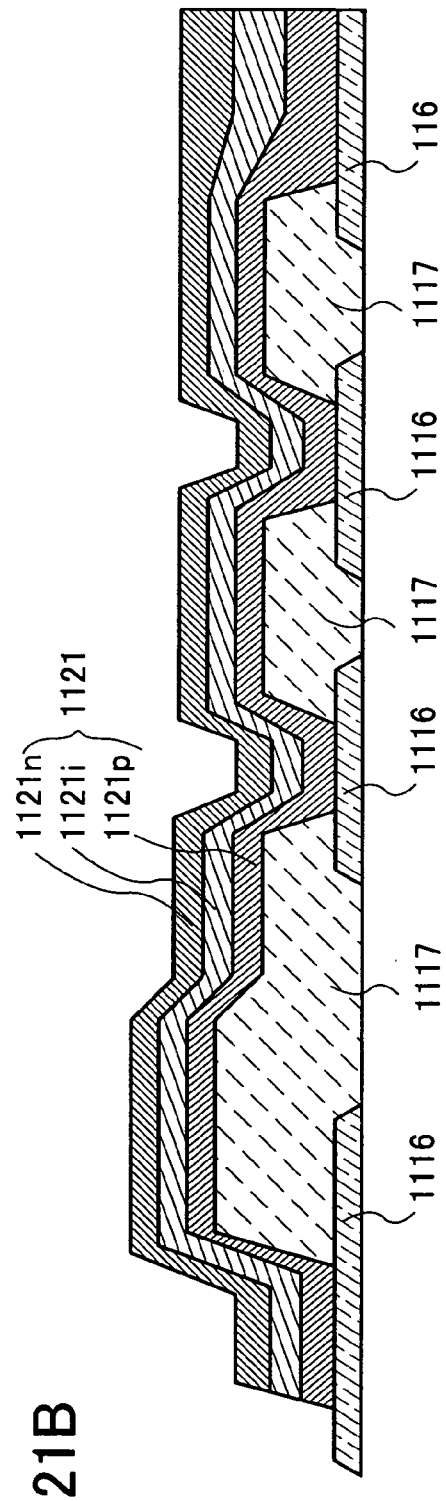
Figure 23:
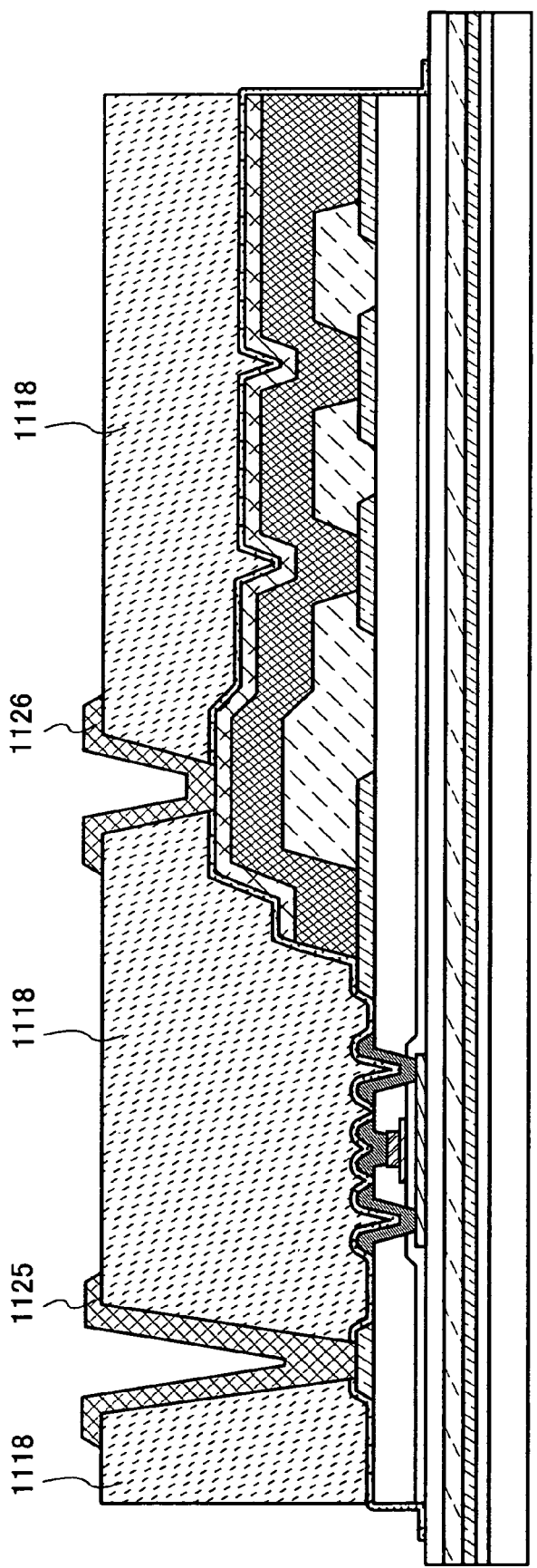
FIG. 23 shows a manufacturing step of a semiconductor device of the invention.
Figure 24:
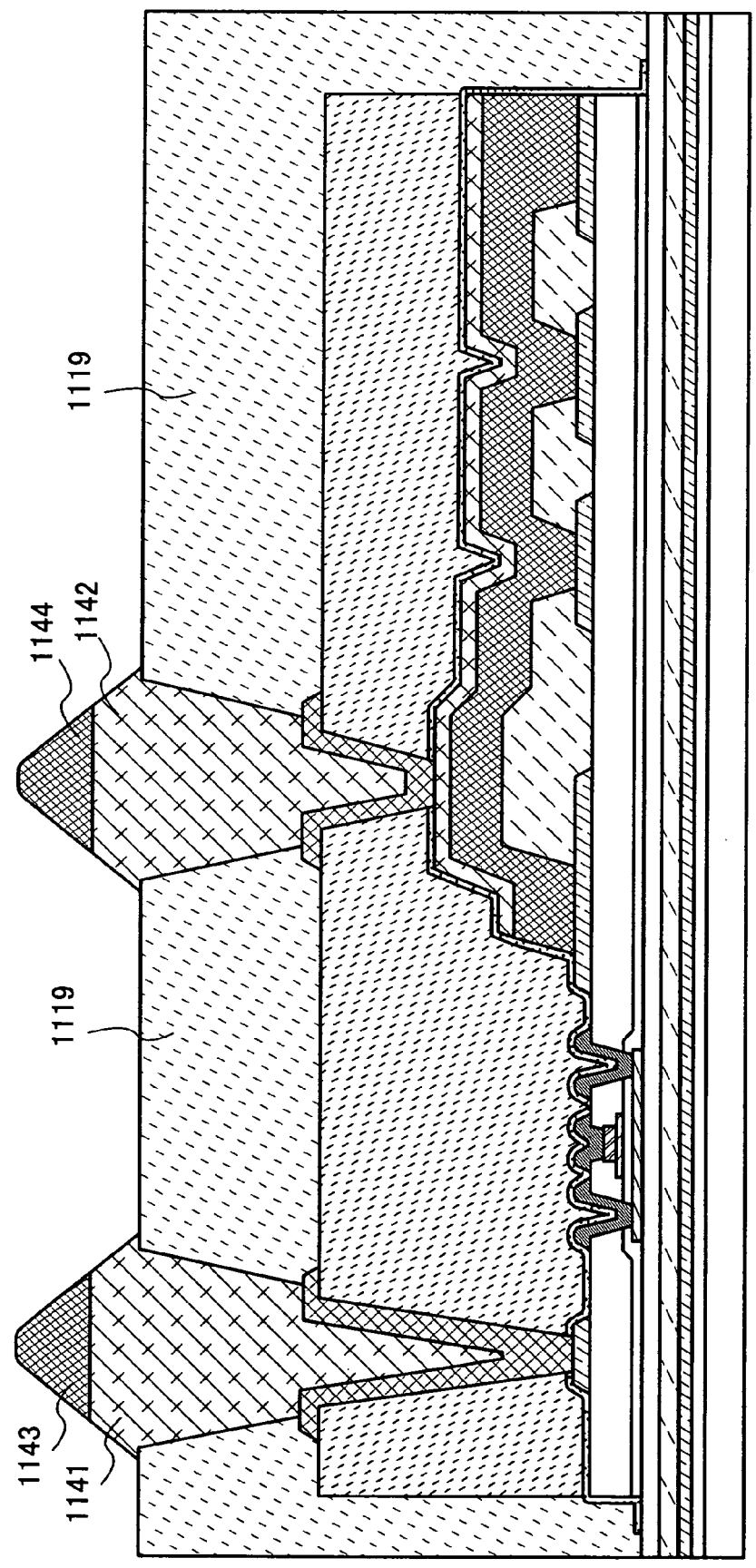
FIG. 24 shows a manufacturing step of a semiconductor device of the invention.

Next, a p-type semiconductor film, an i-type semiconductor film, and an n-type semiconductor film are formed over the electrode 1116 and the overcoat layer 1117, and etched to form the photoelectric conversion layer 1121 including the p-type semiconductor layer 1121*p*, an i-type semiconductor layer 1121*i*, and the n-type semiconductor layer 1121*n* (see FIGS. 21A and 21B). Note that a magnified view of a region surrounded by dotted lines in FIG. 21A is shown in FIG. 21B.

The p-type semiconductor layer 1121*p* may be formed by depositing an amorphous semiconductor film containing an impurity element belonging to Group 13, for example, boron (B) by a plasma CVD method.

In FIGS. 21A and 21B, the electrode 1116 is in contact with the bottom layer of the photoelectric conversion layer 1121, in this embodiment mode, the p-type semiconductor layer 1121*p*.

After the p-type semiconductor layer 1121*p* is formed, the i-type semiconductor layer 1121*i* and the n-type semiconductor layer 1121*n* are sequentially formed. Accordingly, the photoelectric conversion layer 1121 including the p-type semiconductor layer 1121*p*, the i-type semiconductor layer 1121*i*, and the n-type semiconductor layer 1121*n* is formed.

As the i-type semiconductor layer 1121*i*, an amorphous semiconductor film may be formed by a plasma CVD method, for example. As the n-type semiconductor layer 1121*n*, an amorphous semiconductor film containing an impurity element belonging to Group 15, for example, phosphorus (P) may be formed, or after an amorphous semiconductor film is formed, an impurity element belonging to Group 15 may be introduced.

Note that an amorphous silicon film, an amorphous germanium film, or the like may be used as the amorphous semiconductor film.

Note that in this specification, an i-type semiconductor film refers to a semiconductor film in which the concentration of an impurity which imparts p-type or n-type conductivity is $1\times10^{20}$ cm$^{-3}$ or less, and the concentration of oxygen and nitrogen is $5\times10^{19}$ cm$^{-3}$ or less, and photoconductivity against dark conductivity is 1000 times or more. Further, 10 to 1000 ppm of boron (B) may be added to the i-type semiconductor film.

In addition, other than an amorphous semiconductor film, a microcrystalline semiconductor film (also referred to as a semi-amorphous semiconductor film) may be used as the p-type semiconductor layer 1121*p*, the i-type semiconductor layer 1121*i*, and the n-type semiconductor layer 1121*n*.

Alternatively, the p-type semiconductor layer 1121*p* and the n-type semiconductor layer 1121*n* may be formed using microcrystalline semiconductor films, and the i-type semiconductor layer 1121*i* may be formed using an amorphous semiconductor film.

Next, an auxiliary electrode 1122 is formed on a top surface of the photoelectric conversion layer 1121 (see FIG. 22A). The auxiliary electrode 1122 is formed only when resistance of the photoelectric conversion layer 1121 is high, and if the resistance of the photoelectric conversion layer 1121 is low, the auxiliary electrode 1122 is not needed to be formed. In this embodiment mode, as the auxiliary electrode 1122, titanium (Ti) is formed to a thickness of 20 to 30 nm.

Alternatively, after the p-type semiconductor film, the i-type semiconductor film, and the n-type semiconductor film are formed, a conductive film to be the auxiliary electrode 1122 may be formed and etched to form the auxiliary electrode 1122. Then, the photoelectric conversion layer 1121 may be formed by etching the p-type semiconductor film, the i-type semiconductor film, and the n-type semiconductor film.

Next, a protective film 1129 is formed to cover a part of the insulating film 1104, the gate insulating film 1106, the interlayer insulating film 1109, the electrode 1115, the gate wiring 1111, the source electrode 1112, the drain electrode 1113, and the electrode 1116, which are exposed (see FIG. 22B). As the protective film 1129, a silicon nitride film may used, for example. The protective film 1129 can prevent an impurity such as moisture or an organic material from mixing into the TFT 1110 and the photoelectric conversion layer 1121.

Next, an interlayer insulating film 1118 is formed over the protective film 1129. The interlayer insulating film 1118 also functions as a planarization film. In this embodiment mode, polyimide is formed with a thickness of 2 μm as the interlayer insulating film 1118. At this time, the interlayer insulating film 1118 does not extend beyond a region where the protective film 1129 is formed, in particular, a region where the interlayer insulating film 1109 or the photoelectric conversion layer 1121 is formed.

Next, the interlayer insulating film 1118 is etched to form contact holes. At this time, because of the presence of the protective film 1129, the gate wiring 1111, the source electrode 1112, and the drain electrode 1113 of the TFT 1110 are not etched. Then, part of the protective film 1129 in a region where an electrode 1125 and an electrode 1126 are formed is etched to form contact holes. Further, the electrode 1125 electrically connected to the electrode 1115 through the contact hole formed in the interlayer insulating film 1118 and the protective film 1129; and the electrode 1126 electrically connected to the auxiliary electrode 1122 through the contact hole formed in the interlayer insulating film 1118 and the protective film 1129 are formed over the interlayer insulating film 1118 (see FIG. 23). As the electrodes 1125 and 1126, tungsten (W), titanium (Ti), tantalum (Ta), silver (Ag), or the like can be used.

In this embodiment mode, conductive films of titanium (Ti) which are formed to a thickness of 30 to 50 nm are used as the electrodes 1125 and 1126.

Note that when the auxiliary electrode 1122 is not formed, the electrode 1126 may be electrically connected to the uppermost layer of the photoelectric conversion layer 1121, in this embodiment mode, the n-type semiconductor layer 1121*n*.

Then, an interlayer insulating film 1119 is formed over the interlayer insulating film 1118 by a screen printing method or an inkjet method. At this time, the interlayer insulating film 1119 is not formed over the electrodes 1125 and 1126. In this embodiment mode, an epoxy resin is used for the interlayer insulating film 1119. The interlayer insulating film 1119 is formed to cover the insulating film 1104, which covers the protective film 1129 and functions as a base film, and functions as a sealing material.

Next, an electrode 1141 electrically connected to the electrode 1125 and an electrode 1142 electrically connected to the electrode 1126 are formed using nickel (Ni) paste, for example, by a printing method. Further, an electrode 1143 and an electrode 1144 are formed over the electrode 1141 and the electrode 1142, respectively, with the use of copper (Cu) paste by a printing method (see FIG. 24).

Figure 25:
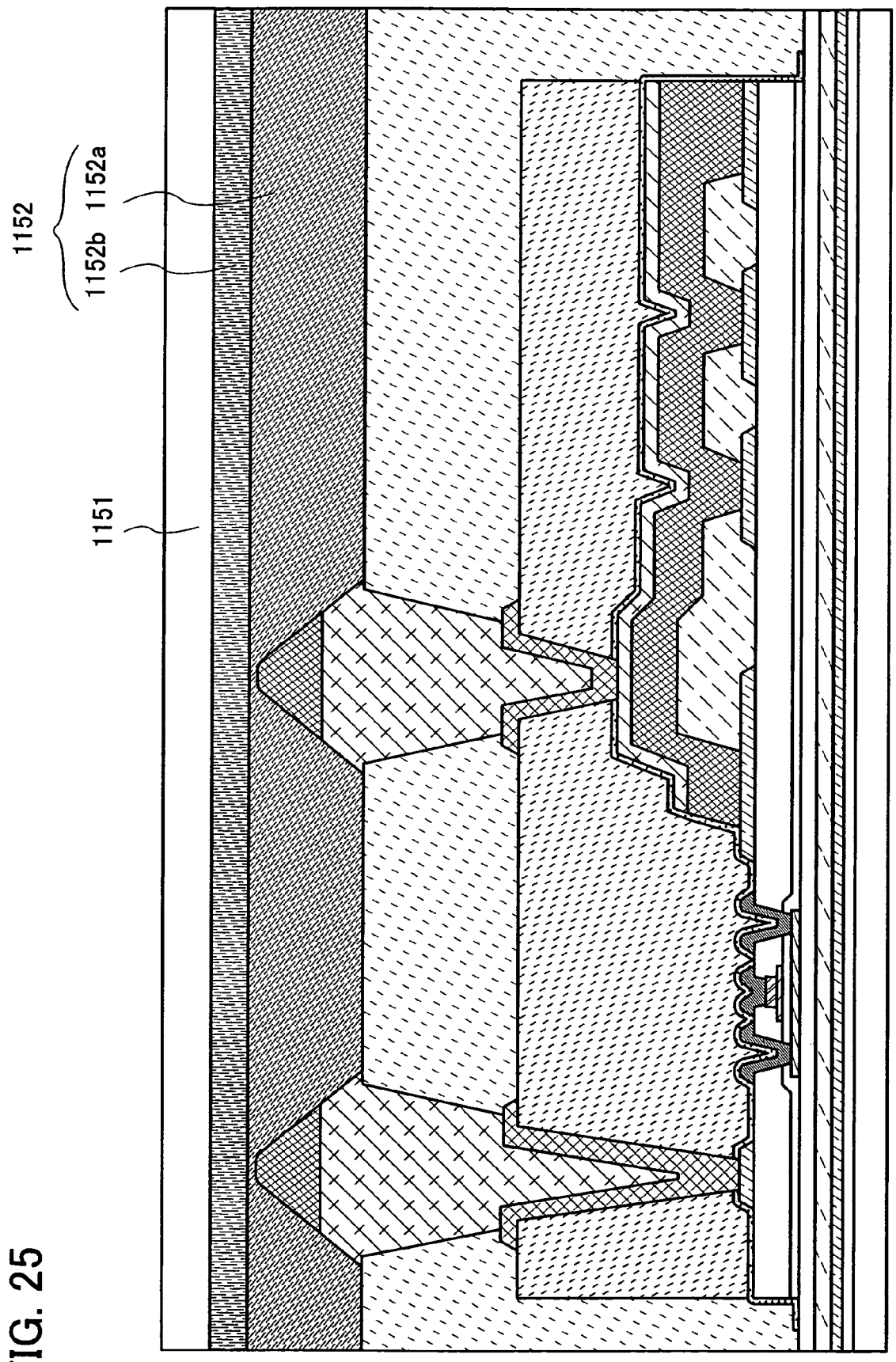
FIG. 25 shows a manufacturing step of a semiconductor device of the invention.

Then, a second substrate 1151 to be a support is attached with an adhesive material 1152 (see FIG. 25). Note that a substrate which is more rigid than the substrate 1101 is preferably used as the second substrate 1151. Typically, a glass substrate, a quartz substrate, a metal substrate, a ceramic substrate, or a plastic substrate can be used as the second substrate 1151 as appropriate.

Further, as the adhesive material 1152, an adhesive material made of an organic material may be used. At this time, a planarization layer may be formed in part of the adhesive material. In this embodiment mode, as the planarization layer, a water soluble resin 1152*a* is formed in an adhesive material made of an organic material, and a member 1152*b* each side of which is covered with a reactive separation adhesive material (hereinafter referred to as a double-sided sheet) may be bonded thereon to attach the interlayer insulating film 1119, the electrode 1141, the electrode 1143, the electrode 1142, the electrode 1144, or the like to the second substrate 1151.

By using such an adhesion method, subsequent steps of separation can be performed with relatively low force. As the adhesive material made of the organic material, various separation adhesive materials, for example, a reactive separation adhesive material, a heat separation adhesive material, a light-separation adhesive material such as a UV separation adhesive material, and an anaerobic separation adhesive material can be employed.

Note that in this embodiment mode, after the step of forming the electrode 1143 and the electrode 1144, the second substrate 1151 to be the support is attached with the adhesive material 1152; however, the second substrate 1151 may be attached with the adhesive material 1152 before the electrode 1141, the electrode 1143, the electrode 1142, and the electrode 1144 are formed.

Figure 26:
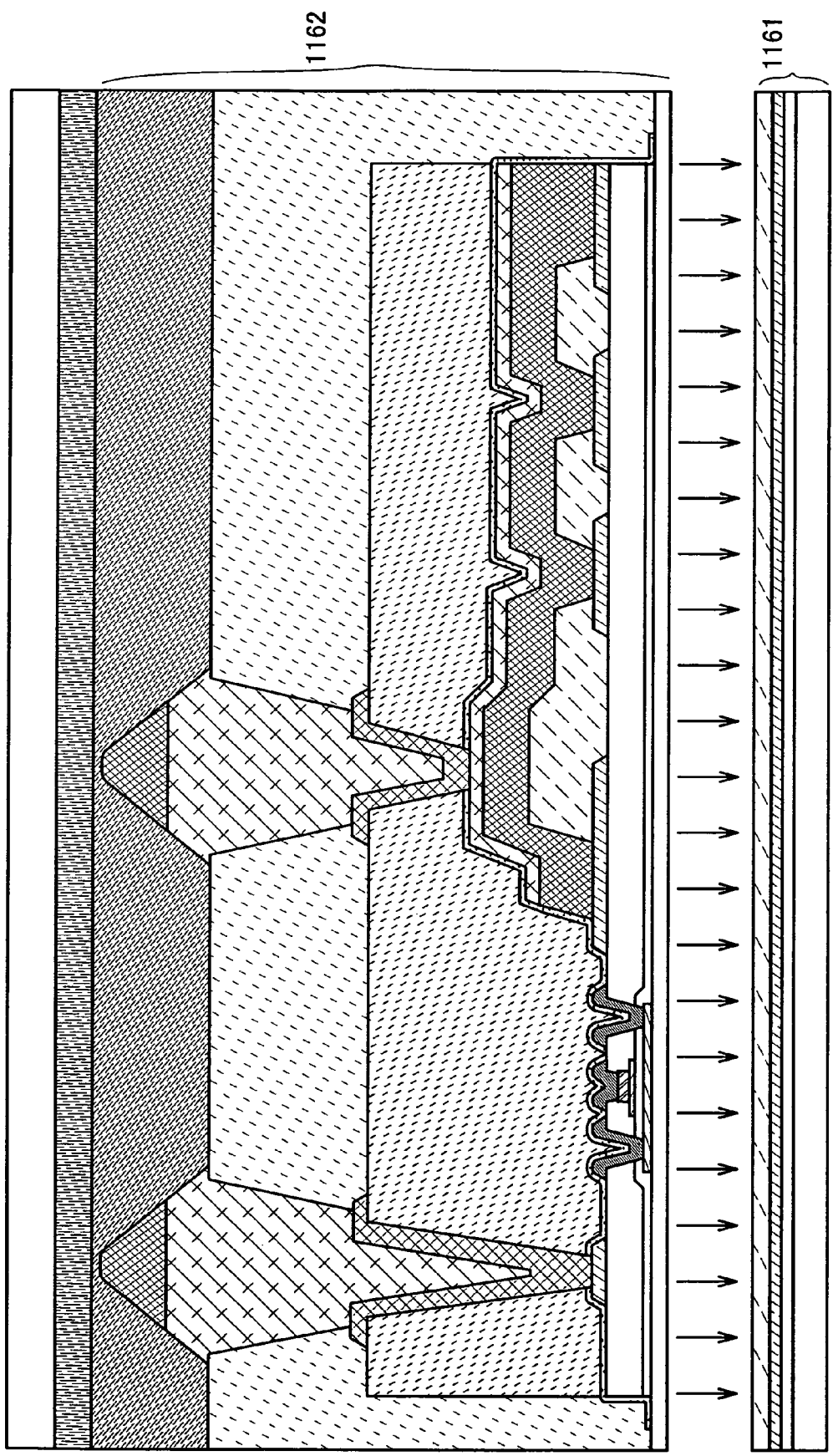
FIG. 26 shows a manufacturing step of a semiconductor device of the invention.

In FIGS. 25 and 26, the substrate 1101 and the metal film 1103 are referred to as a separation body 1161. Further, the layer from the insulating film 1104 to the electrode 1143 and the electrode 1144 is referred to as a stacked-layer body 1162.

Figure 27:
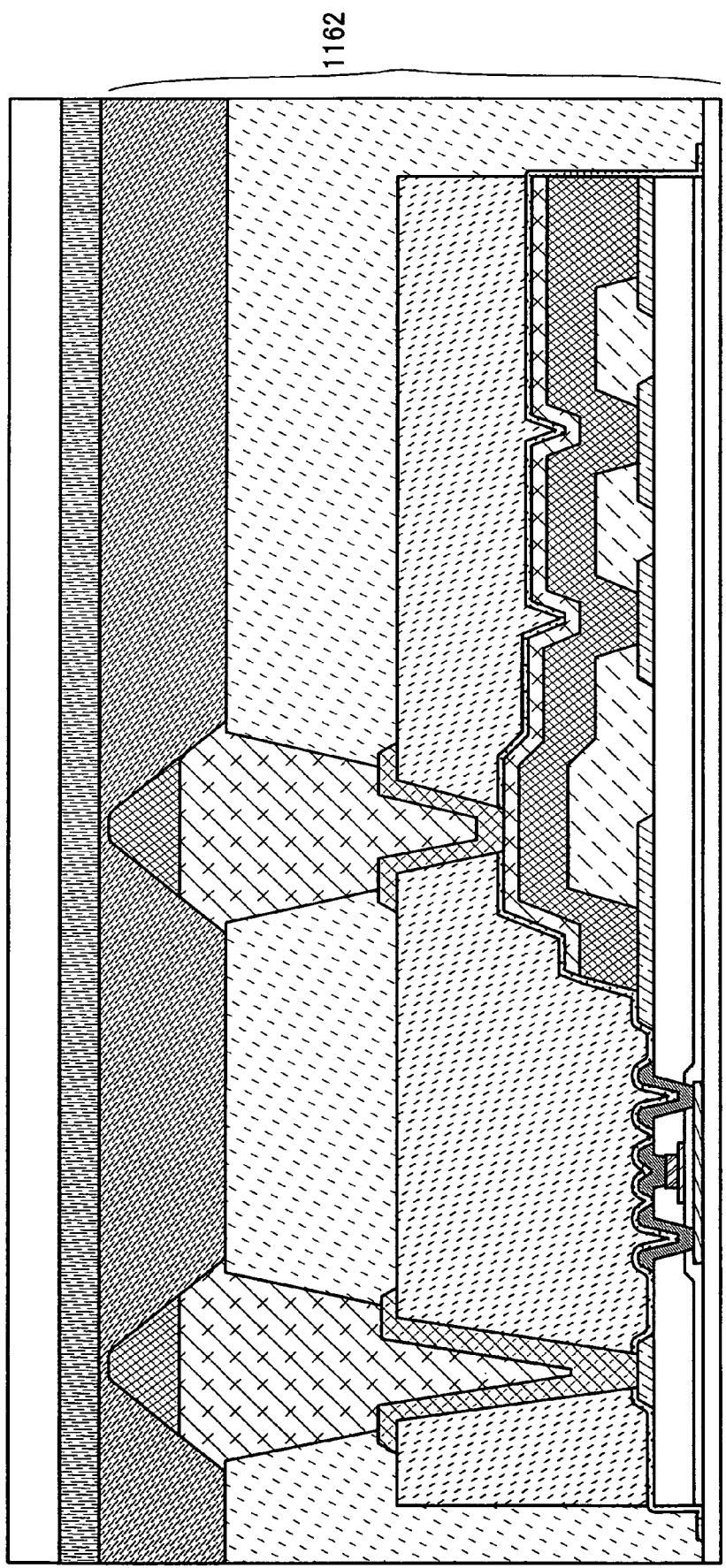
FIG. 27 shows a manufacturing step of a semiconductor device of the invention.

Next, the metal film 1103 over the substrate 1101 is peeled from the insulating film 1104 by a physical means (see FIG. 26). Physical force is relatively low force, for example, load using a member having a sharp end portion, such as a wedge, wind pressure of gas blown from a nozzle, or ultrasonic waves. Separation occurs within the metal oxide film 1100, at an interface between the insulating film 1104 and the metal oxide film 1100, or at an interface between the metal oxide film 1100 and the metal film 1103, so that the separation body 1161 and the stacked-layer body 1162 are peeled from each other with relatively low force. Thus, the stacked-layer body 1162 can be separated from the separation body 1161. The stacked-layer body 1162 from which the separation body 1161 is separated is shown in FIG. 27.

Here, a color filter is described. An insulating film 1132, a metal film 1133, and an insulating film 1134 are formed over a substrate 1131. The substrate 1131, the insulating film 1132, the metal film 1133, and the insulating film 1134 may be formed of the same material as the substrate 1101, the insulating film 1102, the metal film 1103, and the insulating film 1104, respectively. Further, a metal oxide film 1130 is formed between the metal film 1133 and the insulating film 1134.

In this embodiment mode, a glass substrate is used as the substrate 1131; a silicon oxide film containing nitrogen as the insulating film 1132; tungsten (W) as the metal film 1133, and a silicon oxide film containing nitrogen as the insulating film 1134.

A color filter 1135 is formed over a part of or the entire surface of the insulating film 1134.

As a method for manufacturing the color filter 1135, a known method such as an etching method using a colored resin, a color resist method using a color resist, a staining method, an electrodeposition method, a micelle electrolytic method, an electrodeposition transfer method, a film dispersion method, an inkjet method (a droplet discharging method), or a silver salt color development method can be used.

In this embodiment mode, a color filter is formed by an etching method using a photosensitive resin in which pigment is dispersed. A photosensitive acrylic resin in which a red pigment, a green pigment, or a blue pigment is dispersed is provided over the insulating film 1134 by a coating method. Next, the acrylic resin is dried and temporarily baked. Thereafter, exposure and development are performed, and then, the acryl is hardened by heating at 220° C. to form the color filter 1135 of 1.0 to 2.5 μm.

Note that a position of the color filter 1135 is adjusted to the region where the photoelectric conversion layer 1121 is formed after attachment with a bonding material 1137.

Figure 28A:
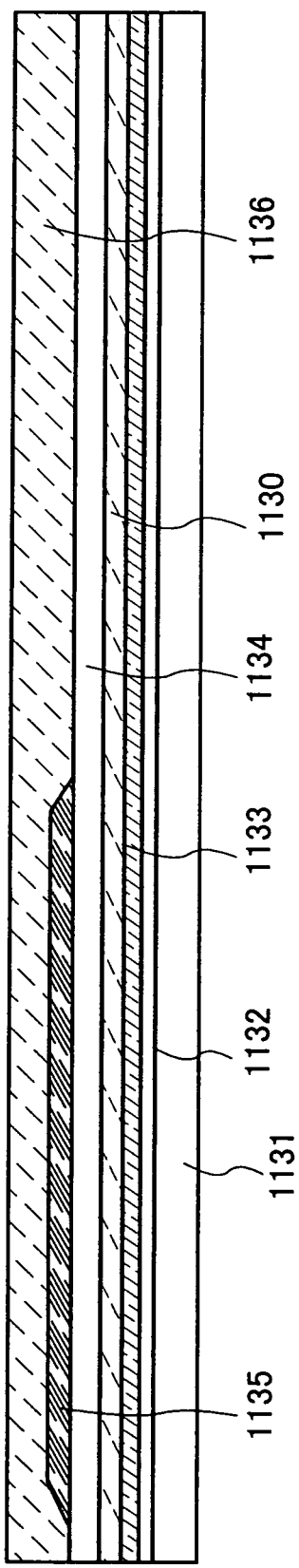
FIGS. 28A and 28B show manufacturing steps of a semiconductor device of the invention.
Figure 28B:
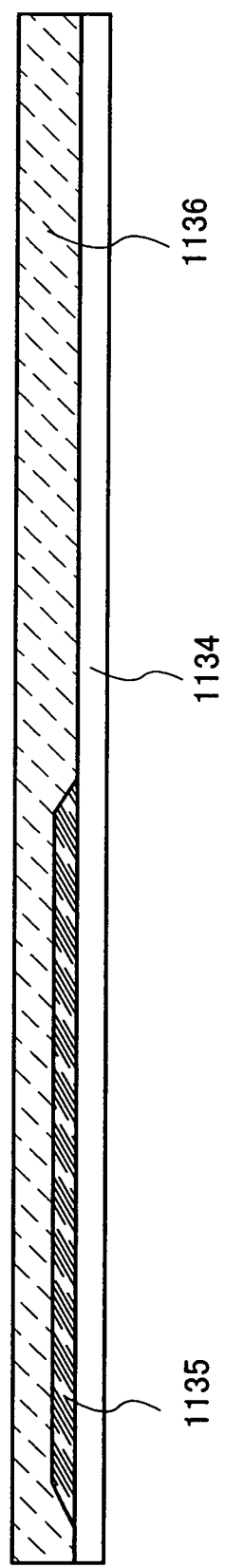

An overcoat layer 1136 is formed to cover the color filter 1135 (see FIG. 28A). The overcoat layer 1136 may be formed of a material similar to that of the overcoat layer 1117.

Next, similar in FIG. 26, the metal film 1133 over the substrate 1131 is separated from the insulating film 1134 by a physical means. Thus, the substrate 1131, the insulating film 1132, the metal film 1133, and the metal oxide film 1130 can be separated from the insulating film 1134, the color filter 1135, and the overcoat layer 1136 (see FIG. 28B).

Figure 36:
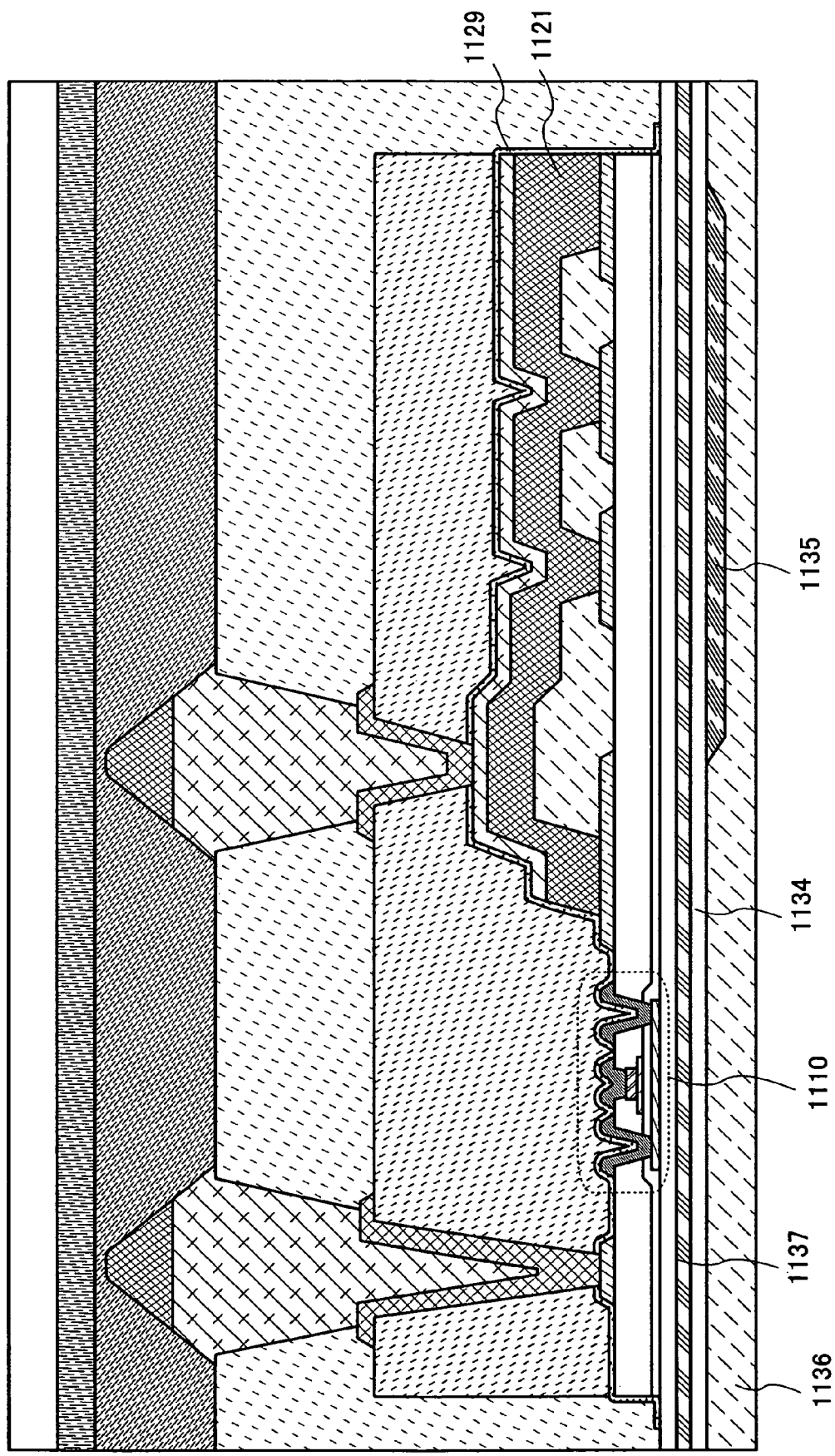
FIG. 36 shows a manufacturing step of a semiconductor device of the invention.

Then, the insulating film 1104 and the insulating film 1134 are bonded to each other using the bonding material 1137 (see FIG. 36). It is important for the bonding material 1137 to have higher adhesiveness between the stacked-layer body 1162 including the insulating film 1104 and the insulating film 1134 than adhesiveness of the adhesive material 1152 formed of an organic material between the second substrate 1151 and the stacked-layer body 1162 which is a layer to be peeled. That is, it is preferable that the adhesion of the bonding material 1137 be higher than that of the adhesive material 1152.

As the bonding material 1137, various kinds of curable bonding materials, for example, a reactive curable bonding material, a heat-curable bonding material, a light-curable bonding material such as a UV-curable bonding material, and an anaerobic curable bonding material can be employed. In this embodiment mode, an epoxy resin may be used as the bonding material 1137.

Note that instead of the aforementioned step, an adhesive material (hereinafter also referred to as double-sided tape) in which release paper (separate paper, that is, a separator or the like, in which a sheet having a separation surface on one or each substrate side) is provided so that the adhesive material does not adhere to other members may be provided on the insulating film 1104. When separation paper is peeled, the adhesive material can adhere to any member. As a material of such double-sided tape, polyimide (PI), polyethylene naphthalate (PEN), polyethylene terephthalate (PET), and the like can be employed.

Figure 37:
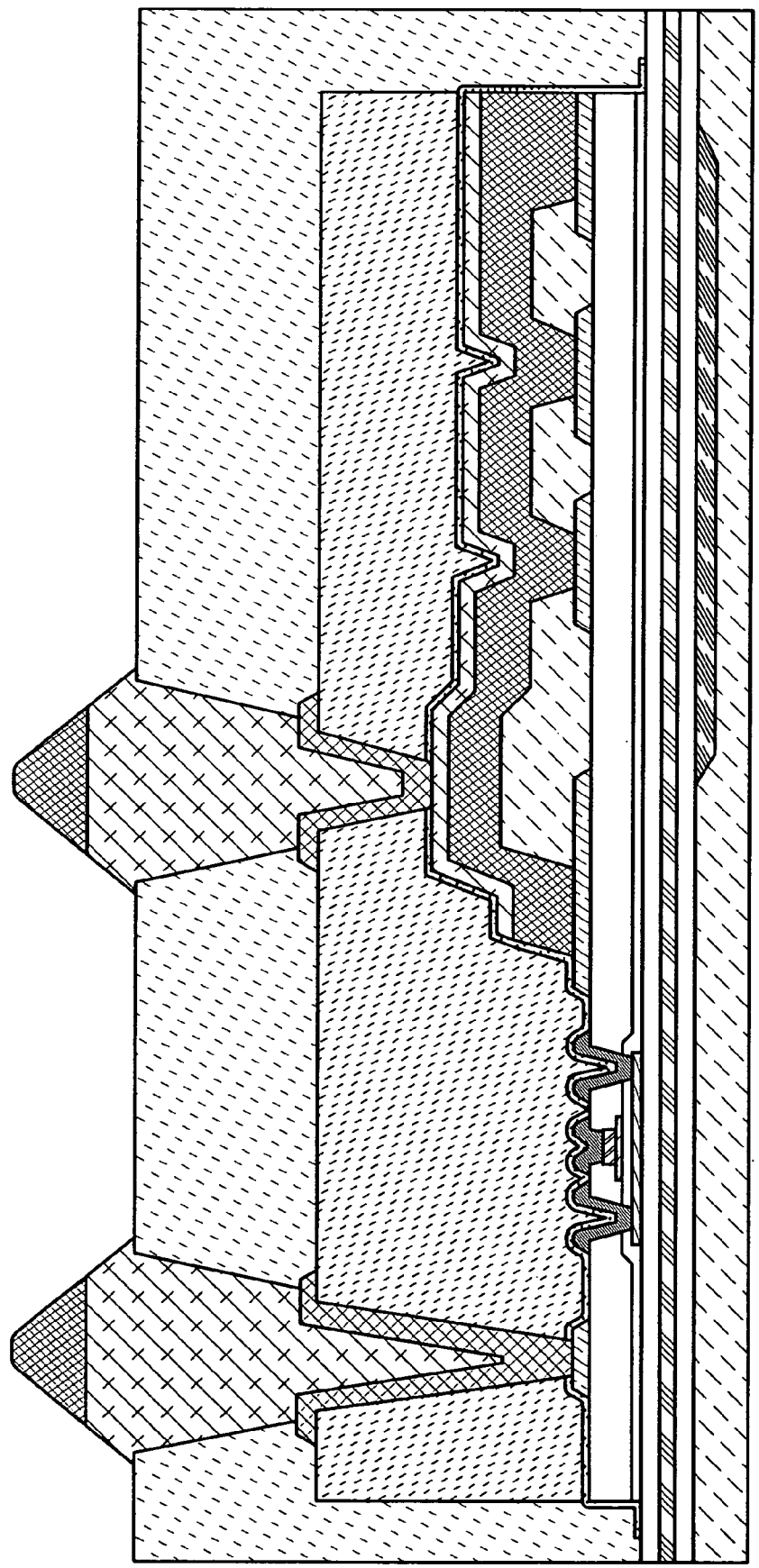
FIG. 37 is a cross-sectional view of a semiconductor device of the invention.

Next, the adhesive material 1152 and the second substrate 1151 are separated from the stacked-layer body 1162 (see FIG. 37). The adhesive material 1152 made of an organic material is subjected to thermal reaction, photoreaction, reaction to humidity, or chemical reaction (e.g., adhesion is decreased using water, oxygen, or the like), and then the adhesive material 1152 made of the organic material and the second substrate 1151 are separated from the stacked-layer body 1162.

Through the above steps, a semiconductor device which is also a photoelectric conversion device including the photoelectric conversion layer 1121, the TFT 1110, and the color filter 1135 is formed.

In this embodiment mode, the insulating film 1104 is a single layer; however, the insulating film 1104 may have a two-layer structure of a lower insulating film 1104a and an upper insulating film 1104b.

In that case, it is preferable that a silicon nitride film containing oxygen (SiOxNy: y>x) be used as the lower insulating film 1104a and a silicon oxide film containing nitrogen (SiOxNy: x>y) be used as the upper insulating film 1104b, for example. Accordingly, contaminant such as moisture from the substrate 1101 side can be prevented.

A semiconductor device in this embodiment mode is useful because it can prevent an impurity such as moisture or an organic material from being mixed.

[Embodiment Mode 4]

In this embodiment mode, a photoelectric conversion device having a structure different from that in Embodiment Mode 3 is described with reference to FIG. 38. Note that portions which are the same as those in Embodiment Mode 3 are denoted by the same reference numeral, and the description in Embodiment Mode 3 is used for portions which are not particularly described.

Figure 38:
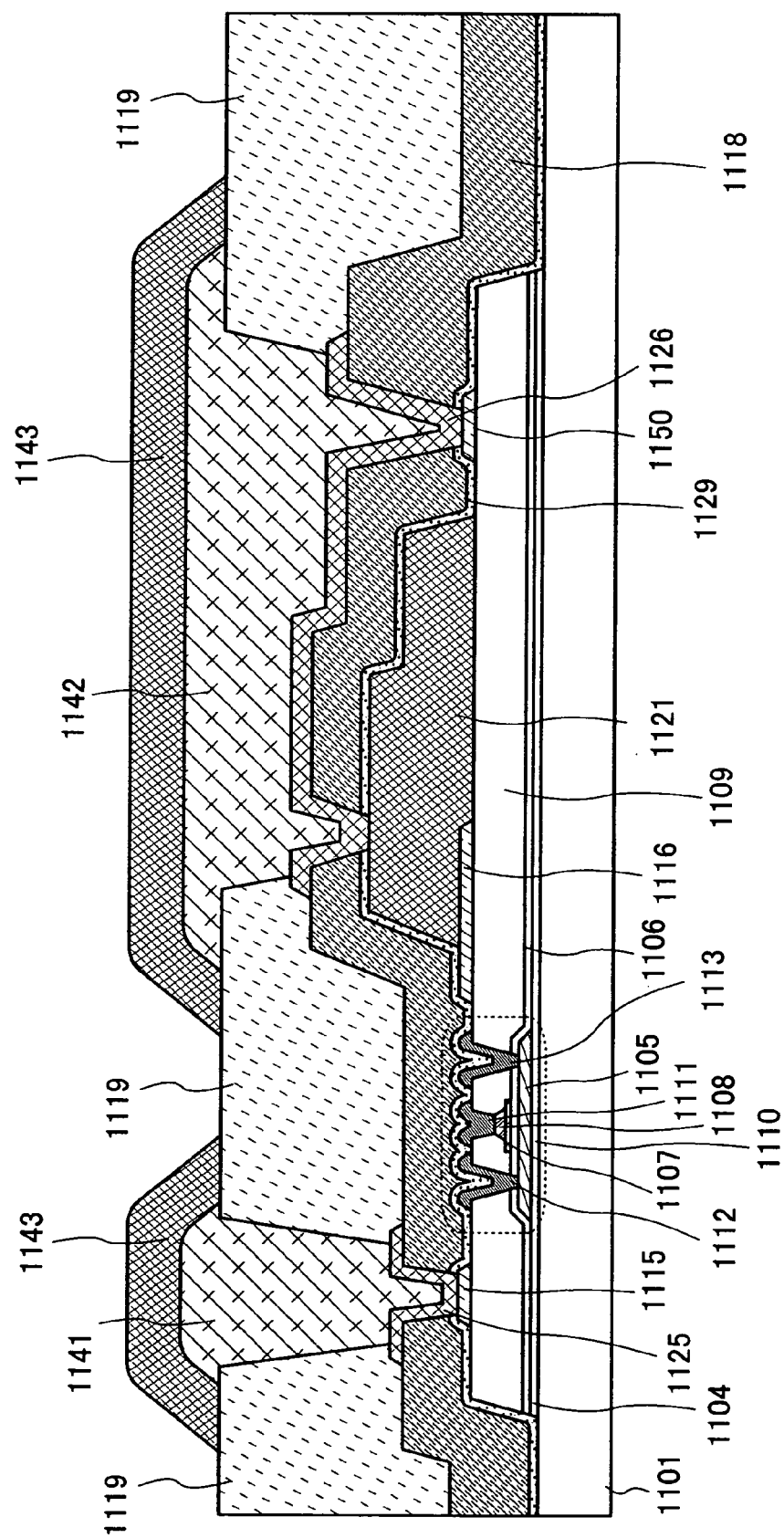
FIG. 38 is a cross-sectional view of a semiconductor device of the invention.

In a photoelectric conversion device shown in FIG. 38, the insulating film 1104 which is the base film and the TFT 1110 are formed over the substrate 1101. The TFT 1110 includes the island-shaped semiconductor film 1105 which is an active layer, the gate insulating film 1106, the lower gate electrode 1107, and the upper gate electrode 1108. The source region, the drain region, and the channel formation region are formed in the island-shaped semiconductor film 1105 which is the active layer. The electrode 1112 is electrically connected to one of the source region and the drain region. The electrode 1113 is electrically connected to the other of the source region and the drain region.

The interlayer insulating film 1109 is formed to cover the TFT 1110 and the gate insulating film 1106. The electrodes 1115 and 1116 and an electrode 1150 are formed over the interlayer insulating film 1109. The electrodes 1115, 1116, and 1150 are formed of the same material in the same step.

End portions of the insulating film 1104 which is the base film, the gate insulating film 1106, and the interlayer insulating film 1109 are tapered. Thus, coverage of them with the protective film 1129 formed thereover is improved, and moisture, an impurity, or the like can be prevented from entering.

Next, the photoelectric conversion layer 1121 is formed over the interlayer insulating film 1109. The bottom layer of the photoelectric conversion layer 1121, in this embodiment mode, the p-type semiconductor layer 1121p overlaps with part of the electrode 1116 to be electrically connected. The photoelectric conversion layer 1121 includes the i-type semiconductor layer 1121i and the n-type semiconductor layer 1121n over the p-type semiconductor layer 1121p.

The protective film 1129 is formed to cover the insulating film 1104 which is the base film, the gate insulating film 1106, the interlayer insulating film 1109, the electrodes 1115, 1116, and 1150, and the photoelectric conversion layer 1121. In this embodiment mode, a silicon nitride film is used as the protective film 1129.

The interlayer insulating film 1118 is formed over the protective film 1129. Over the interlayer insulating film 1118, the electrode 1125 which is electrically connected to the electrode 1115, and the electrode 1126 which is electrically connected to the electrode 1150 and the uppermost layer of the photoelectric conversion layer 1121, in this embodiment mode, the n-type semiconductor layer 1121n are formed.

Next, the interlayer insulating film 1119 is formed over the interlayer insulating film 1118. At this time, the interlayer insulating film 1119 is not formed over the electrodes 1125 and 1126.

The electrode 1141 electrically connected to the electrode 1125 and the electrode 1142 electrically connected to the electrode 1126 are formed. Then, the electrodes 1143 and 1144 are formed over the electrodes 1141 and 1142, respectively.

When a color filter is formed by attachment similarly to Embodiment Mode 3, the insulating film 1102, the metal film 1103, and the metal oxide film 1100 may be formed between the substrate 1101 and the insulating film 1104 functioning as the base film, and a photoelectric conversion device provided with the color filter may be formed through the steps in Embodiment Mode 3.

In this embodiment mode, the end portions of the insulating film 1104 which is the base film, the gate insulating film 1106, and the interlayer insulating film 1109 are tapered; thus, coverage of them with the protective film 1129 is improved, and a photoelectric conversion device in which moisture, an impurity, or the like can be prevented from entering can be obtained.

[Embodiment Mode 5]

A photoelectric conversion device of the invention provides a beneficial effect by being attached to a liquid crystal display device. In particular, in the case of a liquid crystal display device provided with a backlight, image quality can be improved by changing luminance of the backlight with respect to output of the photoelectric conversion device of the invention.

For example, when illuminance at a position where the liquid crystal display device is provided is detected by the photoelectric conversion device of the invention and the illuminance is low, luminance of the backlight is made lower. Accordingly, quality of an image displayed by the liquid crystal display device is improved. This is because in the liquid crystal display device, faint light emission of a black display portion (i.e., black blurring) becomes noticeable as ambient illuminance is lower, and contrast of a display image is reduced; at this time, the degree of black blurring is reduced as luminance of the backlight is lower. At the same time, power consumption for light emission of the backlight can be reduced.

On the other hand, when illuminance at a position where the liquid crystal display device is provided is detected by the photoelectric conversion device of the invention and the illuminance is high, luminance of the backlight is preferably made higher. This is because light intensity of the backlight is relatively small with respect to light by reflection of external light when the illuminance at the position where the liquid crystal display device is provided is high, so that contrast of an image is reduced as well; at this time, reduction in contrast of the image can be suppressed as luminance of the backlight is higher. Further, the use of a polarizing plate a surface of which has low reflectivity is effective in order to suppress reflection of external light itself.

In this embodiment mode, a peripheral portion of a liquid crystal display device, in particular, a backlight and a polarizing plate are described.

Figure 50:
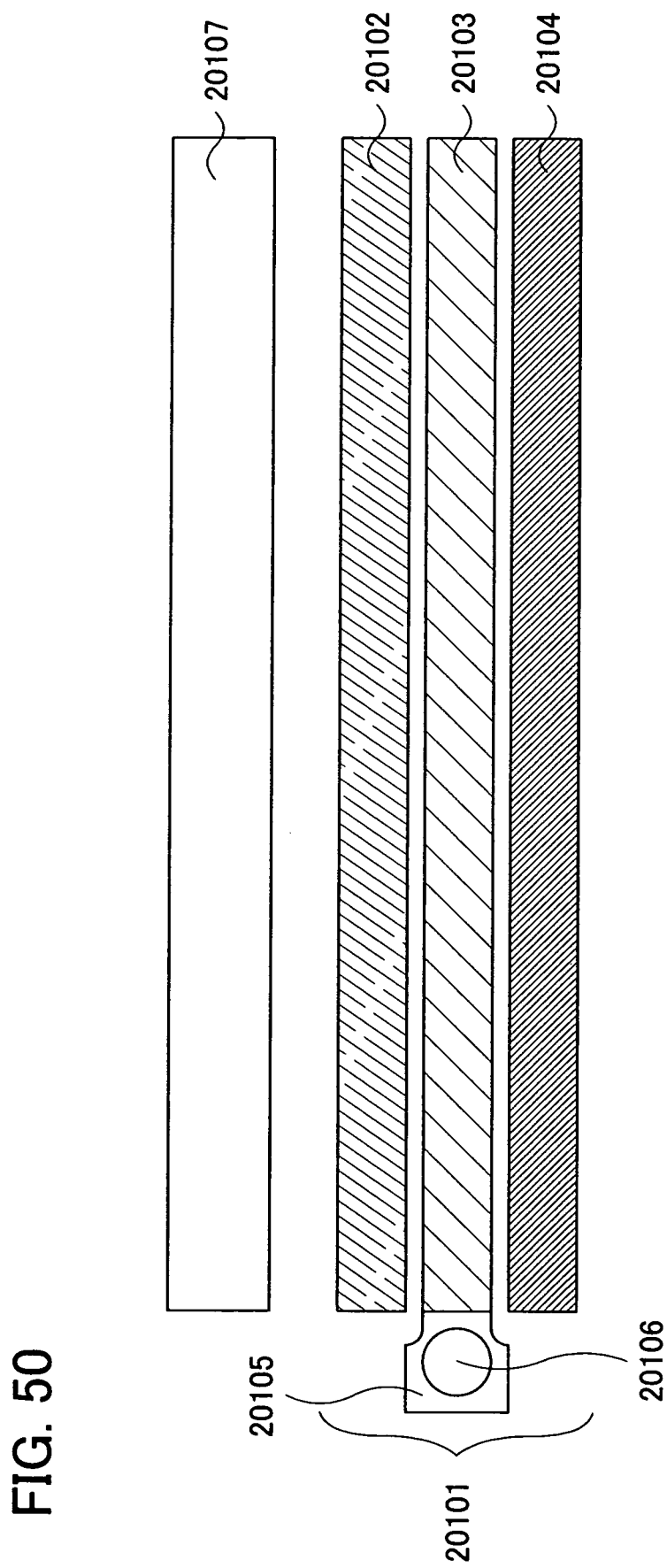
FIG. 50 illustrates an example of a peripheral component of a semiconductor device of the invention.

FIG. 50 shows an example of a liquid crystal display device including a so-called edge-light type backlight unit 20101 and a liquid crystal panel 20107. An edge-light type refers to a type in which a light source is provided at an end portion of a backlight unit and fluorescence of the light source is emitted from the entire light-emitting surface. The edge-light type backlight unit is thin and can save power.

The backlight unit 20101 includes a diffusion plate 20102, a light guide plate 20103, a reflection plate 20104, a lamp reflector 20105, and a light source 20106.

The light source 20106 has a function of emitting light when necessary. As the light source 20106, a cold cathode fluorescent lamp, a hot cathode fluorescent lamp, a light-emitting diode, an inorganic EL element, an organic EL element, or the like can be used, for example. The lamp reflector 20105 has a function of efficiently guiding fluorescence from the light source 20106 to the light guide plate 20103. The light guide plate 20103 has a function of guiding light to the entire surface by total reflection of fluorescence. The diffuser plate 20102 has a function of reducing variation in brightness. The reflection plate 20104 has a function of reflecting and reusing light leaked under the light guide plate 20103 (a direction opposite to the liquid crystal panel 20107).

Note that a control circuit for adjusting luminance of the light source 20106 is connected to the backlight unit 20101. Luminance of the light source 20106 can be adjusted by the control circuit.

FIGS. 51A to 51D each show a detailed structure of the edge-light type backlight unit. Note that description of a diffusion plate, a light guide plate, a reflection plate, and the like is omitted.

Figure 51A:
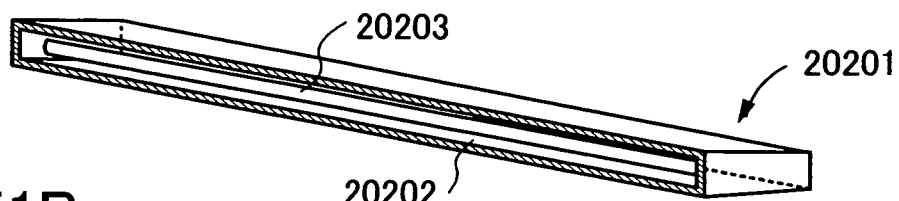
FIGS. 51A to 51D illustrate examples of peripheral components of a semiconductor device of the invention.

A backlight unit 20201 shown in FIG. 51A has a structure in which a cold cathode fluorescent lamp 20203 is used as a light source. A lamp reflector 20202 is provided to efficiently reflect light from the cold cathode fluorescent lamp 20203. Such a structure is often used for a large display device due to intensity of luminance from the cold cathode fluorescent lamp.

Figure 51B:
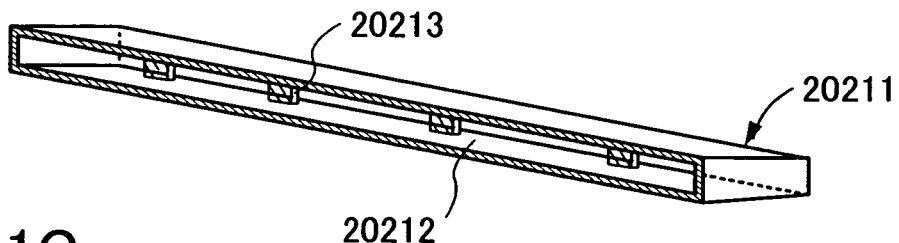

A backlight unit 20211 shown in FIG. 51B has a structure in which light-emitting diodes (LEDs) 20213 are used as light sources. For example, the light-emitting diodes (W) 20213 which emit white light are provided at a predetermined interval. Further, a lamp reflector 20212 is provided to efficiently reflect light from the light-emitting diodes 20213.

Since luminance of the light-emitting diode is high, a structure using the light-emitting diode is suitable for a large display device. Since the light-emitting diode is superior in color reproducibility, layout area can be reduced. Accordingly, a narrower frame of a display device can be realized.

Note that when the light-emitting diode is included in a large display device, the light-emitting diode can be provided on a back surface of a substrate. The light-emitting diodes of respective colors are sequentially arranged at a predetermined interval. Color reproducibility can be improved by arrangement of the light-emitting diodes.

Figure 51C:
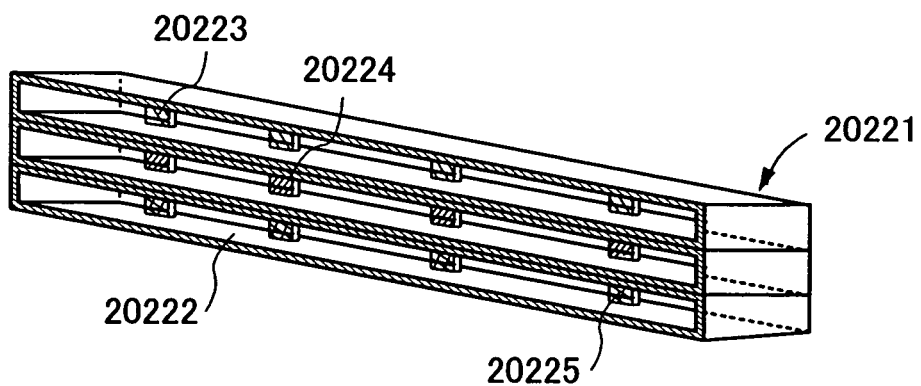

A backlight unit 20221 shown in FIG. 51C has a structure in which light-emitting diodes (LEDs) 20223, light-emitting diodes (LEDs) 20224, and light-emitting diodes (LEDs) 20225 of each color of RGB are used as light sources. The light-emitting diodes (LEDs) 20223, 20224, and 20225 of each color of RGB are provided at a predetermined interval. By using the light-emitting diodes (LEDs) 20223, 20224, and 20225 of each color of RGB, color reproducibility can be improved. Further, a lamp reflector 20222 is provided to efficiently reflect light from the light-emitting diodes.

Since luminance of the light-emitting diode is high, a structure where the light-emitting diodes of each color of RGB are used as the light sources is suitable for a large display device. Since the light-emitting diode is superior in color reproducibility, layout area can be reduced. Accordingly, a narrower frame of a display device can be realized.

Note that color display can be performed by sequentially lighting the light-emitting diodes of RGB in accordance with time, which is a so-called field sequential mode.

A light-emitting diode which emits white light and the light-emitting diodes (LEDs) 20223, 20224, and 20225 of each color of RGB can be combined.

Note that when the light-emitting diode is included in a large display device, the light-emitting diode can be provided on a back surface of a substrate. The light-emitting diodes of respective colors are sequentially arranged at a predetermined interval. Color reproducibility can be improved by arrangement of the light-emitting diodes.

Figure 51D:
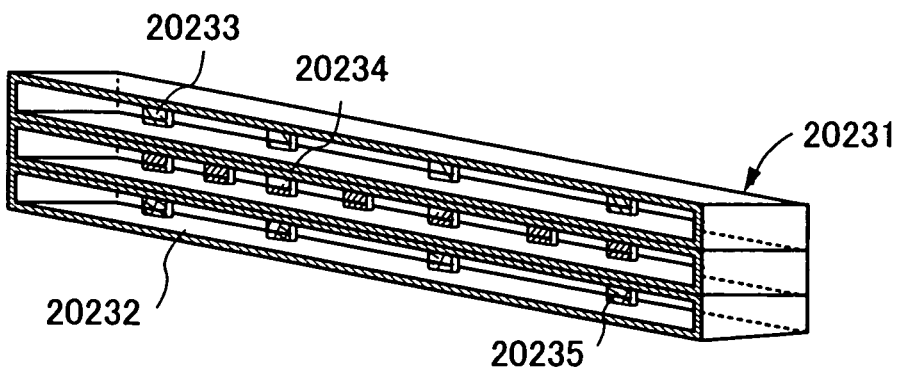

A backlight unit 20231 shown in FIG. 51D has a structure in which light-emitting diodes (LEDs) 20233, light-emitting diodes (LEDs) 20234, and light-emitting diodes (LEDs) 20235 of each color of RGB are used as light sources. For example, among the light-emitting diodes (LEDs) 20233, 20234, and 20235 of each color of RGB, the light-emitting diodes of a color with low emission intensity (e.g., green) are provided more than other light-emitting diodes. By using the light-emitting diodes (LEDs) 20233, 20234, and 20235 of each color of RGB, color reproducibility can be improved. Further, a lamp reflector 20232 is provided to efficiently reflect light from the light-emitting diodes.

Since luminance of the light-emitting diode is high, a structure where the light-emitting diodes of each color of RGB are used as the light sources is suitable for a large display device. Since the light-emitting diode is superior in color reproducibility, layout area can be reduced. Accordingly, a narrower frame of a display device can be realized.

Note that color display can be performed by sequentially lighting the light-emitting diodes of RGB in accordance with time, which is a so-called field sequential mode.

A light-emitting diode which emits white light and the light-emitting diodes (LEDs) 20233, 20234, and 20235 of each color of RGB can be combined.

Note that when the light-emitting diode is included in a large display device, the light-emitting diode can be provided on a back surface of a substrate. The light-emitting diodes of respective colors are sequentially arranged at a predetermined interval. Color reproducibility can be improved by arrangement of the light-emitting diodes.

FIG. 52A shows an example of a liquid crystal display device including a so-called direct-type backlight unit and a liquid crystal panel. A direct type refers to a type in which a light source is provided directly under a light-emitting surface and fluorescence of the light source is emitted from the entire light-emitting surface. The direct-type backlight unit can efficiently utilize the amount of emitted light.

A backlight unit 20500 includes a diffusion plate 20501, a light-shielding plate 20502, a lamp reflector 20503, and a light source 20504. The backlight unit 20500 is provided directly under a liquid crystal panel 20505.

The light source 20504 has a function of emitting light when necessary. As the light source 20504, a cold cathode fluorescent lamp, a hot cathode fluorescent lamp, a light-emitting diode, an inorganic EL element, an organic EL element, or the like can be used, for example. The lamp reflector 20503 has a function of efficiently guiding fluorescence of the light source 20504 to the diffusion plate 20501 and the light-shielding plate 20502. The light-shielding plate 20502 has a function of reducing variation in brightness by shielding a larger amount of light as light intensity is increased in accordance with arrangement of the light source 20504. The diffusion plate 20501 has a function of further reducing variation in brightness.

Note that a control circuit for adjusting luminance of the light source 20504 is connected to the backlight unit 20500. Luminance of the light source 20504 can be adjusted by the control circuit.

FIG. 52B shows another example of a liquid crystal display device including a so-called direct-type backlight unit and a liquid crystal panel. A direct type refers to a type in which a light source is provided directly under a light-emitting surface and fluorescence of the light source is emitted from the entire light-emitting surface. The direct-type backlight unit can efficiently utilize the amount of emitted light.

A backlight unit 20510 includes a diffusion plate 20511, a light-shielding plate 20512, a lamp reflector 20513, and a light source (R) 20514a, a light source (G) 20514b, and a light source (B) 20514c of each color of RGB. The backlight unit 20510 is provided directly under a liquid crystal panel 20515.

The light source (R) 20514a, the light source (G) 20514b, and the light source (B) 20514c of each color of RGB have a function of emitting light when necessary. As the light source (R) 20514a, the light source (G) 20514b, and the light source (B) 20514c, a cold cathode fluorescent lamp, a hot cathode fluorescent lamp, a light-emitting diode, an inorganic EL element, an organic EL element, or the like can be used, for example. The lamp reflector 20513 has a function of efficiently guiding fluorescence of the light source 20514 to the diffusion plate 20511 and the light-shielding plate 20512. The light-shielding plate 20512 has a function of reducing variation in brightness by shielding a larger amount of light as light intensity is increased in accordance with arrangement of the light source 20514. The diffusion plate 20511 has a function of further reducing variation in brightness.

Note that a control circuit for adjusting luminances of the light source (R) 20514a, the light source (G) 20514b, and the light source (B) 20514c of respective colors of RGB is connected to the backlight unit 20510. Luminances of the light source (R) 20514a, the light source (G) 20514b, and the light source (B) 20514c of respective colors of RGB can be adjusted by the control circuit. Further, luminances of the light sources of respective colors are controlled by output of the photoelectric conversion device of the invention, so that image quality of the liquid crystal display device can be improved.

Figure 53:
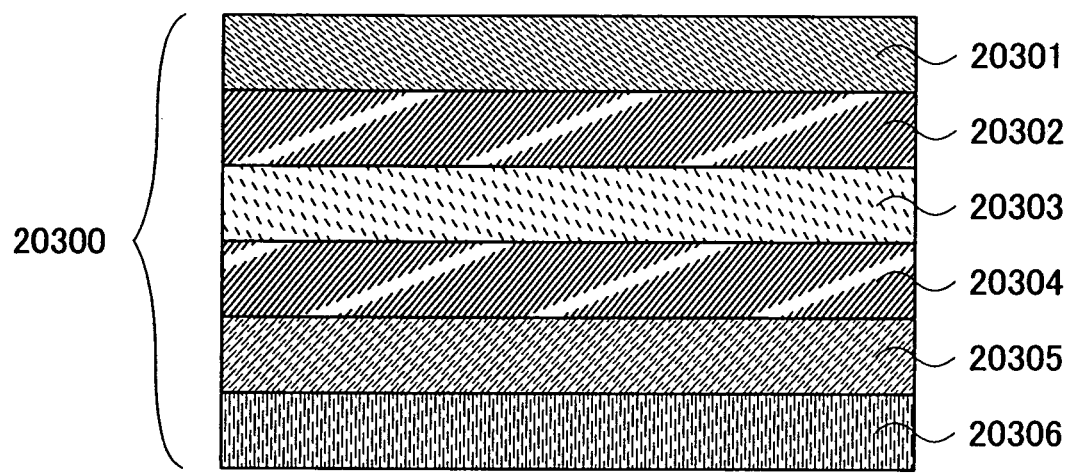
FIG. 53 illustrates an example of a peripheral component of a semiconductor device of the invention.

FIG. 53 shows an example of a structure of a polarizing plate (also referred to as a polarizing film).

A polarizing film 20300 includes a protective film 20301, a substrate film 20302, a PVA polarizing film 20303, a substrate film 20304, an adhesive layer 20305, and a mold release film 20306.

The PVA polarizing film 20303 has a function of generating light which oscillates only in a certain direction (linear polarized light). Specifically, the PVA polarizing film 20303 contains molecules (polarizers) in which vertical electron density and horizontal electron density are greatly different from each other. The direction of the molecules in which vertical electron density and horizontal electron density are greatly different from each other is uniformed, so that the PVA polarizing film 20303 can form linear polarized light.

For example, as the PVA polarizing film 20303, a polymer film of polyvinyl alcohol is doped with an iodine compound and the PVA film is pulled in a certain direction, so that a film in which iodine molecules are aligned in a certain direction can be obtained. Then, light parallel to the major axis of the iodine molecule is absorbed by the iodine molecule. Note that a dichroic dye may be used instead of iodine for applications which require high durability and high heat resistance. Dye is preferably used for a liquid crystal display device which need to have durability and heat resistance, such as an in-car LCD or an LCD for a projector.

When the PVA polarizing film 20303 is interposed between films (the substrate films 20302 and 20304) to be base materials, reliability can be improved. Note that the PVA polarizing film 20303 may be interposed by triacetyl cellulose (TAC) films with high light-transmitting properties and high durability. The substrate films and the TAC films each function as a protective film of a polarizer included in the PVA polarizing film 20303.

The adhesive layer 20305 which is to be attached to a glass substrate of the liquid crystal panel is attached to one of the substrate films (the substrate film 20304). Note that the adhesive layer 20305 is formed by applying an adhesive to one of the substrate films (the substrate film 20304). The adhesive layer 20305 is provided with the mold release film 20306 (a separate film).

The other of the substrates films (the substrate film 20302) is provided with the protective film 20301.

A hard coating scattering layer (an anti-glare layer) may be provided on a surface of the polarizing film 20300. Since the surface of the hard coating scattering layer has minute unevenness formed by AG treatment and has an anti-glare function of scattering external light, reflection of external light in the liquid crystal panel and surface reflection can be prevented.

Treatment in which a plurality of optical thin-film layers having different refractive indexes are layered (also referred to as anti-reflection treatment or AR treatment) may be performed on the surface of the polarizing film 20300. The plurality of layered optical thin-film layers having different refractive indexes can reduce reflectivity on the surface by an interference effect of light. Since reflection of external light can be suppressed by using a polarizing film having a surface with low reflectivity, a liquid crystal display device can be obtained by which an image with high contrast can be displayed even when ambient illuminance is high. Moreover, further degradation in contrast can be suppressed by using the photoelectric conversion device of the invention.

Figure 54A:
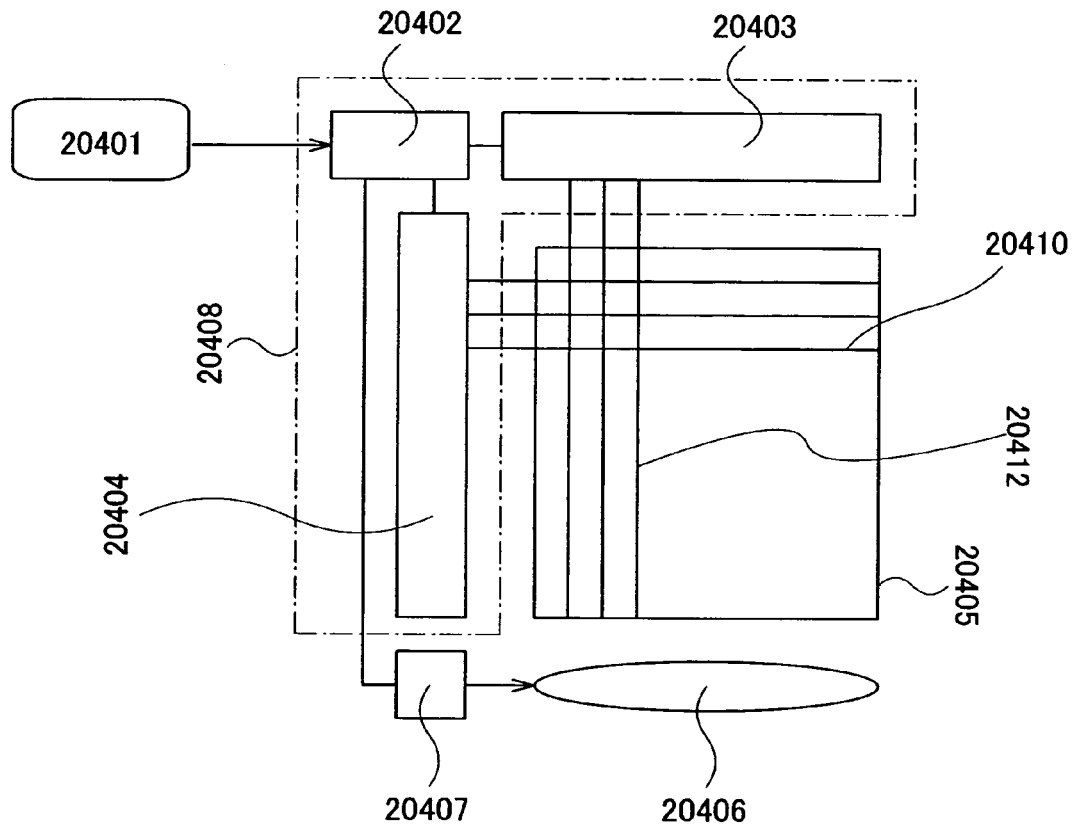
FIGS. 54A to 54C illustrate examples of circuit structures of a panel in a semiconductor device according to the invention.
Figure 54B:
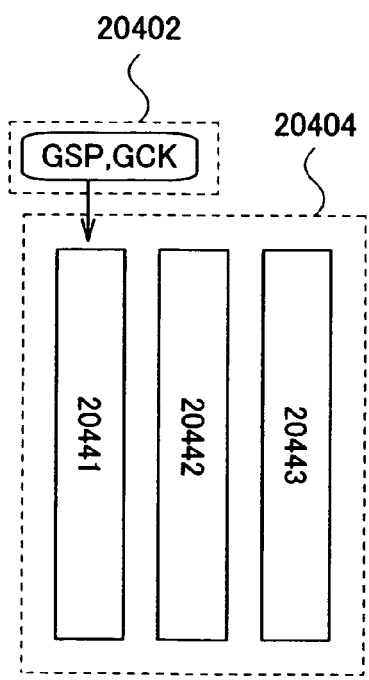
Figure 54C:
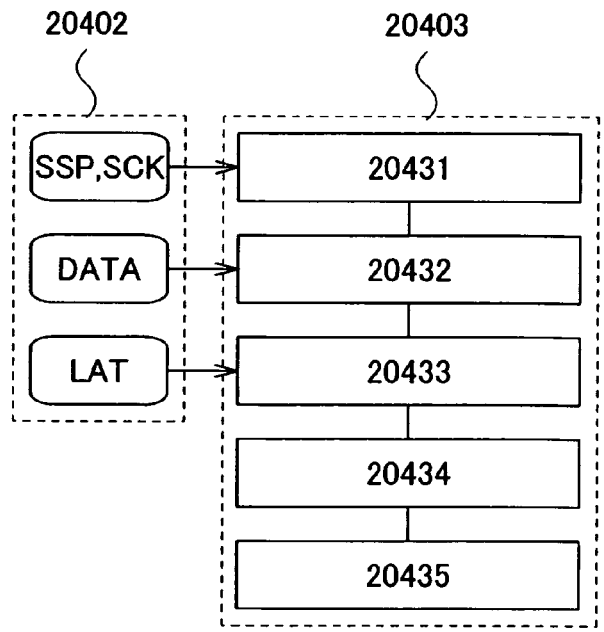

FIGS. 54A to 54C show examples of a system block of a liquid crystal display device.

In a pixel portion 20405, signal lines 20412 which are extended from a signal line driver circuit 20403 are provided. In the pixel portion 20405, scan lines 20410 which are extended from a scan line driver circuit 20404 are also provided. Further, a plurality of pixels are arranged in matrix in intersection regions of the signal lines 20412 and the scan lines 20410. Note that each of the plurality of pixels includes a switching element. Accordingly, voltage for controlling inclination of liquid crystal molecules can be separately input to each of the plurality of pixels. A structure in which a switching element is provided in each intersection region in such a manner is referred to as an active matrix type. Note that the invention is not limited to such an active matrix type, and a structure of a passive matrix type may be employed. In a passive matrix type, a switching element is not included in each pixel, so that a process is simple.

A driver circuit portion 20408 includes a control circuit 20402, the signal line driver circuit 20403, and the scan line driver circuit 20404. An image signal 20401 is input to the control circuit 20402. The control circuit 20402 controls the signal line driver circuit 20403 and the scan line driver circuit 20404 in accordance with the image signal 20401, and inputs a control signal to each of the signal line driver circuit 20403 and the scan line driver circuit 20404. Then, in accordance with the control signal, the signal line driver circuit 20403 inputs a video signal to the signal lines 20412, and the scan line driver circuit 20404 inputs a scan signal to the scan lines 20410. Then, the switching element included in the pixel is selected in accordance with the scan signal, and the video signal is input to a pixel electrode of the pixel.

In addition, the control circuit 20402 also controls a power supply 20407 in accordance with the image signal 20401. The power supply 20407 includes a means to supply power to a lighting unit 20406. As the lighting unit 20406, an edge-light type backlight unit or a direct-type backlight unit can be used. Alternatively, a front light may be used as the lighting unit 20406. A front light refers to a plate-like lighting unit including a luminous body and a light conducting body, which is attached to the front surface side of a pixel portion and illuminates the whole area. Such a lighting unit can uniformly illuminate the pixel portion at low power consumption. Further, by using the photoelectric conversion device of the invention, a liquid crystal display device can be obtained by which an image with high contrast can be displayed.

As shown in FIG. 54B, the scan line driver circuit 20404 includes a shift register 20441, a level shifter 20442, and a circuit functioning as a buffer 20443. A signal such as a gate start pulse (GSP) or a gate clock signal (GCK) is input to the shift register 20441.

As shown in FIG. 54C, the signal line driver circuit 20403 includes a shift register 20431, a first latch 20432, a second latch 20433, a level shifter 20434, and a circuit functioning as a buffer 20435. The circuit functioning as the buffer 20435 refers to a circuit which has a function of amplifying a weak signal and includes an operational amplifier or the like. A signal such as a start pulse (SSP) is input to the level shifter 20434, and data (DATA) such as a video signal is input to the first latch 20432. A latch (LAT) signal can be temporally held in the second latch 20433 and is input to the pixel portion 20405 all at once. This is referred to as line sequential driving. Accordingly, when a pixel in which not line sequential driving but dot sequential driving is performed is employed, the second latch can be omitted.

In this embodiment mode, various types of liquid crystal panels can be used. For example, the liquid crystal panel can have a structure in which a liquid crystal layer is sealed between two substrates. A transistor, a capacitor, a pixel electrode, an alignment film, or the like is formed over one substrate. A polarizing plate, a retardation plate, or a prism sheet may be provided on a surface opposite to a top surface of one substrate. A color filter, a black matrix, an opposite electrode, an alignment film, or the like is provided on the other substrate. A polarizing plate or a retardation plate may be provided on a surface opposite to a top surface of the other substrate. Note that the color filter and the black matrix may be formed over the top surface of one substrate. In addition, three-dimensional display can be performed by providing a slit (a grid) on the top surface or the surface opposite to the top surface of one substrate.

Each of the polarizing plate, the retardation plate, and the prism sheet can be provided between the two substrates. Alternatively, each of the polarizing plate, the retardation plate, and the prism sheet can be integrated with one of the two substrates.

Note that although this embodiment mode is described with reference to various drawings, the contents (or part of the contents) described in each drawing can be freely applied to, combined with, or replaced with the contents (or part of the contents) described in another drawing. Further, much more drawings can be formed by combining each part with another part in the above-described drawings.

Similarly, the contents (or part of the contents) described in each drawing in this embodiment mode can be freely applied to, combined with, or replaced with the contents (or part of the contents) described in a drawing in another embodiment mode. Further, much more drawings can be formed by combining each part in each drawing in this embodiment mode with part of another embodiment mode.

Note that this embodiment mode shows examples of embodying, slightly transforming, partially modifying, improving, describing in detail, or applying the contents (or part of the contents) described in other embodiment modes, an example of related part thereof, or the like. Therefore, the contents described in other embodiment modes can be freely applied to, combined with, or replaced with this embodiment mode.

[Embodiment Mode 6]

In this embodiment mode, various liquid crystal modes are described. As an operation mode of a liquid crystal which a semiconductor device according to the invention can use, a TN (twisted nematic) mode, an IPS (in-plane-switching) mode, an FFS (fringe field switching) mode, an MVA (multi-domain vertical alignment) mode, a PVA (patterned vertical alignment) mode, an ASM (axially symmetric aligned microcell) mode, an OCB (optical compensated birefringence) mode, an FLC (ferroelectric liquid crystal) mode, an AFLC (anti-ferroelectric liquid crystal) mode, or the like can be used.

When a liquid crystal display device including the photoelectric conversion device of the invention is driven by various liquid crystal modes, beneficial effects can be provided. For example, when a liquid crystal display device having a TN mode liquid crystal includes the photoelectric conversion device of the invention, a manufacturing cost can be suppressed as well as contrast of display can be improved by changing luminance of a backlight in accordance with ambient illuminance.

Figure 55A:
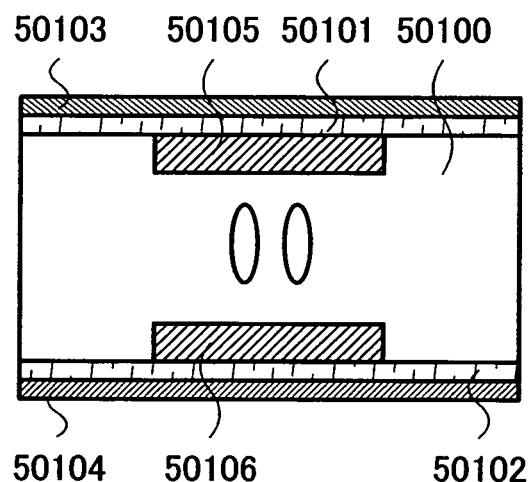
FIGS. 55A and 55B illustrate an operation mode of liquid crystals.
Figure 55B:
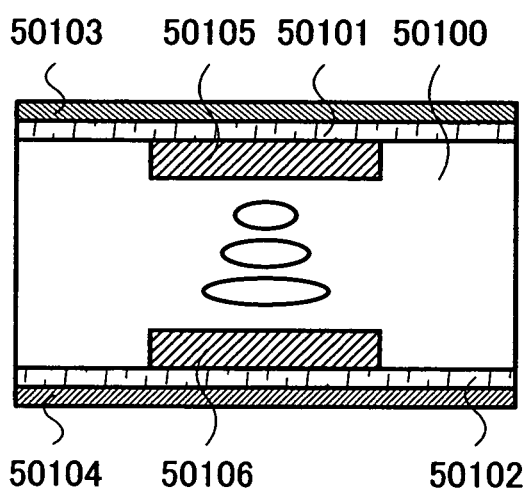

FIGS. 55A and 55B are schematic views of cross sections of a TN mode.

A liquid crystal layer 50100 is held between a first substrate 50101 and a second substrate 50102 which are provided so as to face each other. A first electrode 50105 is formed on a top surface of the first substrate 50101. A second electrode 50106 is formed on a top surface of the second substrate 50102. A first polarizing plate 50103 is provided on a side of the first substrate 50101, which is opposite to the side where the liquid crystal layer is provided. A second polarizing plate 50104 is provided on a side of the second substrate 50102, which is opposite to the side where the liquid crystal layer is provided. Note that the first polarizing plate 50103 and the second polarizing plate 50104 are arranged so as to be in a cross nicol state.

The first polarizing plate 50103 may be provided on the top surface of the first substrate 50101, that is, may be provided between the first substrate 50101 and the liquid crystal layer. The second polarizing plate 50104 may be provided on the top surface of the second substrate 50102, that is, may be provided between the second substrate 50102 and the liquid crystal layer.

It is only necessary that at least one of the first electrode 50105 and the second electrode 50106 have light-transmitting properties. When both the first electrode 50105 and the second electrode 50106 are light-transmitting electrodes, a transmissive panel is obtained. When one of the first electrode 50105 and the second electrode 50106 is a light-transmitting electrode and the other thereof is a reflective electrode, a reflective panel is obtained. Alternatively, when both of the electrodes have light-transmitting properties and part of one of the electrodes has reflectivity, a transflective panel is obtained.

FIG. 55A is a schematic view of a cross section when voltage is applied to the first electrode 50105 and the second electrode 50106 (referred to as a vertical electric field mode). Since liquid crystal molecules are vertically aligned, light emitted from a backlight is not affected by birefringence of the liquid crystal molecules. In addition, since the first polarizing plate 50103 and the second polarizing plate 50104 are arranged so as to be in a cross nicol state, light emitted from the backlight cannot pass through the substrate. Accordingly, black display is performed.

Note that a state of the liquid crystal molecules can be controlled by controlling voltage applied to the first electrode 50105 and the second electrode 50106. Accordingly, the amount of light emitted from the backlight passing through the substrate can be controlled, so that a predetermined image can be displayed.

FIG. 55B is a schematic view of a cross section when voltage is not applied to the first electrode 50105 and the second electrode 50106. Since the liquid crystal molecules are horizontally aligned and rotated in a plane, light emitted from the backlight is affected by birefringence of the liquid crystal molecules. In addition, since the first polarizing plate 50103 and the second polarizing plate 50104 are arranged so as to be in a cross nicol state, light emitted from the backlight passes through the substrate. Accordingly, white display is performed. This is a so-called normally white mode.

A liquid crystal display device having a structure shown in FIGS. 55A and 55B can perform full-color display by being provided with a color filter. The color filter can be provided on the first substrate 50101 side or the second substrate 50102 side.

A known material may be used for a liquid crystal material used for a TN mode.

When a liquid crystal display device including the photoelectric conversion device of the invention is driven by various liquid crystal modes, beneficial effects can be provided. For example, when a liquid crystal display device having a VA mode liquid crystal includes the photoelectric conversion device of the invention, black blurring can be reduced as well as contrast of display can be improved by changing luminance of a backlight in accordance with ambient illuminance. This is because the VA mode liquid crystal is a normally black liquid crystal (black is displayed in a state where an electric field is not applied to the liquid crystal), so that the amount of faint light emission in displaying black is smaller than that of a normally white liquid crystal (black is displayed in a state where an electric field is applied to the liquid crystal). Further, when the liquid crystal display device having the VA mode liquid crystal includes the photoelectric conversion device of the invention, change in viewing angle in accordance with ambient illuminance can be compensated as appropriate. For example, in the case where the liquid crystal display device is seen from an oblique direction, contrast is reduced when a large amount of external light is reflected. The liquid crystal display device can be controlled so that a viewing angle is increased as a larger amount of external light is reflected.

Figure 56A:
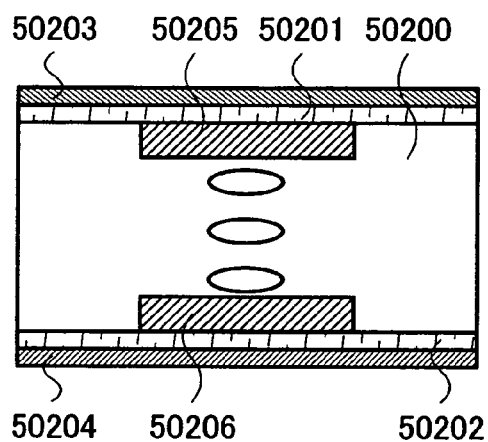
FIGS. 56A to 56D illustrate operation modes of liquid crystals.
Figure 56B:
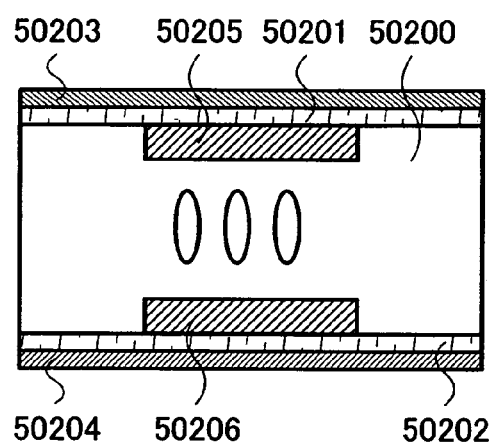

FIGS. 56A and 56B are schematic views of cross sections of a VA mode. In the VA mode, liquid crystal molecules are aligned such that they are vertical to a substrate when there is no electric field.

A liquid crystal layer 50200 is held between a first substrate 50201 and a second substrate 50202 which are provided so as to face each other. A first electrode 50205 is formed on a top surface of the first substrate 50201. A second electrode 50206 is formed on a top surface of the second substrate 50202. A first polarizing plate 50203 is provided on a side of the first substrate 50201, which is opposite to the side where the liquid crystal layer is provided. A second polarizing plate 50204 is provided on a side of the second substrate 50202, which is opposite to the side where the liquid crystal layer is provided. Note that the first polarizing plate 50203 and the second polarizing plate 50204 are arranged so as to be in a cross nicol state.

The first polarizing plate 50203 may be provided on the top surface of the first substrate 50201, that is, may be provided between the first substrate 50201 and the liquid crystal layer. The second polarizing plate 50204 may be provided on the top surface of the second substrate 50202, that is, may be provided between the second substrate 50202 and the liquid crystal layer.

It is only necessary that at least one of the first electrode 50205 and the second electrode 50206 have light-transmitting properties. When both the first electrode 50205 and the second electrode 50206 are light-transmitting electrodes, a transmissive panel is obtained. When one of the first electrode 50205 and the second electrode 50206 is a light-transmitting electrode and the other thereof is a reflective electrode, a reflective panel is obtained. Alternatively, when both of the electrodes have light-transmitting properties and part of one of the electrodes has reflectivity, a transflective panel is obtained.

FIG. 56A is a schematic view of a cross section when voltage is applied to the first electrode 50205 and the second electrode 50206 (referred to as a vertical electric field mode). Since liquid crystal molecules are horizontally aligned, light emitted from a backlight is affected by birefringence of the liquid crystal molecules. In addition, since the first polarizing plate 50203 and the second polarizing plate 50204 are arranged so as to be in a cross nicol state, light emitted from the backlight passes through the substrate. Accordingly, white display is performed.

Note that a state of the liquid crystal molecules can be controlled by controlling voltage applied to the first electrode 50205 and the second electrode 50206. Accordingly, the amount of light emitted from the backlight passing through the substrate can be controlled, so that a predetermined image can be displayed.

FIG. 56B is a schematic view of a cross section when voltage is not applied to the first electrode 50205 and the second electrode 50206. Since the liquid crystal molecules are vertically aligned, light emitted from the backlight is not affected by birefringence of the liquid crystal molecules. In addition, since the first polarizing plate 50203 and the second polarizing plate 50204 are arranged so as to be in a cross nicol state, light emitted from the backlight does not pass through the substrate. Accordingly, black display is performed. This is a so-called normally black mode.

A liquid crystal display device having a structure shown in FIGS. 56A and 56B can perform full-color display by being provided with a color filter. The color filter can be provided on the first substrate 50201 side or the second substrate 50202 side.

A known material may be used for a liquid crystal material used for a VA mode.

Figure 56C:
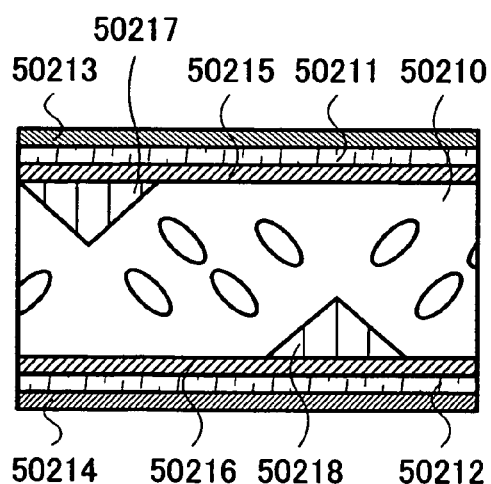
Figure 56D:
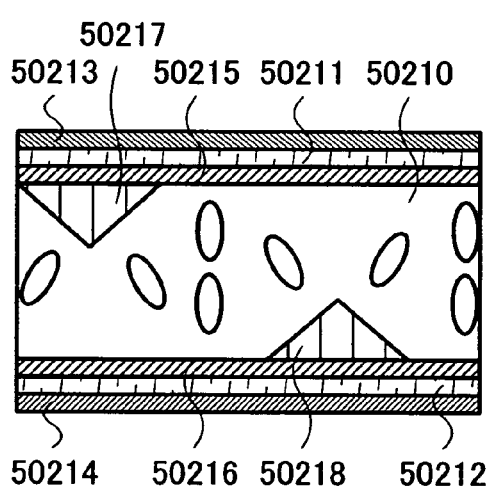

FIGS. 56C and 56D are schematic views of cross sections of an MVA mode. In the MVA mode, viewing angle dependency of each portion is compensated by that of the other portions.

A liquid crystal layer 50210 is held between a first substrate 50211 and a second substrate 50212 which are provided so as to face each other. A first electrode 50215 is formed on a top surface of the first substrate 50211. A second electrode 50216 is formed on a top surface of the second substrate 50212. A first projection 50217 for controlling alignment is formed on the first electrode 50215. A second projection 50218 for controlling alignment is formed over the second electrode 50216. A first polarizing plate 50213 is provided on a side of the first substrate 50211, which is opposite to the side where the liquid crystal layer is provided. A second polarizing plate 50214 is provided on a side of the second substrate 50212, which is opposite to the side where the liquid crystal layer is provided. Note that the first polarizing plate 50213 and the second polarizing plate 50214 are arranged so as to be in a cross nicol state.

The first polarizing plate 50213 may be provided on the top surface of the first substrate 50211, that is, may be provided between the first substrate 50211 and the liquid crystal layer. The second polarizing plate 50214 may be provided on the top surface of the second substrate 50212, that is, may be provided between the second substrate 50212 and the liquid crystal layer.

It is only necessary that at least one of the first electrode 50215 and the second electrode 50216 have light-transmitting properties. When both the first electrode 50215 and the second electrode 50216 are light-transmitting electrodes, a transmissive panel is obtained. When one of the first electrode 50215 and the second electrode 50216 is a light-transmitting electrode and the other thereof is a reflective electrode, a reflective panel is obtained. Alternatively, when both of the electrodes have light-transmitting properties and part of one of the electrodes has reflectivity, a transflective panel is obtained.

FIG. 56C is a schematic view of a cross section when voltage is applied to the first electrode 50215 and the second electrode 50216 (referred to as a vertical electric field mode). Since liquid crystal molecules are aligned so as to tilt toward the first projection 50217 and the second projection 50218, light emitted from a backlight is affected by birefringence of the liquid crystal molecules. In addition, since the first polarizing plate 50213 and the second polarizing plate 50214 are arranged so as to be in a cross nicol state, light emitted from the backlight passes through the substrate. Accordingly, white display is performed.

Note that a state of the liquid crystal molecules can be controlled by controlling voltage applied to the first electrode 50215 and the second electrode 50216. Accordingly, the amount of light emitted from the backlight passing through the substrate can be controlled, so that a predetermined image can be displayed.

FIG. 56D is a schematic view of a cross section when voltage is not applied to the first electrode 50215 and the second electrode 50216. Since the liquid crystal molecules are vertically aligned, light emitted from the backlight is not affected by birefringence of the liquid crystal molecules. In addition, since the first polarizing plate 50213 and the second polarizing plate 50214 are arranged so as to be in a cross nicol state, light emitted from the backlight does not pass through the substrate. Accordingly, black display is performed. This is a so-called normally black mode.

A liquid crystal display device having a structure shown in FIGS. 56C and 56D can perform full-color display by being provided with a color filter. The color filter can be provided on the first substrate 50211 side or the second substrate 50212 side.

A known material may be used for a liquid crystal material used for a MVA mode.

When a liquid crystal display device including the photoelectric conversion device of the invention is driven by various liquid crystal modes, beneficial effects can be provided. For example, when a liquid crystal display device having an OCB mode liquid crystal includes the photoelectric conversion device of the invention, quality of a moving image can be improved by increasing response speed of the liquid crystal as well as contrast of display can be improved by changing luminance of a backlight in accordance with ambient illuminance. Further, the response speed of the liquid crystal can be controlled as appropriate in accordance with ambient illuminance. For example, the response speed of the liquid crystal can be reduced by overdriving or the like as illuminance becomes higher or lower than normal illuminance. This is because motion blur of an image with higher contrast is more easily perceived. That is, contrast is lower by black blurring as ambient illuminance is lower, so that motion blur is not likely to be perceived, whereas when ambient illuminance is high, contrast is lower by reflection of external light, so that motion blur is not likely to be perceived.

Figure 57A:
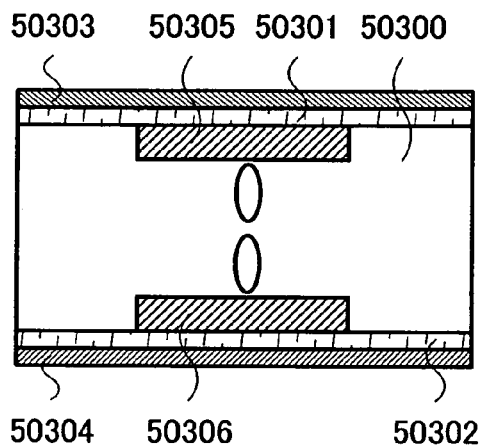
FIGS. 57A to 57D illustrate operation modes of liquid crystals.
Figure 57B:
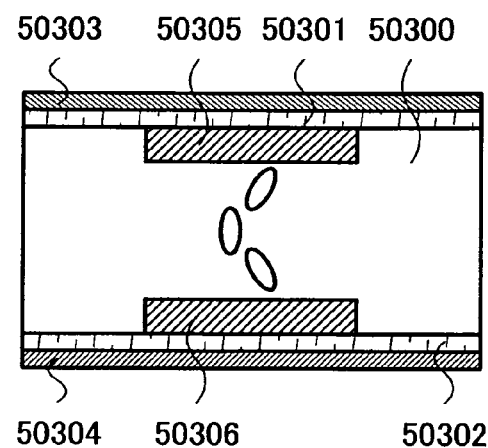

FIGS. 57A and 57B are schematic views of cross sections of an OCB mode. In the OCB mode, viewing angle dependency is low because alignment of liquid crystal molecules in a liquid crystal layer is optically compensated. This state of the liquid crystal molecules is referred to as bend alignment.

A liquid crystal layer 50300 is held between a first substrate 50301 and a second substrate 50302 which are provided so as to face each other. A first electrode 50305 is formed on a top surface of the first substrate 50301. A second electrode 50306 is formed on a top surface of the second substrate 50302. A first polarizing plate 50303 is provided on a side of the first substrate 50301, which is opposite to the side where the liquid crystal layer is provided. A second polarizing plate 50304 is provided on a side of the second substrate 50302, which is opposite to the side where the liquid crystal layer is provided. Note that the first polarizing plate 50303 and the second polarizing plate 50304 are arranged so as to be in a cross nicol state.

The first polarizing plate 50303 may be provided on the top surface of the first substrate 50301, that is, may be provided between the first substrate 50301 and the liquid crystal layer. The second polarizing plate 50304 may be provided on the top surface of the second substrate 50302, that is, may be provided between the second substrate 50302 and the liquid crystal layer.

It is only necessary that at least one of the first electrode 50305 and the second electrode 50306 have light-transmitting properties. When both the first electrode 50305 and the second electrode 50306 are light-transmitting electrodes, a transmissive panel is obtained. When one of the first electrode 50305 and the second electrode 50306 is a light-transmitting electrode and the other thereof is a reflective electrode, a reflective panel is obtained. Alternatively, when both of the electrodes have light-transmitting properties and part of one of the electrodes has reflectivity, a transflective panel is obtained.

FIG. 57A is a schematic view of a cross section when voltage is applied to the first electrode 50305 and the second electrode 50306 (referred to as a vertical electric field mode). Since liquid crystal molecules are vertically aligned, light emitted from a backlight is not affected by birefringence of the liquid crystal molecules. In addition, since the first polarizing plate 50303 and the second polarizing plate 50304 are arranged so as to be in a cross nicol state, light emitted from the backlight does not pass through the substrate. Accordingly, black display is performed.

Note that a state of the liquid crystal molecules can be controlled by controlling voltage applied to the first electrode 50305 and the second electrode 50306. Accordingly, the amount of light emitted from the backlight passing through the substrate can be controlled, so that a predetermined image can be displayed.

FIG. 57B is a schematic view of a cross section when voltage is not applied to the first electrode 50305 and the second electrode 50306. Since the liquid crystal molecules are in a state of bend alignment, light emitted from the backlight is affected by birefringence of the liquid crystal molecules. In addition, since the first polarizing plate 50303 and the second polarizing plate 50304 are arranged so as to be in a cross nicol state, light emitted from the backlight passes through the substrate. Accordingly, white display is performed. This is a so-called normally white mode.

A liquid crystal display device having a structure shown in FIGS. 57A and 57B can perform full-color display by being provided with a color filter. The color filter can be provided on the first substrate 50301 side or the second substrate 50302 side.

A known material may be used for a liquid crystal material used for an OCB mode.

Figure 57C:
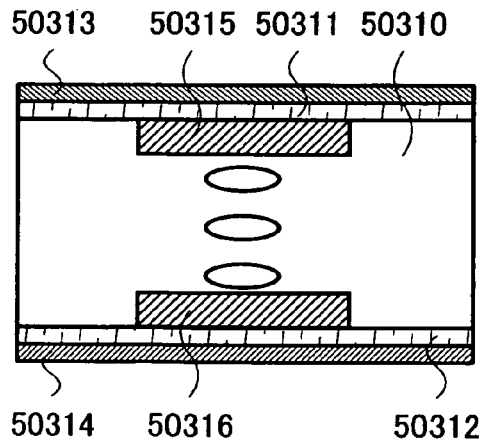
Figure 57D:
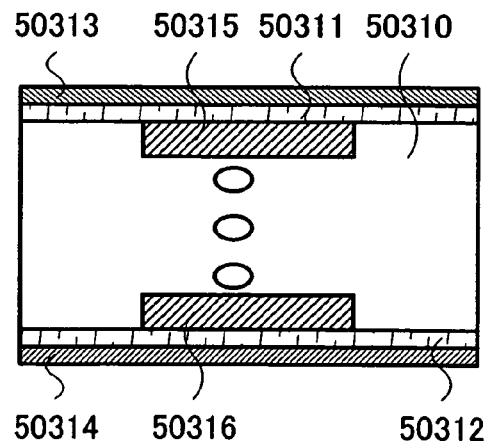

FIGS. 57C and 57D are schematic views of cross sections of an FLC mode or an AFLC mode.

A liquid crystal layer 50310 is held between a first substrate 50311 and a second substrate 50312 which are provided so as to face each other. A first electrode 50315 is formed on a top surface of the first substrate 50311. A second electrode 50316 is formed on a top surface of the second substrate 50312. A first polarizing plate 50313 is provided on a side of the first substrate 50311, which is opposite to the side where the liquid crystal layer is provided. A second polarizing plate 50314 is provided on a side of the second substrate 50312, which is opposite to the side where the liquid crystal layer is provided. Note that the first polarizing plate 50313 and the second polarizing plate 50314 are arranged so as to be in a cross nicol state.

The first polarizing plate 50313 may be provided on the top surface of the first substrate 50311, that is, may be provided between the first substrate 50311 and the liquid crystal layer. The second polarizing plate 50314 may be provided on the top surface of the second substrate 50312, that is, may be provided between the second substrate 50312 and the liquid crystal layer.

It is only necessary that at least one of the first electrode 50315 and the second electrode 50316 have light-transmitting properties. When both the first electrode 50315 and the second electrode 50316 are light-transmitting electrodes, a transmissive panel is obtained. When one of the first electrode 50315 and the second electrode 50316 is a light-transmitting electrode and the other thereof is a reflective electrode, a reflective panel is obtained. Alternatively, when both of the electrodes have light-transmitting properties and part of one of the electrodes has reflectivity, a transflective panel is obtained.

FIG. 57C is a schematic view of a cross section when voltage is applied to the first electrode 50315 and the second electrode 50316 (referred to as a vertical electric field mode). Since liquid crystal molecules are horizontally aligned in a direction which is deviated from a rubbing direction, light emitted from a backlight is affected by birefringence of the liquid crystal molecules. In addition, since the first polarizing plate 50313 and the second polarizing plate 50314 are arranged so as to be in a cross nicol state, light emitted from the backlight passes through the substrate. Accordingly, white display is performed.

Note that a state of the liquid crystal molecules can be controlled by controlling voltage applied to the first electrode 50315 and the second electrode 50316. Accordingly, the amount of light emitted from the backlight passing through the substrate can be controlled, so that a predetermined image can be displayed.

FIG. 57D is a schematic view of a cross section when voltage is not applied to the first electrode 50315 and the second electrode 50316. Since liquid crystal molecules are horizontally aligned in the rubbing direction, light emitted from the backlight is not affected by birefringence of the liquid crystal molecules. In addition, since the first polarizing plate 50313 and the second polarizing plate 50314 are arranged so as to be in a cross nicol state, light emitted from the backlight does not pass through the substrate. Accordingly, black display is performed. This is a so-called normally black mode.

A liquid crystal display device having a structure shown in FIGS. 57C and 57D can perform full-color display by being provided with a color filter. The color filter can be provided on the first substrate 50311 side or the second substrate 50312 side.

A known material may be used for a liquid crystal material used for an FLC mode or an AFLC mode.

When a liquid crystal display device including the photoelectric conversion device of the invention is driven by various liquid crystal modes, beneficial effects can be provided. For example, when a liquid crystal display device having an IPS mode liquid crystal includes the photoelectric conversion device of the invention, a viewing angle can be increased as well as contrast of display can be improved by changing luminance of a backlight in accordance with ambient illuminance. Further, when the liquid crystal display device having the IPS mode liquid crystal includes the photoelectric conversion device of the invention, change in viewing angle in accordance with ambient illuminance can be compensated as appropriate. For example, in the case where the liquid crystal display device is seen from an oblique direction, contrast is reduced when a large amount of external light is reflected. The liquid crystal display device can be controlled so that a viewing angle is increased as a larger amount of external light is reflected.

Figure 58A:
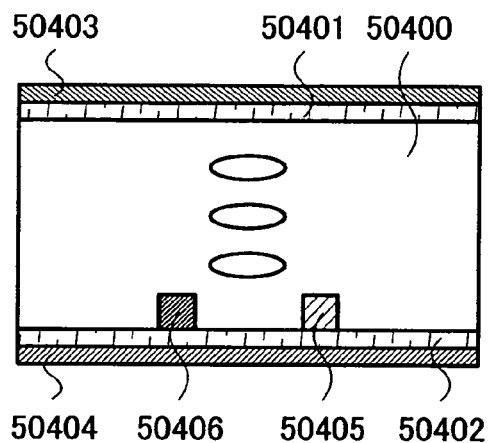
FIGS. 58A to 58D illustrate operation modes of liquid crystals.
Figure 58B:
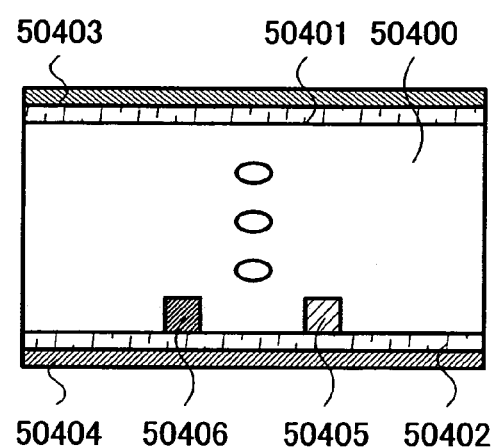

FIGS. 58A and 58B are schematic views of cross sections of an IPS mode. In the IPS mode, since alignment of liquid crystal molecules in a liquid crystal layer is optically compensated, the liquid crystal molecules are always rotated in a plane parallel to a substrate, and a horizontal electric field method in which electrodes are provided only on one substrate side is employed.

A liquid crystal layer 50400 is held between a first substrate 50401 and a second substrate 50402 which are provided so as to face each other. A first electrode 50405 and a second electrode 50406 are formed on a top surface of the second substrate 50402. A first polarizing plate 50403 is provided on a side of the first substrate 50401, which is opposite to the side where the liquid crystal layer is provided. A second polarizing plate 50404 is provided on a side of the second substrate 50402, which is opposite to the side where the liquid crystal layer is provided. Note that the first polarizing plate 50403 and the second polarizing plate 50404 are arranged so as to be in a cross nicol state.

The first polarizing plate 50403 may be provided on the top surface of the first substrate 50401, that is, may be provided between the first substrate 50401 and the liquid crystal layer. The second polarizing plate 50404 may be provided on the top surface of the second substrate 50402, that is, may be provided between the second substrate 50402 and the liquid crystal layer.

Both the first electrode 50405 and the second electrode 50406 may have transparency. Alternatively, part of one of the first electrode 50405 and the second electrode 50406 may have reflectivity FIG. 58A is a schematic view of a cross section when voltage is applied to the first electrode 50405 and the second electrode 50406 (referred to as a horizontal electric field mode). Since liquid crystal molecules are aligned along an electric flux line which is deviated from a rubbing direction, light emitted from a backlight is affected by birefringence of the liquid crystal molecules. In addition, since the first polarizing plate 50403 and the second polarizing plate 50404 are arranged so as to be in a cross nicol state, light emitted from the backlight passes through the substrate. Accordingly, white display is performed.

Note that a state of the liquid crystal molecules can be controlled by controlling voltage applied to the first electrode 50405 and the second electrode 50406. Accordingly, the amount of light emitted from the backlight passing through the substrate can be controlled, so that a predetermined image can be displayed.

FIG. 58B is a schematic view of a cross section when voltage is not applied to the first electrode 50405 and the second electrode 50406. Since liquid crystal molecules are horizontally aligned in the rubbing direction, light emitted from the backlight is not affected by birefringence of the liquid crystal molecules. In addition, since the first polarizing plate 50403 and the second polarizing plate 50404 are arranged so as to be in a cross nicol state, light emitted from the backlight does not pass through the substrate. Accordingly, black display is performed. This is a so-called normally black mode.

A liquid crystal display device having a structure shown in FIGS. 58A and 58B can perform full-color display by being provided with a color filter. The color filter can be provided on the first substrate 50401 side or the second substrate 50402 side.

A known material may be used for a liquid crystal material used for an IPS mode.

Figure 58C:
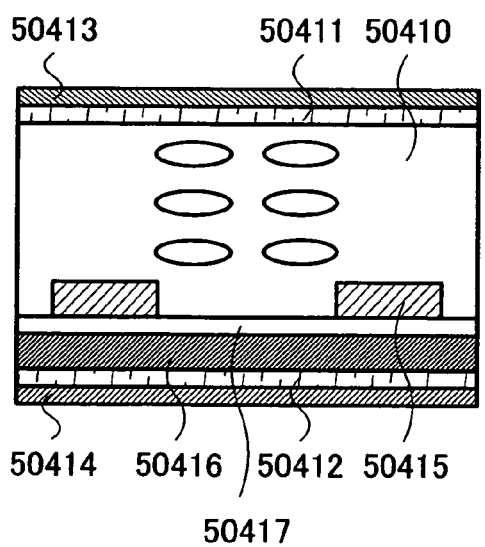
Figure 58D:
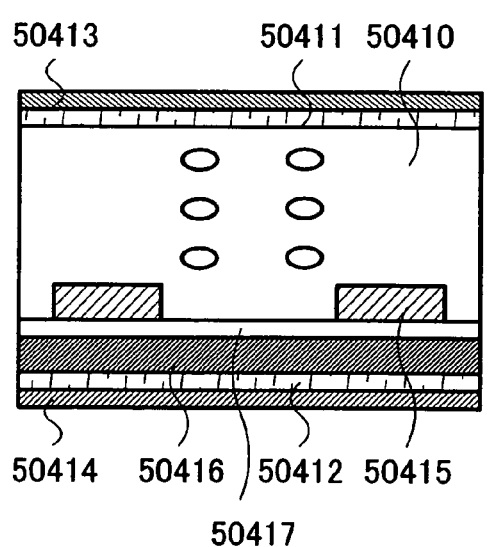

FIGS. 58C and 58D are schematic views of cross sections of an FFS mode. In the FFS mode, since alignment of liquid crystal molecules in a liquid crystal layer is optically compensated, the liquid crystal molecules are constantly rotated in a plane parallel to a substrate, and a horizontal electric field method in which electrodes are provided only on one substrate side is employed.

A liquid crystal layer 50410 is held between a first substrate 50411 and a second substrate 50412 which are provided so as to face each other. A second electrode 50416 is formed on a top surface of the second substrate 50412. An insulating film 50417 is formed on a top surface of the second electrode 50416. A first electrode 50415 is formed over the insulating film 50417. A first polarizing plate 50413 is provided on a side of the first substrate 50411, which is opposite to the side where the liquid crystal layer is provided. A second polarizing plate 50414 is provided on a side of the second substrate 50412, which is opposite to the side where the liquid crystal layer is provided. Note that the first polarizing plate 50413 and the second polarizing plate 50414 are arranged so as to be in a cross nicol state.

The first polarizing plate 50413 may be provided on the top surface of the first substrate 50411, that is, may be provided between the first substrate 50411 and the liquid crystal layer. The second polarizing plate 50414 may be provided on the top surface of the second substrate 50412, that is, may be provided between the second substrate 50412 and the liquid crystal layer.

It is only necessary that at least one of the first electrode 50415 and the second electrode 50416 have light-transmitting properties. When both the first electrode 50415 and the second electrode 50416 are light-transmitting electrodes, a transmissive panel is obtained. When one of the first electrode 50415 and the second electrode 50416 is a light-transmitting electrode and the other thereof is a reflective electrode, a reflective panel is obtained. Alternatively, when both of the electrodes have light-transmitting properties and part of one of the electrodes has reflectivity, a transflective panel is obtained.

FIG. 58C is a schematic view of a cross section when voltage is applied to the first electrode 50415 and the second electrode 50416 (referred to as a horizontal electric field mode). Since liquid crystal molecules are aligned along an electric flux line which is deviated from a rubbing direction, light emitted from a backlight is affected by birefringence of the liquid crystal molecules. In addition, since the first polarizing plate 50413 and the second polarizing plate 50414 are arranged so as to be in a cross nicol state, light emitted from the backlight passes through the substrate. Accordingly, white display is performed.

Note that a state of the liquid crystal molecules can be controlled by controlling voltage applied to the first electrode 50415 and the second electrode 50416. Accordingly, the amount of light emitted from the backlight passing through the substrate can be controlled, so that a predetermined image can be displayed.

FIG. 58D is a schematic view of a cross section when voltage is not applied to the first electrode 50415 and the second electrode 50416. Since the liquid crystal molecules are horizontally aligned in the rubbing direction, light emitted from the backlight is not affected by birefringence of the liquid crystal molecules. In addition, since the first polarizing plate 50413 and the second polarizing plate 50414 are arranged so as to be in a cross nicol state, light emitted from the backlight does not pass through the substrate. Accordingly, black display is performed. This is a so-called normally black mode.

A liquid crystal display device having a structure shown in FIGS. 58C and 58D can perform full-color display by being provided with a color filter. The color filter can be provided on the first substrate 50411 side or the second substrate 50412 side.

A known material may be used for a liquid crystal material used for an FFS mode.

Next, various liquid crystal modes are described with reference to top plan views.

Figure 59:
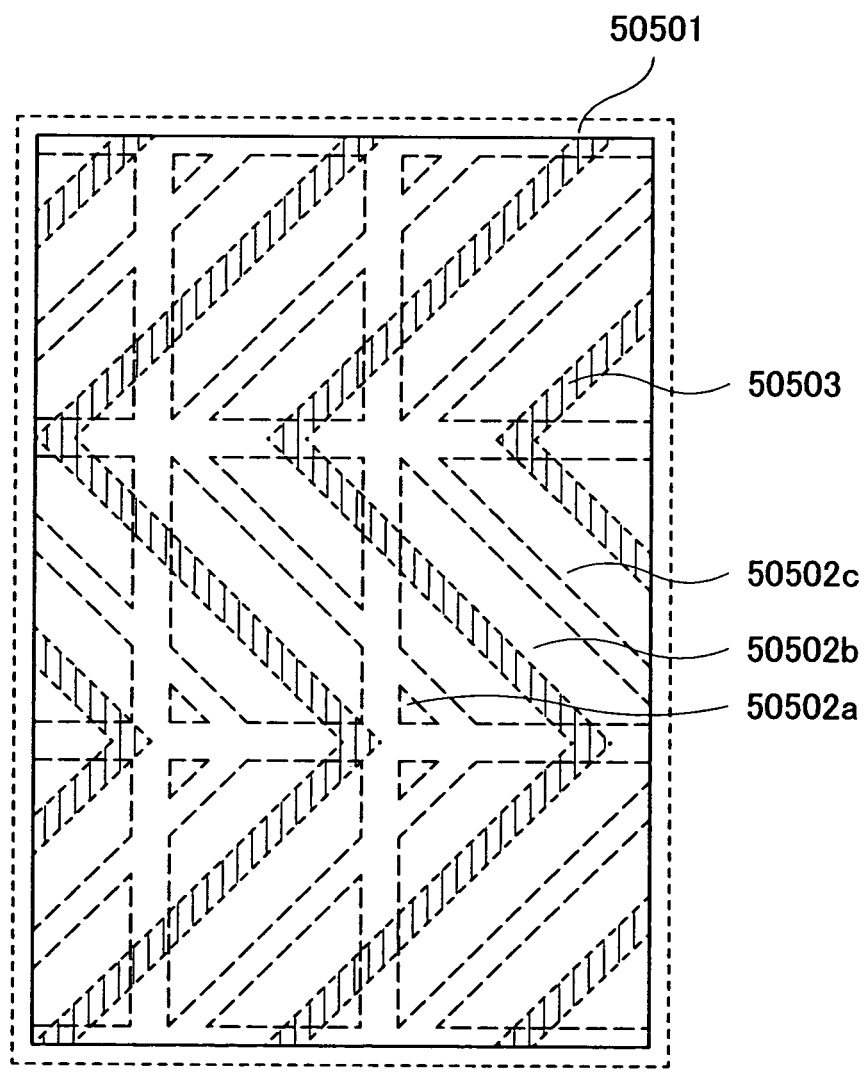
FIG. 59 is a top plan view of a pixel electrode.

FIG. 59 is a top plan view of a pixel portion to which an MVA mode is applied. In the MVA mode, viewing angle dependency of each portion is compensated by each other.

FIG. 59 shows a first pixel electrode 50501, second pixel electrodes 50502a, 50502b, and 50502c, and a projection 50503. The first pixel electrode 50501 is formed over the entire surface of an opposite substrate. The projection 50503 is formed so as to have a dogleg shape. The second pixel electrodes 50502a, 50502b, and 50502c are formed over the first pixel electrode 50501 so as to have shapes corresponding to the projection 50503.

Opening portions of the second pixel electrodes (50502a, 50502b, and 50502c) function like projections.

When voltage is applied to the first pixel electrode 50501 and the second pixel electrodes 50502a, 50502b, and 50502c (referred to as a vertical electric field mode), liquid crystal molecules are aligned so as to tilt toward the projection 50503 and the opening portions of the second pixel electrodes 50502a, 50502b, and 50502c. When a pair of polarizing plates is arranged so as to be in a cross nicol state, light emitted from a backlight passes through a substrate; thus, white display is performed.

Note that a state of the liquid crystal molecules can be controlled by controlling voltage applied to the first pixel electrode 50501 and the second pixel electrodes 50502a, 50502b, and 50502c. Accordingly, the amount of light emitted from the backlight passing through the substrate can be controlled, so that a predetermined image can be displayed.

When voltage is not applied to the first pixel electrode 50501 and the second pixel electrodes 50502a, 50502b, and 50502c, the liquid crystal molecules are vertically aligned. When the pair of polarizing plates is provided so as to be in the cross nicol state, light emitted from the backlight does not pass through a panel; thus, black display is performed. This is a so-called normally black mode.

A known material may be used for a liquid crystal material used for an MVA mode.

FIGS. 60A to 60D are top plan views of pixel portions to which an IPS mode is applied. In the IPS mode, since alignment of liquid crystal molecules in a liquid crystal layer is optically compensated, the liquid crystal molecules are constantly rotated in a plane parallel to a substrate, and a horizontal electric field method in which electrodes are provided only on one substrate side is employed.

In the IPS mode, a pair of electrodes is formed so as to have different shapes.

Figure 60A:
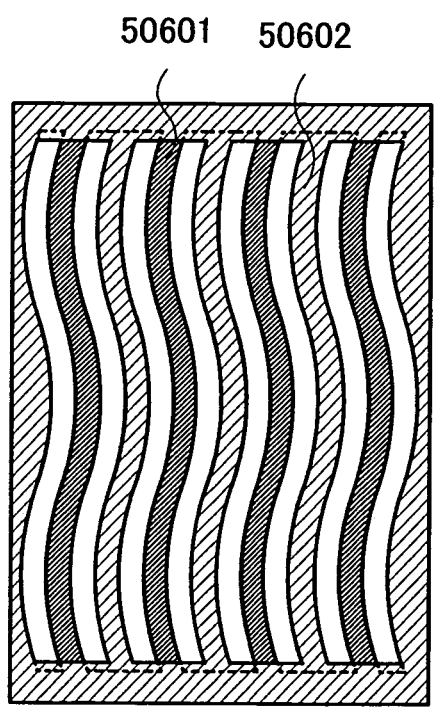
FIGS. 60A to 60D are top plan views of pixel electrodes.

FIG. 60A shows a first pixel electrode 50601 and a second pixel electrode 50602. The first pixel electrode 50601 and the second pixel electrode 50602 have wavy shapes.

Figure 60B:
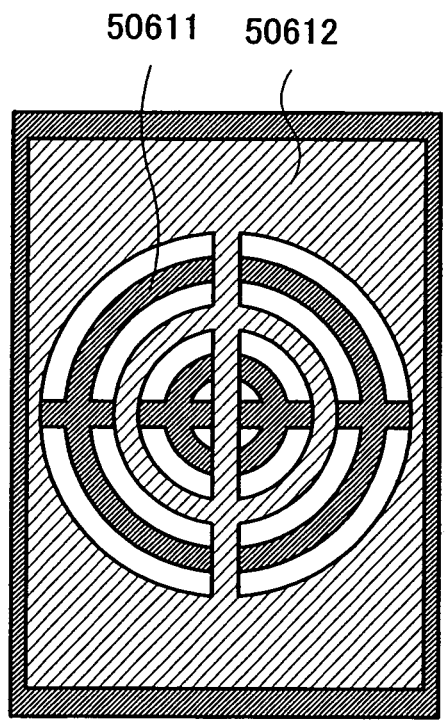

FIG. 60B shows a first pixel electrode 50611 and a second pixel electrode 50612. The first pixel electrode 50611 and the second pixel electrode 50612 have shapes with concentric openings.

Figure 60C:
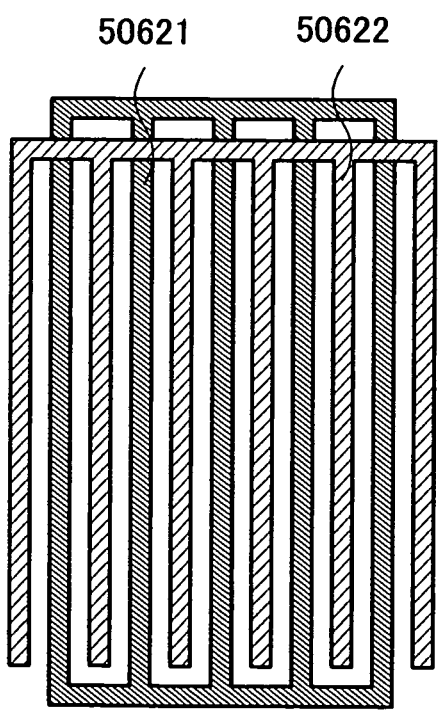

FIG. 60C shows a first pixel electrode 50621 and a second pixel electrode 50622. The first pixel electrode 50621 and the second pixel electrode 50622 have comb shapes and partially overlap with each other.

Figure 60D:
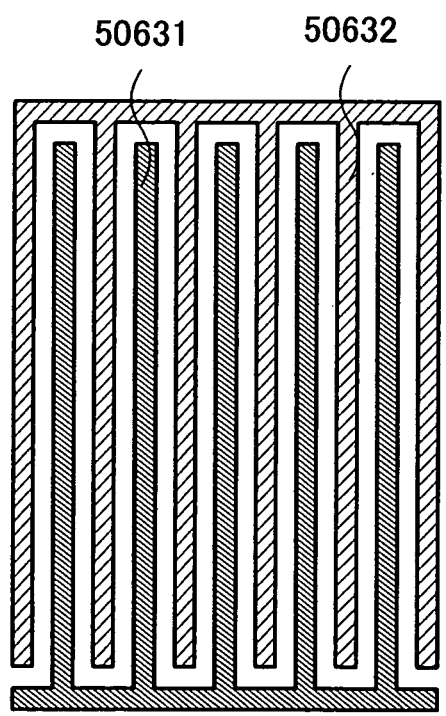

FIG. 60D shows a first pixel electrode 50631 and a second pixel electrode 50632. The first pixel electrode 50631 and the second pixel electrode 50632 have comb shapes in which electrodes engage with each other.

When voltage is applied to the first pixel electrodes 50601, 50611, 50621, and 50631 and the second pixel electrodes 50602, 50612, 50622, and 50623 (referred to as a horizontal electric field mode), liquid crystal molecules are aligned along an electric flux line which is deviated from a rubbing direction. When a pair of polarizing plates is arranged so as to be in a cross nicol state, light emitted from a backlight passes through a substrate; thus, white display is performed.

Note that a state of the liquid crystal molecules can be controlled by controlling voltage applied to the first pixel electrodes 50601, 50611, 50621, and 50631 and the second pixel electrodes 50602, 50612, 50622, and 50632. Accordingly, the amount of light emitted from the backlight passing through the substrate can be controlled, so that a predetermined image can be displayed.

When voltage is not applied to the first pixel electrodes 50601, 50611, 50621, and 50631 and the second pixel electrodes 50602, 50612, 50622, and 50632, the liquid crystal molecules are horizontally aligned in the rubbing direction. When the pair of polarizing plates is provided so as to be in the cross nicol state, light emitted from the backlight does not pass through the substrate; thus, black display is performed. This is a so-called normally black mode.

A known material may be used for a liquid crystal material used for an IPS mode.

FIGS. 61A to 61D are top plan views of pixel portions to which an FFS mode is applied. In the FFS mode, since alignment of liquid crystal molecules in a liquid crystal layer is optically compensated, the liquid crystal molecules are constantly rotated in a plane parallel to a substrate, and a horizontal electric field method in which electrodes are provided only on one substrate side is employed.

In the FFS mode, a first electrode with various shapes is formed over a top surface of a second electrode.

Figure 61A:
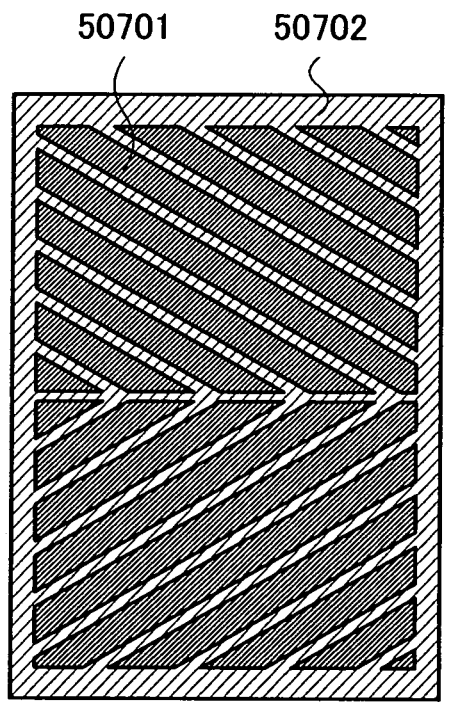
FIGS. 61A to 61D are top plan views of pixel electrodes.

FIG. 61A shows a first pixel electrode 50701 and a second pixel electrode 50702. The first pixel electrode 50701 has a bent dogleg shape. The second pixel electrode 50702 is not necessarily patterned.

Figure 61B:
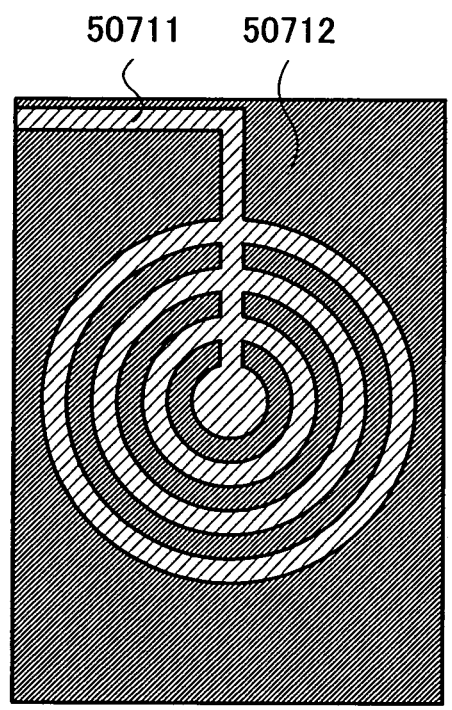

FIG. 61B shows a first pixel electrode 50711 and a second pixel electrode 50712. The first pixel electrode 50711 has a concentric shape. The second pixel electrode 50712 is not necessarily patterned.

Figure 61C:
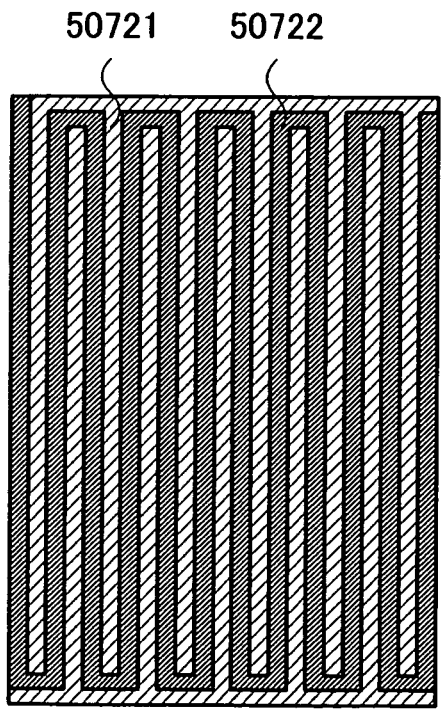

FIG. 61C shows a first pixel electrode 50721 and a second pixel electrode 50722. The first pixel electrode 50721 has a comb shape in which electrodes engage with each other. The second pixel electrode 50722 is not necessarily patterned.

Figure 61D:
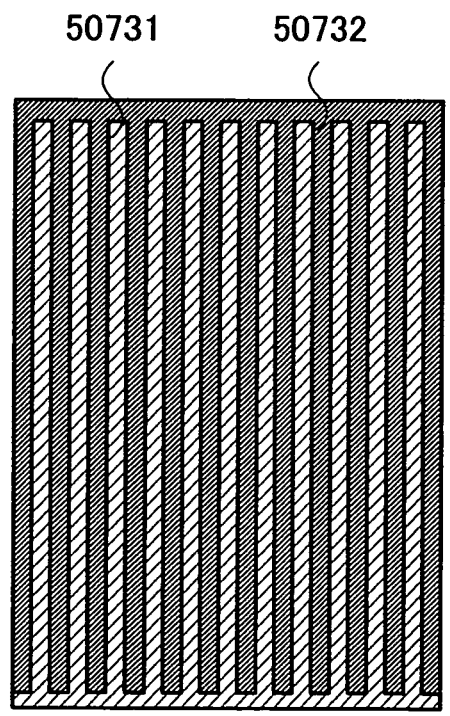

FIG. 61D shows a first pixel electrode 50731 and a second pixel electrode 50732. The first pixel electrode 50731 has a comb shape. The second pixel electrode 50732 is not necessarily patterned.

When voltage is applied to the first pixel electrodes 50701, 50711, 50721, and 50731 and the second pixel electrodes 50702, 50712, 50722, and 50723 (referred to as a horizontal electric field mode), liquid crystal molecules are aligned along an electric flux line which is deviated from a rubbing direction. When a pair of polarizing plates is provided so as to be in a cross nicol state, light emitted from a backlight passes through a substrate; thus, white display is performed.

Note that a state of the liquid crystal molecules can be controlled by controlling voltage applied to the first pixel electrodes 50701, 50711, 50721, and 50731 and the second pixel electrodes 50702, 50712, 50722, and 50732. Accordingly, the amount of light emitted from the backlight passing through the substrate can be controlled, so that a predetermined image can be displayed.

When voltage is not applied to the first pixel electrodes 50701, 50711, 50721, and 50731 and the second pixel electrodes 50702, 50712, 50722, and 50732, the liquid crystal molecules are horizontally aligned in the rubbing direction. When the pair of polarizing plates is provided so as to be in the cross nicol state, light emitted from the backlight does not pass through the substrate; thus, black display is performed. This is a so-called normally black mode.

A known material may be used for a liquid crystal material used for an FFS mode.

Note that although this embodiment mode is described with reference to various drawings, the contents (or part of the contents) described in each drawing can be freely applied to, combined with, or replaced with the contents (or part of the contents) described in another drawing. Further, much more drawings can be formed by combining each part with another part in the above-described drawings.

Similarly, the contents (or part of the contents) described in each drawing in this embodiment mode can be freely applied to, combined with, or replaced with the contents (or part of the contents) described in a drawing in another embodiment mode. Further, much more drawings can be formed by combining each part in each drawing in this embodiment mode with part of another embodiment mode.

Note that this embodiment mode shows examples of embodying, slightly transforming, partially modifying, improving, describing in detail, or applying the contents (or part of the contents) described in other embodiment modes, an example of related part thereof, or the like. Therefore, the contents described in other embodiment modes can be freely applied to, combined with, or replaced with this embodiment mode.

[Embodiment Mode 7]

In this embodiment mode, a method for driving a display device is described. In particular, a method for driving a liquid crystal display device is described.

Figure 62A:
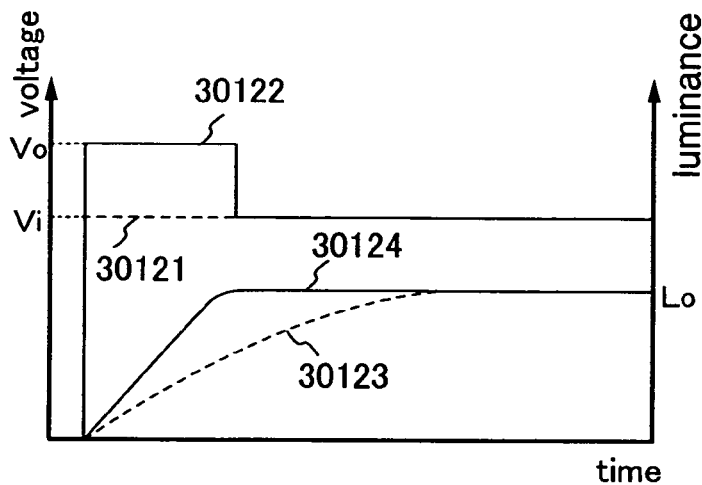
FIGS. 62A to 62C illustrate examples of driving methods of a semiconductor device according to the invention.
Figure 62B:
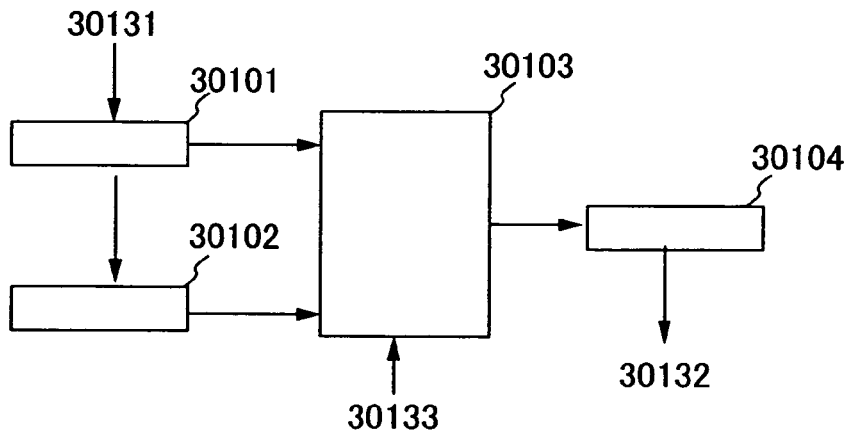
Figure 62C:
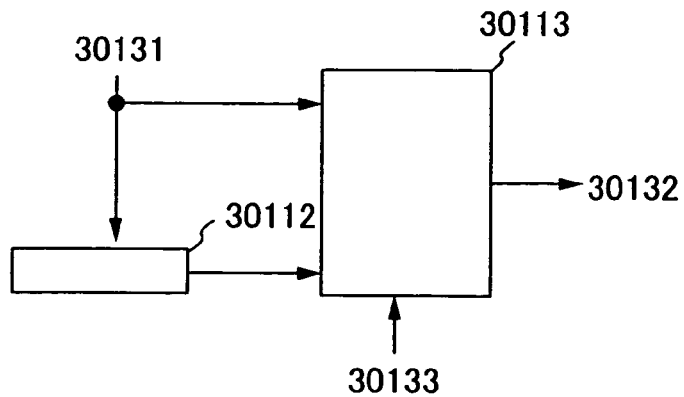

First, overdriving is described with reference to FIGS. 62A to 62C. FIG. 62A shows time change of output luminance with respect to input voltage of a display element. Time change of output luminance of the display element with respect to input voltage 30121 shown by a broken line is represented by output luminance 31123 also shown by a broken line. That is, although voltage for obtaining intended output luminance Lo is Vi, time in accordance with response speed of the element is necessary to achieve the intended output luminance Lo when Vi is directly input as the input voltage.

Overdriving is a technique to increase the response speed. Specifically, overdriving is a method in which the input voltage is brought back to Vi after response speed of output luminance is increased by applying Vo which is voltage higher than Vi to the element for a certain period so that output luminance is increased to be close to the intended output luminance Lo. At this time, the input voltage is represented by input voltage 30122 and the output luminance is represented by output luminance 30124. Time to reach the intended luminance Lo represented by a graph of the output luminance 30124 is shorter than that represented by a graph of the output luminance 30123.

Note that although the case is described in FIG. 62A in which the output luminance is changed positively with respect to the input voltage, this embodiment mode also includes the case where the output luminance is changed negatively with respect to the input voltage.

A circuit for achieving such driving is described with reference to FIGS. 62B and 62C. First, the case is described with reference to FIG. 62B in which an input video signal 30131 is a signal having an analog value (may be a discrete value) and an output video signal 30132 is also a signal having an analog value. An overdrive circuit shown in FIG. 62B includes an encoding circuit 30101, a frame memory 30102, a correction circuit 30103, and a DA converter circuit 30104.

First, the input video signal 30131 is input to the encoding circuit 30101 and is encoded. That is, the input video signal 30131 is converted from an analog signal to a digital signal having the appropriate number of bits. After that, the converted digital signal is input to the frame memory 30102 and the correction circuit 30103. A video signal of a previous frame held in the frame memory 30102 is also input to the correction circuit 30103 at the same time. Then, the correction circuit 30103 outputs a corrected video signal based on the video signal of the frame and the video signal of the previous frame in accordance with a numerical value table which is prepared in advance. At this time, an output switching signal 30133 may be input to the correction circuit 30103 so that the corrected video signal and the video signal of the frame are switched and output. Next, the corrected video signal or the video signal of the frame is input to the DA converter circuit 30104. Then, the output video signal 30132 which is an analog signal having a value in accordance with the corrected video signal or the video signal of the frame is output. In this manner, overdriving can be realized.

Next, the case is described with reference to FIG. 62C in which the input video signal 30131 is a signal having a digital value and the output video signal 30132 is also a signal having a digital value. An overdrive circuit shown in FIG. 62C includes a frame memory 30112 and a correction circuit 30113.

The input video signal 30131 is a digital signal and is input to the frame memory 30112 and the correction circuit 30113. A video signal of a previous frame held in the frame memory 30112 is also input to the correction circuit 30113 at the same time. Then, the correction circuit 30113 outputs a corrected video signal based on the video signal of the frame and the video signal of the previous frame in accordance with a numerical value table which is prepared in advance. At this time, the output switching signal 30133 may be input to the correction circuit 30113 so that the corrected video signal and the video signal of the frame are switched and output. In this manner, overdriving can be realized.

Note that the overdrive circuit in this embodiment mode also includes the case where the input video signal 30131 is an analog signal and the output video signal 30132 is a digital signal. At this time, it is only necessary that the DA converter circuit 30104 be removed from the circuit shown in FIG. 62B. Further, the overdrive circuit in this embodiment mode also includes the case where the input video signal 30131 is a digital signal and the output video signal 30132 is an analog signal. At this time, it is only necessary that the encoding circuit 30101 be removed from the circuit shown in FIG. 62B.

Figure 63A:
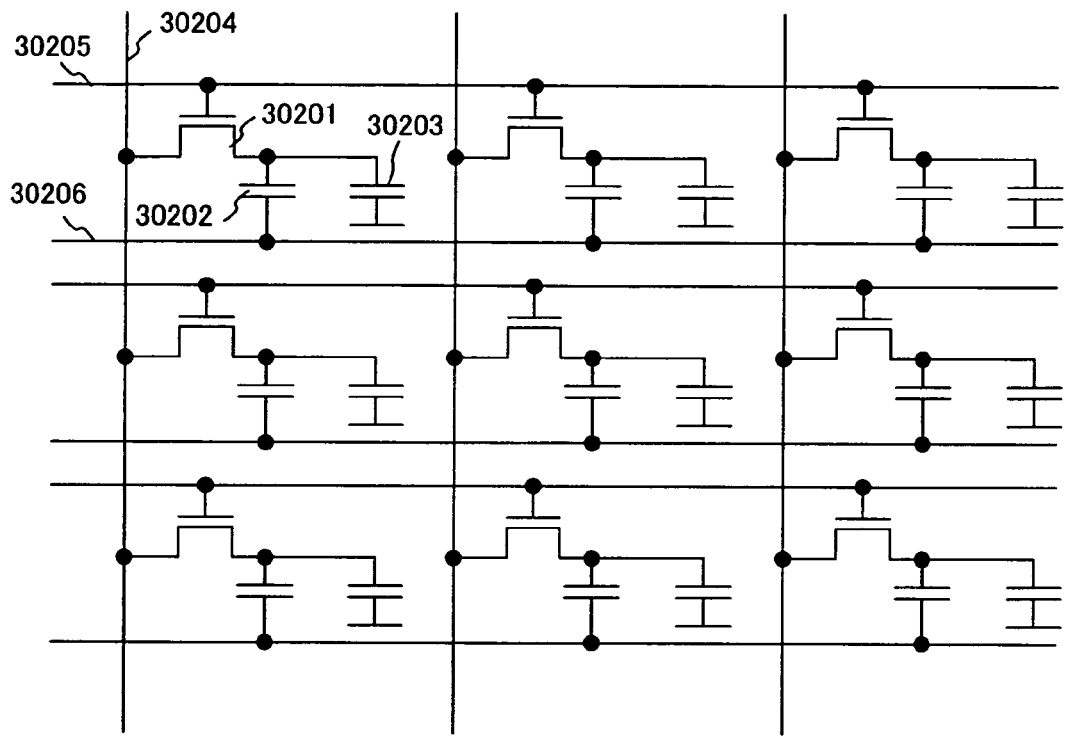
FIGS. 63A and 63B illustrate examples of driving methods of a semiconductor device according to the invention.

Next, driving which controls a potential of a common line is described with reference to FIGS. 63A and 63B. FIG. 63A is a diagram showing a plurality of pixel circuits in which one common line is provided with respect to one scan line in a display device using a display element which has capacitive properties, such as a liquid crystal element. Each of the pixel circuits shown in FIG. 63A includes a transistor 30201, an auxiliary capacitor 30202, a display element 30203, a video signal line 30204, a scan line 30205, and a common line 30206.

A gate electrode of the transistor 30201 is electrically connected to the scan line 30205. One of a source electrode and a drain electrode of the transistor 30201 is electrically connected to the video signal line 30204. The other of the source electrode and the drain electrode of the transistor 30201 is electrically connected to one electrode of the auxiliary capacitor 30202 and one electrode of the display element 30203. The other electrode of the auxiliary capacitor 30202 is electrically connected to the common line 30206.

First, in a pixel selected by the scan line 30205, the transistor 30201 is turned on, so that voltage corresponding to a video signal is applied to the display element 30203 and the auxiliary capacitor 30202 through the video signal line 30204. At this time, when the video signal is a signal which makes all of pixels connected to the common line 30206 display a minimum gray scale or a maximum gray scale, it is not necessary to write the video signal to each of the pixels through the video signal line 30204. Instead of writing the video signal through the video signal line 30204, voltage applied to the display element 30203 can be changed by changing a potential of the common line 30206.

Figure 63B:
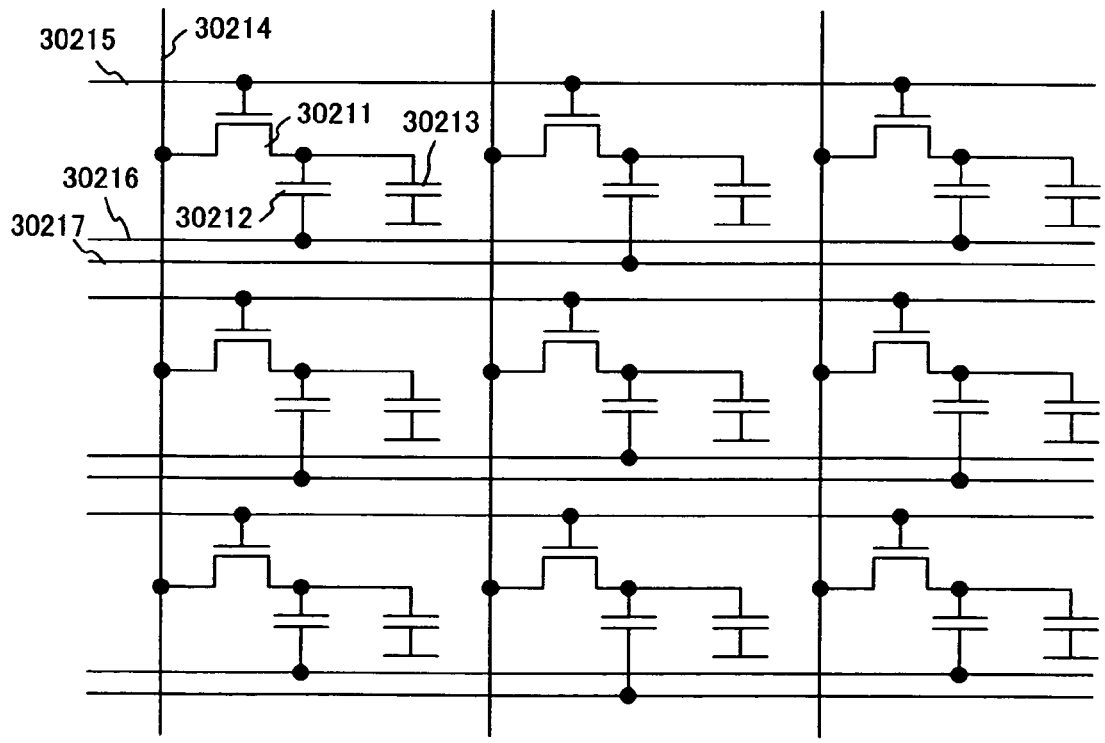

FIG. 63B is a diagram showing a plurality of pixel circuits in which two common lines are provided with respect to one scan line in a display device using a display element which has capacitive properties, such as a liquid crystal element. Each of the pixel circuits shown in FIG. 63B includes a transistor 30211, an auxiliary capacitor 30212, a display element 30213, a video signal line 30214, a scan line 30215, a first common line 30216, and a second common line 30217.

A gate electrode of the transistor 31211 is electrically connected to the scan line 31215. One of a source electrode and a drain electrode of the transistor 31211 is electrically connected to the video signal line 31214. The other of the source electrode and the drain electrode of the transistor 31211 is electrically connected to one electrode of the auxiliary capacitor 31212 and one electrode of the display element 31213. The other electrode of the auxiliary capacitor 31212 is electrically connected to the first common line 31216. Further, in an adjacent pixel, the other electrode of the auxiliary capacitor 31212 is electrically connected to the second common line 31217.

In the pixel circuits shown in FIG. 63B, the number of pixels electrically connected to one common line is small. Accordingly, by changing a potential of the first common line 31216 or the second common line 31217 instead of writing a video signal through the video signal line 31214, frequency of changing voltage applied to the display element 31213 is significantly increased. Further, source inversion driving or dot inversion driving can be performed. By performing source inversion driving or dot inversion driving, reliability of the element can be improved and a flicker can be suppressed.

Figure 64A:
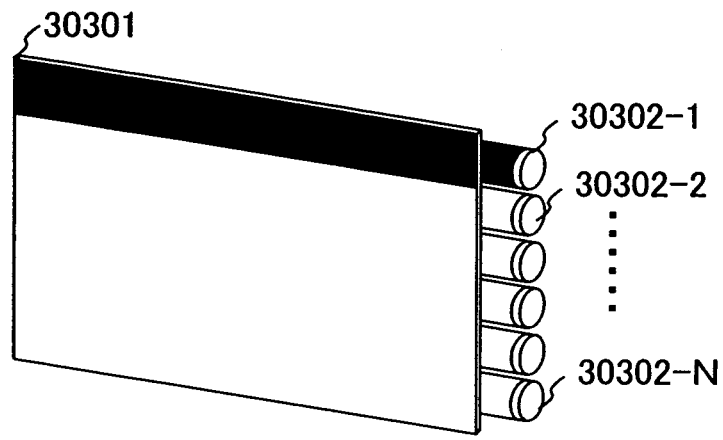
FIGS. 64A to 64C illustrate examples of driving methods of a semiconductor device according to the invention.

Next, a scanning backlight is described with reference to FIGS. 64A to 64C. FIG. 64A shows a scanning backlight in which cold cathode fluorescent lamps are arranged. The scanning backlight shown in FIG. 64A includes a diffusing plate 30301 and N pieces of cold cathode fluorescent lamps 30302-1 to 30302-N. The N pieces of the cold cathode fluorescent lamps 30302-1 to 30302-N are arranged on the back side of the diffusing plate 30301, so that the N pieces of the cold cathode fluorescent lamps 30302-1 to 30302-N can be scanned while luminance thereof is changed.

Change in luminance of each cold cathode fluorescent lamp in scanning is described with reference to FIG. 64C. First, luminance of the cold cathode fluorescent lamp 30302-1 is changed for a certain period. After that, luminance of the cold cathode fluorescent lamp 30302-2 which is provided adjacent to the cold cathode fluorescent lamp 30302-1 is changed for the same length of time. In such a manner, luminance is changed sequentially from the cold cathode fluorescent lamp 30302-1 to the cold cathode fluorescent lamp 30302-N. Note that although luminance which is changed for a certain period is set to be lower than original luminance in FIG. 64C, it may also be higher than the original luminance. In addition, although scanning is performed from the cold cathode fluorescent lamps 30302-1 to 30302-N, scanning may also be performed from the cold cathode fluorescent lamps 30302-N to 30302-1, which is in a reverse order.

Figure 64B:
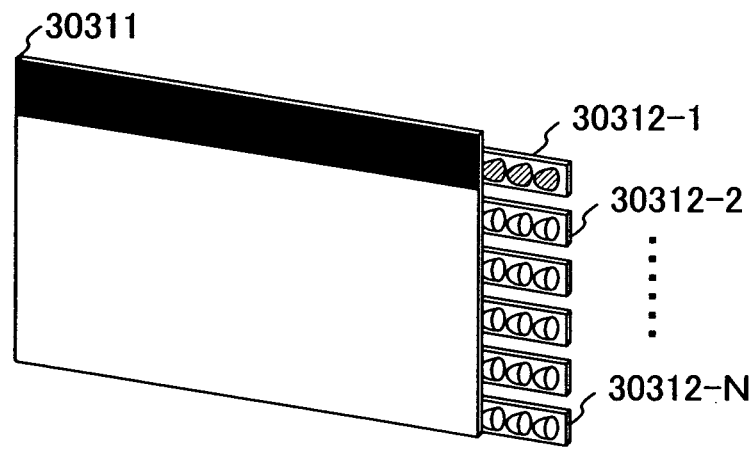
Figure 64C:
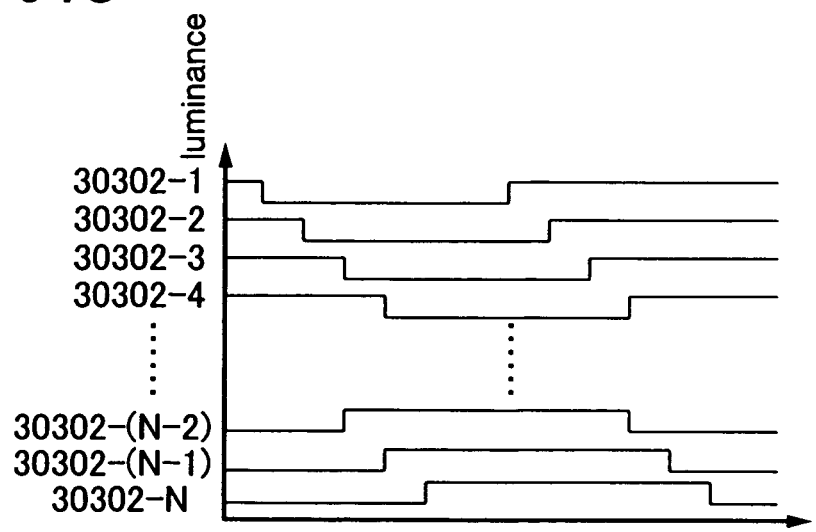

By performing driving as in FIG. 64C, average luminance of the backlight can be decreased. Accordingly, power consumption of the backlight, which mainly takes up power consumption of the liquid crystal display device, can be reduced.

Note that an LED may be used as a light source of the scanning backlight. A scanning backlight in that case is as shown in FIG. 64B. The scanning backlight shown in FIG. 64B includes a diffusing plate 30311 and light sources 30312-1 to 30312-N, in each of which LEDs are arranged. When the LED is used as the light source of the scanning backlight, there is an advantage in that the backlight can be thin and lightweight and that a color reproduction range can be widened. Further, since the LEDs which are arranged in each of the light sources 30312-1 to 30312-N can be similarly scanned, a dot scanning backlight can also be obtained. By using the dot scanning backlight, quality of a moving image can be further improved.

When the LED is used as the light source of the backlight, driving can be performed by changing luminance as shown in FIG. 64C as well.

Note that although this embodiment mode is described with reference to various drawings, the contents (or part of the contents) described in each drawing can be freely applied to, combined with, or replaced with the contents (or part of the contents) described in another drawing. Further, much more drawings can be formed by combining each part with another part in the above-described drawings.

Similarly, the contents (or part of the contents) described in each drawing in this embodiment mode can be freely applied to, combined with, or replaced with the contents (or part of the contents) described in a drawing in another embodiment mode. Further, much more drawings can be formed by combining each part in each drawing in this embodiment mode with part of another embodiment mode.

Note that this embodiment mode shows examples of embodying, slightly transforming, partially modifying, improving, describing in detail, or applying the contents (or part of the contents) described in other embodiment modes, an example of related part thereof, or the like. Therefore, the contents described in other embodiment modes can be freely applied to, combined with, or replaced with this embodiment mode.

[Embodiment Mode 8]

In this embodiment mode, examples are described in which a semiconductor device including a photoelectric conversion device obtained by the invention is incorporated in various electronic devices. Examples of electronic devices to which the invention is applied include a computer, a display, a mobile phone, and a television set. Specific examples of these electronic devices are shown in FIGS. 39, 40A, 40B, 41A, 41B, 42, 43A, 43B, 44, 45, 46A, 46B, 47A, 47B, 48, and 49A to 49H.

Figure 39:
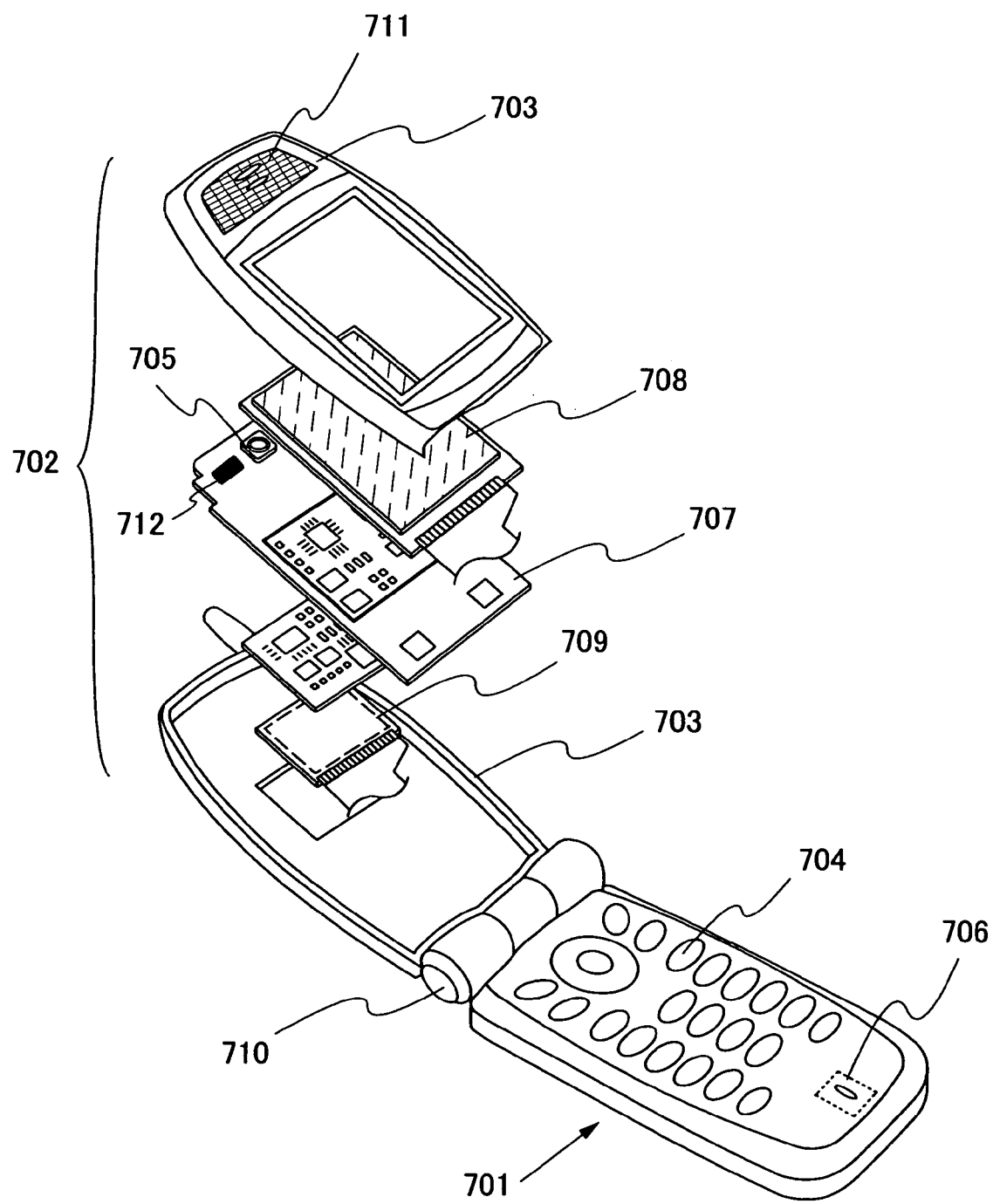
FIG. 39 shows a device to which a semiconductor device of the invention is mounted.

FIG. 39 shows an example of a mobile phone to which the invention is applied, which includes a main body (A) 701, a main body (B) 702, a housing 703, operation keys 704, an audio output portion 705, an audio input portion 706, a circuit board 707, a display panel (A) 708, a display panel (B) 709, a hinge 710, a light-transmitting material portion 711 and a photoelectric conversion device 712. The invention can be applied to the photoelectric conversion device 712.

The photoelectric conversion device 712 detects light which is transmitted through the light-transmitting material portion 711, controls luminance of the display panel (A) 708 and the display panel (B) 709 in accordance with illuminance of detected external light, and controls illumination of the operation keys 704 in accordance with illuminance obtained by the photoelectric conversion device 712. Accordingly, power consumption of the mobile phone can be reduced.

Figure 40A:
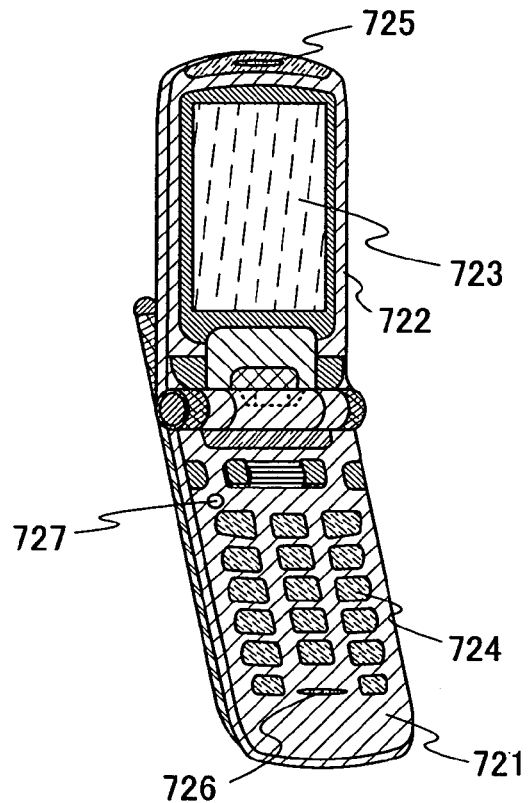
FIGS. 40A and 40B show devices to which a semiconductor device of the invention is mounted.
Figure 40B:
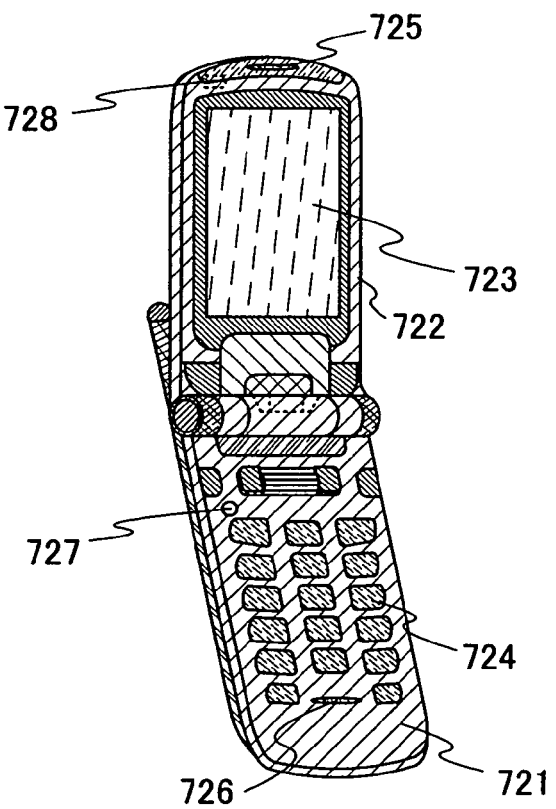

FIGS. 40A and 40B show another example of a mobile phone. The mobile phone shown in FIGS. 40A and 40B includes a main body 721, a housing 722, a display panel 723, operation keys 724, an audio output portion 725, an audio input portion 726, and a photoelectric conversion device 727.

In the mobile phone shown in FIG. 40A, luminance of the display panel 723 and the operation keys 724 can be controlled by detecting external light by the photoelectric conversion device 727 to which the invention is applied, which is provided to the main body 721.

In the mobile phone shown in FIG. 40B, a photoelectric conversion device 728 is provided inside the main body 721 in addition to the structure of FIG. 40A. By the photoelectric conversion device 728, luminance of a backlight provided for the display panel 723 can be detected and controlled. Accordingly, power consumption can be further reduced.

Figure 41A:
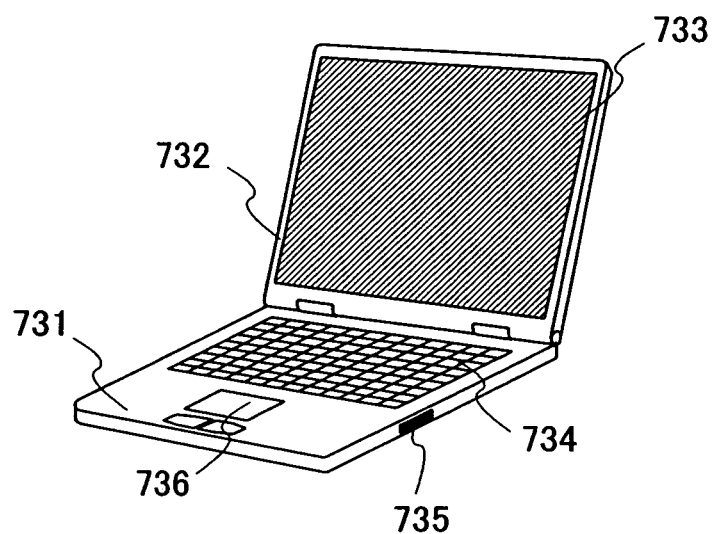
FIGS. 41A and 41B show devices to which a semiconductor device of the invention is mounted.
Figure 41B:
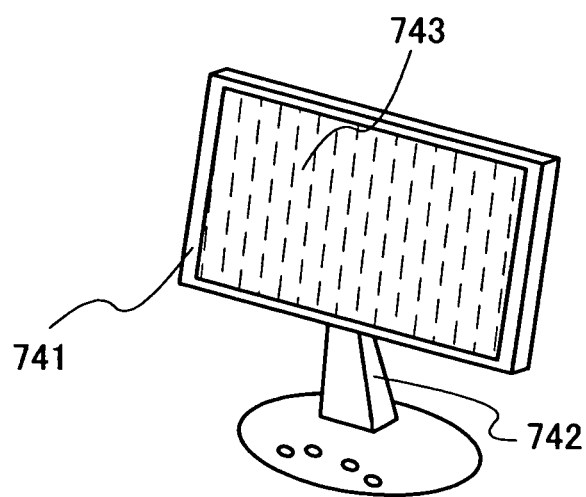

FIG. 41A shows a computer including a main body 731, a housing 732, a display portion 733, a keyboard 734, an external connection port 735, a pointing device 736, and the like. FIG. 41B shows a display device, which corresponds to a television receiver or the like. The display device includes a housing 741, a support base 742, a display portion 743, and the like.

Figure 42:
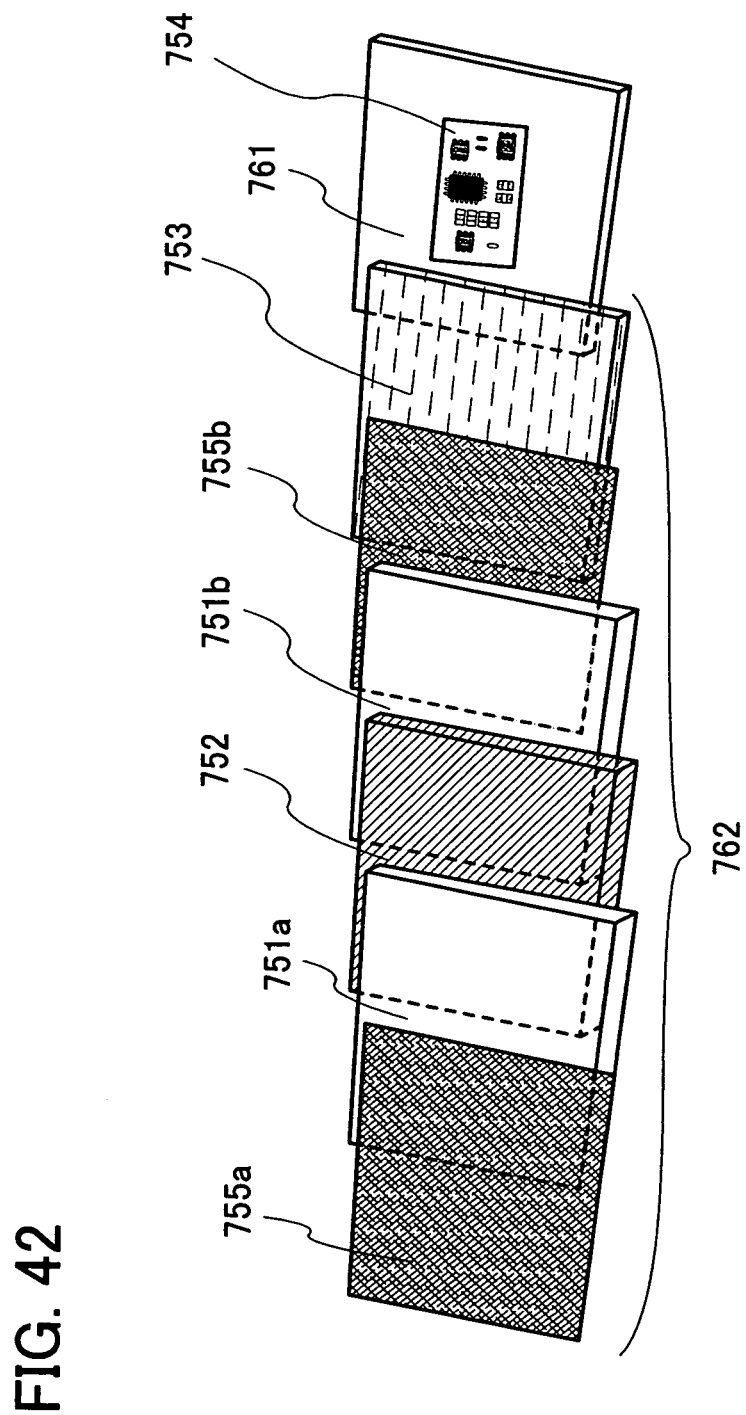
FIG. 42 shows a device to which a semiconductor device of the invention is mounted.

As the display portion 733 provided in the computer of FIG. 41A and the display portion 743 of the display device shown in FIG. 41B, a specific structure in the case where a liquid crystal panel is used is shown in FIG. 42. A liquid crystal panel 762 shown in FIG. 42 is incorporated in a housing 761 and includes substrates 751a and 751b, a liquid crystal layer 752 interposed between the substrates 751a and 751b, polarizing filters 755a and 752b, a backlight 753, and the like. Note that a photoelectric conversion device 754 is formed in the housing 761.

The photoelectric conversion device 754 formed using the invention detects the amount of light from the backlight 753, and luminance of the liquid crystal panel 762 is adjusted when information of the amount of light is fed back.

For the liquid crystal panel 762, a TN (twisted nematic) mode, a VA (vertical alignment) mode, an MVA (multi-domain vertical alignment) mode, an OCB (optical compensated birefringence) mode, an FLC (ferroelectric liquid crystal) mode, an AFLC (anti-ferroelectric liquid crystal) mode, an IPS (in-plane-switching) mode, an FFS (fringe field switching) mode, or the like can be employed as needed. Further, a normally black mode or a normally white mode may be employed as needed.

In addition, the liquid crystal panel 762 may be a reflective panel, a transmissive panel, or a transflective panel. When the liquid crystal panel 762 is a reflective panel or a transflective panel, a position of an optical sensor is needed to be determined as appropriate.

Alternatively, an EL (electroluminescence) display device may be used instead of the liquid crystal panel 762. As the EL display device, a display device including an EL element containing both organic and inorganic materials, a display device including an organic EL element, or a display device including an inorganic EL element may be employed as needed.

Alternatively, various display devices other than an EL display device may be used instead of the liquid crystal panel 762.

Figure 43A:
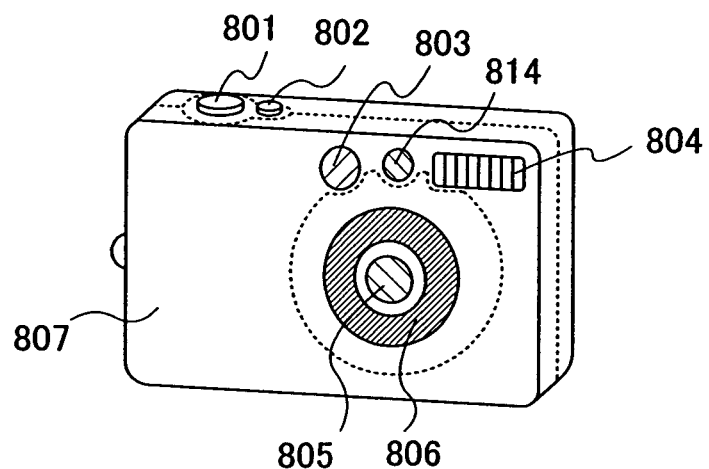
FIGS. 43A and 43B show a device to which a semiconductor device of the invention is mounted.
Figure 43B:
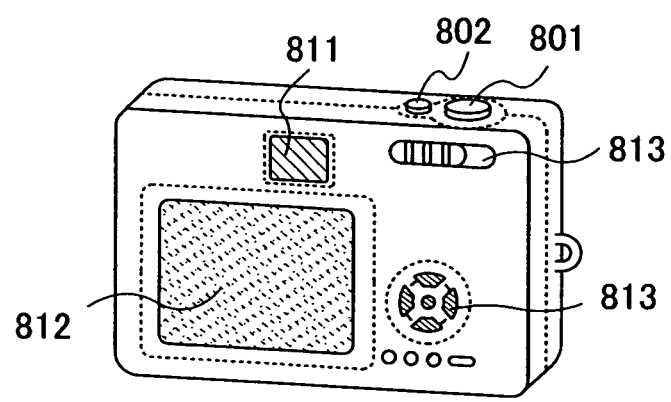

FIGS. 43A and 43B show an example in which an optical sensor in this embodiment mode is incorporated in a camera such as a digital camera. FIG. 43A is a front perspective view of the digital camera, and FIG. 43B is a back perspective view of the digital camera. In FIG. 43A, the digital camera is provided with a release button 801, a main switch 802, a finder window 803, a flash portion 804, a lens 805, a lens barrel 806, a housing 807, and an optical sensor 814. Further, in FIG. 43B, a finder eyepiece window 811, a monitor 812, and operation buttons 813 are provided.

When the release button 801 is pressed down halfway, a focus adjusting mechanism and an exposure adjusting mechanism are operated. When the release button 801 is pressed down fully, a shutter is opened. The main switch 802 switches on/off of a power supply of the digital camera by being pressed or rotated. The finder window 803 is provided at an upper portion of the lens 805 on a front side of the digital camera, and is a device for determining an area to be photographed or a focus position from the finder eyepiece window 811 shown in FIG. 43B. The flash portion 804 is provided at an upper portion on the front side of the digital camera, and when luminance of an object is low, assist light is emitted at the same time as the release button is pressed down so that the shutter is opened. The lens 805 is provided at the front face of the digital camera. The lens is formed of a focusing lens, a zoom lens, or the like, and forms a photographing optical system together with a shutter and an aperture which are not shown. Further, an imaging element such as a CCD (charge coupled device) is provided at the rear of the lens. The lens barrel 806 moves a lens position to adjust the focus of the focusing lens, the zoom lens, or the like. When a picture is taken, the lens barrel is slid out to move the lens 805 forward. When the camera is carried, the lens 805 is moved backward and made compact. Note that this embodiment mode employs a structure in which the lens barrel is slid out so that the object can be shot by being zoomed; however, the structure is not limited thereto. Instead, a structure of a digital camera may be employed in which zoom shooting can be performed without the lens barrel being slid out due to a structure of the photographing optical system inside the housing 807. The finder eyepiece window 811 is provided at an upper portion of the rear surface of the digital camera so that an area to be photographed or a focus point can be checked therethrough. The operation buttons 813 are buttons having various functions, which are provided at the rear surface of the digital camera, and include a set up button, a menu button, a display button, a functional button, a selection button, and the like.

When an optical sensor to which the invention is applied is incorporated in the camera shown in FIGS. 43A and 43B, the optical sensor can detect the presence and intensity of light. Accordingly, an exposure adjustment or the like of the camera can be performed.

In addition, the optical sensor in this embodiment mode can be applied to other electronic devices such as a projection TV and a navigation system. That is, the optical sensor of the invention can be used for any device which is necessary to detect light. A result of light detection is fed back, so that power consumption can be reduced.

Figure 44:
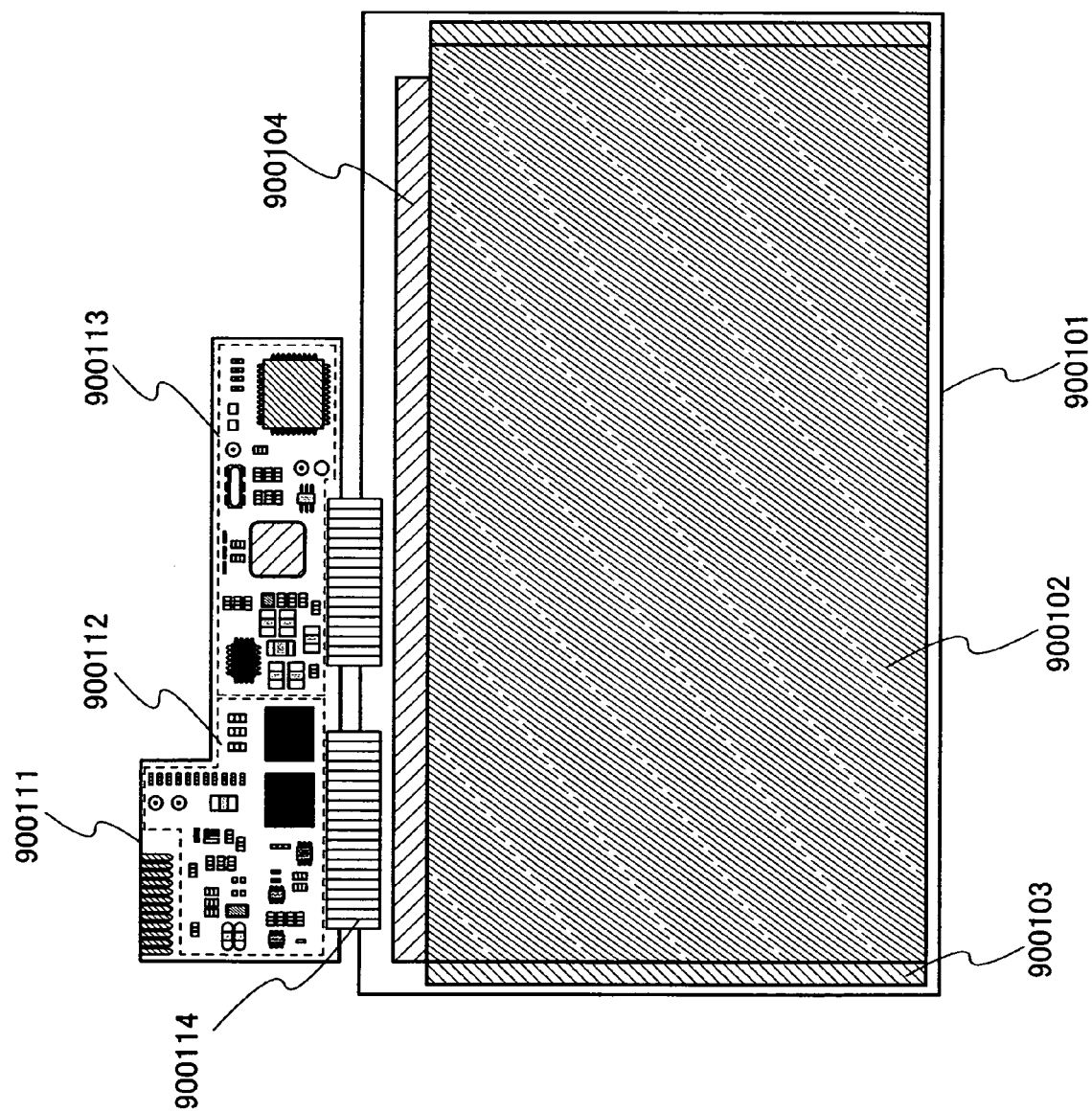
FIG. 44 shows a device to which a semiconductor device of the invention is mounted.

FIG. 44 shows a display panel module combining a display panel 900101 and a circuit board 900111. The display panel 900101 includes a pixel portion 900102, a scan line driver circuit 900103, and a signal line driver circuit 900104. The circuit board 900111 is provided with a control circuit 900112, a signal dividing circuit 900113, and the like, for example. The display panel 900101 and the circuit board 900111 are connected to each other by a connection wiring 900114. An FPC or the like can be used as the connection wiring.

In the display panel 900101, the pixel portion 900102 and part of peripheral driver circuits (a driver circuit having a low operation frequency among a plurality of driver circuits) may be formed over the same substrate by using transistors, and another part of the peripheral driver circuits (a driver circuit having a high operation frequency among the plurality of driver circuits) may be formed over an IC chip. Then, the IC chip may be mounted on the display panel 900101 by COG (Chip On Glass) or the like. Thus, the area of the circuit board 900111 can be reduced, and a small display device can be obtained. Alternatively, the IC chip may be mounted on the display panel 900101 by using TAB (Tape Automated Bonding) or a printed wiring board. Thus, the area of the display panel 900101 can be reduced, and a display device with a narrower frame can be obtained.

For example, in order to reduce power consumption, the pixel portion may be formed over a glass substrate by using transistors, and all peripheral circuits may be formed over an IC chip. Then, the IC chip may be mounted on a display device by COG or TAB.

Figure 45:
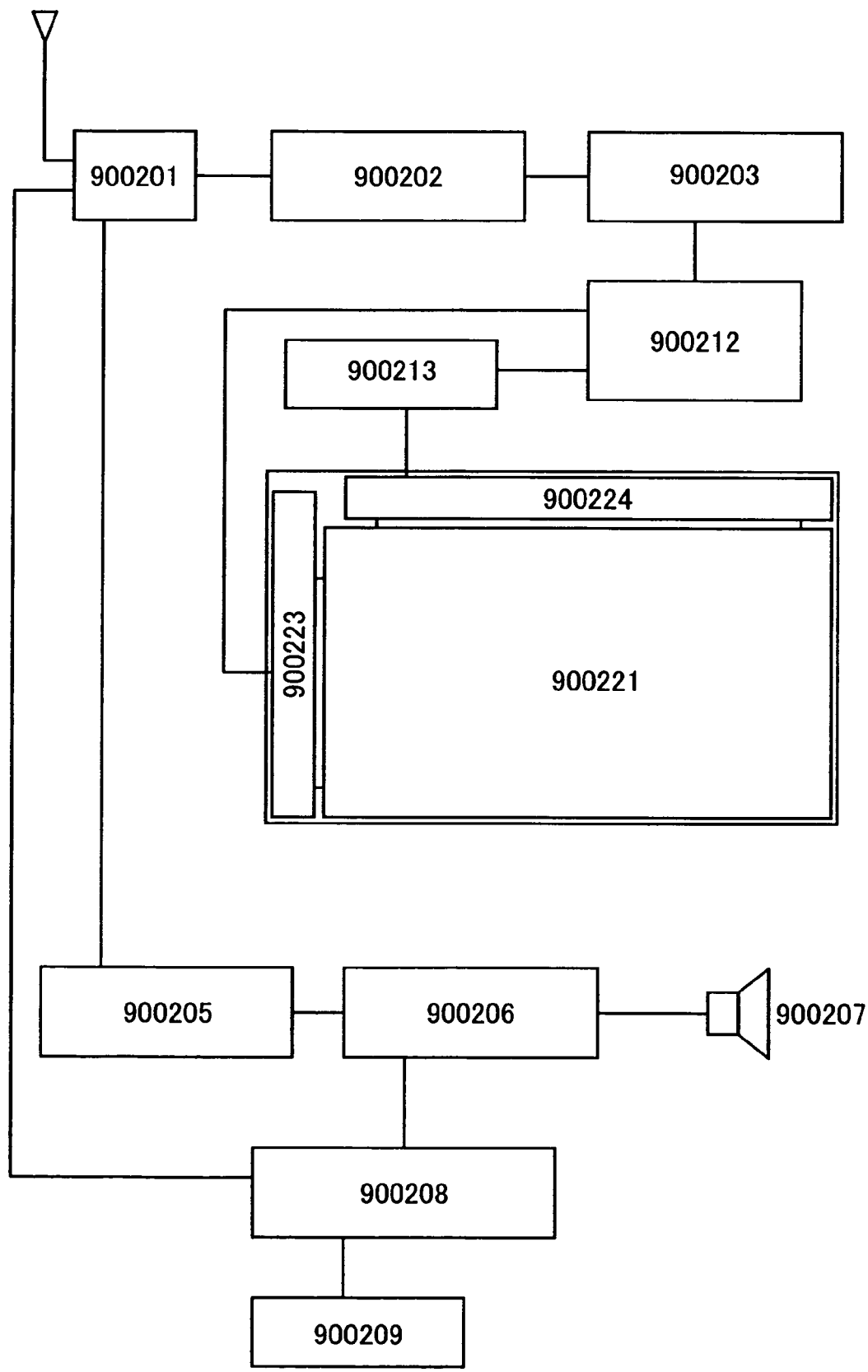
FIG. 45 shows a device to which a semiconductor device of the invention is mounted.

By the display panel module shown in FIG. 44, a television receiver can be completed. FIG. 45 is a block diagram showing a main structure of a television receiver. A tuner 900201 receives a video signal and an audio signal. The video signals are processed by an video signal amplifier circuit 900202; a video signal processing circuit 900203 which converts a signal output from the video signal amplifier circuit 900202 into a color signal corresponding to each color of red, green, and blue; and a control circuit 900212 which converts the video signal into the input specification of a driver circuit. The control circuit 900212 outputs a signal to each of the scan line side and the signal line side. A scan line driver circuit 900223 and a signal line driver circuit 900224 drive a display panel 900221. When digital drive is performed, a structure may be employed in which a signal dividing circuit 900213 is provided on the signal line side and an input digital signal is divided into m signals (m is a positive integer) to be supplied.

Among the signals received by the tuner 900201, an audio signal is transmitted to an audio signal amplifier circuit 900205, and an output thereof is supplied to a speaker 900207 through an audio signal processing circuit 900206. A control circuit 900208 receives control information on receiving station (receiving frequency) and volume from an input portion 900209 and transmits signals to the tuner 900201 or the audio signal processing circuit 900206.

Figure 46A:
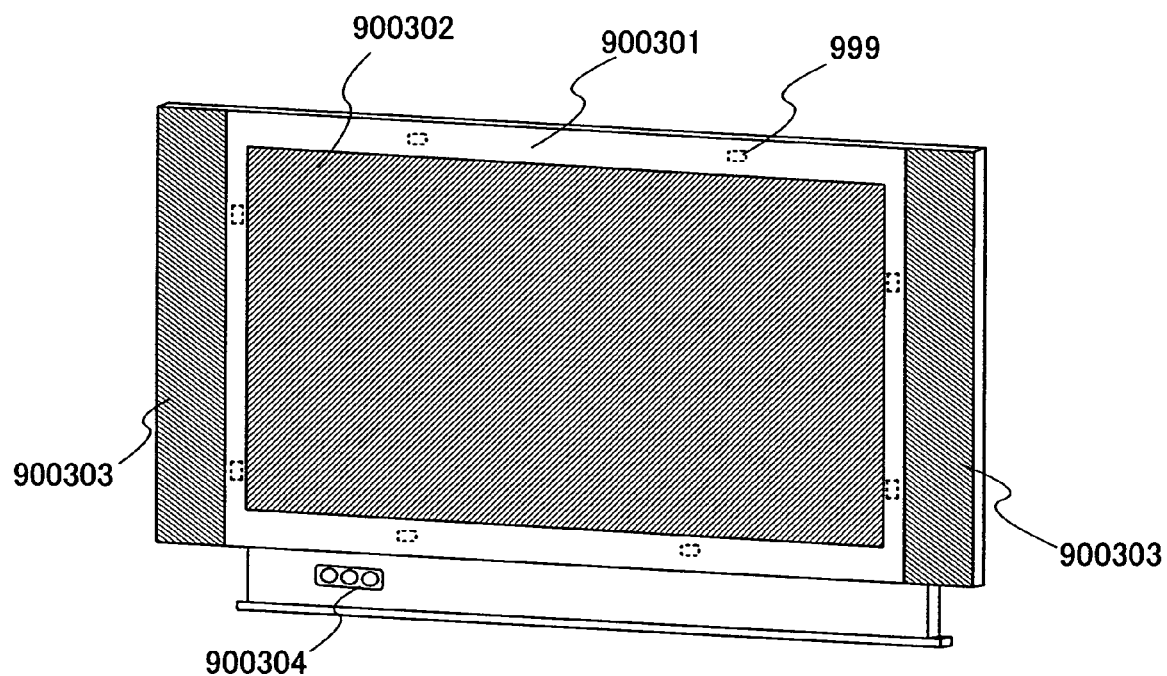
FIGS. 46A and 46B show devices to which a semiconductor device of the invention is mounted.

FIG. 46A shows a television receiver incorporated with the display panel 900101 shown in FIG. 44. In FIG. 46A, a display screen 900302 incorporated in a housing 900301 includes the display panel module 900101. Note that speakers 900303, an operation switch 900304, input means (a connection terminal, a sensor (having a function of measuring power, displacement, position, speed, acceleration, angular velocity, the number of rotations, distance, light, liquid, magnetism, temperature, a chemical substance, sound, time, hardness, an electric field, current, voltage, electric power, radiation, a flow rate, humidity, gradient, oscillation, smell, or infrared ray), and a microphone), and the like may be provided as appropriate.

Figure 46B:
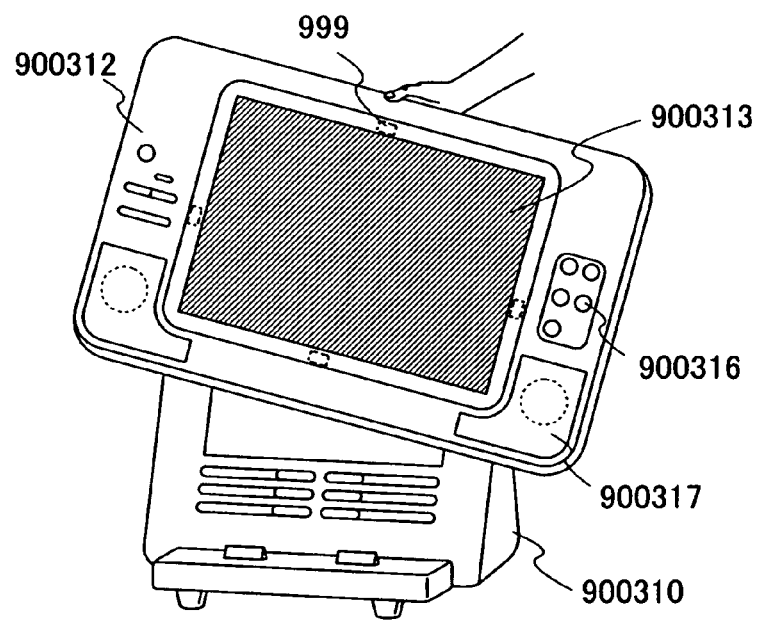

FIG. 46B shows a television receiver in which only a display can be carried wirelessly. A display portion 900313 includes the display panel 900101. A battery and a signal receiver are incorporated in a housing 900312. The battery drives the display portion 900313 or a speaker portion 900317. The battery can be repeatedly charged by a charger 900310. The charger 900310 can transmit and receive a video signal and transmit the video signal to the signal receiver of the display. The housing 900312 is controlled by operation keys 900316. Alternatively, the device shown in FIG. 46B can transmit a signal to the charger 900310 from the housing 900312 by operating the operation keys 900316. That is, the device may be an image and audio interactive communication device. Further alternatively, by operating the operation keys 900316, a signal is transmitted to the charger 900310 from the housing 900312, and another electronic device is made to receive a signal which can be transmitted from the charger 900310; thus, the device can control communication of another electronic device. That is, the device may be a general-purpose remote control device.

A photoelectric conversion device 999 formed according to Embodiment Modes 1 to 4 can be provided in the periphery of the display screen 900302 in FIG. 46A and in the periphery of the display portion 900313 in FIG. 64B. The number of photoelectric conversion devices 999 can be determined as appropriate when necessary.

Figure 47A:
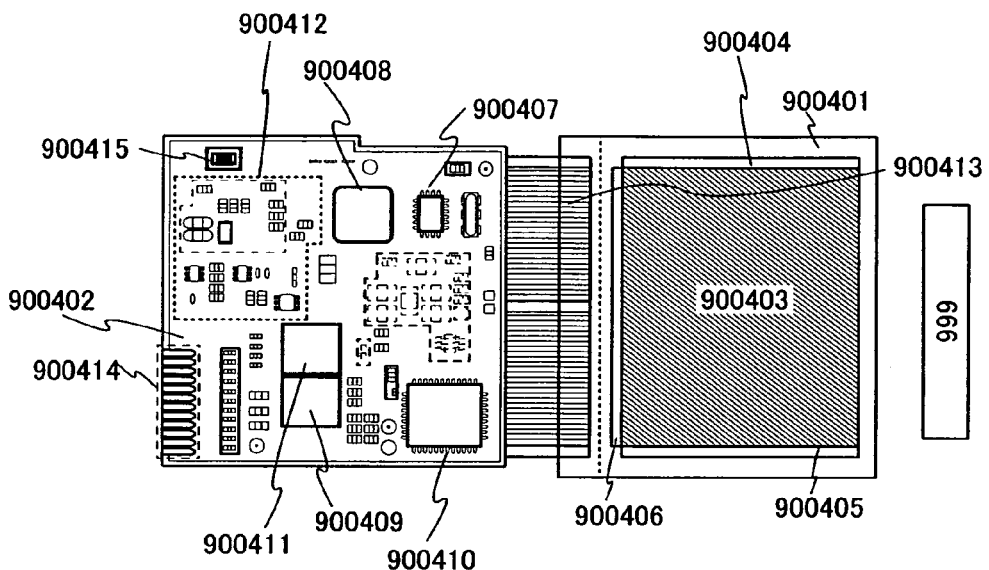
FIGS. 47A and 47B show a device to which a semiconductor device of the invention is mounted.

FIG. 47A shows a module combining a display panel 900401 and a printed wiring board 900402. The display panel 900401 may include a pixel portion 900403 provided with a plurality of pixels, a first scan line driver circuit 900404, a second scan line driver circuit 900405, and a signal line driver circuit 900406 which supplies a video signal to a selected pixel.

The printed wiring board 900402 is provided with a controller 900407, a central processing unit (CPU) 900408, a memory 900409, a power supply circuit 900410, an audio processing circuit 900411, a transmitting/receiving circuit 900412, and the like. The printed wiring board 900402 and the display panel 900401 are connected by a flexible printed circuit (FPC) 900413. The flexible printed circuit (FPC) 900413 may be provided with a capacitor, a buffer circuit, or the like so as to prevent noise on power supply voltage or a signal and increase in rise time of a signal. Note that the controller 900407, the audio processing circuit 900411, the memory 900409, the central processing unit (CPU) 900408, the power supply circuit 900410, or the like can be mounted to the display panel 900401 by a COG (Chip On Glass) method. By using the COG method, the size of the printed wiring board 900402 can be reduced.

Various control signals are input and output through an interface (I/F) 900414 provided on the printed wiring board 900402. An antenna port 900415 for transmitting and receiving a signal to/from an antenna is provided on the printed wiring board 900402.

Figure 47B:
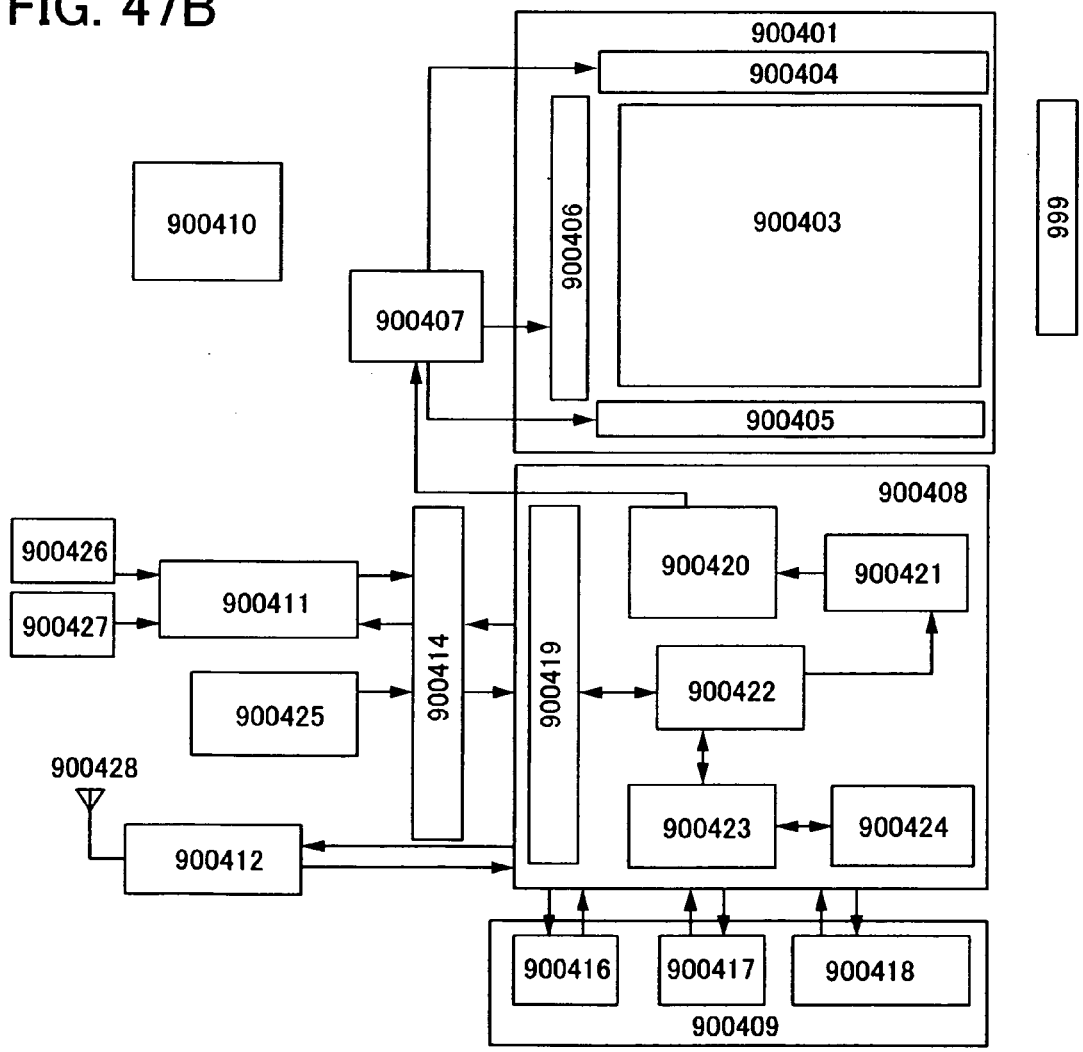

FIG. 47B is a block diagram of the module shown in FIG. 47A. The module includes a VRAM 900416, a DRAM 900417, a flash memory 900418, and the like as the memory 900409. The VRAM 900416 stores data on an image displayed on a panel, the DRAM 900417 stores video data or audio data, and the flash memory 900418 stores various programs.

The power supply circuit 900410 supplies electric power for operating the display panel 900401, the controller 900407, the central processing unit (CPU) 900408, the audio processing circuit 900411, the memory 900409, and the transmitting/receiving circuit 900412. Note that the power supply circuit 900410 may be provided with a current source depending on a panel specification.

The central processing unit (CPU) 900408 includes a control signal generation circuit 900420, a decoder 900421, a register 900422, an arithmetic circuit 900423, a RAM 900424, an interface (I/E) 900419 for the central processing unit (CPU) 900408, and the like. Various signals input to the central processing unit (CPU) 900408 via the interface (VF) 900419 are once stored in the register 900422, and subsequently input to the arithmetic circuit 900423, the decoder 900421, or the like. The arithmetic circuit 900423 performs operation based on the signal input thereto so as to designate a location to which various instructions are sent. On the other hand, the signal input to the decoder 900421 is decoded and input to the control signal generation circuit 900420. The control signal generation circuit 900420 generates a signal including various instructions based on the signal input thereto, and transmits the signal to the location designated by the arithmetic circuit 900423, specifically the memory 900409, the transmitting/receiving circuit 900412, the audio processing circuit 900411, and the controller 900407, for example.

The memory 900409, the transmitting/receiving circuit 900412, the audio processing circuit 900411, and the controller 900407 operate in accordance with respective instructions. Hereinafter, the operation is briefly described.

A signal input from an input means 900425 is transmitted to the central processing unit (CPU) 900408 mounted to the printed wiring board 900402 via the interface (I/F) 900414. The control signal generation circuit 900420 converts image data stored in the VRAM 900416 into a predetermined format depending on the signal transmitted from the input means 900425 such as a pointing device or a keyboard, and transmits the converted data to the controller 900407.

The controller 900407 performs data processing of the signal including the image data transmitted from the central processing unit (CPU) 900408 in accordance with the panel specification, and supplies the signal to the display panel 900401. The controller 900407 generates an Hsync signal, a Vsync signal, a clock signal CLK, alternating voltage (AC Cont), and a switching signal L/R based on power supply voltage input from the power supply circuit 900410 or various signals input from the central processing unit (CPU) 900408, and supplies the signals to the display panel 900401.

The transmitting/receiving circuit 900412 processes a signal which is to be transmitted and received as an electric wave by an antenna 900428. Specifically, the transmitting/receiving circuit 900412 may include a high-frequency circuit such as an isolator, a band pass filter, a VCO (voltage controlled oscillator), an LPF (low pass filter), a coupler, or a balun. A signal including audio information among signals transmitted and received by the transmitting/receiving circuit 900412 is transmitted to the audio processing circuit 900411 in accordance with an instruction from the central processing unit (CPU) 900408.

The signal including the audio information which is transmitted in accordance with the instruction from the central processing unit (CPU) 900408 is demodulated into an audio signal by the audio processing circuit 900411 and transmitted to a speaker 900427. An audio signal transmitted from a microphone 900426 is modulated by the audio processing circuit 900411 and transmitted to the transmitting/receiving circuit 900412 in accordance with an instruction from the central processing unit (CPU) 900408.

The controller 900407, the central processing unit (CPU) 900408, the power supply circuit 900410, the audio processing circuit 900411, and the memory 900409 can be mounted as a package of this embodiment mode.

The photoelectric conversion device 999 formed according to Embodiment Modes 1 to 4 may be provided in the periphery of the display panel 900401.

It is needless to say that this embodiment mode is not limited to a television receiver and can be applied to various uses, such as a monitor of a personal computer, and especially as a large display medium such as an information display board at the train station, the airport, or the like, or an advertisement display board on the street.

Next, a structure example of a mobile phone, which is different from FIG. 39, is described with reference to FIG. 48.

A display panel 900501 is detachably incorporated in a housing 900530. The shape or the size of the housing 900530 can be changed as appropriate in accordance with the size of the display panel 900501. The housing 900530 which fixes the display panel 900501 is fitted in a printed wiring board 900531 to be assembled as a module.

The display panel 900501 is connected to the printed wiring board 900531 through an FPC 900513. The printed wiring board 900531 is provided with a speaker 900532, a microphone 900533, a transmitting/receiving circuit 900534, and a signal processing circuit 900535 including a CPU, a controller, and the like. Note that the printed wiring board 900531 or the like may be provided with various kinds of sensors (having a function of measuring power, displacement, position, speed, acceleration, angular velocity, the number of rotations, distance, light, liquid, magnetism, temperature, a chemical substance, sound, time, hardness, an electric field, current, voltage, electric power, radiation, a flow rate, humidity, gradient, oscillation, smell, or infrared ray). Such a module, an input means 900536, and a battery 900537 are combined and stored in a housing 900539. The housing 900539 is provided with an antenna 900540. A pixel portion of the display panel 900501 is provided so as to be seen from an opening window formed in the housing 900539.

In the display panel 900501, the pixel portion and part of peripheral driver circuits (a driver circuit having a low operation frequency among a plurality of driver circuits) may be formed over the same substrate by using transistors, and another part of the peripheral driver circuits (a driver circuit having a high operation frequency among the plurality of driver circuits) may be formed over an IC chip. Then, the IC chip may be mounted on the display panel 900501 by COG (Chip On Glass). Alternatively, the IC chip may be connected to a glass substrate by using TAB (Tape Automated Bonding) or a printed wiring board. With such a structure, power consumption of a display device can be reduced, and operation time of the mobile phone per charge can be extended. Further, reduction in cost of the mobile phone can be realized.

Figure 48:
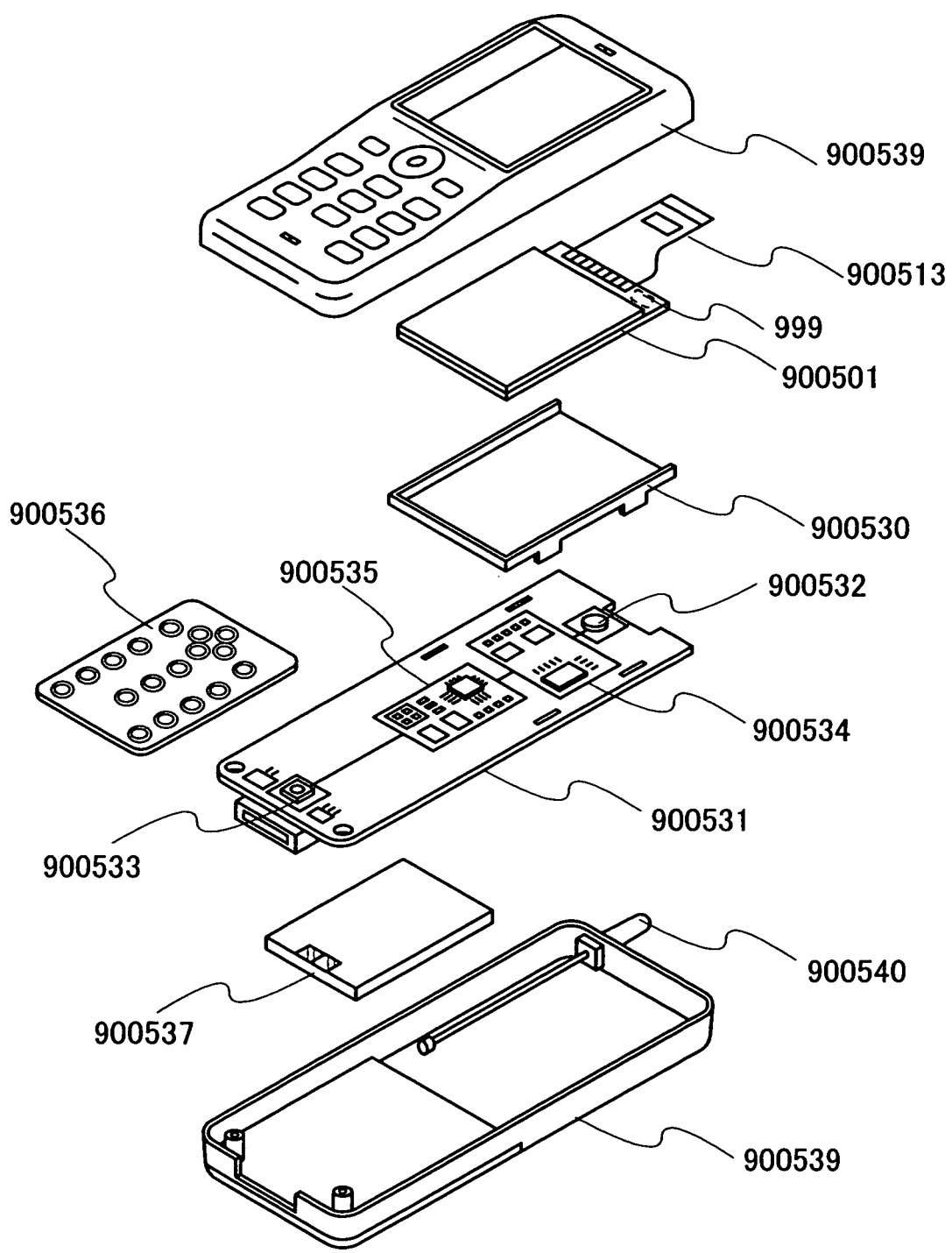
FIG. 48 shows a device to which a semiconductor device of the invention is mounted.

The mobile phone shown in FIG. 48 has various functions such as, but not limited to, a function of displaying various kinds of information (e.g., a still image, a moving image, and a text image); a function of displaying a calendar, a date, the time, and the like on a display portion; a function of operating or editing the information displaying on the display portion; a function of controlling processing by various kinds of software (programs); a function of wireless communication; a function of communicating with another mobile phone, a fixed phone, or an audio communication device by using the wireless communication function; a function of connecting with various computer networks by using the wireless communication function; a function of transmitting or receiving various kinds of data by using the wireless communication function; a function of operating a vibrator in accordance with incoming call, reception of data, or an alarm; and a function of generating a sound in accordance with incoming call, reception of data, or an alarm.

The photoelectric conversion device 999 formed according to Embodiment Modes 1 to 4 may be provided in the periphery of the display panel 900501.

The invention can be applied to various electronic devices. Specifically, the invention can be applied to a display portion of an electronic device. Examples of such electronic devices include cameras such as a video camera and a digital camera, a goggle-type display, a navigation system, an audio reproducing device (such as car audio components and audio components), a computer, a game machine, a portable information terminal (such as a mobile computer, a mobile phone, a mobile game machine, and an electronic book), and an image reproducing device provided with a recording medium (specifically, a device which reproduces a recording medium such as a digital versatile disc (DVD) and has a display for displaying the reproduced image).

Figure 49A:
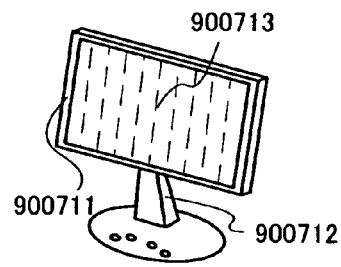
FIGS. 49A to 49H show devices to which a semiconductor device of the invention is mounted.

FIG. 49A shows a display, which includes a housing 900711, a support base 900712, a display portion 900713, and the like. The display shown in FIG. 49A can have various functions such as, but not limited to, a function of displaying various kinds of information (e.g., a still image, a moving image, and a text image) on the display portion.

Although not shown, an optical sensor formed according to Embodiment Modes 1 to 4 is provided in the periphery of the display portion 900713.

Figure 49B:
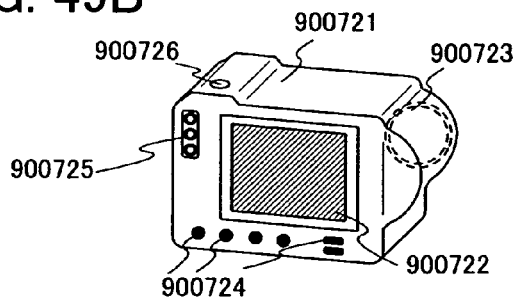

FIG. 49B shows a camera, which includes a main body 900721, a display portion 900722, an image receiving portion 900723, operation keys 900724, an external connection port 900725, a shutter button 900726, and the like. The camera shown in FIG. 49B can have various functions such as, but not limited to, a function of photographing a still image and a moving image; a function of automatically adjusting the photographed image (the still image or the moving image); a function of storing the photographed image in a recording medium (provided externally or incorporated in the camera); and a function of displaying the photographed image on the display portion.

Although not shown, the optical sensor formed according to Embodiment Modes 1 to 4 is provided in the periphery of the display portion 900722.

Figure 49C:
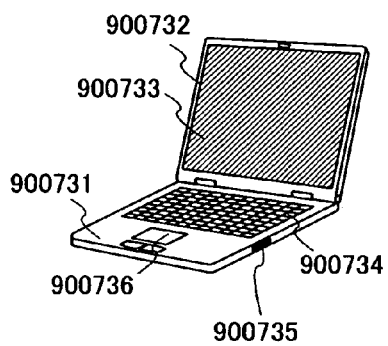

FIG. 49C shows a computer, which includes a main body 900731, a housing 900732, a display portion 900733, a keyboard 900734, an external connection port 900735, a pointing device 900736, and the like. The computer shown in FIG. 49C can have various functions such as, but not limited to, a function of displaying various kinds of information (e.g., a still image, a moving image, and a text image) on the display portion; a function of controlling processing by various kinds of software (programs); a communication function such as wireless communication or wire communication; a function of connecting with various computer networks by using the communication function; and a function of transmitting or receiving various kinds of data by using the communication function.

Although not shown, the optical sensor formed according to Embodiment Modes 1 to 4 is provided in the periphery of the display portion 900733.

Figure 49D:
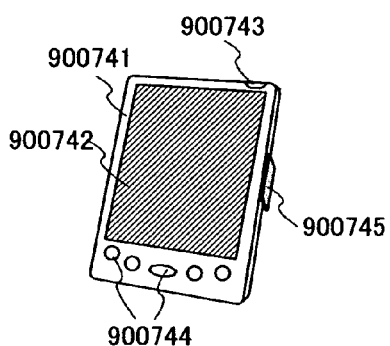

FIG. 49D shows a mobile computer, which includes a main body 900741, a display portion 900742, a switch 900743, operation keys 900744, an infrared port 900745, and the like. The mobile computer shown in FIG. 49D can have various functions such as, but not limited to, a function of displaying various kinds of information (e.g., a still image, a moving image, and a text image) on the display portion; a touch panel function provided on the display portion; a function of displaying a calendar, a date, the time, and the like on the display portion; a function of controlling processing by various kinds of software (programs); a function of wireless communication; a function of connecting with various computer networks by using the wireless communication function; and a function of transmitting or receiving various kinds of data by using the wireless communication function.

Although not shown, the optical sensor formed according to Embodiment Modes 1 to 4 is provided in the periphery of the display portion 900742.

Figure 49E:
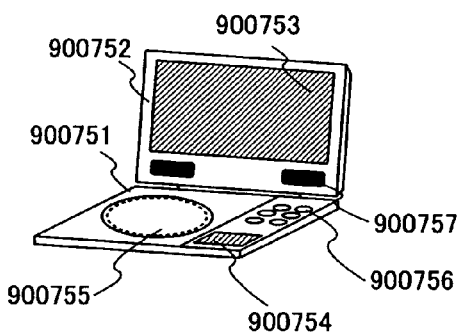

FIG. 49E shows a portable image reproducing device provided with a recording medium (e.g., a DVD reproducing device), which includes a main body 900751, a housing 900752, a display portion A 900753, a display portion B 900754, a recording medium reading portion 900755, operation keys 900756, a speaker portion 900757, and the like. The display portion A 900753 can mainly display image information, and the display portion B 900754 can mainly display text information. The recording medium read by the recording medium reading portion 900755 is a DVD, for example.

Although not shown, the optical sensor formed according to Embodiment Modes 1 to 4 is provided in the periphery of one or both of the display portion A 900753 and the display portion B 900754.

Figure 49F:
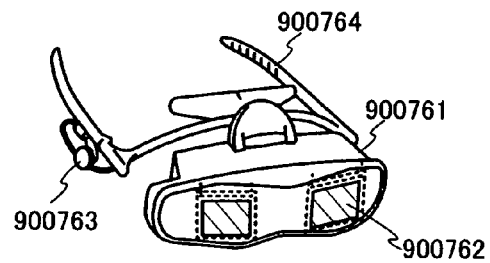

FIG. 49F shows a goggle-type display, which includes a main body 900761, a display portion 900762, an earphone 900763, and a support portion 900764. The goggle-type display shown in FIG. 49F can have various functions such as, but not limited to, a function of displaying an image (e.g., a still image, a moving image, and a text image) which is externally obtained on the display portion.

Although not shown, the optical sensor formed according to Embodiment Modes 1 to 4 is provided in the periphery of the display portion 900762.

Figure 49G:
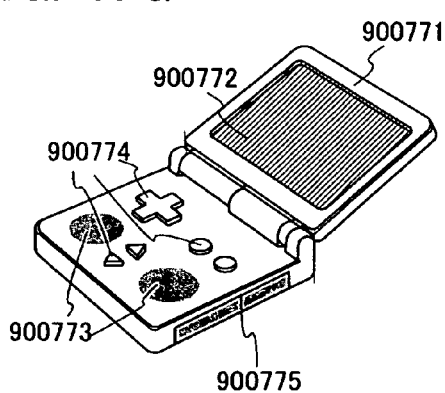

FIG. 49G shows a portable game machine, which includes a housing 900771, a display portion 900772, speaker portions 900773, operation keys 900774, a recording medium insert portion 900775, and the like. The portable game machine shown in FIG. 49G can have various functions such as, but not limited to, a function of reading a program or data stored in the recording medium to display on the display portion; and a function of sharing information by wireless communication with another portable game machine.

Although not shown, the optical sensor formed according to Embodiment Modes 1 to 4 is provided in the periphery of the display portion 900772.

Figure 49H:
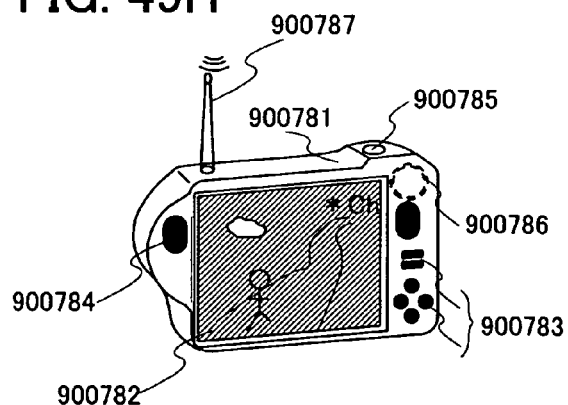

FIG. 49H shows a digital camera having a television reception function, which includes a housing 900781, a display portion 900782, operation keys 900783, a speaker 900784, a shutter button 900785, an image receiving portion 900786, an antenna 900787, and the like. The digital camera having the television reception function shown in FIG. 49H can have various functions such as, but not limited to, a function of photographing a still image and a moving image; a function of automatically adjusting the photographed image; a function of obtaining various kinds of information from the antenna; a function of storing the photographed image or the information obtained from the antenna; and a function of displaying the photographed image or the information obtained from the antenna on the display portion.

Although not shown, the optical sensor formed according to Embodiment Modes 1 to 4 is provided in the periphery of the display portion 900782.

As shown in FIGS. 49A to 49H, an electronic device in this embodiment mode includes a display portion for displaying some kind of information. Since the electronic device in this embodiment mode includes a photoelectric conversion device with a small output variation due to variation in characteristics, the electronic device which can operate precisely in accordance with illuminance can be obtained. Further, an electronic device with high yield and low manufacturing cost can be obtained. Moreover, an electronic device with low power consumption can be obtained.

Note that although this embodiment mode is described with reference to various drawings, the contents (or part of the contents) described in each drawing can be freely applied to, combined with, or replaced with the contents (or part of the contents) described in another drawing. Further, much more drawings can be formed by combining each part with another part in the above-described drawings.

Similarly, the contents (or part of the contents) described in each drawing in this embodiment mode can be freely applied to, combined with, or replaced with the contents (or part of the contents) described in a drawing in another embodiment mode. Further, much more drawings can be formed by combining each part in each drawing in this embodiment mode with part of another embodiment mode.

Note that this embodiment mode shows examples of embodying, slightly transforming, partially modifying, improving, describing in detail, or applying the contents (or part of the contents) described in other embodiment modes, an example of related part thereof, or the like. Therefore, the contents described in other embodiment modes can be freely applied to, combined with, or replaced with this embodiment mode.

The following aspects are included in a semiconductor device and a manufacturing method thereof which can be obtained by the invention.

One aspect is a semiconductor device including a light detection circuit which includes an optical sensor to output a current signal corresponding to illuminance and a current-voltage conversion circuit to convert the current signal output from the optical sensor into a voltage signal; an amplifier to amplify the voltage signal output from the light detection circuit; a comparison circuit to compare voltage output from the amplifier and reference voltage and output the result to a control circuit; and the control circuit to determine an illuminance range to be detected depending on the output from the comparison circuit and output a control signal to the light detection circuit. A resistance value of the current-voltage conversion circuit is changed in accordance with the control signal.

Another aspect is a semiconductor device including a light detection circuit which includes an optical sensor to output a current signal corresponding to illuminance and a current-voltage conversion circuit to convert the current signal output from the optical sensor into a voltage signal; an amplifier to amplify the voltage signal output from the light detection circuit; a comparison circuit to compare voltage output from the amplifier and reference voltage and output the result to a control circuit; and the control circuit to determine an illuminance range to be detected depending on the output from the comparison circuit and output a control signal to the light detection circuit. The current-voltage conversion circuit includes a plurality of resistors having different resistance values and a switch. The optical sensor is electrically connected to one of the plurality of resistors by the switch.

Another aspect is a semiconductor device including a light detection circuit which includes an optical sensor to output a current signal corresponding to illuminance and a current-voltage conversion circuit to convert the current signal output from the optical sensor into a voltage signal; an amplifier to amplify the voltage signal output from the light detection circuit; a comparison circuit to compare voltage output from the amplifier and reference voltage and output the result to a control circuit; and the control circuit to determine an illuminance range to be detected depending on the output from the comparison circuit and output a control signal to the light detection circuit. The current-voltage conversion circuit includes a variable resistor.

Another aspect is a semiconductor device including a light detection circuit which includes an optical sensor to output a current signal corresponding to illuminance and a current-voltage conversion circuit to convert the current signal output from the optical sensor into a voltage signal; an amplifier to amplify the voltage signal output from the light detection circuit; a comparison circuit to compare voltage output from the amplifier and reference voltage and output the result to a control circuit; and the control circuit to determine an illuminance range to be detected depending on the output from the comparison circuit and output a control signal to the light detection circuit. The current-voltage conversion circuit includes a transistor.

The optical sensor may include a photodiode.

The reference voltage may be generated by a reference voltage generation circuit.

This application is based on Japanese Patent Application serial No. 2006-354387 filed with Japan Patent Office on Dec. 28, 2006, the entire contents of which are hereby incorporated by reference.

What is claimed is:

1. A photoelectric conversion device comprising:
   a light detection circuit comprising an optical sensor and a current-voltage conversion circuit;
   a comparison circuit configured to compare an output voltage of the light detection circuit to a reference voltage; and
   a control circuit electrically connected to the current-voltage conversion circuit and configured to output a control signal based on an output signal of the comparison circuit,
   wherein the current-voltage conversion circuit comprises a first resistor having a first resistance value, a second resistor having a second resistance value different from the first resistance value, and a switch,
   wherein the switch is controlled based on the control signal,
   wherein the optical sensor is electrically connected to at least one of the first resistor and the second resistor,
   wherein an output of the light detection circuit is electrically connected to the optical sensor, and
   wherein the output of the light detection circuit is electrically connected to the current-voltage conversion circuit.

2. The photoelectric conversion device according to claim 1,
   wherein the optical sensor comprises a photodiode.

3. The photoelectric conversion device according to claim 1,
   wherein the reference voltage is generated by a reference voltage generation circuit.

4. The photoelectric conversion device according to claim 1,
   wherein the light detection circuit is electrically connected to the comparison circuit through at least an amplifier.

5. The photoelectric conversion device according to claim 1,
   wherein the optical sensor outputs a current signal according to detection illuminance.

6. The photoelectric conversion device according to claim 5,
   wherein the current-voltage conversion circuit converts the current signal into a voltage signal.

7. A photoelectric conversion device comprising:
   a light detection circuit comprising an optical sensor and a current-voltage conversion circuit;
   a comparison circuit configured to compare an output voltage of the light detection circuit to a reference voltage; and
   a control circuit electrically connected to the current-voltage conversion circuit and configured to output a control signal based on an output signal of the comparison circuit,
   wherein the current-voltage conversion circuit comprises a plurality of resistors and a switch,
   wherein the plurality of resistors are provided in parallel,
   wherein the switch is controlled based on the control signal,
   wherein the optical sensor is electrically connected to at least one of the plurality of resistors,
   wherein an output of the light detection circuit is electrically connected to the optical sensor, and
   wherein the output of the light detection circuit is electrically connected to the current-voltage conversion circuit.

8. The photoelectric conversion device according to claim 7,
   wherein the optical sensor comprises a photodiode.

9. The photoelectric conversion device according to claim 7,
   wherein the reference voltage is generated by a reference voltage generation circuit.

10. The photoelectric conversion device according to claim 7,
    wherein the light detection circuit is electrically connected to the comparison circuit through at least an amplifier.

11. The photoelectric conversion device according to claim 7,
    wherein the optical sensor outputs a current signal according to detection illuminance.

12. The photoelectric conversion device according to claim 11,
    wherein the current-voltage conversion circuit converts the current signal into a voltage signal.

13. The photoelectric conversion device according to claim 7,
    wherein the plurality of resistors have different resistance values.

14. The photoelectric conversion device according to claim 7,
    wherein the switch comprises a plurality of transistors.

15. A photoelectric conversion device comprising:
    a light detection circuit comprising an optical sensor and a current-voltage conversion circuit;
    a comparison circuit configured to compare an output voltage of the light detection circuit to a reference voltage; and
    a control circuit electrically connected to the current-voltage conversion circuit and configured to output a control signal based on an output signal of the comparison circuit,
    wherein the current-voltage conversion circuit comprises a plurality of resistors and a plurality of switches,
    wherein the plurality of switches are controlled based on the control signal,
    wherein the optical sensor is electrically connected to at least one of the plurality of resistors,
    wherein an output of the light detection circuit is electrically connected to the optical sensor, and wherein the output of the light detection circuit is electrically connected to the current-voltage conversion circuit.

16. The photoelectric conversion device according to claim 15,
wherein the optical sensor comprises a photodiode.

17. The photoelectric conversion device according to claim 15,
wherein the reference voltage is generated by a reference voltage generation circuit.

18. The photoelectric conversion device according to claim 15,
wherein the light detection circuit is electrically connected to the comparison circuit through at least an amplifier.

19. The photoelectric conversion device according to claim 15,
wherein the optical sensor outputs a current signal according to detection illuminance.

20. The photoelectric conversion device according to claim 19,
wherein the current-voltage conversion circuit converts the current signal into a voltage signal.

21. The photoelectric conversion device according to claim 15,
wherein the plurality of resistors have different resistance values.

22. The photoelectric conversion device according to claim 7,
wherein the switch is configured to connect the output of the light detection circuit to one of the plurality of resistors.

23. The photoelectric conversion device according to claim 15,
wherein each of the plurality of resistors is provided to the respective switches.

24. The photoelectric conversion device according to claim 1,
wherein the switch comprises a plurality of transistors.

25. The photoelectric conversion device according to claim 1,
wherein the switch is configured to connect the output of the light detection circuit to the first resistor or the second resistor.

* * * * *

UNITED STATES PATENT AND TRADEMARK OFFICE
CERTIFICATE OF CORRECTION

| | | |
|---|---|---|
| PATENT NO. | : 8,514,165 B2 | Page 1 of 1 |
| APPLICATION NO. | : 12/003154 | |
| DATED | : August 20, 2013 | |
| INVENTOR(S) | : Yasunori Yoshida | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1186 days.

Signed and Sealed this
Fifteenth Day of March, 2016

Michelle K. Lee
*Director of the United States Patent and Trademark Office*